United States Patent [19]

Umaba

[11] Patent Number: 5,688,324
[45] Date of Patent: Nov. 18, 1997

[54] APPARATUS FOR COATING SUBSTRATE

[75] Inventor: Takayuki Umaba, Kyoto, Japan

[73] Assignee: Dainippon Screen Mfg. Co., Ltd., Japan

[21] Appl. No.: 464,080

[22] Filed: Jun. 5, 1995

[30]         Foreign Application Priority Data

| Jul. 15, 1994 | [JP] | Japan | 6-186255 |
| Sep. 14, 1994 | [JP] | Japan | 6-247331 |
| Oct. 5, 1994 | [JP] | Japan | 6-270337 |
| Nov. 24, 1994 | [JP] | Japan | 6-315973 |
| Dec. 2, 1994 | [JP] | Japan | 6-329565 |

[51] Int. Cl.$^6$ ................................................. B05C 9/00
[52] U.S. Cl. ........................... 118/401; 118/407; 118/410; 118/62; 118/63
[58] Field of Search ................................ 118/401, 407, 118/410, 58, 62, 63, 686

[56]               References Cited

U.S. PATENT DOCUMENTS

| 4,051,807 | 10/1977 | Graf et al. | 118/401 |
| 4,233,338 | 11/1980 | Ricard et al. | 118/401 |
| 4,370,079 | 1/1983 | Bok et al. | 427/38 |
| 4,481,235 | 11/1984 | Foell et al. | 118/401 |
| 4,529,628 | 7/1985 | Haour et al. | 118/401 |
| 4,938,835 | 7/1990 | Ludwig | 118/58 |
| 5,270,079 | 12/1993 | Bok | 427/429 |
| 5,455,062 | 10/1995 | MühHriedal et al. | 118/407 |
| 5,525,373 | 6/1996 | Chandler | 118/410 |

FOREIGN PATENT DOCUMENTS 49-101435  9/1974  Japan .

OTHER PUBLICATIONS

"Capillary–Fed Meniscus Coating Technique," Ind. Eng. Chem. Prod. Res. Dev. 19:314–316 (1980), C.S. Herrick.
Harasaki, Yuji, Latest Coating Technique, pp. 68–69 (1961).

*Primary Examiner*—Laura Edwards
*Attorney, Agent, or Firm*—Ostrolenk, Faber, Gerb & Soffen, LLP

[57]           ABSTRACT

A substrate coating apparatus includes a stage, a coating liquid tank, and a moving mechanism. The stage holds the substrate to be vertical or inclined. The tank has a hollow body extending along the widthwise direction of the substrate, with opposing ends closed. The tank has a protruding front end surface which can be positioned facing the substrate surface to be coated. The tank has an outlet path having an opening over the width of the area to be coated, and an inlet opened in the tank below the outlet. The moving mechanism holds the tank such that the front end surface thereof faces the surface of the substrate, with a prescribed space, for example, 0.1 to 0.3 mm, therebetween. The moving mechanism moves the tank vertically relative to the substrate, from a start position to an end position, while the predetermined space between the tank and the surface is maintained. The front end surface of the tank has a lower edge positioned between the outlet and the inlet of the coating liquid outlet path. The upper edge of the front edge surface being between the outlet and a maximum height position reached by coating liquid in the gap by capillary action or, it may be formed above the maximum height, assuming that the front end surface of the coating liquid tank and the substrate surface to be coated extend infinitely upward to define the gap of said prescribed size therebetween.

150 Claims, 78 Drawing Sheets

APPARATUS FOR COATING SUBSTRATE

BACKGROUND OF THE INVENTION

1. Field of the Invention

The present invention relates to an apparatus for forming a coating film on a substrate surface. More specifically, the present invention relates to an apparatus for applying coating liquid such as photoresist liquid or solder liquid on a surface of a substrate such as a glass substrate for LCDs, a semiconductor substrate and a printed board, in the process of manufacturing liquid crystal display devices (LCDs), semiconductor devices and various electronic components.

2. Description of the Related Art

Conventionally, when a substrate is coated with a coating liquid in a single substrate process system, coating apparatuses of spinner type, blade type, spray type, roll coater type and so on have been used. Of these coating apparatuses, spinner types have been most widely used in the process of manufacturing liquid crystal display devices and semiconductor devices.

As demands for liquid crystal display devices and semiconductor devices have increased and larger substrates or quadrilateral substrates such as square substrates come to be used more frequently, the following problems of the spinner type coating apparatus have come to be recognized.

First, in a spinner type coating apparatus, the proportion of coating liquid used effectively is low. As is well known, in the spinner type coating apparatus, a substrate is rotated while being held by the spinner, coating liquid is supplied to the surface and the coating liquid is dispersed over the surface of the substrate by centrifugal force, to form the coating film. Therefore, in the step of dispersing the coating liquid, most of the coating liquid that is used scatters around, and is wasted. Relatively expensive coating liquid such as developer of a resist, is used frequently, and therefore a coating apparatus which achieves more effective use of the coating liquid has been desired.

As already described, in the spinner type coating apparatus, the substrate is held horizontally and is rotated by the spinner. Therefore, when the substrate becomes larger, the apparatus must be made larger. Accordingly, real estate necessary for manufacturing the device mentioned above becomes larger, and as a result, manufacturing cost of the device rises. Especially when the substrate to be coated is quadrilateral, the space necessary for rotating the substrate increases in relation to the length of the diagonal of the substrate. Therefore, it is particularly disadvantageous when a quadrilateral substrate is coated by using a spinner type coating apparatus.

As another disadvantage, the spinner type coating apparatus, which was originally developed for coating circular substrates, is not optimal for coating a quadrilateral substrate. More specifically, as distinguished from a circular substrate, a quadrilateral substrate has corners, and turbulence in air flow tends to be generated around the corners during rotation, which turbulence in the air flow tends to extend over the surface of the substrate. Such turbulence of air flow over the substrate surface results in degradation of quality, such as uniformity of thickness of the coating film.

As the substrate becomes larger and larger, radius of rotation of the substrate becomes larger, and therefore the amount of evaporation of the solvent contained in the coating liquid differs near the center and near the outer periphery of the substrate. Therefore, a difference in fluidity of the coating liquid near the center and near the outer periphery of the substrate develops, resulting in an uneven film thickness of the coating.

The above described problems of a spinner type coating apparatus is inherent in the spinner type coating apparatus because of its principle of operation, and therefore a coating apparatus based on a different principle which is suitable for coating a leaf type substrate has been desired.

One proposal to meet such demand is disclosed in U.S. Pat. No. 5,270,079 entitled "Methods of Meniscus Coating" issued to Bok, of which a schematic structure is shown in FIG. 1 herein. Referring to FIG. 1, the apparatus of Bok includes a container 231 containing coating material 230, a porous applicator 240 provided in the container 231, lines 232 and 234 for withdrawing coating material 230 from container 231, a solenoid valve 233 provided at a connection point of lines 232 and 234, a pump 235 for pressurizing the coating material to fill line 236 with material 230, a filter 237 having the pore size of about 0.1 to 10 µm provided at a connection point between lines 236 and 238, and a solenoid valve 246 provided at a connection point of lines 238 and 239. The other end of line 239 is connected to the inside of porous applicator 240.

In operation, coating material 230 is withdrawn from container 231 via line 232, passes through solenoid valve 233 and passes via line 234 to a pump 245 where it is pressurized to about 2 to about 15 psig, depending upon the pore size of the filter and viscosity of the fluid. The pressurized coating material flows from pump 235 via line 236 and is passed through filter 237 to remove particular materials larger than the pore size of filter 237. The filtered, pressurized coating material is withdrawn from filter 237 via line 238, passes through the second solenoid valve 246 and passes via line 239 to the inside of porous applicator 240. Porous applicator 240 is comprised of sintered metal, has a circular cross section, is hollow and has a porous wall through which coating material 230 can flow.

Pump 235 is operated, and solenoid valves 233 and 246 are open, until the outer surface of applicator 240 is wet, so as to cause a downward laminar flow 241. Then pump 235 is turned off and solenoid valves 233 and 246 are closed. In order to establish contact of the coating material with the object, the outer surface of applicator 240 is allowed to contact the lower surface of object 242 to establish a leading meniscus 243 and a trailing meniscus 244. Then applicator 240 is separated from the surface of object 242. Preferably the distance between the outer surface of applicator 240 and surface of object 242 is from about 0.015 to 0.250 inches, more preferably from about 0.015 to 0.125 inches, and most preferably from about 0.020 to 0.040 inches.

Once menisci 243 and 244 have been established, object 242 is advanced in a generally horizontal direction across and above the surface of applicator 240 in the direction of the arrow (to the right of FIG. 1) in order to establish a film of coating material 245 on the surface of the object. The downward laminar flow 241 is continued throughout the coating step.

In the apparatus of Bok, as compared with a spinner type coating apparatus, the amount of wasted coating liquid is far smaller in Bok. Therefore, in order to coat a substrate in a single substrate process system, this apparatus of the prior art is considered to be more suitable than the spinner type one.

However, the apparatus of Bok still has problems. First, in the apparatus of Bok, there is a possibility of deterioration of the coating liquid. The top side of container 231 shown in FIG. 1 is open. Therefore, coating liquid 230 is in contact with the atmosphere over a relatively large area. As the solvent evaporates from coating material 230, it may be possible that the viscosity of coating material 230 changes or the nature of the coating material changes.

The second problem is that a larger area is necessary for the apparatus of Bok.

Third, the coating rate of the apparatus of Bok is too low. According this reference, relative speed of object 242 and applicator 240 is typically from 0.5 to 20 inch/min. (0.21–8.5 mm/sec), and more preferably, 2 to 15 inch/min (0.85–6.35 mm/sec). This is too slow, and preferable much faster throughput cannot be obtained by the apparatus of Bok. Assuming that the size of substrates will become larger and larger, the apparatus of Bok is not advantageous.

Further, the apparatus of this reference has another problem in that the coating formed at the start position of coating becomes thicker than the remaining portions. This may be the case when trailing meniscus 244 is not stable immediately after the start of coating, and trailing meniscus 244 becomes stable only after a considerably long length of object 242 has been coated. That portion of the substrate on which a thick film is formed is not suitable for use, and therefore all substrate area cannot be used efficiently. In order to solve this problem, it may be possible to place a plate or the like at an end surface of the substrate to be flush with the lower surface of the substrate, start formation of the coating film from this plate portion, and start coating of the substrate surface after the trailing meniscus 244 becomes stable. By this approach, the thick film is formed not on the substrate surface but on the plate surface, and the coating film formed on the substrate surface does not have any thick portion.

However, in this case also, the coating material applied to other than the substrate will be wasted and in addition, since coating starts from a portion other than the substrate, time required for coating the substrate surface becomes longer. Especially as the relative speed of the substrate and the applicator is slow in the apparatus of Bok, when coating starts from a portion other than the substrate, the time increased by that amount will be relatively long.

SUMMARY OF THE INVENTION

Therefore, an object of the present invention is to provide an apparatus for coating a substrate which achieves highly efficient use of the coating liquid and allows high throughput.

Another object of the present invention is to provide an apparatus for coating a substrate which achieves highly efficient use of the coating liquid, high throughput and which requires small area for installment.

A further object of the present invention is to provide an apparatus for coating a substrate which achieves highly efficient use of the coating liquid and high throughput, requires a small area for installation and which can reduce spoiled areas of the coating film.

An additional object of the present invention is to provide an apparatus for coating a substrate which achieves highly efficient use of the coating liquid and high throughput, requires small area for installment, and which reduces area of faulty and spoiled coating film generated at a coating start position.

A still further object of the present invention is to provide an apparatus for coating a substrate which apparatus achieves highly efficient use of the coating liquid and high throughput, requires a relatively small area for installation thereof and reduces faulty and spoiled areas of coating film generated at a coating terminating position.

With a view to accomplishing the above objects, there is provided an apparatus for applying a coating liquid to a substrate, in accordance with an aspect of the present invention, which includes a substrate holding mechanism for holding a substrate having a surface to be coated, such that the surface to be coated is positioned vertically or inclined; a coating liquid tank capable of storing the coating liquid therein, having a hollow body with opposing ends closed, and a front end surface at a front surface portion of its outer periphery, the front end surface being adapted to oppose to the surface of the substrate held by the substrate holding mechanism that is to be coated and to extend over at least a prescribed range of width of that surface which is to be coated, the coating liquid tank having a coating liquid outlet path having an outlet opened at the front end surface, and an inlet opened in the coating liquid tank below the outlet, through which outlet path the coating liquid rises to reach the outlet at least by capillary action; and a moving mechanism for holding the coating liquid tank with its front end surface opposing to the surface to be coated of the substrate held by the substrate holding mechanism with a gap of a prescribed size therebetween, and for linearly moving at least one of the substrate holding mechanism and the coating liquid tank relative to each other, while maintaining the gap of the prescribed size, between a first position where coating of the substrate surface to be coated starts and a second position where coating of the substrate surface to be coated is terminated, the front end surface of the coating liquid tank having a lower edge that is positioned at a level between the outlet and the inlet when the coating liquid tank is held by the moving mechanism, and an upper edge that is positioned at a level formed between the outlet and a maximum height reached by the coating liquid rising in the gap of the prescribed size at least by capillary action and which coating liquid flows from the outlet to the gap when the coating liquid tank is held by the moving mechanism, assuming that both the front end surface of the coating liquid tank and the substrate surface to be coated extend infinitely upward to define the gap of prescribed size therebetween; wherein when the coating liquid is introduced to the coating liquid tank with the coating liquid tank being held by the moving mechanism, such that the level of the coating liquid surface is positioned at a level between the inlet of the coating liquid outlet path and the lower edge of the front end surface of the coating liquid tank, and the coating liquid introduced to the gap through the coating liquid outlet path forms a pool where flow is regulated by the upper and lower edges of the front end surface.

In accordance with another aspect of the present invention, an apparatus for applying a coating liquid to a substrate includes a substrate holding mechanism for holding a substrate having a surface to be coated, such that the surface to be coated is positioned vertically or inclined; a coating liquid tank capable of storing the coating liquid therein, having a hollow body with opposing ends closed, and a front end surface at a front surface portion of its outer periphery, the front end surface being adapted to oppose the surface to be coated of the substrate held by the substrate holding mechanism and to extend over at least a prescribed range of width of the substrate surface to be coated, the coating liquid tank having a coating liquid outlet path having an outlet opened at the front end surface, and an inlet opened in the coating liquid tank and below the outlet, through which outlet path the coating liquid rises to reach the outlet at least by capillary action; and a moving mechanism for holding the coating liquid tank with its front end surface opposing the surface to be coated of the substrate held by the substrate holding mechanism with a gap of a prescribed size therebetween, and for linearly moving at least one of the substrate holding mechanism and the coating liquid tank relative to each other, while maintaining the gap of the prescribed size, between a first position where coating of the substrate surface to be coated starts and a second position where coating of the substrate surface to be coated is terminated, the front end surface of the coating liquid tank having a lower edge positioned at a level between the outlet and the inlet when the coating liquid tank is held by the moving mechanism, and an upper edge positioned above a maximum height reached by the coating liquid rising in the gap of the prescribed size at least by capillary action which coating liquid flows from the outlet to the gap when the coating liquid tank is held by the moving mechanism, assuming that both the front end surface of the coating liquid tank and the substrate surface to be coated extend infinitely upward to define the gap of prescribed size therebetween; wherein when the coating liquid is introduced to the coating liquid tank with the coating liquid tank being held by the moving mechanism, such that the surface of the coating liquid is positioned at a level between the inlet of the coating liquid outlet path and the lower edge of the front end surface of the coating liquid tank, the coating liquid introduced to the gap through the coating liquid outlet path forms a pool with flow that is regulated by the lower edge of the front end surface, and a space containing no coating liquid is formed above the pool.

If the substrate is transparent, the substrate holding stage includes a suction holding plate for holding the rear surface of the substrate, and the holding plate may have at least a portion formed of transparent material and corresponding to the position of the upper end of the pool when the coating liquid tank is at the first position. The substrate holding stage may hold the substrate such that the upper end portion of the substrate surface to be coated protrudes upward from the upper end of the substrate holding stage. If the substrate is not transparent, the substrate holding stage may include a suction holding plate having a through hole at a portion corresponding to the position of the upper end of the pool when the coating liquid is at the first position, the through hole allowing observation of the substrate from the side opposite to the substrate holding surface.

The substrate holding stage may hold the substrate such that the lower end portion of the substrate protrudes downward from the lower end of the substrate holding stage. This can prevent entrance of the coating liquid to a space between the rear surface of the substrate and the substrate holding stage at the completion of coating.

In accordance with yet another aspect of the present invention there is provided an apparatus for applying a coating liquid to a substrate, which apparatus includes a substrate holding mechanism for holding a substrate having a surface to be coated, such that the surface to be coated is positioned vertically or inclined; a coating liquid tank capable of storing the coating liquid therein, having a hollow body with opposing ends closed, and a front end surface at a front surface portion of its outer periphery, the front end surface being adapted to oppose the surface to be coated of the substrate held by the substrate holding mechanism and to extend over at least a prescribed range of width of the substrate surface to be coated, the coating liquid tank having a coating liquid outlet path having an outlet opened at the front end surface, and an inlet opened in the coating liquid tank below the outlet, through which outlet path the coating liquid rises to reach the outlet at least by capillary action; and a moving mechanism for holding the coating liquid tank with its front end surface opposing the surface to be coated of the substrate held by the substrate holding mechanism with a gap of a prescribed size therebetween, and for linearly moving at least one of the substrate holding mechanism and the coating liquid tank relative to each other, while maintaining the gap of the prescribed size, between a first position where coating of the substrate surface to be coated starts and a second position where coating of the substrate surface to be coated is terminated, the front end surface of the coating liquid tank having a lower edge positioned at a level between the outlet and the inlet when the coating liquid tank is held by the moving mechanism, and an upper edge formed between the outlet and a maximum height reached by the coating liquid rising in the gap of prescribed size at least by capillary action which coating liquid flows from the outlet to the gap when the coating liquid tank is held by the moving mechanism, assuming that both the front end surface of the coating liquid tank and the substrate surface to be coated extend infinitely upward to define the gap of prescribed size therebetween; and a pressure adjusting mechanism coupled to the coating liquid tank for controlling the amount of said coating liquid in the pool; wherein when the coating liquid is introduced to the coating liquid tank with the coating liquid tank being held by the moving mechanism, such that the surface of the coating liquid is positioned at a level between the outlet of the coating liquid outlet path and the lower edge of the front end surface of the coating liquid tank, the coating liquid introduced to the gap through the coating liquid outlet path forms a pool where flow is regulated by the upper and lower edges of the front end surface.

In accordance with further aspect of the present invention there is provided an apparatus for applying a coating liquid to a substrate, which apparatus includes a substrate holding mechanism for holding a substrate having a surface to be coated, such that the substrate surface to be coated is positioned vertically or inclined; a coating liquid tank capable of storing the coating liquid therein, having a hollow body with opposing ends closed, and a front end surface at a front surface portion of its outer periphery, the front end surface being adapted to oppose the surface to be coated of the substrate held by the substrate holding mechanism and to extend over at least a prescribed range of width of the substrate surface to be coated, the coating liquid tank having a coating liquid outlet path having an outlet opened at the front end surface, and an inlet opened in the coating liquid tank below the outlet, through which outlet path the coating liquid rises to reach the outlet at least by capillary action; and a moving mechanism for holding the coating liquid tank with its front end surface opposing the surface to be coated of the substrate held by the substrate holding mechanism with a gap of a prescribed size therebetween, and for linearly moving at least one of the substrate holding mechanism and the coating liquid tank relative to each other, while maintaining the gap of the prescribed size, between a first position where coating of the substrate surface to be coated starts and a second position where coating of the substrate surface to be coated is terminated, the front end surface of the coating liquid tank having a lower edge being at a level between the outlet and the inlet when the coating liquid tank is held by the moving mechanism, and an upper edge formed above a maximum height reached by the coating liquid rising in the gap of prescribed size at least by capillary action which coating liquid flows from the outlet to the gap when the coating liquid tank is held by the moving mechanism, assuming that both the front end surface of the coating liquid tank and the surface to be coated of the substrate extend infinitely upward to define the gap of prescribed size therebetween; and pressure adjusting mechanism coupled to the coating liquid tank for controlling the amount of said coating liquid in the pool; wherein when the coating liquid is introduced to the coating liquid tank being held by the moving mechanism, the surface of the coating liquid is positioned at a level between the outlet of the coating liquid outlet path and the lower edge of the front end surface of the coating liquid tank, the coating liquid introduced to the gap through the coating liquid outlet path forms a pool with flow regulated by the lower edge of the front end surface, and a space containing no coating liquid is formed above the pool.

In accordance with yet another aspect of the present invention there is provided an apparatus for applying a coating liquid to a substrate, which apparatus includes a substrate holding mechanism for holding a substrate having a surface to be coated, such that the surface to be coated is positioned vertically or inclined; a coating liquid tank capable of storing the coating liquid therein, having a hollow body with opposing ends closed, and a front end surface at a front surface portion of its outer periphery, the front end surface being adapted to oppose the surface to be coated of the substrate held by the substrate holding mechanism and to extend over at least a prescribed range of width of the substrate surface to be coated, the coating liquid tank having a coating liquid outlet path having an outlet opened at the front end surface, and an inlet opened in the coating liquid tank below the outlet, through which outlet path the coating liquid rises to reach the outlet at least by capillary action; and a moving mechanism for holding the coating liquid tank with its front end surface opposing the surface to be coated of the substrate held by the substrate holding mechanism with a gap of a prescribed size therebetween, and for linearly moving at least one of the substrate holding mechanism and the coating liquid tank relative to each other, while maintaining the gap of prescribed size, between a first position where coating of the substrate surface to be coated starts and a second position where coating of the substrate surface to be coated is terminated, the front end surface of the coating liquid tank having a lower edge formed at a position below the inlet when the coating liquid tank is held by the moving mechanism, and an upper edge formed between the outlet and a maximum height reached by the coating liquid rising in the gap of prescribed size at least by capillary action which coating liquid flows from the outlet to the gap when the coating liquid tank is held by the moving mechanism, assuming that both the front end surface of the coating liquid tank and the substrate surface to be coated extend infinitely upward to define the gap of prescribed size therebetween; and a pressure adjusting mechanism coupled to the coating liquid tank for controlling the amount of coating liquid in the pool; wherein when the coating liquid is introduced to the coating liquid tank held by the moving mechanism, such that the surface of the coating liquid is positioned at a height between the inlet and the outlet of the coating liquid outlet path, the coating liquid introduced to the gap through the coating liquid outlet path forms a pool with flow being regulated by the upper and lower edges of the front end surface.

In accordance with a further aspect of the present invention there is provided an apparatus for applying a coating liquid to a substrate, which apparatus includes a substrate holding mechanism for holding a substrate having a surface to be coated, such that the surface to be coated is positioned vertically or inclined; a coating liquid tank capable of storing the coating liquid therein, having a hollow body with opposing ends closed, and a front end surfaces at a front surface portion of its outer periphery, the front end surface being adapted to oppose the surface to be coated of the substrate held by the substrate holding mechanism and to extend over at least a prescribed range of width of the substrate surface to be coated, the coating liquid tank having a coating liquid outlet path having an outlet opened at the front end surface, and an inlet opened in the coating liquid tank below the outlet, through which outlet path the coating liquid rises to reach the outlet at least by capillary action; and a moving mechanism for holding the coating liquid tank with its front end surface opposed to the surface to be coated of the substrate held by the substrate holding mechanism with a gap of a prescribed size therebetween, and for linearly moving at least one of the substrate holding mechanism and the coating liquid tank relative to each other, while maintaining the gap of prescribed size, between a first position where coating of the substrate surface to be coated starts and a second position where coating of the substrate surface to be coated is terminated, the front end surface of the coating liquid tank having a lower edge formed at a position below the inlet when the coating liquid tank is held by the moving mechanism, and an upper edge formed above a maximum height reached by the coating liquid rising in the gap of prescribed size at least by capillary action which coating liquid flows from the outlet to the gap when the coating liquid tank is held by the moving mechanism, assuming that both the front end surface of the coating liquid tank and the substrate surface to be coated extend infinitely upward to define the gap of prescribed size therebetween; and a pressure adjusting mechanism coupled to the coating liquid tank for controlling the amount of said coating liquid in the pool; wherein when the coating liquid is introduced to the coating liquid tank with the coating liquid tank being held by the moving mechanism, such that surface of the coating liquid is positioned at a level between the outlet and inlet of the coating liquid outlet path, the coating liquid introduced to the gap through the coating liquid outlet path forms a pool with flow being regulated by the lower edge of the front end surface, and a space containing no coating liquid is formed above the pool.

In accordance with yet another aspect of the present invention there is provided an apparatus for applying a coating liquid to a substrate, which apparatus includes a substrate holding mechanism for holding a substrate having a surface to be coated, such that the surface to be coated is positioned vertically or inclined; a coating liquid tank capable of storing the coating liquid therein, having a hollow body with opposing ends closed, and a front end surface at a front surface portion of its outer periphery, the front end surface being adapted to oppose the surface to be coated of the substrate held by the substrate holding mechanism and to extend over at least a prescribed range of width of the substrate surface to be coated, the coating liquid tank having a coating liquid outlet path having an outlet opened at the front end surface, and an inlet opened in the coating liquid tank through which outlet path the coating liquid moves to reach the outlet at least by capillary action; and a moving mechanism for holding the coating liquid tank with its front end surface opposing the surface to be coated of the substrate held by the substrate holding mechanism with a gap of a prescribed size therebetween, and for moving at least one of the substrate holding mechanism and the coating liquid tank linearly relative to each other, while maintaining the gap of prescribed size, between a first position where coating of the substrate surface to be coated starts and a second position where coating of the substrate surface to be coated is terminated, the front end surface of the coating liquid tank having a lower edge formed at a position below the inlet when the coating liquid tank is held by the moving mechanism, and an upper edge formed between the outlet and a maximum height reached by the coating liquid rising in the gap of prescribed size at least by capillary action which coating liquid flows from the outlet to the gap when the coating liquid tank is held by the moving mechanism, assuming that both the front end surface of the coating liquid tank and the surface to be coated of the substrate extend infinitely upward to define the gap of prescribed size therebetween; and a pressure adjusting mechanism coupled to the coating liquid tank for controlling the amount of said coating liquid in the pool; wherein when the coating liquid is introduced to the coating liquid tank with the coating liquid tank being held by the moving mechanism, such that the surface of the coating liquid is positioned above both the inlet and the outlet of the coating liquid outlet path, the coating liquid introduced to the gap through the coating liquid outlet path forms a pool with a flow that is regulated by the upper and lower edges of the front end surface.

In accordance with a further aspect of the present invention there is provided an apparatus for applying a coating liquid to a substrate, which apparatus includes a substrate holding mechanism for holding a substrate having a surface to be coated, such that the surface to be coated is positioned vertically or inclined; a coating liquid tank capable of storing the coating liquid therein, having a hollow body with opposing ends closed, and a front end surface at a front surface portion of its outer periphery, the front end surface being adapted to oppose the surface to be coated of the substrate held by the substrate holding mechanism and to extend over at least a prescribed range of width of the substrate surface to be coated, the coating liquid tank having a coating liquid outlet path having an outlet opened at the front end surface, and an inlet opened to the coating liquid tank through which outlet path the coating liquid moves to reach the outlet at least by capillary action; and a moving mechanism for holding the coating liquid tank with its front end surface opposing to the substrate surface to be coated held by the substrate holding mechanism with a gap of a prescribed size therebetween, and for linearly moving at least one of the substrate holding mechanism and the coating liquid tank relative to each other, while maintaining the gap of prescribed size, between a first position where coating of the substrate surface to be coated starts and a second position where coating of the substrate surface to be coated is terminated, the front end surface of the coating liquid tank having a lower edge formed at a position below the outlet when the coating liquid tank is held by the moving mechanism, and an upper edge formed above a maximum height reached by the coating liquid rising in the gap of prescribed size at least by capillary action which coating liquid flows from the outlet to the gap when the coating liquid tank is held by the moving mechanism, assuming that both the front end surface of the coating liquid tank and the substrate surface to be coated extend infinitely upward to define the gap of prescribed size therebetween; and a pressure adjusting mechanism coupled to the coating liquid tank for controlling the amount of said coating liquid in the pool; wherein when the coating liquid is introduced to the coating liquid tank which is held by the moving mechanism, such that the surface of the coating liquid is positioned at a level above both the outlet and inlet of the coating liquid outlet path, the coating liquid introduced to the gap through the coating liquid outlet path forms a pool with flow regulated by the lower edge of the front end surface, and a space containing no coating liquid is formed above the pool.

Thus, the outlet of the coating liquid outlet path is not necessarily positioned higher than the inlet. The lower end of the front end surface of the coating liquid tank may be positioned lower than the inlet of the coating liquid tank. The surface level of the coating liquid in the tank may be determined independent from the levels of the outlet and inlet of the coating liquid outlet path.

The coating liquid tank and the substrate holding stage may be positioned such that the upper end of the substrate held by the substrate holding stage is positioned between the upper end of the front end surface of the coating liquid tank and the outlet of the coating liquid outlet path.

The coating apparatus may further include an extended member arranged on the side of the lower end of the substrate holding stage, and having an end surface opposing to and in contact with or close to the lower end of the substrate held by the substrate holding stage. The extended member has a front wall surface, and is arranged such that the front wall surface forms a gap continuous to the gap formed between the surface to be coated of the substrate held by the substrate holding stage and the front end surface of the coating liquid tank, between the front wall surface and the front end surface of the coating liquid tank. The moving mechanism moves the coating liquid tank until at least a portion of the pool formed between the surface to be coated of the substrate held by the substrate holding stage and the front end surface of the coating liquid tank passes over the lower end of the substrate and reaches the position opposing the front wall surface of the extended member.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

First Embodiment

Figure 1:
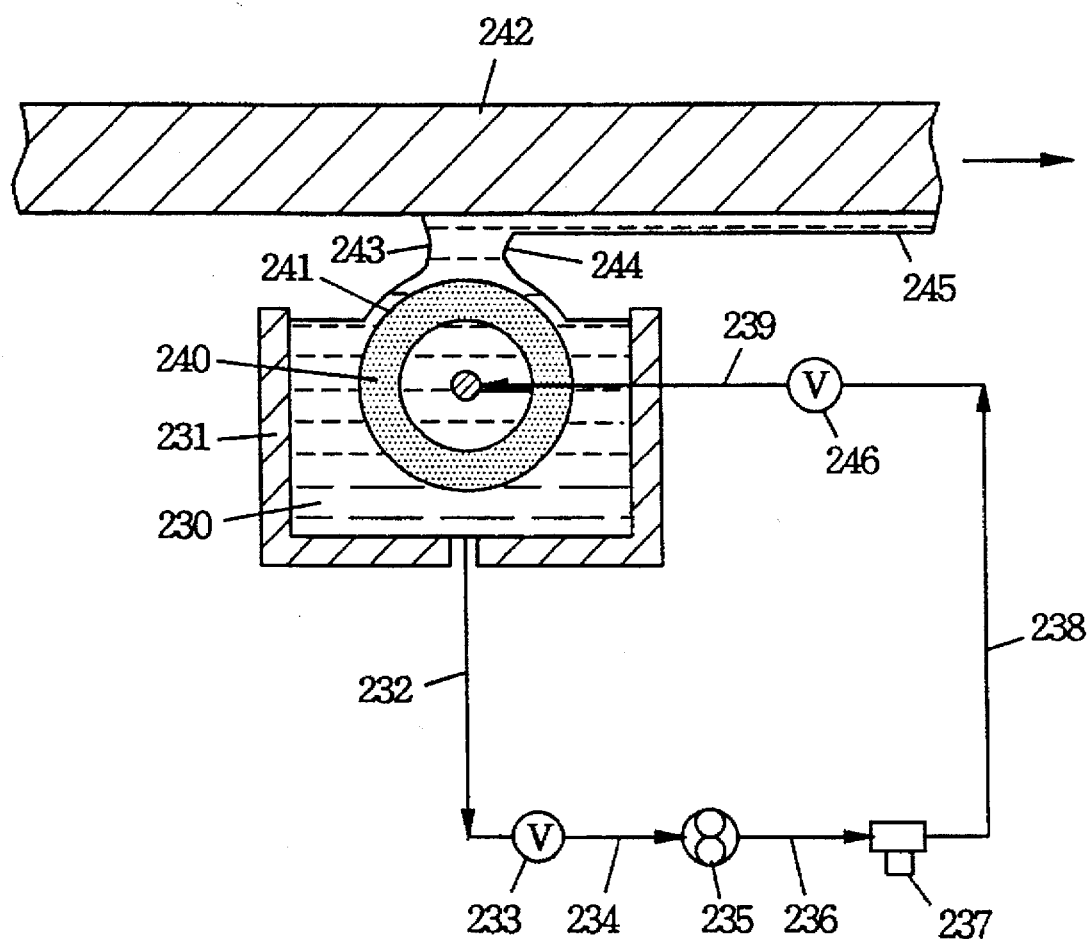
FIG. 1 is a side elevation illustrating a main portion of a conventional meniscus coater.
Figure 2:
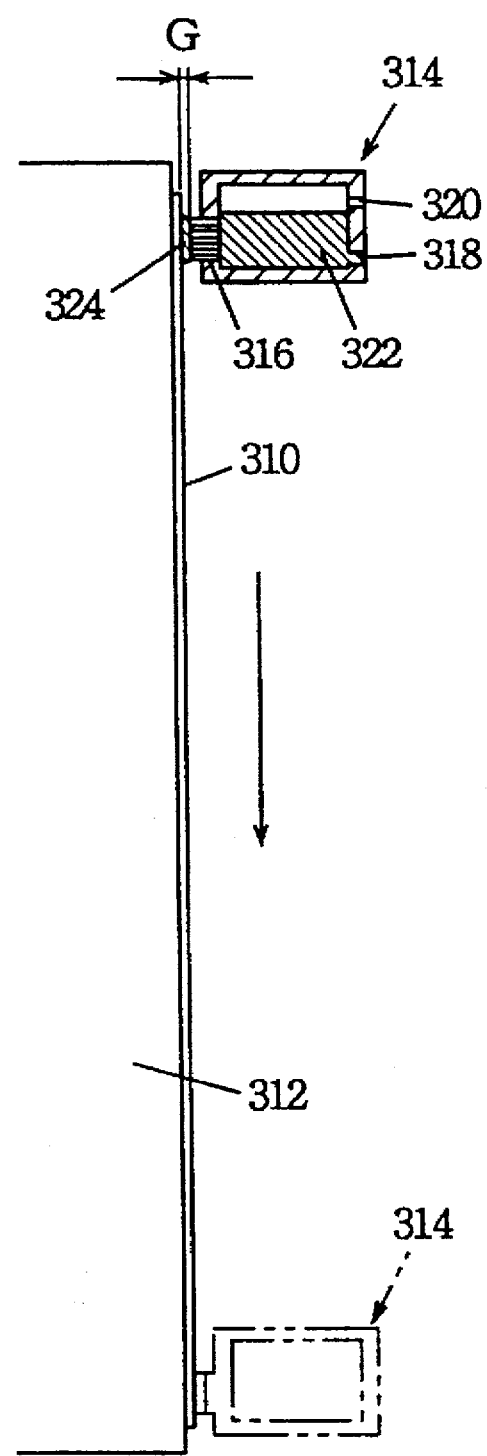
FIG. 2 is a vertical section of a main portion of coating apparatus constructed in accordance with a first embodiment of the present invention.
Figure 3:
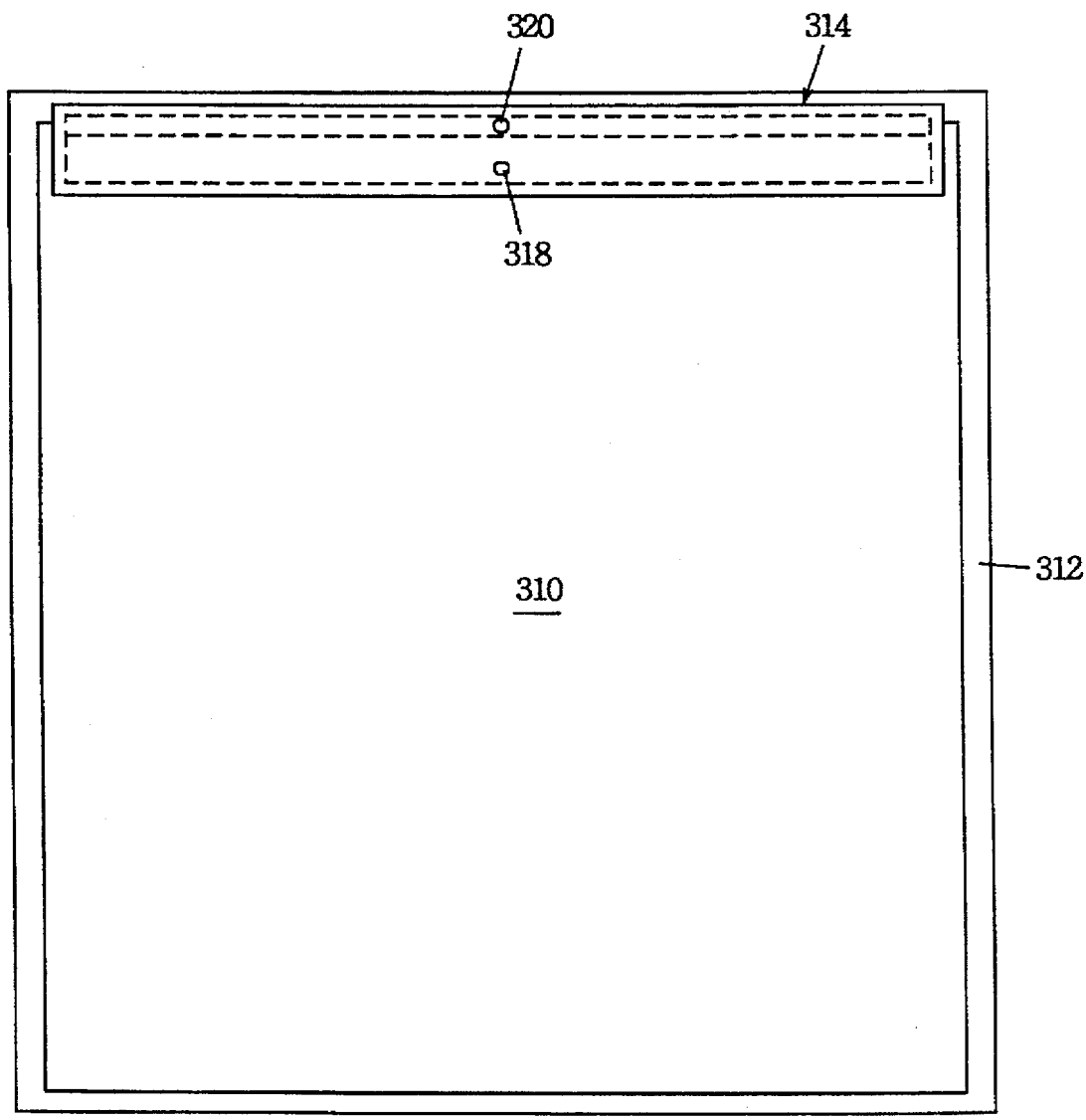
FIG. 3 is a front view of the main portion of the coating apparatus in accordance with the first embodiment.
Figure 4:
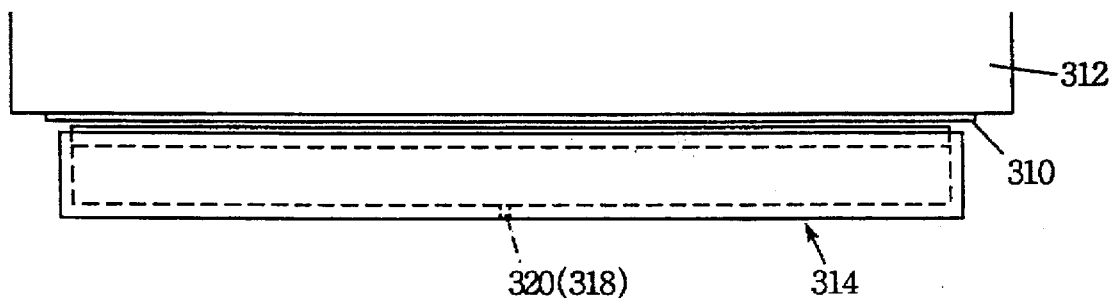
FIG. 4 is a plan view of the main portion of the coating apparatus in accordance with the first embodiment.

Referring to FIGS. 2 through 8 and particularly to FIGS. 2 through 4, coating apparatus of the first embodiment includes a substrate stage 312 for fixing and holding a substrate 310 to be coated with the coating liquid in a vertical position by utilizing vacuum suction, for example, and a hollow coating liquid tank 314 having a hollow body and extending in the widthwise direction of the substrate 310 and having opposing ends closed.

It should be appreciated by those skilled in the art that, while substrate 310 is held vertically by stage 312, the attitude of substrate 310 is not limited thereto. Substrate 310 can be held inclined by a proper angle such that the surface to be coated faces downward or upward.

Figure 5:
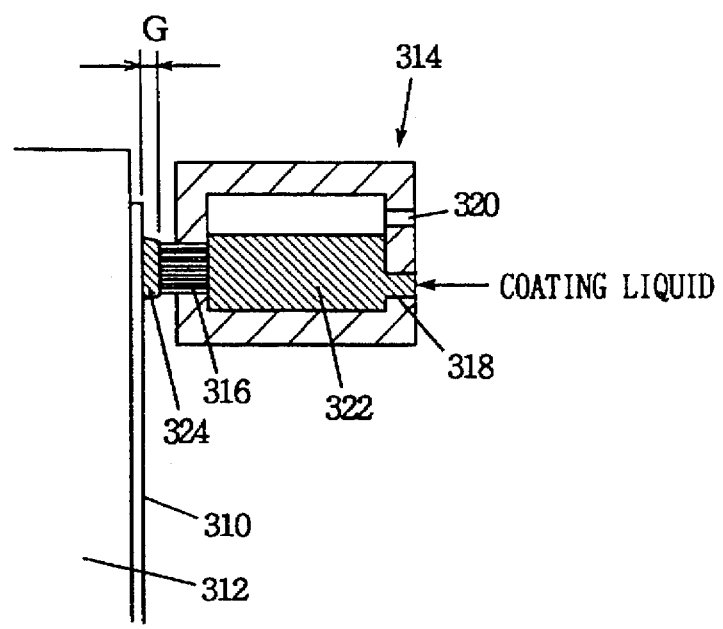
FIG. 5 is an enlarged vertical section of the main portion of the coating apparatus in accordance with the first embodiment.

Mainly referring to FIG. 5, on a front wall portion of coating liquid tank 314 confronting substrate 310, a large number of capillaries piercing therethrough are formed along the widthwise direction of coating liquid tank 314, thus providing coating liquid outlet portion 316. At a lower portion of a rear wall portion of coating liquid tank 314, a coating liquid inlet 318 is provided. At an upper portion of the rear wall portion of coating liquid tank 314, an air vent 320 is formed. When coating liquid is supplied through coating liquid inlet 318 to coating liquid tank 314, the air in coating liquid tank 314 escapes through the air vent 320.

Coating liquid tank 314 is provided with its entire width kept horizontal along the widthwise direction of the substrate 310, such that a gap G is formed between its front end surface and the surface to be coated of substrate 310 held by stage 312, and such that the front end surface is not in contact but close to the surface to be coated of substrate 310. Coating liquid tank 314 is movable in the vertical or longitudinal direction as shown in FIG. 2, while the aforementioned gap G is maintained between the front end surface thereof and the surface to be coated of the substrate 310 held by stage 312. A linear driving mechanism for linearly moving coating liquid tank 314 downward in a direction orthogonal to the widthwise direction of substrate 310 is provided. Though not shown in FIGS. 2 to 5, details of the linear driving mechanism will be described later with reference to FIGS. 6 to 8.

Referring to FIG. 5, coating liquid 322 is supplied through coating liquid inlet 318 to coating liquid tank 314. The amount of coating liquid 322 supplied is determined such that surface level of coating liquid 322 is above the upper edge position of coating liquid outlet portion 316 and is lower than the position of air vent 320. When coating liquid 322 is introduced to coating liquid tank 314, coating liquid 322 flows out from coating liquid tank 314 through the number of capillaries at the coating liquid outlet portion 316 at the front wall portion. As a result, a strip like pool 324 of coating liquid is formed approximately entirely over the widthwise direction of substrate 310 in the gap G between the front end surface of coating liquid tank 314 and the surface to be coated of substrate 310 held by stage 312.

Menisci are formed at the upper and lower ends edges of the pool 324, respectively, liquid pool 324 and coating liquid 322 in coating liquid tank 314 are in communication through the capillaries at the coating liquid outlet portion 316.

The size of the gap G is set such that the coating liquid flowing out from coating liquid tank 314 through coating liquid outlet portion 316 does not flow downward through the gap G. More specifically, the size of the gap G is determined by the pressure of coating liquid which is to go across gap G, and pressure loss and flow resistance at the gap G, using various material values and characteristics of the coating liquid, condition, geometry and roughness of the surface of substrate 310 and wettability of the substrate surface to be coated with respect to the coating liquid as parameters. Therefore, the size of the gap G is varied in accordance with the type of coating liquid, the type of substrate 310 and the size of the coating liquid tank 314.

Figure 6:
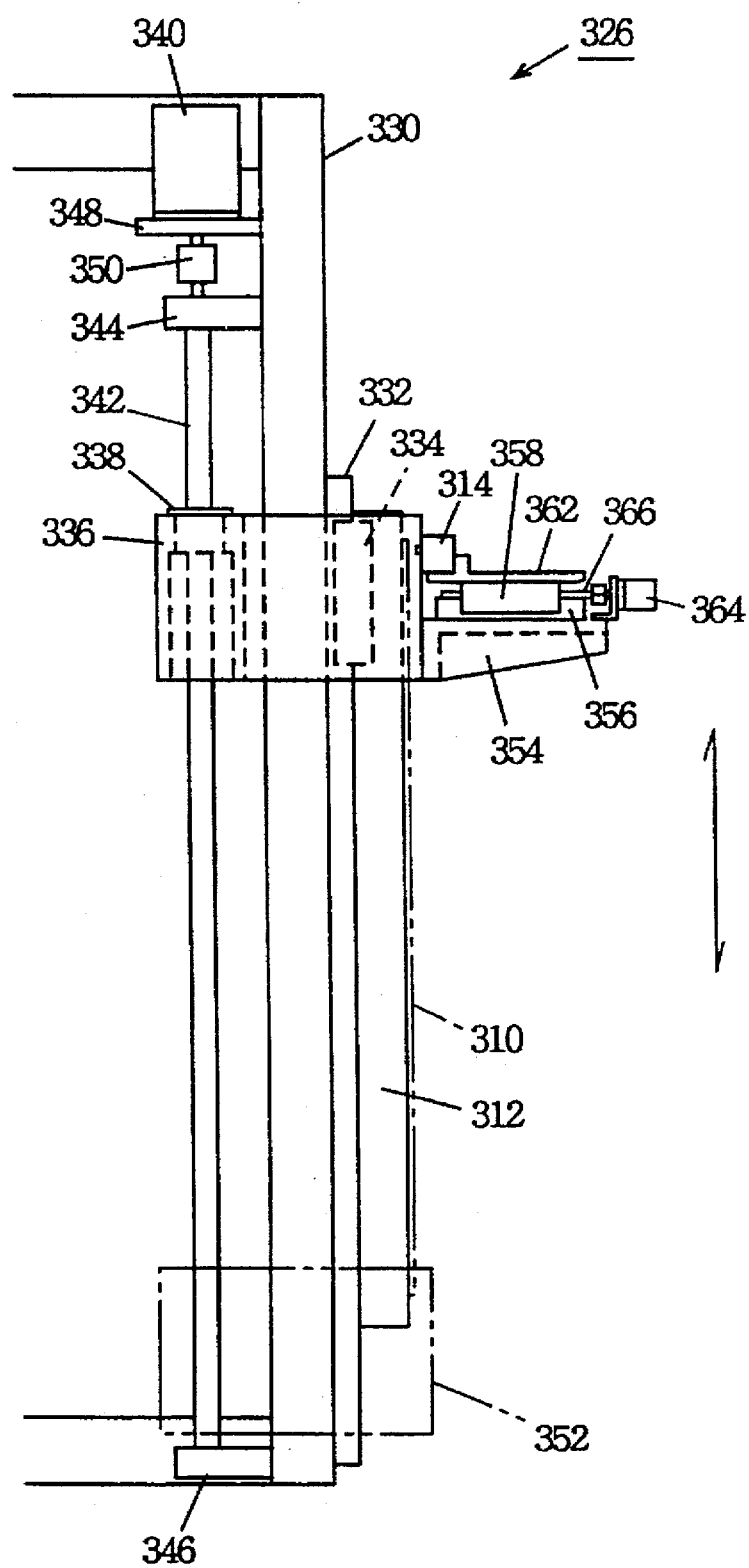
FIG. 6 is a side elevation of the coating apparatus in accordance with the first embodiment.
Figure 7:
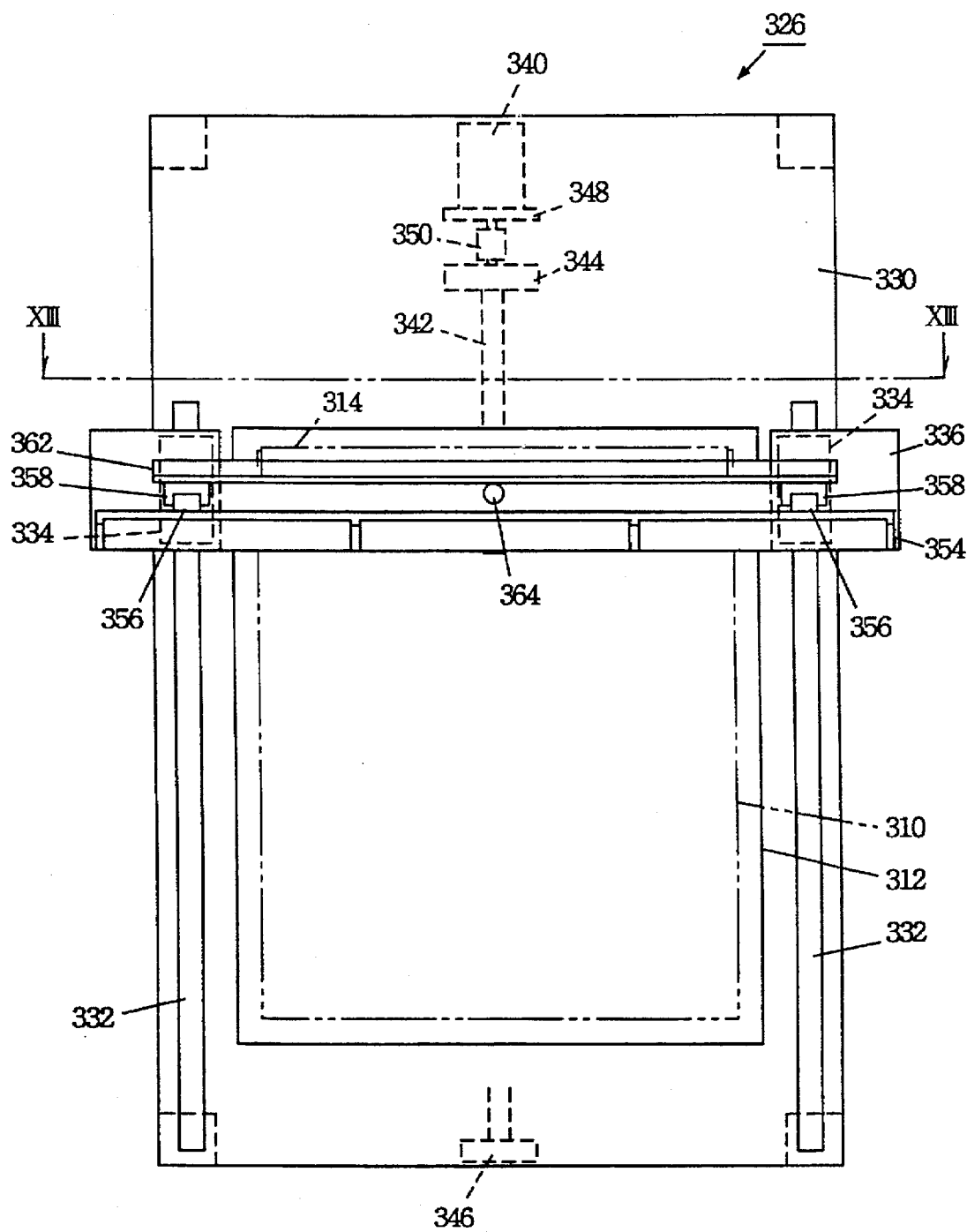
FIG. 7 is a front elevation of the coating apparatus in accordance with the first embodiment.
Figure 8:
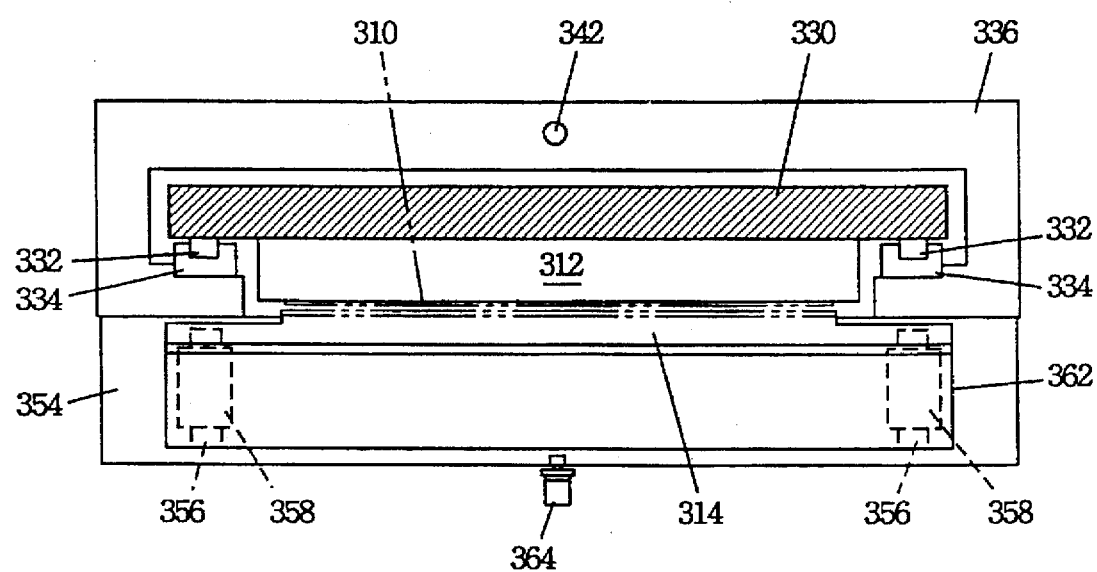
FIG. 8 is a plan view of the coating apparatus in accordance with the first embodiment.

Referring to FIGS. 6 to 8, the linear driving mechanism 326 for moving tank 314 vertically includes a main frame 330 on which stage 312 is fixed, a pair of rail portions 332 fixed in the vertical direction facing the rear surface of main frame 330, and a pair of bearing portions 334 which are movable in the upward and downward directions. Bearing portions 334 are fixed on X stage 336 by means of screws, not shown, allowing linear vertical movement of X stage 336.

Referring to FIG. 8, X stage 336 includes a body portion arranged on the opposing side of stage 312 with respect to main frame 330 and an arm portion extending over the surface of main frame 330 where stage 312 is provided, from both ends of the body portion. Bearing portions 334 are attached on the arm portions.

Vertically extending ball screw 342 is rotatable by support members 344 and 346 that project forward from main frame 330. At that portion of main frame 330 which is above ball screw 342, a driving motor 340 is fixed with supporting member 348 that projects forward from main frame. The rotation axis of driving motor 340 is coupled to ball screw 342 through a coupling 350. A nut portion 338 which engages the ball screw 342 is fixed on X stage 336, so that when ball screw 342 is rotated in one direction by driving motor 340, X stage 336 moves downward, and when balls crew 342 is rotated in opposite direction, X stage 336 moves upward. X stage 336 is bidirectionally movable between the position denoted by the solid line and a lower end position 352 denoted by one dotted line in FIG. 6.

On an end surface of X stage 336 which is facing the same direction as the surface to be coated of substrate 310, a plate member 354 is fixed. Rail portions 356 are attached to upper surfaces of the plate member 354 to extend in a direction vertical to the surface to be coated of substrate 310. A pair of bearing portions 358 are combined movable with the rail portion 356, both of the pair of bearing portions 358 are fixed on a common coating liquid tank base 362 secured to coating liquid tank 314. On the plate member 354, a ball screw 366 coupled to a driving motor 364 such as a pulse motor is rotatably attached. Engagement of a nut (not shown) fixed on tank base 362 with ball screw 366 allows both tank base 362 and coating liquid tank 314 to move close to or separate from the surface of the substrate 310 in the horizontal direction.

In operation, first, substrate 310 is fixed on stage 312 by vacuum suction, for example. By using linear driving mechanism 326, coating liquid tank 314 is placed near the upper end of substrate 310 such that gap G is formed between the front end surface of coating liquid tank 314 and the surface to be coated of substrate 310. A prescribed amount of coating liquid 322 is introduced through coating liquid inlet 318 to coating liquid tank 314. If coating liquid outlet portion 316 at the front wall portion of coating liquid tank 314 has flow resistance large enough to prevent outflow of coating liquid through capillaries, coating liquid 322 may be introduced to coating liquid tank 314 in advance. When means for reducing pressure in coating liquid tank 314 through air vent 320 is provided, it is possible to prevent outflow of coating liquid from coating liquid tank 314 through capillaries at coating liquid outlet portion 316. In that case also, coating liquid 322 may be introduced to coating liquid tank 314 in advance.

Coating liquid flows out through capillaries of coating liquid outlet portions 316, and coating liquid is brought into contact with the surface to be coated of substrate 310. As a result, a pool 324 of coating liquid extending approximately entirely over the widthwise direction of substrate 310 is formed in the gap G between the front end surface of coating liquid tank 314 and the surface to be coated of substrate 310. Menisci are formed at the upper and lower ends of the pool 324. Thereafter, coating liquid tank 314 is moved downward using linear driving mechanism 326, while maintaining the gap G between the front end surface of coating liquid tank 314 and the surface to be coated of substrate 310. This direction is shown by the arrow in FIG. 2. At the point when coating liquid tank 314 reaches the lower end position denoted by the two dotted line in FIG. 2, the coating liquid tank 314 is stopped. Thus, coating liquid tank 314 has moved from the vicinity of the upper end to the vicinity of the lower end of the substrate 310, so that almost the entire surface to be coated of substrate 310 comes into contact with coating liquid 322. As a result, coating liquid is applied to the surface to be coated of substrate 310.

After the coating liquid tank 314 is stopped near the lower end of substrate 310, coating liquid 322 is removed from coating liquid tank 314. Alternatively, inner pressure of coating liquid tank 314 may be reduced through air vent 320, so as to prevent outflow of the coating liquid from the coating liquid tank 314 through capillaries of coating liquid outlet portion 316. Thereafter, coating liquid tank 314 is moved horizontally to a direction away from stage 312. Vacuum suction of stage 312 is released, and substrate 310 is removed from stage 312. Thereafter, operation returns to the first step.

According to the first embodiment above, most of the coating liquid is used for forming valid coating film, and the amount of wasted coating liquid is very small. As substrate 310 is held in the vertical direction, area (floor space) occupied by the overall apparatus is far smaller as compared with the conventional apparatuses. Even when the area of the substrate is increased, the size of the apparatus is increased dependent only on the increase of the width of the substrate, and therefore increase in the necessary area can be minimized. Further, the quality or state of coating possible by the above described embodiment is improved over that obtained by using the apparatus of Bok's U.S. Pat. No. 5,270,079, and hence throughput of the apparatus can be improved.

In the first embodiment, substrate 310 is held vertically. However, the attitude of substrate 310 is not limited to vertical attitude, and substrate 310 may be held so that the surface to be coated is inclined downward or upward. Optimum value of the angle or the like may be determined taking into consideration the material values of the coating liquid used, type of substrate surface to be coated, condition of the that surface, and so on. The angle of the substrate can be arbitrarily set not only in the present embodiment but also in other embodiments, except when a specific angle is identified.

In the first embodiment described above, the substrate is static and coating liquid tank 314 moves downward. However, the present invention is not limited to this, and what is needed is to have relative movement between the substrate and the coating liquid tank in the vertical direction of the substrate. For example, the coating liquid tank may be kept still, while the substrate held on the stage is moved upward. Alternatively, both the coating liquid tank and the stage may be moved.

Further, in the above described embodiment, when the surface of the substrate 310 is separated from coating liquid tank 314, substrate 310 is fixed and coating liquid tank 314 is moved horizontally. However, the present invention is not limited to this, and stage 312 may be moved in a direction away from coating liquid tank 314 while the coating liquid tank 314 is fixed.

The linear driving mechanism shown in FIGS. 6 to 8 are not specifically shown in the second and following embodiments. However, it should be noted that similar linear driving mechanisms are used in these embodiments as well.

Figure 9:
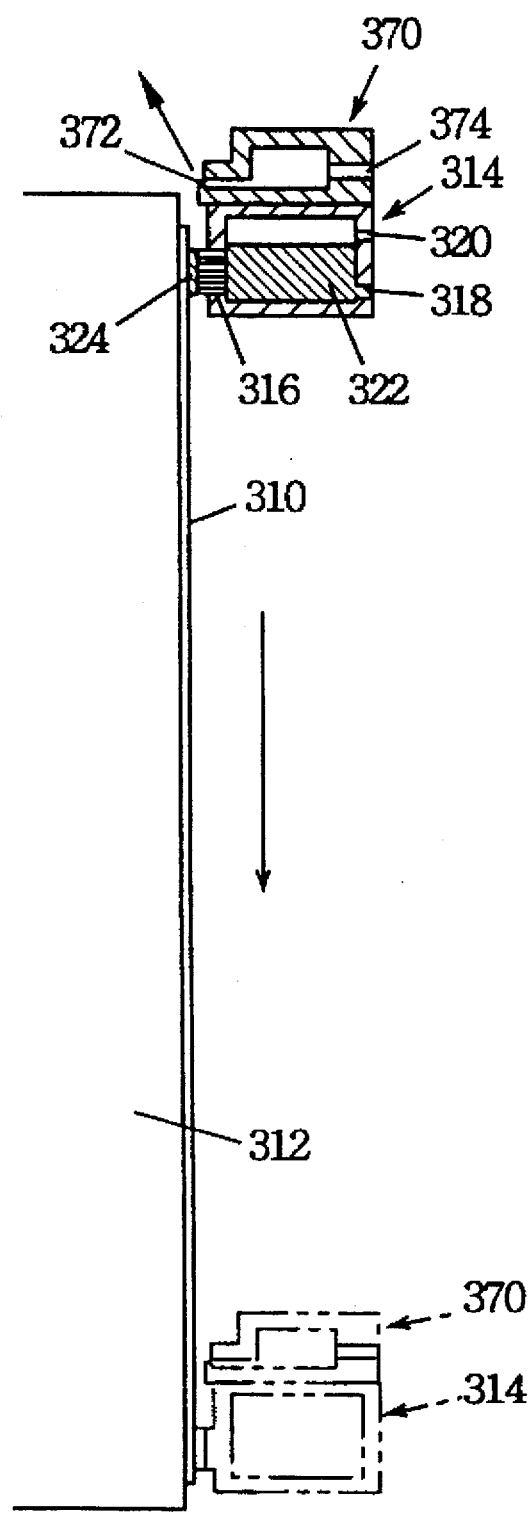
FIG. 9 is a vertical section of the main portion of coating apparatus constructed in accordance with a second embodiment of the present invention.
Figure 10:
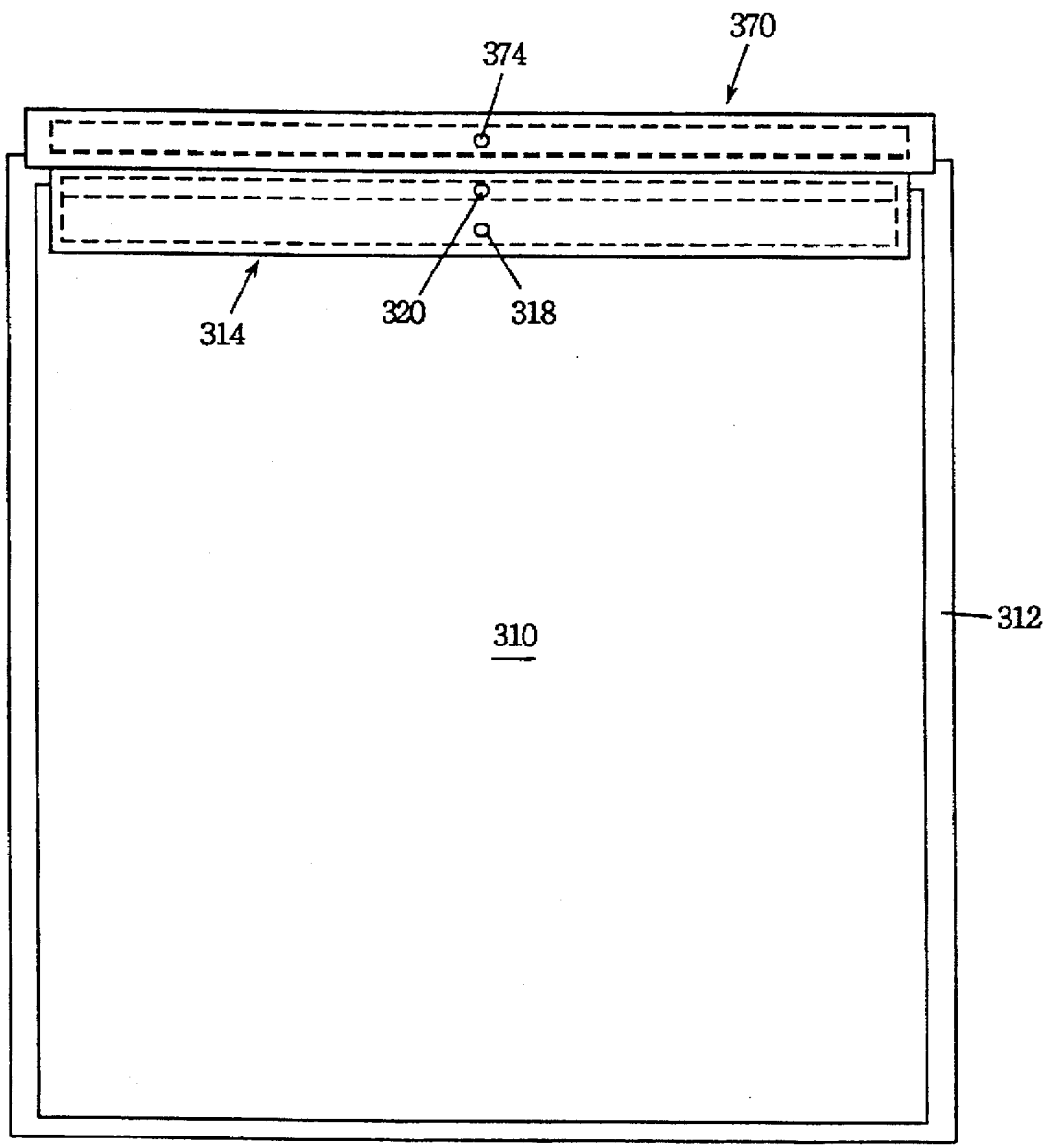
FIG. 10 is a front elevation of a main portion of the coating apparatus in accordance with the second embodiment.
Figure 11:
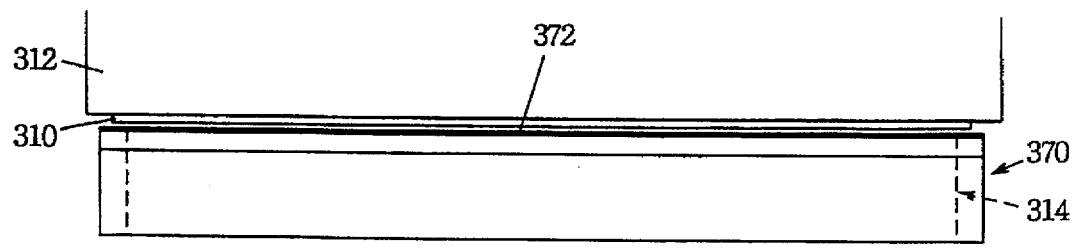
FIG. 11 is a plan view of the main portion of the coating apparatus in accordance with the second embodiment.

The coating apparatus of a second embodiment of the present invention shown in FIGS. 9 to 11 includes, in addition to the components of the first embodiment described above, a gas blower 370 provided at an upper portion of coating liquid tank 314 for blowing gas diagonally upward from an upper portion of front end surface of coating liquid tank 314.

Gas blower portion 370 has a hollow body extending entirely over the widthwise direction of substrate 310. A slit shaped nozzle 372 communicating with the inner space of gas blower portion 370 is formed over approximately the entire width of front end portion of gas blower portion 370. The front facing at the tip end of slit shaped nozzle 372 is formed such that gas is blown diagonally upward, as already mentioned. At the rear wall portion of gas blower portion 370, a gas supplying hole 374 is formed for supplying gas through the inner space of gas blower portion 370.

In FIGS. 9 to 11, the same elements those shown in FIGS. 1 to 8 are denoted by the same reference characters, and they have similar functions. Therefore, detailed description thereof is not repeated.

In the coating apparatus of the second embodiment, coating liquid is applied approximately to the entire surface to be coated of substrate 310, as in the first embodiment. In the process of coating, gas blower portion 370 blows gas, such as nitrogen, diagonally upward from slit shaped nozzle 372, while moving integrally with the coating liquid tank 314. Therefore, gas is blown toward the film of coating liquid immediately after it is applied to the substrate 310. This promotes evaporation of solvent from the coating film, and viscosity of the coating liquid forming the coating film is increased. Therefore, downward dropping of coating liquid from and sagging of the coating liquid on the coating film across the surface can be suppressed.

It is desirable that blowing of gas by gas blower portion 370 be continued until completion of a coating operation. When coating liquid tank 314 and gas blower portion 370 are stopped after they have moved near to the lower end of substrate 310 denoted by the two dotted lines in FIG. 9, blowing of gas by gas blower portion 370 is stopped.

Alternatively, after the completion of a coating operation, the coating liquid tank 314 and gas blower portion 370 may be further moved downward. In that case, gas is blown to the lowermost portion of the film coated on substrate 310, and thereafter blowing of gas by gas blower portion 370 is stopped. This prevents drop and sag of the coating liquid.

In the second embodiment, coating liquid tank 314 and gas blower portion 370 are secured together as an integral structure. However, the coating liquid tank may be separated from the gas blower portion. In that case, coating liquid tank and gas blower portion may be driven by separate linear driving mechanisms.

A stationary apparatus for blowing gas may be provided. In that case, gas may be blown from the apparatus for blowing gas from the vicinity of the upper end or from the side of substrate 310 toward the coating film applied onto the substrate 310.

In the apparatus of the second embodiment, gas blower portion 370 is attached on the upper portion of coating liquid tank 314. However, the present invention is not limited to this, and the gas blower portion may be provided at a lower portion of coating liquid tank 314. The substrate may be coated while the coating liquid tank 314 and gas blower portion 370 move upward with respect to the substrate 310. In this case also, gas is blown from the gas blower portion to impinge upon the coating film immediately after its application on substrate 310. Therefore, an effort similar to that obtained with the first embodiment can be expected.

In the second embodiment, a slit shaped nozzle 372 is provided at a front end portion of gas blower portion 370. However, the shape of the nozzle is not limited to a slit. For example, a large number of small holes may be formed juxtaposed to each other over the entire length at a front end section of the gas blower portion. Alternatively, two or more slit shaped nozzles may be used.

Further, an obstruction plate may be formed inside the gas blower portion 370 so as to allow uniform blowing of gas toward the widthwise direction of substrate 310 from the slit shaped nozzle 372. Alternatively, a plurality of gas supply holes may be arranged spaced by equal distance, on the rear wall portion of gas blower portion 370.

In the first and second embodiments described above, gas may be supplied to coating liquid tank 314 through air vent 320, so as to apply pressure upon the upper surface of coating liquid 322 contained in tank 314. Nitrogen gas is preferred.

In some situations, adjustment of temperature of the coating liquid may be necessary in order to stabilize quality of coating, such as uniform thickness of the coating film. In such a case, a cooling or heating member may be incorporated in the coating liquid tank. As the cooling or heating member, a Peltier element may be used. At this time, the temperature to be measured for adjusting temperature of the coating liquid may be ambient temperature at the time of applying coating liquid, temperature of the substrate to be coated, or the temperature of the stage holding the substrate. Especially when the above described embodiments are applied to a solder coating apparatus, the temperature of the coating liquid must be set taking into consideration the melting point of the solder liquid used.

In the above described embodiments, the coating liquid outlet portion 316 is formed by providing a plurality of linear capillaries at the front end surface of the coating liquid tank 314. However, the present invention is not limited to such a structure, and the coating liquid outlet holes may be comprised of porous holes (a large number of small holes). Alternatively, the coating liquid outlet portion may be formed by one or a plurality of slit shaped nozzles.

Third Embodiment

FIGS. 12 to 16 show the coating apparatus in accordance with a third embodiment of the present invention.

Referring to FIGS. 12 to 16, the coating apparatus includes a stage 312 for holding a substrate 310 in a vertical attitude, and a coating liquid tank 380 having a hollow body extending in the widthwise direction of the substrate 310 and having opposing ends closed.

Figure 15:
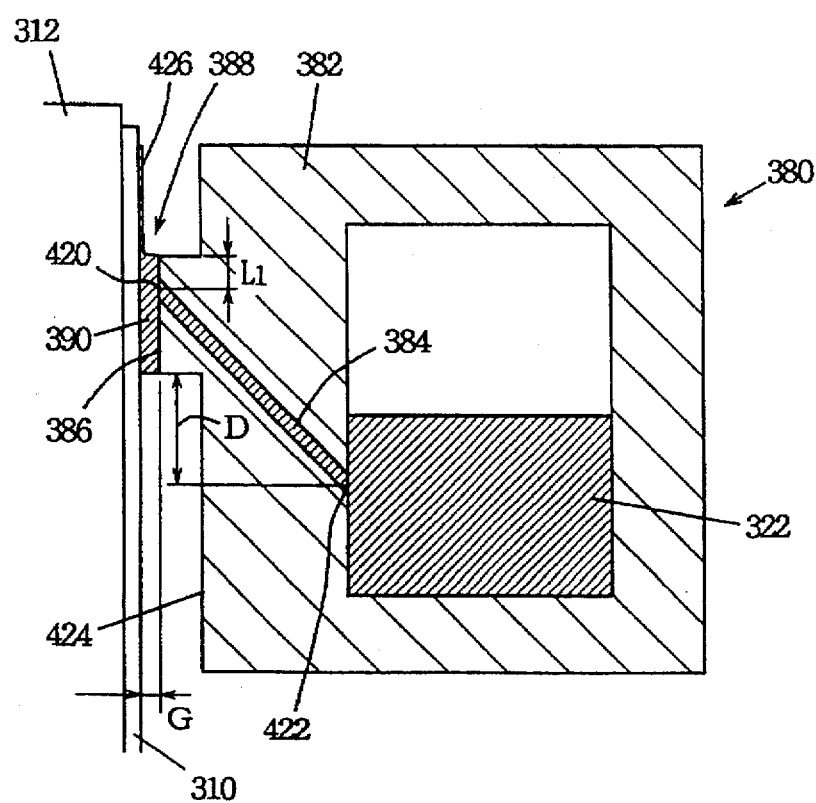
FIG. 15 is a vertical section of the coating liquid tank of the coating apparatus in accordance with the third embodiment.

Mainly referring to FIG. 15, coating liquid tank 380 has a front wall portions 382 with a coating liquid outlet path 384 that is formed over approximately the entire width of coating liquid tank 380, which path extends through the wall portion and is upwardly inclined from the inside to the outside surfaces of front wall portion 382. Depending upon use, it is not always necessary to form the coating liquid outlet path 384 over the entire width of coating liquid tank 380.

In the drawing Figures, coating liquid outlet path 384 is shown as one hole having a linear cross section. However, path 384 may be formed of a number of linear capillaries, a number of minute holes, or one or a plurality of slit shaped thin nozzles. When the coating liquid outlet path 384 is to be formed by using a number of minute holes, the number of minute holes at the inlet and the number of holes at the outlet may not be the same, provided that the inlet and outlet are communicated. The shape intermediate the small holes is not limited to a line.

Referring to FIG. 15, a portion in the vertical direction of front wall portion 382 of coating liquid tank 380 protrudes forward over the entire width of the coating liquid tank 380, thus providing a front end surface 386. Coating liquid tank 380 is held by linear driving means (not shown), such that there is formed a gap 388 having the size G between the front end surface 386 and the surface to be coated of substrate 310, and that the front end surface 386 is not in contact but close to the surface to be coated of substrate 310. As in the first and second embodiments, coating liquid tank 380 is positioned to be horizontal in the widthwise direction. The coating liquid tank 380 is movable vertically, both upward and downward, by the linear driving mechanism similar to that shown in the first embodiment.

In the present embodiment, the width of the coating liquid tank 380 is approximately the same as the width of the substrate 310. However, the present invention is not limited to this, and the width of the coating liquid tank 380 may be smaller or larger than the width of the substrate 310, dependent on use.

As already described, the coating liquid tank 380 is movable such that the front end surface 386 is moved away from the surface to be coated of substrate 310, and for that movement, a mechanism similar to the linear driving mechanism of the first embodiment is used. In this example, a detector for measuring the size G of gap 388 may be advantageous.

Referring to FIG. 15, front end surface 386 has such a shape that its lower edge is positioned between a front end side outlet 420 of coating liquid outlet path 384 and an inlet 422 opened at the coating liquid tank. Further, front end surface 386 is formed such that its upper edge is positioned between the highest position when the coating liquid in the pool 390 rises in the provisional gap by capillary action and the front end side outlet 420 of the coating liquid outlet path 384, assuming that the gap 388 of FIG. 15 is extended upward. When a mechanism for setting pressure in the coating liquid tank 380 is provided, as will be described later, the position of the upper edge of front end surface 386 may be determined by adding the additional rise in height caused by additional pressure, to the highest position reached by capillary action mentioned above.

Figure 13:
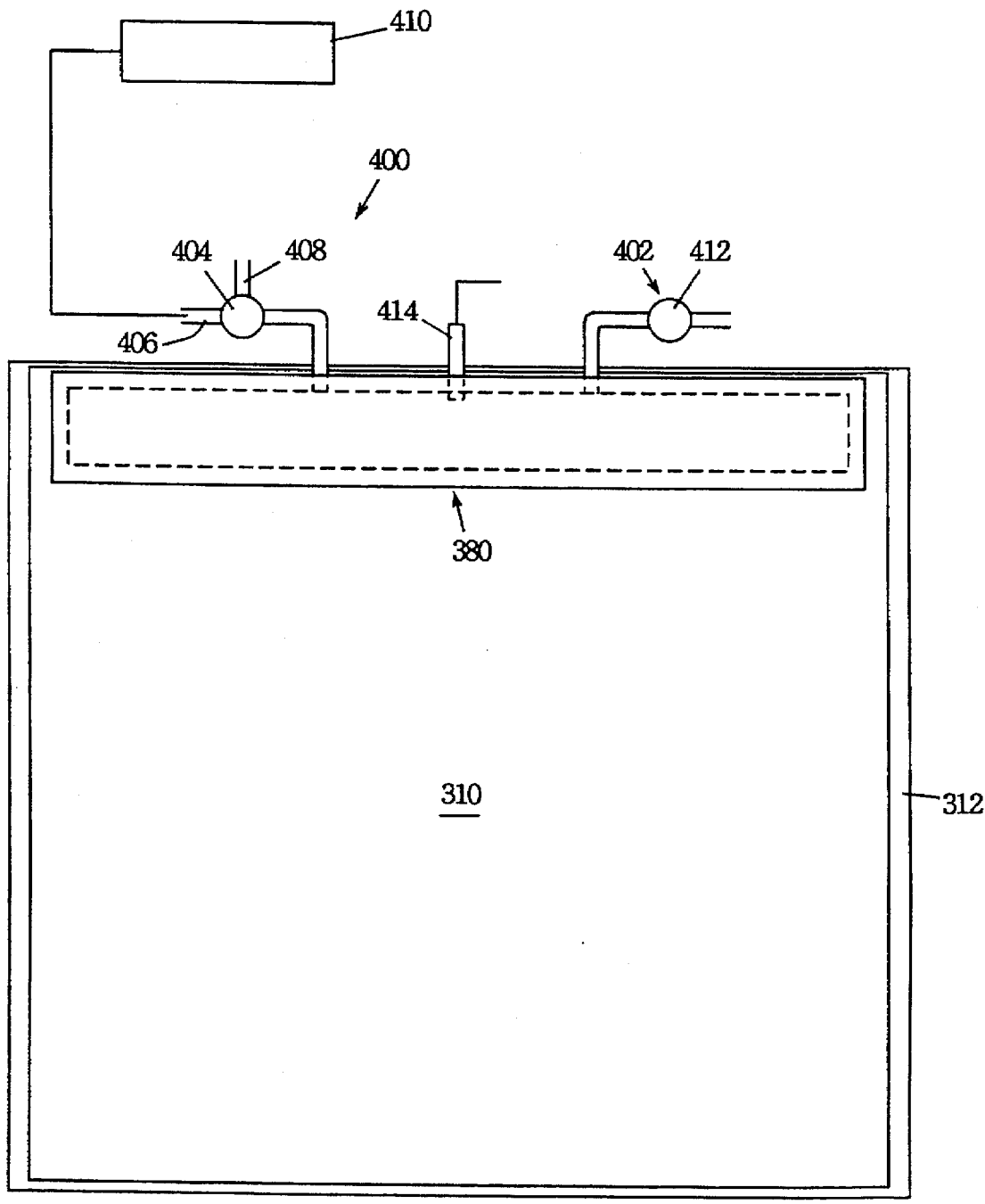
FIG. 13 is a front elevation of the main portion of the coating apparatus in accordance with the third embodiment.
Figure 14:
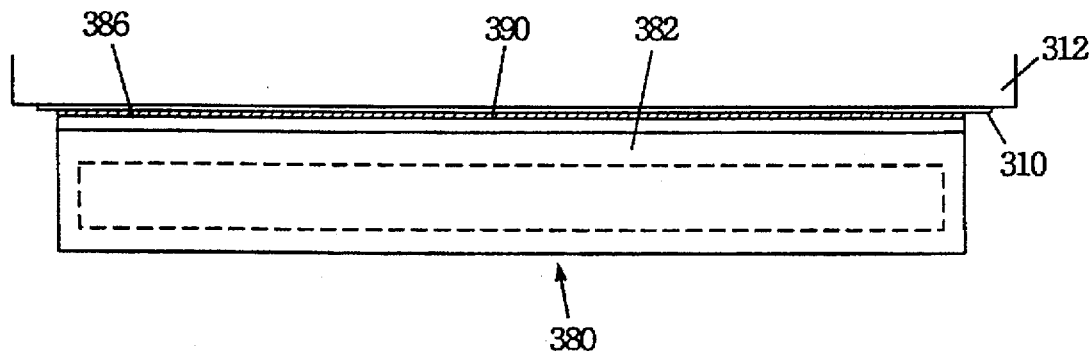
FIG. 14 is a plan view of the main portion of the coating apparatus in accordance with the third embodiment.

Specifically referring to FIG. 13, coating liquid tank 380 includes: a pressure setting system 400 for increasing, decreasing or setting, the pressure inside the coating liquid tank 380 or the coating liquid tank to ambient pressure; a coating liquid supplying system 402 for supplying the coating liquid to the coating liquid tank 380; and a detector 414 for detecting surface level of the coating liquid 322 introduced to the tank are provided.

Referring to FIG. 13, pressure setting system 400 includes a pressure setting mechanism 410, a line 406 communicating and connecting pressure setting mechanism 410 and the inside of coating liquid tank 380, a switching valve 404 provided in line 406, and a line 408 for communicating the inside of coating liquid tank 380 to the air through the switch valve 404. Coating liquid supplying system 402 includes a line for supplying the coating liquid to coating liquid tank 380, and a switching valve 412 provided in the line. Coating liquid 322 is supplied to tank 380 from coating liquid supplying system 402. At this time, the amount or supply of the coating liquid 322 is adjusted while the surface level of the liquid 322 is detected by detector 414, such that the surface of the coating liquid 322 is positioned between the inlet 422 of coating liquid outlet path 384 and the lower end of front end surface 386, that is, within the range D shown in FIG. 15.

When the coating liquid 322 is supplied, pressure in the coating liquid tank 380 increases. Therefore, the coating liquid 322 which has been supplied to coating liquid tank 380 may possibly flow out of the coating liquid tank 380 through the coating liquid outlet path 384. In order to prevent outflow of the coating liquid 322, the switching valve 404 of pressure setting system 400 is operated so that the coating liquid tank 380 is opened to the air, for example, through vent line 408.

When a prescribed amount of coating liquid 322 is introduced to the coating liquid tank 380, the coating liquid rises to the height of the front end side outlet 420 of coating liquid outlet path 384 because of capillary action. Here, it is necessary to prevent forced outward flow of the coating liquid 322 from the outlet 420 of coating liquid outlet path 384 even when the prescribed amount of coating liquid 322 is introduced to the coating liquid tank 380. For this purpose, the pressure in the coating liquid tank 380 is set by using the pressure setting system 400 so that it is continuously opened to the air.

Figure 16:
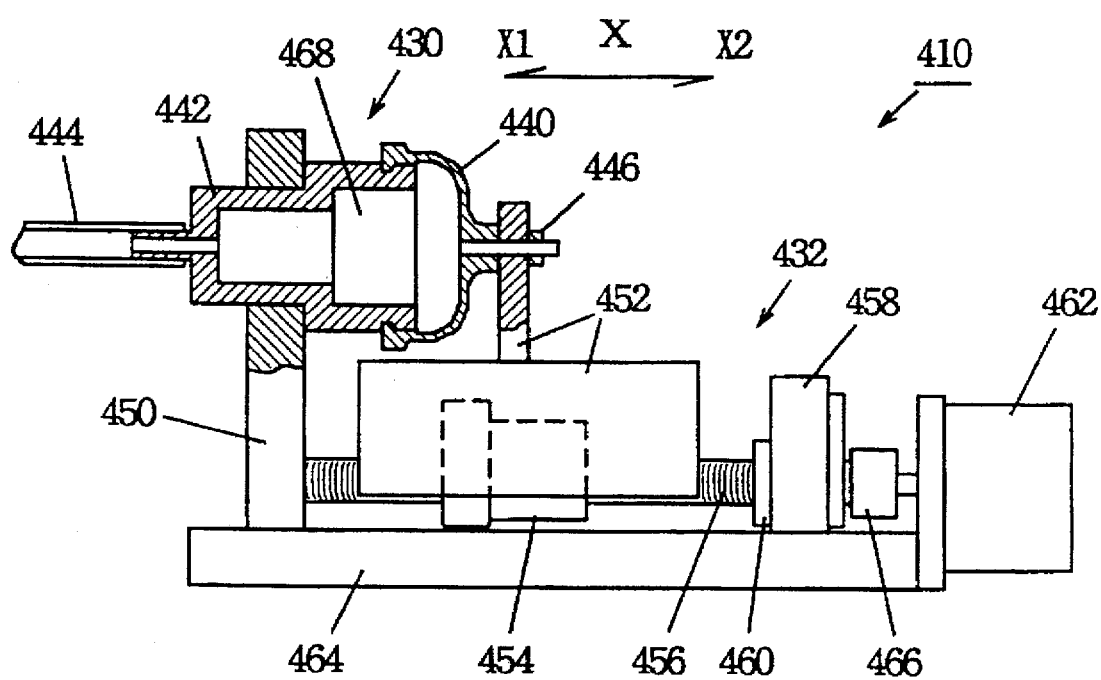
FIG. 16 is a partially sectioned side view of a pressure adjusting system in the coating apparatus in accordance with the third embodiment.

Referring to FIG. 16, the pressure setting mechanism 410 includes a diaphragm system 430 including a diaphragm 440, and a linear driving mechanism 432 for displacing the diaphragm 440 in the X direction of FIG. 16. Diaphragm system 430 includes a holding member 442. Pressure setting member 442 has a columnar appearance with steps of different diameters. Pressure setting member 442 is cylindrical and has a hole therein, opposing ends of which are open. The diameter of the hole is small at one end surface, while it is large on the other end surface. The diaphragm 440 formed of rubber, for example, is attached to pressure setting member 442 so as to close that end portion at which the larger one of the two holes of pressure setting member 442 is formed. At the other end portion of pressure setting member 442, conduit tube 444 is attached at the opening and extends therefrom to line 406 shown in FIG. 13.

Linear driving mechanism 432 includes a frame 464 and a holding member 450 standing on frame 464 and extending upward therefrom. Diaphragm system 430 is fixed on holding member 450 by means of screws and so on, which are not shown.

Linear driving mechanism 432 further includes a holding member 458 standing on frame 464, a screw 456 mounted for rotation around its axis on holding members 450 and 458 with a bearing 460 interposed, a nut 454 rotatably engaging the screw 456, an X stage 452 on which nut 454 is fixed, and a pulse motor 462 fixed on frame 464 coupled to screw 456 by coupling 466 interposed. One end of diaphragm system 430 is fixed on X stage 452 by means of screw 446. The X stage is held by a linear guide, not shown, and is movable in the X direction shown in FIG. 16 together with the nut 454. Linear driving mechanism 432 further includes a detection sensor, which is not shown, for detecting the position of origin of the X stage 452, for example.

In pressure setting mechanism 410 shown in FIG. 16, when X stage 452 is moved in the direction X1 of FIG. 16, diaphragm 440 deforms to the left and the volume of the space 468 in pressure setting member 442 is reduced. Therefore, pressure in coating liquid tank 380 which is communicated to space 468 and conduit tube 444 is increased. When diaphragm 440 is moved to the right or in the direction of X2 of FIG. 16, the pressure in the coating liquid tank 380 can be reduced.

The structure of the pressure setting mechanism 410 described above is only an example, and pressure setting mechanism 410 may be formed by using metal bellows, for example. A pressure setting mechanism (not shown) for causing changes in pressure without using a diaphragm may be used to replace mechanism 410.

Prior to the use of pressure setting mechanism 410, there should be evaluations of the relationships between the amount of movement of X stage in the directions X1 and X2 from the origin mentioned above, the amount of deformation of diaphragm 440, the amount of change in volume of space 468 and the amount of change in the pressure caused thereby, and relations between the speed of movement for X stage 452, the speed of deformation of for diaphragm 440, the amount of change in volume of space 468, the amount of change in pressure and so on.

Mainly referring to FIG. 15, assume that the coating liquid 322 rises to reach outlet 420. Since there is a gap 388 of size G formed between the surface to be coated of substrate 310 and the front end surface 386, coating liquid 322 flows into gap 388. Coating liquid 322 spreads entirely over gap 388 at least because of capillary action, and at the same time, coating liquid 322 is supplied to the portion of outlet 420 through coating liquid outlet path 384 from coating liquid tank 380. Flow of coating liquid 322 is regulated at the upper and lower edges of front end surface 386, a strip shaped pool 390 of the coating liquid is formed approximately over the entire width in the widthwise direction of substrate 310. The pool 390 is constantly in communication with coating liquid 322 in coating liquid tank 380 through coating liquid outlet path 384. There are menisci formed at the upper and lower ends of pool 390.

In the present invention, pool 390 of coating liquid is formed as described above. However, the method of initially forming the pool 390 is not limited to the method above. In another method, the pressure in the coating liquid tank 380 is increased by using pressure setting system 400, so as to force formation of a part of the pool 390. Thereafter, the pressure in coating liquid tank 380 is kept at a value sufficient to prevent forced outflow of the coating liquid through coating liquid outlet path 384 to the outside of the tank, for example, at approximately ambient pressure, and pool 390 is formed at this state. In another method, the inside of coating liquid tank 380 is pressurized from the start until the formation of pool 390. This forces formation of pool 390. In a still further method, the inside of the coating liquid tank 380 is maintained at ambient pressure from the start to the formation of the strip shaped pool 390. Thus, pool 390 of the coating liquid is not formed forcefully.

Any of the above described methods may be used, provided that after the formation of pool 390, the pressure in coating liquid tank 380 is kept such that outflow of coating liquid from the lower edge of front end surface 386 or the like can be prevented and that coating liquid 322 is supplied from coating liquid tank 380 to the gap 388 during the subsequent process of coating. For example, the pressure within coating liquid tank 380 is kept at about ambient pressure.

The size G of the gap 388 between front end surface 386 and the surface to be coated of substrate 310 has large influence on the quality of the resulting coating film. The gap G is selected within the range allowing capillary action, taking into consideration the factors influencing the quality of coating, efficiency in using coating liquid, and whether stability of the pool 390 can be maintained in the gap 388. The factors affecting the quality of coating include speed of movement of coating liquid tank 380, fluidity and material values of coating liquid 322, wettability of the surface to be coated of substrate 310 and/or front end surface 386.

The size of coating liquid outlet path 384 is set to be within the range which allows flowing of coating liquid 322 in coating liquid tank 380 to the gap 388 by capillary action and to allow formation of strip shaped pool 390 in the gap 388 by capillary action. Further, the size of coating liquid outlet path 384 must be set within a range that allows formation of satisfactory coating film, including formation of the film at the start.

Of the surface of front wall portion 382 of coating liquid tank 380, front wall surface 424 other than the front end surface 386 must be formed to have a shape that prevents flowing of coating liquid from pool 390 into the gap formed between the front wall surface and the surface to be coated of substrate 310 at least because of capillary action. If the shape of the front wall surface 424 is so selected, the coating liquid in pool 390 will not flow out of gap 388. More specifically, lower end of the pool 390 in gap 388 is regulated by the lower edge of front end surface 386, while the upper end is regulated by the upper edge of front end surface 386.

In the description of the third embodiment, it is assumed that the surface to be coated of substrate 310 is a uniform plane without any waviness. It is further assumed that the gap 388 between this surface and the front end surface 386 is formed to have the same expansion in the upward and downward directions of the front end surface 386. However, application of the present invention is not limited to that case. The present invention can also be applied if the width of gap 388 differs from one portion to another.

In operation, substrate 310 is fixed on stage 312 by vacuum suction, for example. A prescribed amount of coating liquid 322 is introduced to coating liquid tank 380. The coating liquid tank 380 is moved horizontally from a position away from substrate 310 toward the substrate 310, so that the tank is brought close to the substrate 310. Coating liquid tank 380 is stopped at a position where a gap 388 having the size of G is formed between the front end surface 386 of coating liquid tank 380 and the surface to be coated of substrate 310. The elevation of coating liquid tank 380 is selected to be near the upper end of the substrate 310 surface area which requires coating.

As already described, a prescribed amount of coating liquid 322 has been introduced to coating liquid tank 380. When the pressure in coating liquid tank 380 is set to an appropriate level, for example ambient pressure, by using pressure setting system 400, there is not a possibility of outflow of coating liquid 322 will not flow from coating liquid tank 380 through coating liquid outlet path 384. After the coating liquid tank 380 is stopped at a position where gap 388 of the size G is formed between the front end surface 386 and the surface to be coated of substrate 310, the prescribed amount of coating liquid 322 may be introduced to coating liquid tank 380.

Thereafter, pressure in the coating liquid tank 380 is increased by using pressure setting system 400. The coating liquid flows out of coating liquid tank 380 through coating liquid outlet path 384 into the gap 388. Part of the pool 390 is formed in gap 388. Thereafter, in order to prevent forced flow of the coating liquid outside the coating liquid tank 380, the pressure in coating liquid tank 380 ambient state open to the air. Thus, a strip shaped pool 390 is formed in gap 388.

Alternatively, after coating liquid tank 380 is positioned so as to allow formation of gap 388, the pressure in coating liquid tank 380 may be increased until a strip shaped pool 390 is formed. Further, after coating liquid tank 380 is positioned to allow formation of gap 388, the coating liquid tank 380 may be opened to the air so that strip shaped pool 390 is formed.

Anyway, after of strip shaped pool 390 of the coating liquid is formed, it is necessary to adjust the pressure in coating liquid tank 380 such that the coating liquid in pool 390 does not flow from the gap 388, and that enough of the coating liquid 322 is supplied to the gap 388 from coating liquid tank 380 during the process of coating, which will be described later. For example, coating liquid tank 380 may be at ambient pressure.

Figure 12:
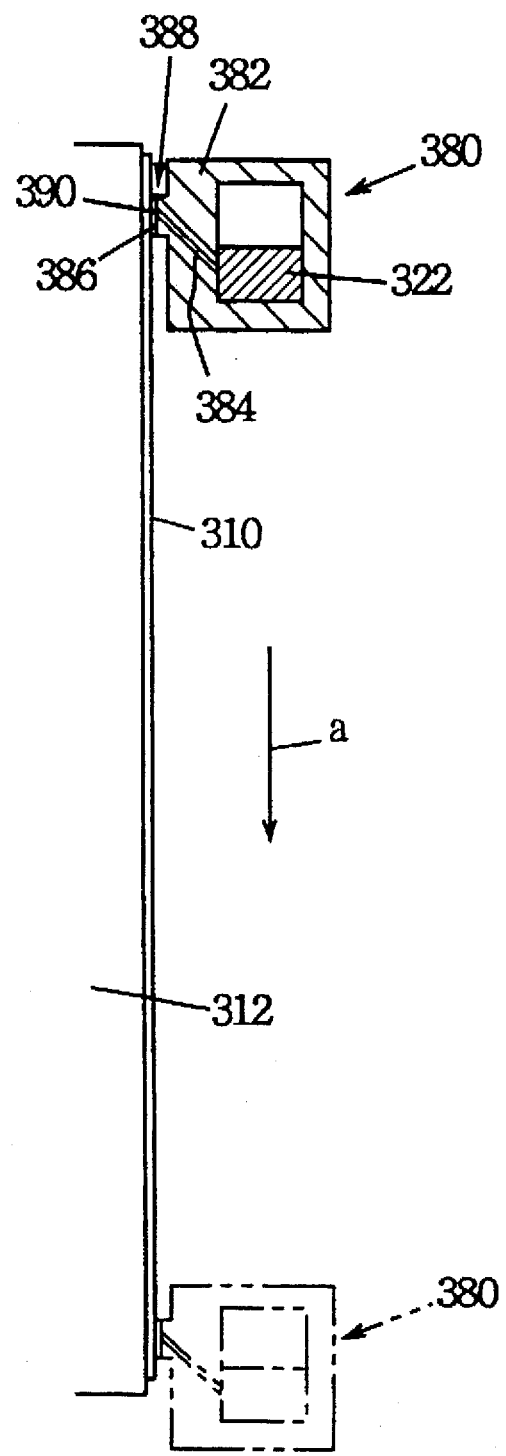
FIG. 12 is a vertical section of a main portion of coating apparatus constructed in accordance with a third embodiment of the present invention.

After the strip shaped pool 390 is formed in gap 388, coating liquid tank 380 is moved in the direction of the arrow (a) shown in FIG. 12. At this time, the distance between front end surface 386 and the surface to be coated of substrate 310 is kept at G. This is realized by using a mechanism similar to the linear driving mechanism described in the first embodiment.

The position of coating liquid tank 380 where the upper end of the front end surface 386 goes out of the area requiring coating is denoted by the two dotted line in FIG. 12. After coating liquid tank 380 has moved downward to this position, movement of coating liquid tank 380 is stopped. As coating liquid tank 380 is moved from the vicinity of the upper end to the vicinity of the lower end of substrate 310, coating liquid in the pool 390 is brought into contact with the area of the surface of substrate 310 that requires coating. As a result, coating film 426 is formed on the surface to be coated of substrate 310.

During the process of coating, coating liquid in the pool 390 in gap 388 is consumed. However, the coating liquid in the amount corresponding to the consumed amount is supplied to the gap 388, at least by capillary action, from coating liquid tank 388 through coating liquid outlet path 384. Therefore, the amount of the coating liquid included in pool 390 in gap 388 is kept constant.

When coating of substrate 310 is completed, substrate 310 is removed from stage 312. At this time, when coating liquid tank 380 is moved horizontally in a direction away from stage 312, substrate 310 can be easily removed from stage 312. When substrate 310 is removed, the process returns to the first step for coating the next substrate.

When coating liquid tank 380 is moved away from the stage 312, the gap 388 is enlarged, and thus pool 390 of the coating liquid is lost. Therefore, the coating liquid which has been in the pool 390 may adhere to the surface to be coated or to the front end surface 386, or it may be dropped. As a result, the coating liquid cannot be used for coating the next substrate.

In order to avoid this phenomenon, the pressure of coating liquid tank 380 may be reduced, by using pressure setting system 400, before moving coating liquid tank 380 away from stage 312. By doing so, the coating liquid in the pool 390 can be recovered in coating liquid tank 380 through coating liquid outlet path 384. At this time, the area of front end surface 386, from the outlet 420 of coating liquid outlet path 384 to the upper edge of front end surface 386, must not be below the lower end of substrate 310. Further, gap 388 must be maintained between front end surface 386 and the surface to be coated of substrate 310. Such processing at the end of coating is effective in most of the embodiments which will be described later, and such processing can be accomplished readily by those skilled in the art in view of the description above. Therefore, while details of this processing will not be described in connection with the embodiments that are about to be described, it is noted that such processing may be carried out.

Now, in the coating apparatus of the third embodiment, upper edge of the pool 390 in gap 388 is regulated by the upper end of front end surface 386. Therefore, the following problem may possibly arise while coating liquid tank 380 is moved downward for applying coating liquid to the surface of substrate 310.

More specifically, depending upon the relation between the size from the lower end to the upper end of front end surface 386 and the period of waves on the surface to be coated, upon the shape of waves on the surface to be coated of substrate 310 along the widthwise direction, and upon the precision in movement of coating liquid tank 380, the size G of the gap 388 between front end surface 386 and the surface to be coated may vary.

Figure 17:
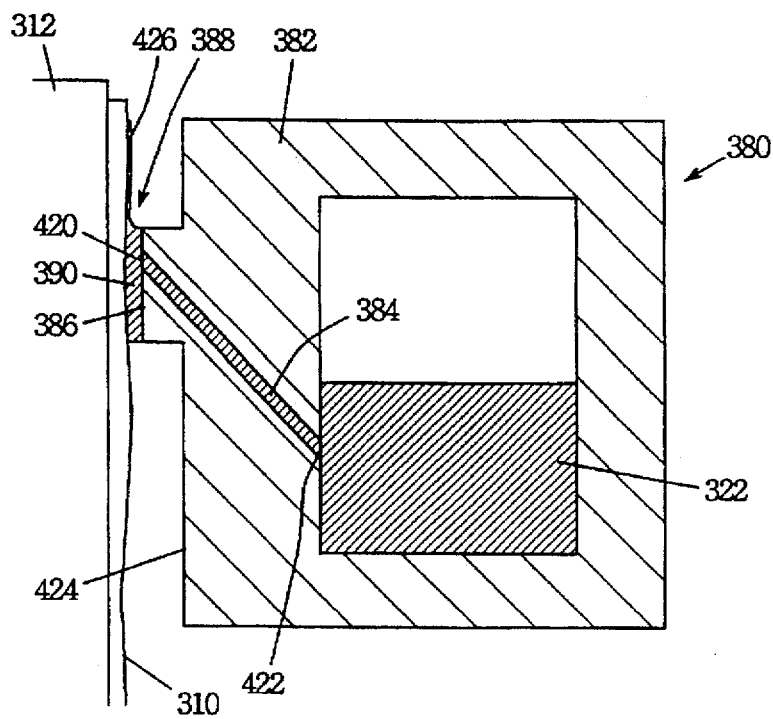
FIGS. 17 to 19 illustrate problems which may occur in the coating liquid tank of the coating apparatus in accordance with the third embodiment.
Figure 18:
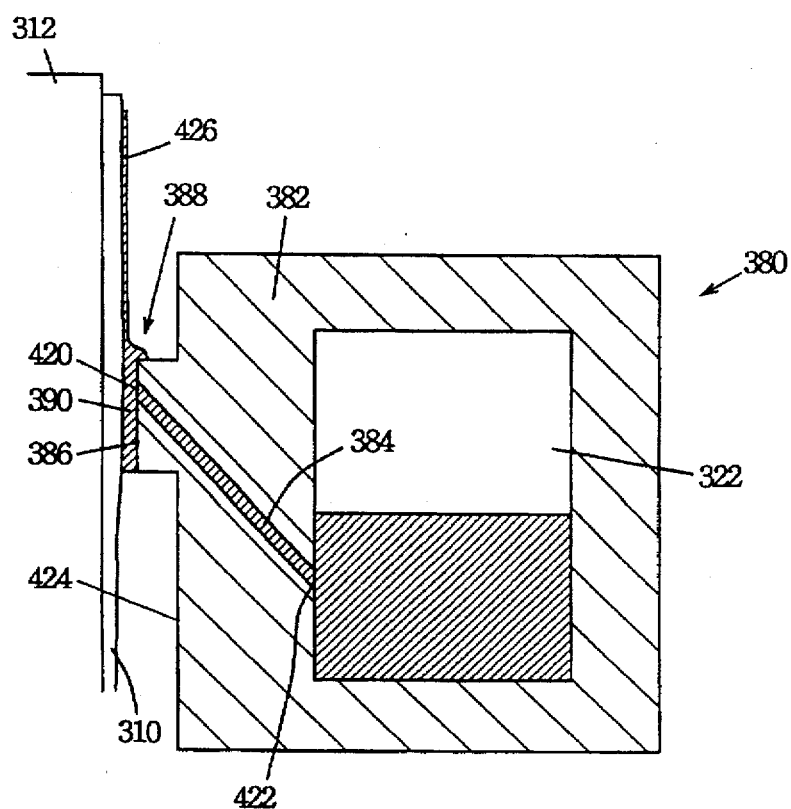

For example, referring to FIG. 17, if the size of gap 388 becomes wider, the volume of the space sandwiched between front end surface 386 and the surface to be coated is increased. This may not cause any problem. However, when the size of gap 388 becomes smaller as shown in FIG. 18, the volume of the space sandwiched between front end surface 386 and the surface to be coated is reduced. In that case, part of the coating liquid may, undesirably, go out over the upper edge of front end surface 386 from the pool 390 in gap 388. This results in degraded quality of coating, for example, a difference in thickness of the coating film.

Figure 19:
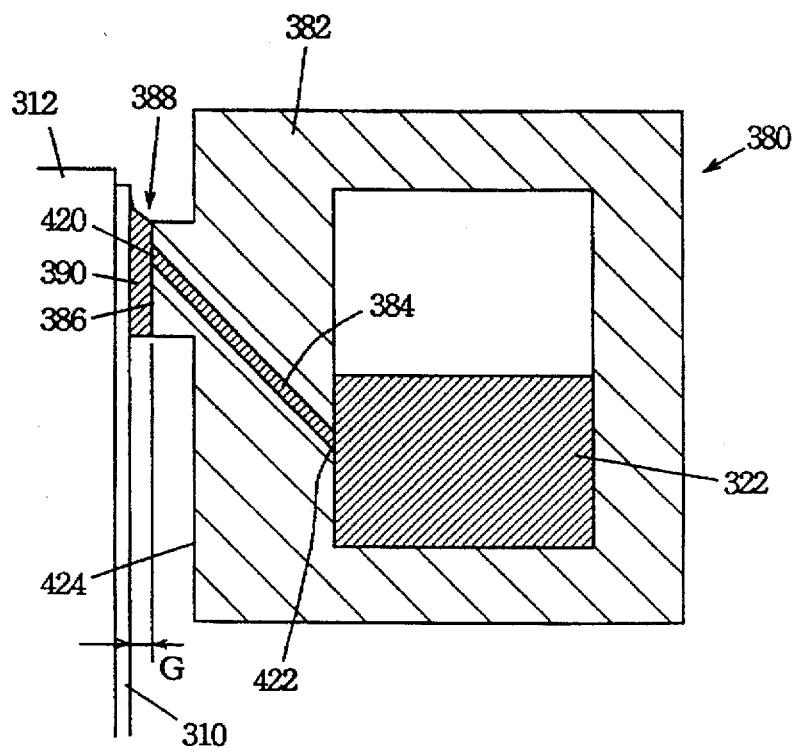

Referring to FIG. 19, this problem also arises at the start position of coating. As shown in FIG. 19, after pool 390 is formed between front end surface 386 and the surface to be coated, coating liquid tank 380 is moved downward, starting a coating operation. At this time, it is possible that the coating liquid in pool 390 may, undesirably, go out to a level above the upper edge of front end surface 386. This also results in degradation of coating quality, such as uneven thickness of the coating film.

Fourth Embodiment

Figure 20:
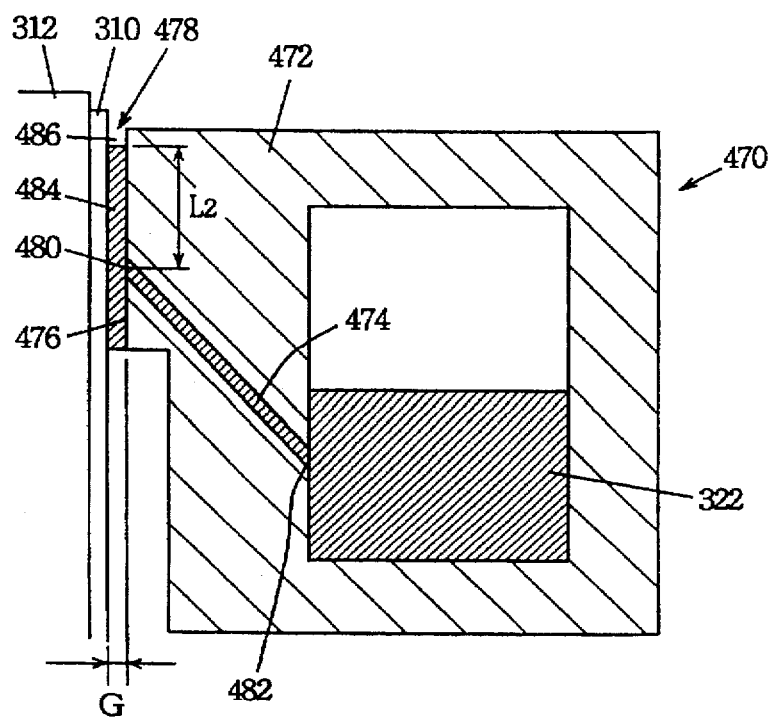
FIG. 20 is a vertical section of a coating liquid tank constructed in accordance with a fourth embodiment of the present invention.

FIG. 20 shows a coating liquid tank 470 which can avoid the above-described problem. The coating liquid tank 470 which may be used in place of coating liquid tank 380 of the third embodiment differs from the latter in the shape of front end surface 476 formed at the front wall portion 472. The upper edge position of front end surface 476 of coating liquid tank 470 has such a shape that, when it is assumed that gap 478 having the size G between front end surface 476 and the surface to be coated of substrate 310 is indefinitely extended upward, the upper edge position of the front end surface 476 is positioned higher than the maximum height reached by the coating liquid 322 in the gap 478 rising in gap 478 at least because of capillary action. Front wall portion 472 is formed such that lower edge of front wall portion 476 is positioned at a level between the front end side outlet 480 of coating liquid outlet path 474 and inlet 482 of coating liquid tank 470, as in the third embodiment.

Coating liquid 322 is introduced to coating liquid tank 470, such that surface level thereof becomes higher than the inlet 482 of coating liquid outlet path 474 and lower edge of front end surface 476. The coating liquid flows to gap 478 from coating liquid tank 470 through coating liquid outlet path 474, and a strip shaped pool 484 is formed in gap 478. The lower end of pool 484 is regulated by the lower edge of front end surface 476. However, the upper end thereof is positioned below the upper edge of the front end surface 476. Therefore, above the pool 484, there is formed a space 486 where gap 478 does not contain any coating liquid, as shown in FIG. 20.

The operation for applying the coating liquid on the surface to be coated of substrate 310 by using coating liquid tank 470 shown in FIG. 20 is the same as that of the third embodiment, except the processing near the lower end. When the coating liquid tank 470 is to be stopped near the lower end of substrate 310, it is necessary that the upper end of pool 484 in gap 478 is below and out of the area requiring coating of the surface of the substrate.

When coating liquid tank 470 shown in FIG. 20 is used, the upper end of pool 484 is positioned below the upper edge of front end surface 476. As a result, there is formed a space 486 containing no coating liquid, above the pool 484 in gap 478. Therefore, the problem caused in the apparatus of FIGS. 18 and 19 can be advantageously avoided by this coating apparatus.

Assume that the size G of gap 478 is not constant and the volume of the space sandwiched between front end surface 476 and the surface to be coated varies while coating liquid tank 470 is moved downward. Even in this case, since there is space 486 above pool 484, what occurs at the upper end position of pool 484 as it moves upward and downward in gap 478, and coating liquid never goes out of pool 484 over the upper edge of front end surface 476. The coating liquid does not leave pool 484 of gap 478 even at the start of coating.

The shape of front wall portion 472 of coating liquid tank 470 shown in FIG. 20 is such that the upper part thereof protrudes forward to provide front end surface 476. However, the shape of the front wall portion 472 of coating liquid tank 470 is not limited to this. What is necessary is that the upper end of the front end surface be above the maximum height of the coating liquid in the pool rising at least because of capillary action. As far as this condition is satisfied, any liquid tank may be used, and for example, a tank having a recessed surface at the front end such as shown in FIG. 15 may be used.

In the liquid tank shown in FIG. 20, the front end surface 476 is formed such that gap 478 between front end surface 476 and the surface to be coated of substrate 310 has the same expansion entirely over the upward and downward directions. However, the present invention is not limited to this figure. For example, the shape of front end surface 476 may be selected such that size of gap 478 is increased from the lower end to the upper end of front end surface 476.

When coating liquid is applied to the surface to be coated of substrate 310 using this coating liquid tank, the thickness of the coating film formed is determined in accordance with relative speed of movement between coating liquid tank 470 and the surface to be coated of substrate 310, the size G of gap 478, fluidity and material values of coating liquid 322, wettability of the coating surface of substrate 310 and/or front end surface 476 of coating liquid tank 470, and so on. Therefore, in order to suppress variation of film thickness, it is necessary to adjust the speed of movement of coating liquid tank 470 and the size G of gap 480 to be within tolerable ranges.

Here, the speed of movement of coating liquid tank 470 is one of the critical factors determining the film thickness of the coating. Exactly speaking, the speed of movement is, when coating liquid tank 470 of FIG. 20 is used, the relative speed of movement of the upper end of pool 484 in gap 478 with respect to the surface to be coated of the substrate. If the size G of gap 478 is perfectly constant, the speed of movement of the meniscus at the upper end of pool 484 in gap 478 is equal to the speed of movement of coating liquid tank 470, except at the start of coating. However, actually, size G varies, and therefore the meniscus at the upper end of pool 484 changes upward and downward in gap 478, and therefore the speed of movement of meniscus at the upper end of pool 484 is not equal to that of coating liquid tank 470. Therefore, even if coating liquid tank 470 is moved at a constant speed, the speed of movement of meniscus at the upper end of pool 484 in gap 478 is not constant. However, even if the upper end of pool 484 changes relatively upward or downward with respect to coating liquid tank 470, the change is within the range of gap 478, and therefore there is little influence on the film thickness of the coating.

Hence, in accordance with this fourth embodiment, the possibility is avoided that the coating liquid in the pool 484 may go out over the upper edge of the front end surface of the coating liquid tank 470 during the coating process or at the start of the coating, as illustrated in FIGS. 18 and 19, which would otherwise adversely affect the thickness of the coating film. Thus, the variation or fluctuation in the coating film thickness can be restricted.

Furthermore, in accordance with this fourth embodiment utilizing the coating liquid tank 470 as shown in FIG. 20, it has been confirmed by the inventor named herein that when the size G of the gap is within the range of from 0.1 to 0.3 mm, the thickness of the coating film obtained is stable at a constant value. What is essential is not merely the size of the gap, but also the shape of the meniscus formed in the gap. That shape of the meniscus is regulated by the size of the gap. That is why the size of the gap should be determined as described above.

Let us consider processing near the lower end of the substrate, when the substrate is coated by using coating liquid tank 470 of FIG. 20. At that time, it is necessary to apply coating liquid until the meniscus at the upper end of pool 484 goes out of the lower end of the surface to be coated of substrate 310. However, in the period from the point where outlet 480 of coating liquid outlet path 474 goes below the lower end of the surface to be coated of substrate 310 to the point where the meniscus at the upper end of pool 484 goes below the lower end of the surface to be coated of substrate 310, coating liquid 322 is not supplied from coating liquid outlet path 474 to gap 478. Therefore, the coating liquid in pool 484 is consumed, and the coating liquid is not supplied from coating liquid tank 470 to the pool 484.

Therefore, in the above described period, the speed of movement of the leading meniscus of pool 484 is determined by the sum of the speed of lowering of the upper end of the pool 484 caused by the consumption of the coating liquid, and the speed of movement of coating liquid tank 470. As a result, a coating film of undesirable film thickness is formed at the lower end portion of the surface to be coated of the substrate 310.

Referring to FIG. 20, the distance from outlet 480 of coating liquid outlet path 474 to the upper end of liquid pool 484 is denoted by L2. In the range from the lower end of the surface to be coated of substrate 310 to a position thereabove by the distance corresponding L2, the film thickness of the coating will be out of a prescribed tolerable range. In other words, an improperly coated or invalid area is formed at the lower end portion of the surface to be coated of the substrate 310.

In the coating liquid tank 380 of FIG. 15, the distance between outlet 420 of coating liquid outlet path 384 to the upper end of pool 390, is denoted by L1. Hence, the distance from outlet 420 to the upper edge of front end surface 386 is denoted by L1. Assuming that the size G of gap 388 shown in FIG. 15 is the same as the size G of gap 478 shown in FIG. 20, then L2>L1. Therefore, when the coating liquid tank shown in FIG. 20 is used, the size of the invalid area generated at the lower end portion of the surface to be coated of substrate 310 is increased, as compared with that invalid portion formed when the coating liquid tank 380 of FIG. 15 is used. As a result, the area of the substrate which can be effectively used becomes smaller.

Two embodiments which can solve the above described problem will be described with reference to FIGS. 21 and 22.

Fifth Embodiment

Figure 21:
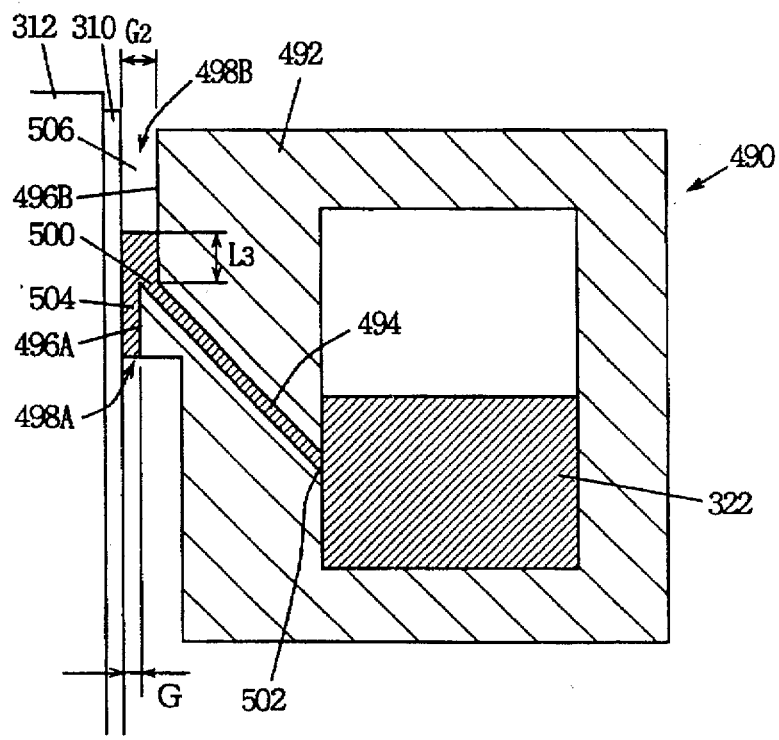
FIG. 21 is a vertical section of a coating liquid tank constructed in accordance with a fifth embodiment of the present invention.

Referring to FIG. 21, a coating liquid tank 490 of the coating apparatus constructed in accordance with a fifth embodiment has a front wall portion 492 having a stepped front end surface. More specifically, the front end surface of front wall portion 492 is comprised of a front end surface lower portion 496A and a front end surface upper portion 496B which is recessed backward with respect to front end surface lower portion 496A.

The size G of gap 498A formed between front end surface lower portion 496A and the surface to be coated of substrate 310 held by stage 312 is the same as that of gap 388 and 478 of the coating apparatuses shown in FIGS. 12 to 16 and 20. The size G2 of gap 498B formed between front end surface upper portion 496B and the surface to be coated is larger than the size G.

Coating liquid outlet path 494 has an inlet 502 opened into coating liquid tank 490, and an outlet 500 formed at a position at the boundary between front end surface lower portion 496A and front end surface upper portion 496B. In coating liquid tank 490, front wall portion 492 is formed such that the lower edge of front end surface lower portion 496A is positioned at a level between inlet 502 and outlet 500 of coating liquid outlet path 494, as in the apparatus shown in FIG. 20.

The level of the upper edge of front end surface upper portion 496B is determined in the following manner. Assume that front end surface upper portion 496B is extended indefinitely upward, while maintaining the gap G2 between it and the surface to be coated of substrate 310. At this time, the coating liquid flowing into gap 498B through coating liquid outlet path 494 will rise in gap 498B at least because of capillary action. The maximum height reached by the coating liquid can be known. Therefore, front wall portion 492 is formed such that the upper edge of front end surface upper portion 496B is positioned higher than the maximum height reached by the coating liquid.

With the front end surface structured as described above, assume that the coating liquid is introduced to coating liquid tank 490. Coating liquid 322 is introduced to coating liquid tank 490 such that the surface level is at a level between inlet 502 of coating liquid outlet path 494 and the lower edge of front end surface lower portion 496A. The coating liquid flows from coating liquid tank 490 through coating liquid outlet path 494 to gaps 498A and 498B. The coating liquid is regulated by the lower edge of front end surface lower portion 496A, and therefore it does not flow down therebelow. The coating liquid rises in the gap 498B by capillary action, but it does not reach the upper edge of front end surface upper portion 496B. Therefore, there is formed a pool 504 of the coating liquid of which lower end is positioned at the lower edge of front end surface lower portion 496A and its upper end positioned lower than the upper edge of the front end surface upper portion 496B. In the upper gap 498B, there is formed a space 506 containing no coating liquid, above pool 504.

In the apparatus of the fifth embodiment, the size G2 of gap 498B between the front end surface upper portion 496B and the surface to be coated of substrate 310 is made wider than the size G. Therefore, as compared with the apparatus of FIG. 20 in which the size G of gap 478 between the front end surface and the surface to be coated of substrate 310 is kept constant, the height of coating liquid rising in gap 498B becomes lower. More specifically, referring to FIG. 21, in the apparatus of the fifth embodiment, the distance L3 from the outlet 500 of coating liquid outlet path 494 to the upper end of pool 504 in gap 498B becomes smaller than the distance L2 shown in FIG. 20. Therefore, when the coating apparatus having the coating liquid tank 490 shown in FIG. 21 is used, the invalid coated area formed at the lower end portion of the surface to be coated of substrate 310 can be made smaller than when the coating apparatus having the coating liquid tank 470 of FIG. 20 is used. Therefore, a larger area of the substrate can be used effectively.

Meanwhile, the size G of gap 498A between front end surface lower portion 496A and the surface to be coated of substrate 310 is the same as the size G of gap 478 in coating liquid tank 470 shown in FIG. 20. Let us consider an example in which coating liquid is applied at the lower end portion of substrate 310 until outlet 500 of coating liquid outlet path 494 of coating liquid tank 490 reaches the lower end of the surface to be coated of substrate 310. The coating liquid in pool 504 within the range from outlet 500 of coating liquid outlet path 494 to the lower edge of front end surface lower portion 496A flows down and is wasted at the final portion of coating. In this example, the size G of FIG. 21 is the same as the size G of FIG. 20 as already mentioned, and therefore the amount of coating liquid lost is the same in the examples of both FIGS. 21 and 20. Accordingly, a decrease in the ratio of effective use of coating liquid can be minimized. The size G of the gap is very much related to the stable capability of holding coating liquid. This stability is the same for the embodiments in both FIGS. 21 and 20.

Sixth Embodiment

Figure 22:
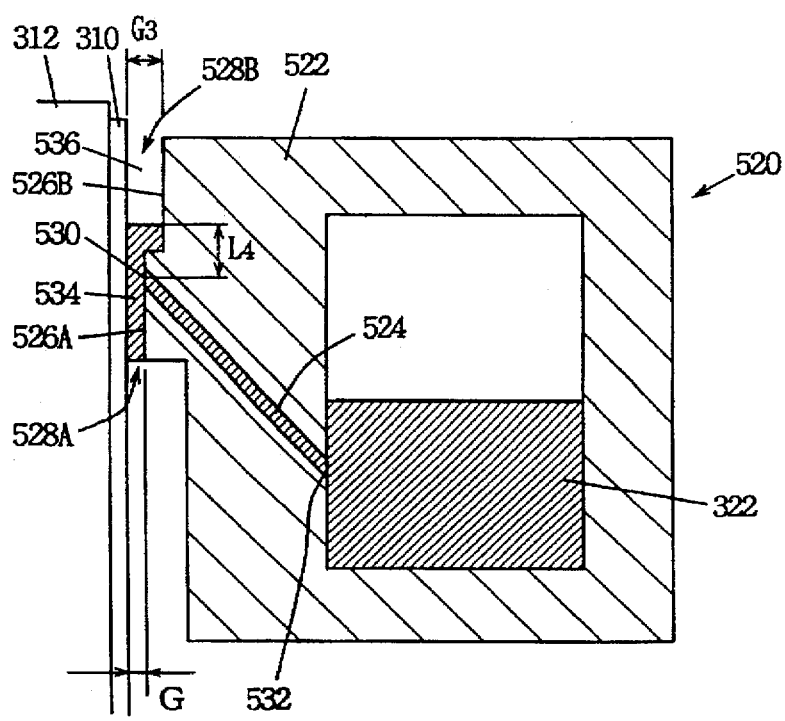
FIG. 22 is a vertical section of a coating liquid tank constructed in accordance with a sixth embodiment of the present invention.

FIG. 22 shows another embodiment of the coating liquid tank providing a similar effect in a similar manner as the coating liquid tank 490 shown in FIG. 21. Referring to FIG. 22, the front end surface of front wall portion 522 of the coating liquid tank 520 is also stepped. More specifically, the front end surface of front wall portion 522 consists of a front end surface lower portion 526A extending from the lower end to a position slightly higher than the outlet 530 of coating liquid outlet path 524, and a front end surface upper portion 526B recessed backward from front end surface lower portion 526A. Upper portion 526B extends from a position slightly higher than the outlet 530 at the front end side to the upper edge of the front end surface. Outlet 530 of coating liquid outlet path 524 is opened in gap 528A formed between front end surface lower portion 526A and the surface to be coated of substrate 310, as already described.

The size G between the front end surface lower portion 526A and the surface to be coated of substrate 310 is the same as the size G shown in FIGS. 20 and 21. The size G3 of gap 528B formed between front end surface upper portion 526B and the surface to be coated of said substrate 310 is larger than the size G. The upper edge of front end surface upper portion 526B is positioned above the maximum height reached by the coating liquid in gap 528B, as in the example of FIG. 21. Front wall portion 522 is formed such that the lower edge of front end surface lower portion 526A is positioned at a level between outlet 530 and inlet 532 of coating liquid outlet path 524.

Assume that a prescribed amount of coating liquid 322 is introduced to coating liquid tank 520. The coating liquid flows into gaps 528A and 528B from coating liquid tank 520 through coating liquid outlet path 524. The coating liquid forms a pool 534 in gaps 528A and 528B, with the lower end of pool 534 being regulated by the lower edge of front end surface lower portion 526A. The upper edge of pool 534 is positioned lower than the upper edge of front end surface upper portion 526B. Therefore, space 536 which does not contain coating liquid, is formed above the pool 534 in gap 528B.

The height from outlet 530 of coating liquid outlet path 524 to the upper end of pool 534 is denoted by L4. Since the size G3 of gap 528B is larger than the size G shown in FIG. 20, the distance L4 is smaller than the distance L2 shown in FIG. 20.

More specifically, when the coating liquid tank 490 or 520 of Embodiments 5 and 6 above is used, a greater area of the substrate can be effectively used, and coating liquid can be used more effectively.

To provide the above described effects, the shape of the front surface of the coating liquid tank is not limited to those shown in FIGS. 21 and 22. For example, in those two embodiments, the front end surface is divided into two surfaces. However, the front wall portion may be formed such that the front end surface is divided into three or more surfaces, and the gap between each of the divided surface and the surface to be coated of the substrate may be different. Alternatively, the front end surface may have a portion that is spaced from the surface to be coated by a gap that becomes wider toward the upper end of the front end surface. In any case, the gap width or thickness between the front end surface and the surface to be coated of the substrate should be selected within a range which ensures that the pool in the gap will hold the coating liquid stably. As a result, the above described effects can be obtained as long as the gap between the front end surface of the coating liquid tank and the surface to be coated of the substrate is at least partially made wider above the outlet of the coating liquid outlet path, than the width of the gap below the outlet.

Seventh Embodiment

An embodiment of an apparatus which allows confirmation that the strip shaped pool has formed at the position where coating begins and before the coating liquid tank is moved down for applying coating liquid to the surface of the substrate, will be described. Such a strip shaped pool must be formed in the widthwise direction of the front end surface of front wall portion of the coating liquid tank at least at the position where coating begins, so as to ensure satisfactory application of the coating liquid.

Figure 23:
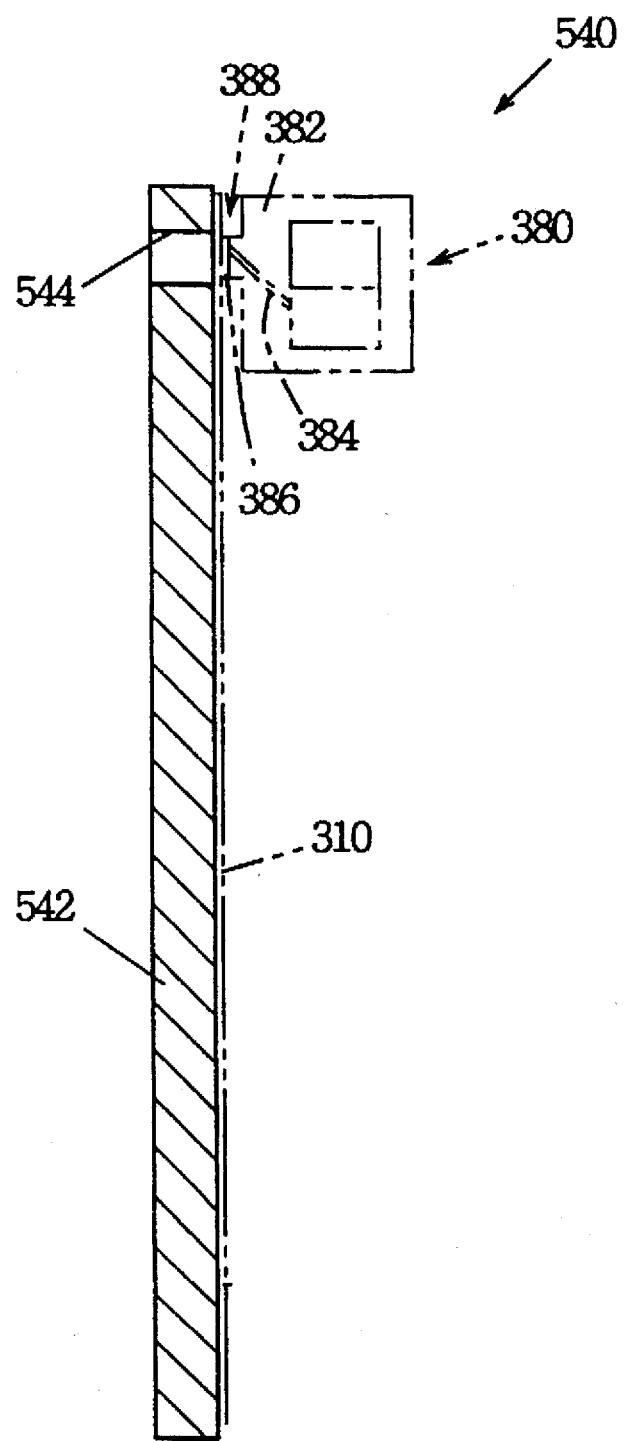
FIG. 23 is a vertical section of a main portion of coating apparatus constructed in accordance with a seventh embodiment of the present invention.

Referring to FIG. 23, the coating apparatus 540 in accordance with the seventh embodiment includes a stage 542 for holding substrate 310, and at a location of stage 542 which corresponds to the position where coating begins, a through hole 544 is formed. The substrate 310 is a transparent substrate, such as a glass substrate for LCDs. The coating liquid tank 380 shown in FIG. 15 may be used as the coating liquid tank. Not only the coating liquid tank 380 but other coating liquid tank, for example the one shown in FIG. 20, may be used.

Referring to FIG. 23, in the coating apparatus 540 the front end surface 386 of front wall portion 382 of coating liquid tank 380 can be observed from the rear side of stage 542 via through hole 544 of stage 542 and through transparent substrate 310. Whether or not the strip shaped pool has been formed at the front end across the widthwise direction of substrate 310 in gap 388 between end surface 386 of front wall portion 382 of coating liquid tank 380 and the surface to be coated of substrate 310 is formed at the start position of coating can be confirmed. After the formation of strip shaped pool is confirmed, the coating liquid tank 380 is moved downward, and thus the coating liquid can be applied surely to the surface of substrate 310.

Eighth Embodiment

Figure 24:
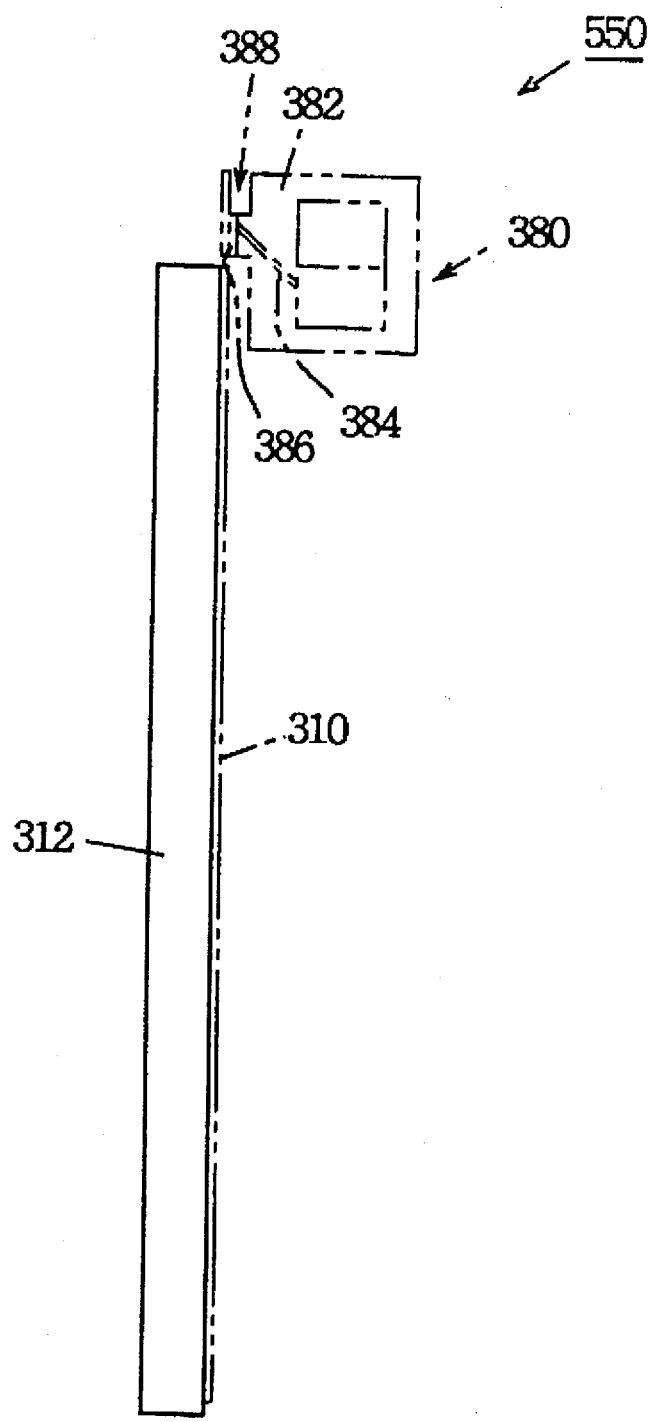
FIG. 24 is a side elevation of the main portion of coating apparatus constructed in accordance with an eighth embodiment of the present invention.

FIG. 24 is a side view of a main portion of the coating apparatus 550 constructed in accordance with the eighth embodiment of the present invention.

In FIG. 24, in the coating apparatus 550, the length in the vertical or longitudinal direction of stage 312 is selected to be shorter than the vertically disposed longitudinal length of substrate 310. Substrate 310 is held by stage 312 such that upper end of substrate 310 protrudes upward beyond the upper end of stage 312. Further, apparatus 550 includes the coating liquid tank 380 described above. In this eighth embodiment, it is assumed that the substrate 310 is transparent.

In coating apparatus 550, the surface to be coated of that portion of substrate 310 which is protruding further upward than the upper end surface of stage 310 can be observed from the opposite side of stage 310. Therefore, at the position where coating begins, it can be confirmed whether the strip shaped pool have been formed in the gap 388 between the front end surface 386 of front wall portion 382 of coating liquid tank 380 and the surface of substrate 310 to be coated. After formation of the widthwise pool is confirmed, coating liquid tank 380 is moved downward, and thus coating liquid is applied to the surface of substrate 310.

In this embodiment, the longitudinal length of stage 312 is selected shorter than that of substrate 310. However, the relationship of the lengths of these is not so limited. For example, even if the longitudinal length of stage 312 is longer than that of substrate 310, the strip shaped pool can be confirmed if the substrate 310 can be held by the stage 312 such that the upper end of substrate 310 protrudes upward beyond the upper end surface of stage 312.

When the substrate is transparent, the portion of the stage holding the substrate which corresponds to the start position of coating may be formed of a transparent material. For example, a transparent glass may be used. Alternatively, not only the portion corresponding to the start position but the entire stage may be transparent. If only the portion corresponding to the start position is transparent, other portions may or may not be transparent.

Alternatively, a plurality of through holes may be formed at appropriate positions of the stage. With such a construction, the state of the pool formed in the gap between the front end portion of front wall portion of the coating liquid tank and the surface to be coated of substrate 310 can be observed not only at the start position of coating but also at other positions thereof. Observation by an operator viewing the state of the pool may be replaced by a detector monitoring the state of the pool.

Ninth Embodiment

Figure 25:
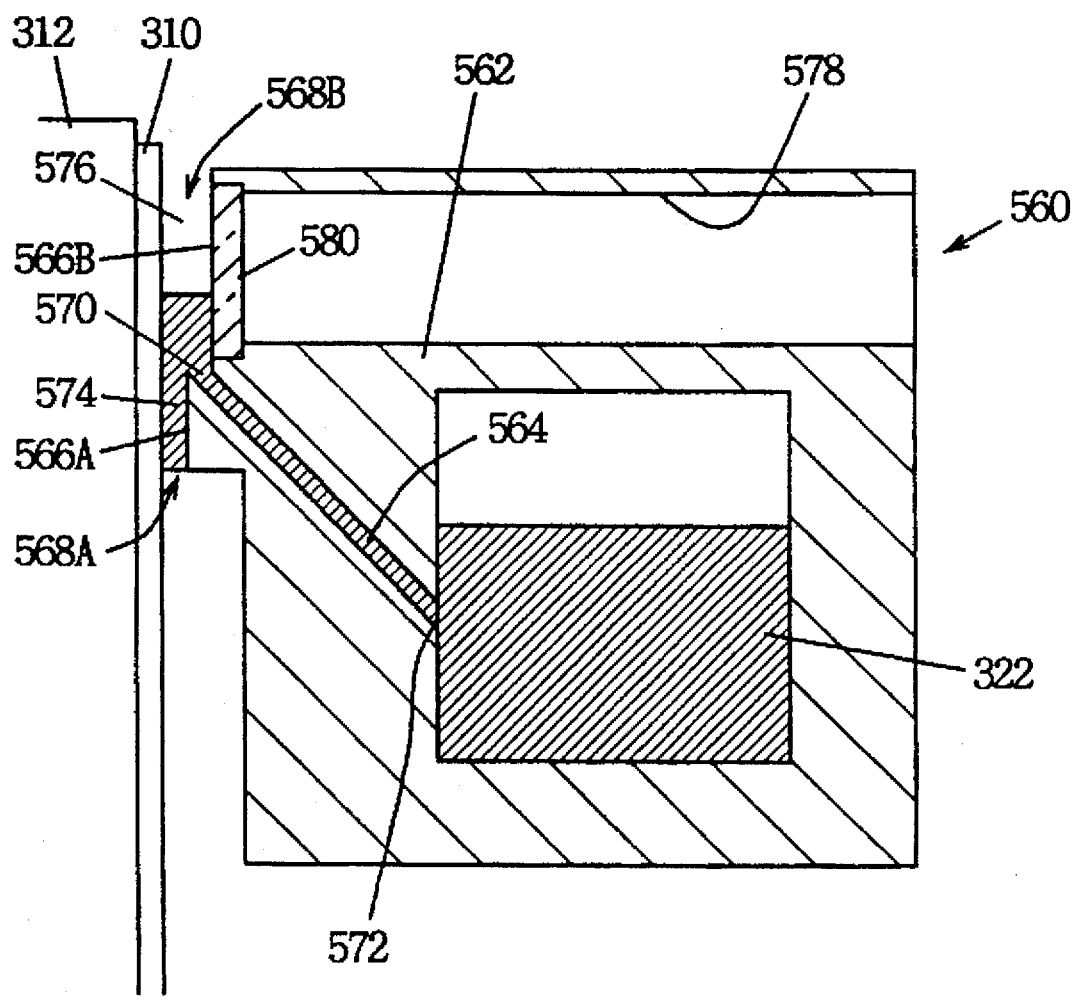
FIG. 25 is a vertical section of a coating liquid tank constructed in accordance with a ninth embodiment of the present invention.

FIG. 25 is a vertical cross section of a main portion of one embodiment of the coating apparatus which allows confirmation of formation of the strip shaped pool between the coating liquid tank and a substrate which is not transparent, at the position of starting coating. The appearance of coating liquid tank 560 used in this apparatus is the same as that illustrated in FIG. 21.

More specifically, the front end surface of front wall portion 562 of coating liquid tank 560 is stepped. The front wall portion 562 is formed such that the front end surface of front wall portion 562 is divided into front end surface lower portion 566A and front end portion upper portion 566B, and the front end surface upper portion 566B is recessed from front end surface lower portion 566A. Therefore, the size of gap 568B between front end surface upper portion 566B and the surface to be coated of substrate 310 is larger than that of gap 568A between front end surface lower portion 566A and the surface to be coated.

An outlet 570 of a coating liquid outlet path 564 is formed to be positioned at the boundary between front end surface lower portion 566A and front end surface upper portion 566B. The lower edge of front end surface lower portion 566A is formed to be positioned at a level between outlet 570 and inlet 572 of coating liquid outlet path 564. The upper edge of front end surface upper portion 566B is formed to be positioned above the maximum height reached by the coating liquid rising in gap 568B at least because of capillary action, assuming that front end surface upper portion 566B is indefinitely extended upward.

Assume that a prescribed amount of coating liquid 322 is introduced to coating liquid tank 560. Coating liquid flows into gaps 568A and 568B through coating liquid outlet path 564 from coating liquid tank 560. A pool 574 is formed in gaps 568A and 568B. The lower end of pool 574 is regulated by the lower end of front end surface lower portion 566A. The upper end of pool 574 is positioned below the upper edge of front end surface upper portion 566B. Therefore, there is formed a space 576 containing no coating liquid, above the pool 574 in gap 568B above.

The structure shown in FIG. 25 is only an example and the appearance of the coating liquid tank is not limited to that shown in FIG. 21. Any coating liquid tank satisfying the conditions described above may be used.

The coating liquid tank 560 has a through hole 578 formed to pass in the forward and rearward directions at least at a portion in the widthwise direction at the upper portion of the tank. Coating liquid tank 560 includes a transparent glass plate 580 fitted to close the opening on the front end surface of through hole 578. The front surface of transparent glass plate 580 provides the front end surface upper portion 566B.

The operator can observe the upper end portion of pool 574 through transparent glass 580 from the rear side of through hole 578. Therefore, after the satisfactory formation of pool 574 at the coating start position is confirmed, coating liquid tank 560 is moved downward, and thus satisfactory coating operation takes place. What is specifically advantageous in the coating apparatus is that not only at the coating start position but at other positions, the state of pool 574 can be observed at any time. The coating apparatus can be used effectively no matter whether substrate 310 is transparent or not.

Now, in the coating apparatus using the coating liquid tank such as shown in FIG. 20 there is still a problem to be solved at the final stage of coating. Such problem will be described with reference to FIGS. 26 to 30.

Figure 26:
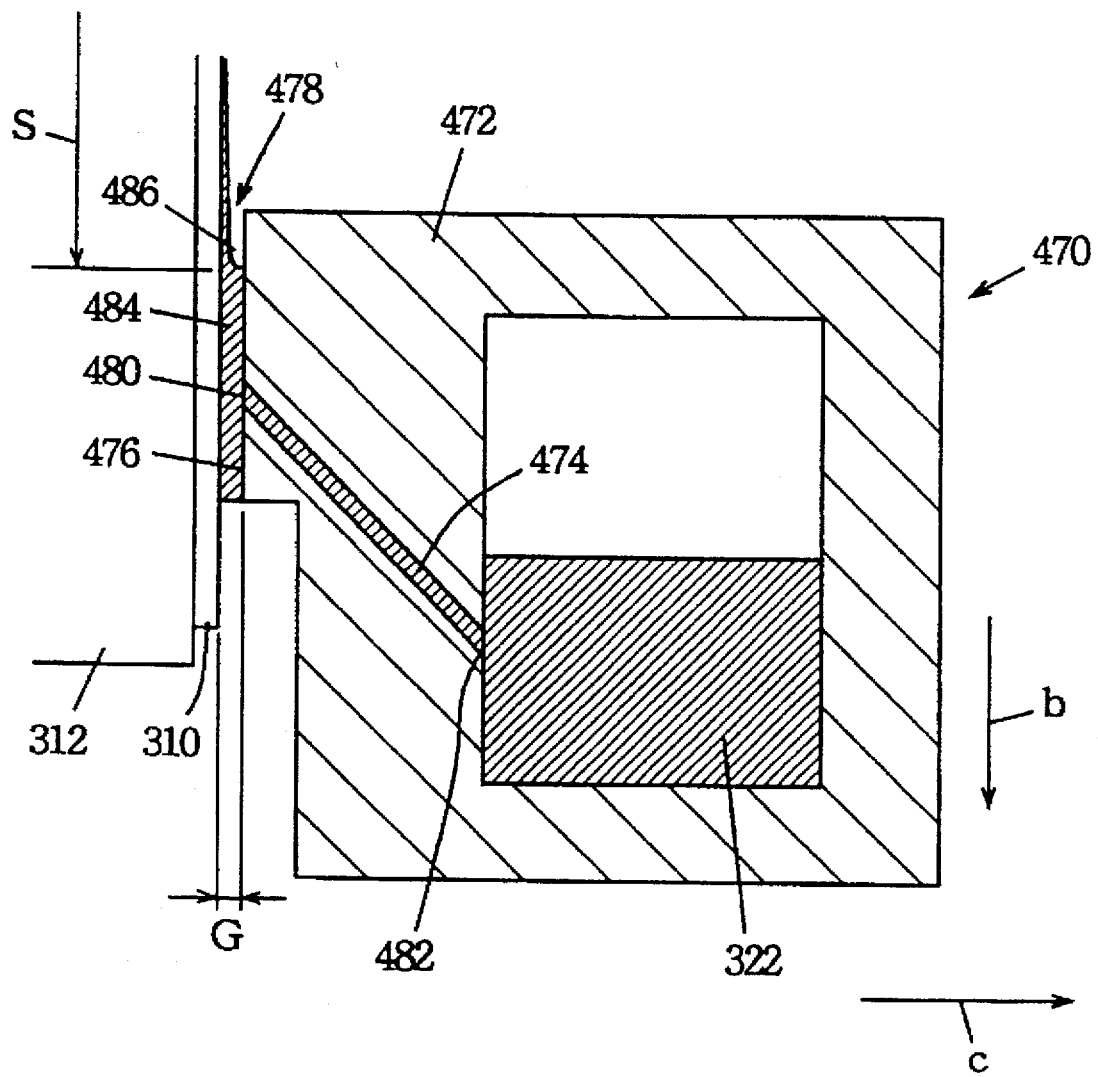
FIGS. 26 to 30 are vertical sections which illustrate problems generated at the end of coating, when the coating liquid tank shown in FIG. 20 is used.

FIG. 26 is an enlarged cross section showing part of an example of a main portion of the coating apparatus at the end of coating. In FIGS. 26 and 20, the same portions are denoted by the same reference characters and referred to by the same names. Therefore, detailed description is not repeated. The gap 478 formed between front end surface 476 and the surface to be coated of substrate 310 has the size G. A pool 484 is formed in gap 478. When coating liquid tank 470 has been moved downward until the upper end of pool 484 reaches the lower end of the area S requiring coating of the surface of substrate 310, the states of various portions of the apparatus and the state of the coating liquid are as shown in FIG. 26.

Figure 27:
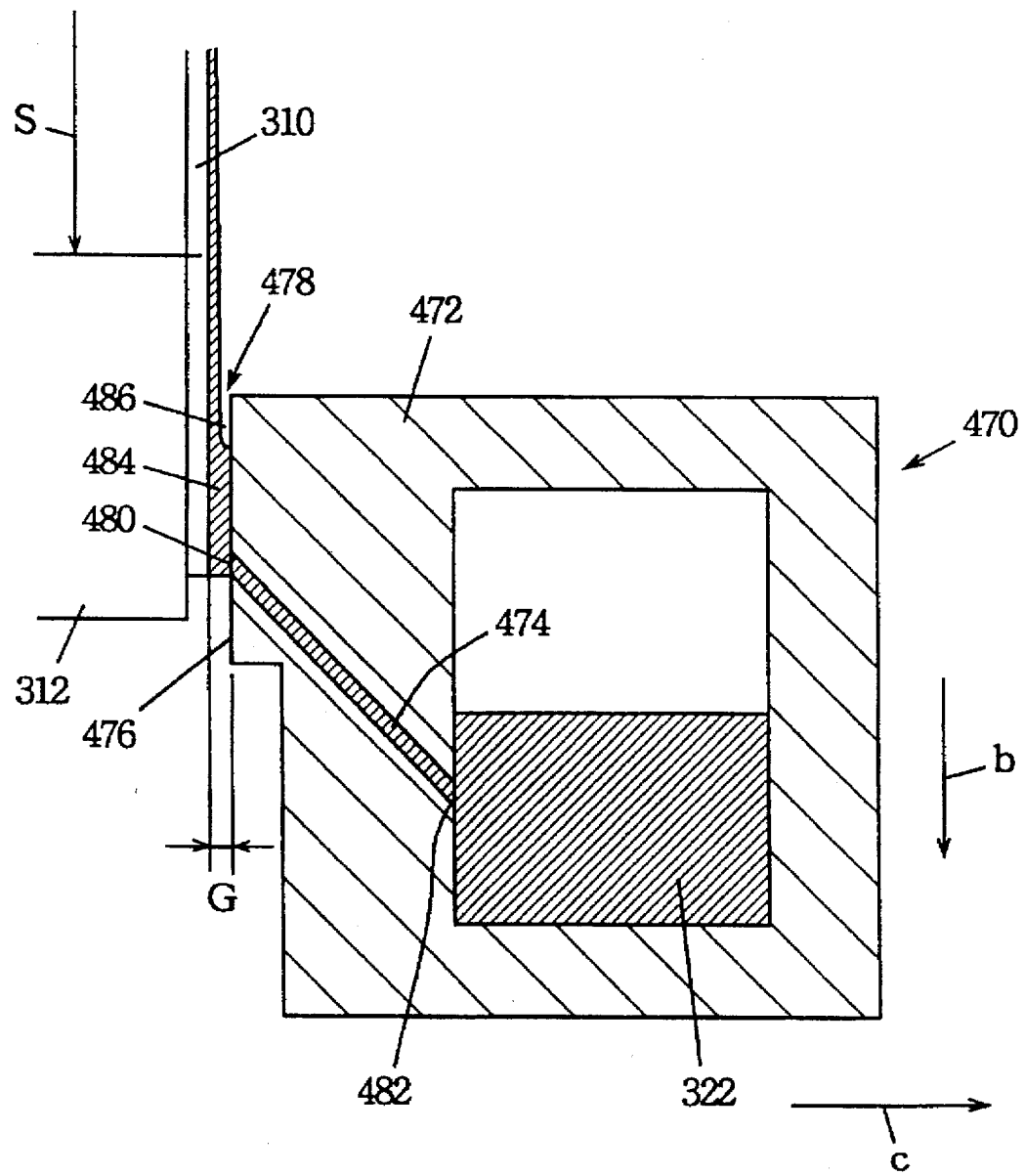

FIG. 27 shows the state of coating liquid tank 470, substrate 310 and the coating liquid, when the coating liquid tank 470 has been moved downward until outlet 480 of coating liquid outlet path 474 of coating liquid tank 470 is positioned at the lower end of the surface to be coated of substrate 310.

Figure 28:
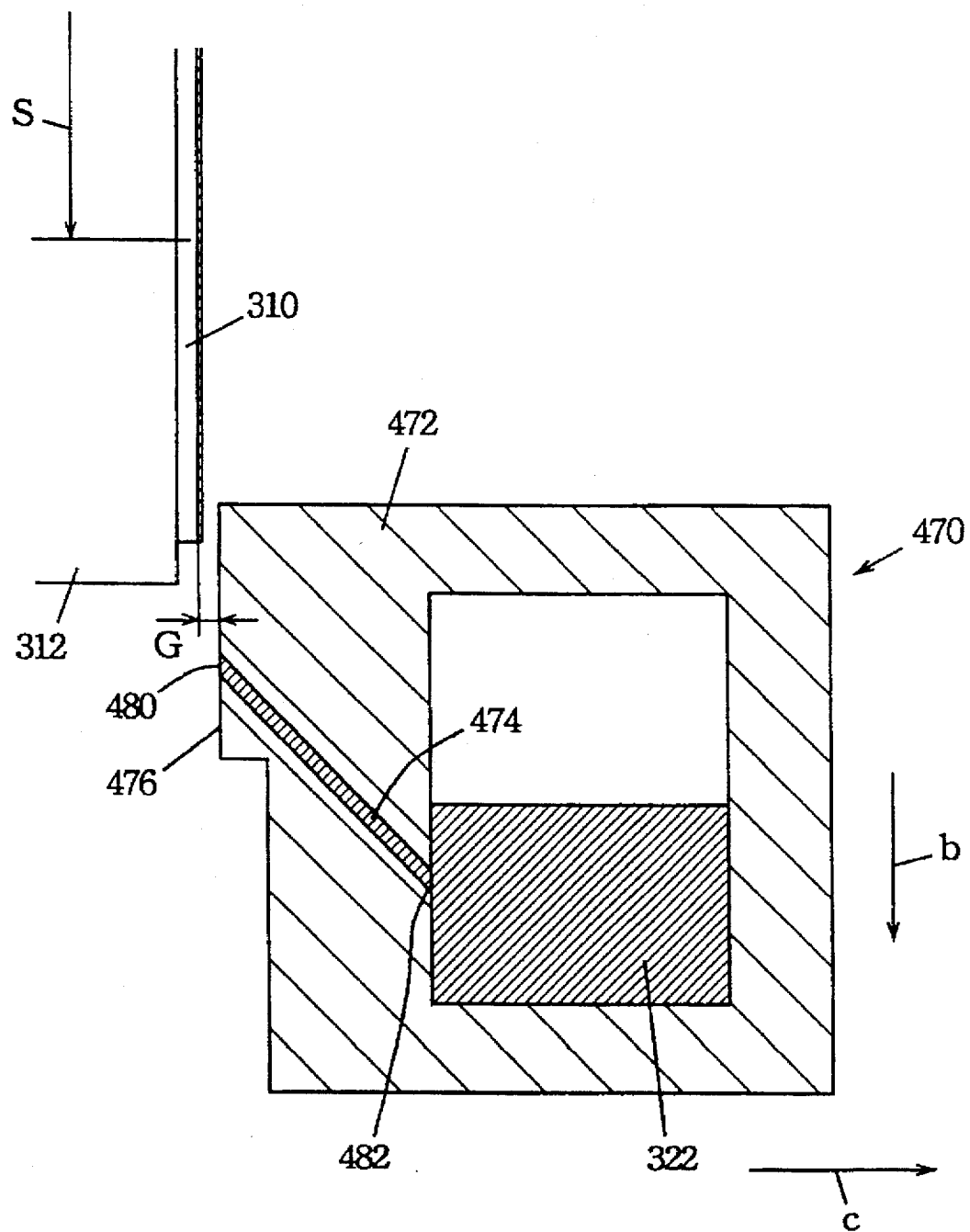

FIG. 28 shows the state of coating liquid tank 470, substrate 310 and the coating liquid, when the coating liquid tank 470 is further moved downward until a position where the pool formed in the gap having the size G between the surface to be coated of substrate 310 and the front end surface 476 of coating liquid tank 470 is positioned at the lower end of the surface to be coated of substrate 310. Application of the coating liquid to the substrate may be completed at a state shown in FIGS. 26, 27 or 28. Which of these state is selected for completing application depends on the relation between the size of the substrate 310, the area requiring coating, and so on.

Thereafter, from the state shown in FIGS. 26 and 27, respectively, the coating liquid tank 470 may be further moved to the direction enlarging the size of gap 478 (direction denoted by the arrow c in the figure). Further, coating liquid tank 470 may be moved to the direction of the arrow b. From the state shown in FIG. 28, coating liquid tank 470 may be moved in the direction of the arrow b and/or the arrow c.

Figure 29:
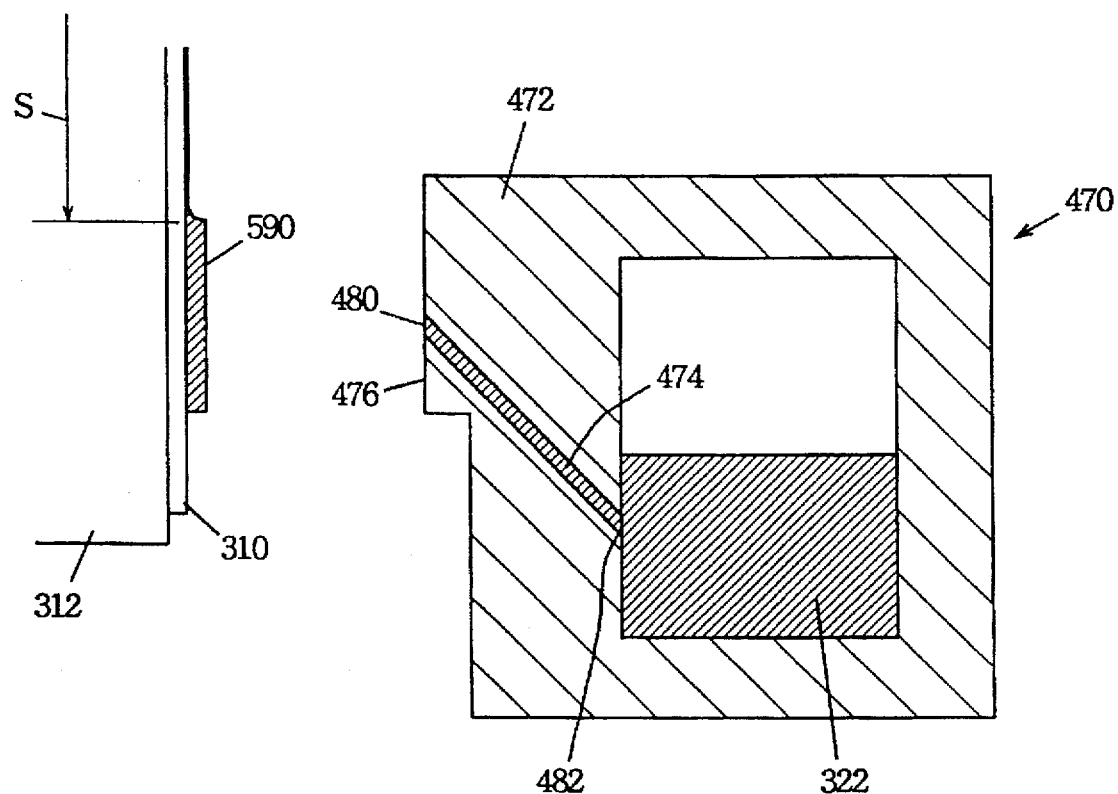
Figure 30:
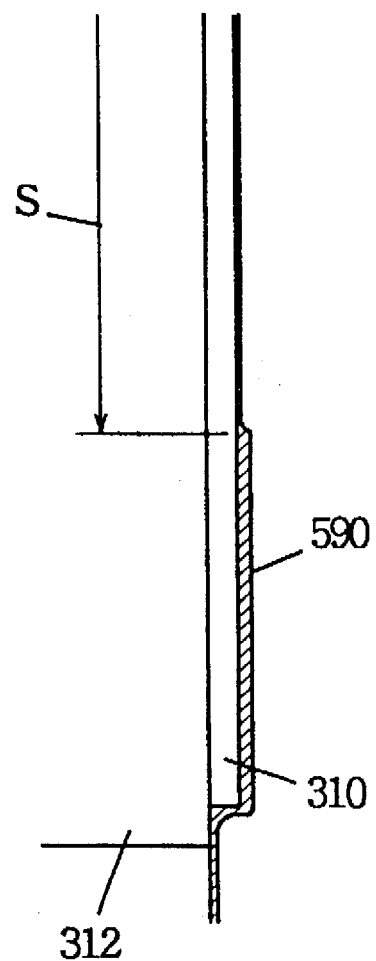

FIG. 29 shows the state in which coating liquid tank 470 is moved from the state shown in FIG. 26 to the direction (denoted by the arrow c) increasing the gap 478. Referring to FIG. 29, at least part of the coating liquid 590 of the pool 484 which has been formed in gap 478 having the size G is left on the surface to be coated of substrate 310. It may be possible that the coating liquid 590 flows down, resulting in the state of FIG. 30. If the coating liquid 590 flows down as shown in FIG. 30, the coating liquid 590 adheres on the surface of stage 312 holding substrate 310. It may be possible that coating liquid 590 enters the space between the surface of stage 312 and the rear surface of substrate 310 because of capillary action, and that the coating liquid adheres on the rear surface of substrate 310.

When coating liquid tank 470 is moved from the state shown in FIG. 27 in the direction (denoted by the arrow c) increasing gap 478, it is possible that the coating liquid in the gap flows down and adheres on the surface of stage 312 or the rear surface of substrate 310. When coating liquid tank 470 is moved from the state shown in FIGS. 26 and 27, respectively, to the direction of the arrow b to the state of FIG. 28, the front end surface 476 of coating liquid tank 470 gradually moves away from the lower end of the surface to be coated of substrate 310, and accordingly, coating liquid may flow down through the gap having the size G, and the liquid may adhere on the surface of stage 312 or on the rear surface of substrate 310.

As already described, if the coating liquid is adhered on the surface of stage 312 or on the rear surface of substrate 310 at the end of coating, it becomes difficult to remove substrate 310 from stage 312. If the coating liquid remains adhering to the rear surface of substrate 310, it may cause some problem during the manufacturing steps after the step of coating. Any such problem must be avoided.

The coating liquid in the pool existing in the gap may be recovered in the coating liquid tank by reducing the pressure inside the coating liquid tank at the end of coating, as already described. However, it is difficult to completely recover the coating liquid, and therefore this problem cannot be solved completely by merely reducing pressure inside of the tank which contains the coating liquid. However, this problem should be solved and the following embodiment is made for this purpose.

Tenth Embodiment

Figure 31:
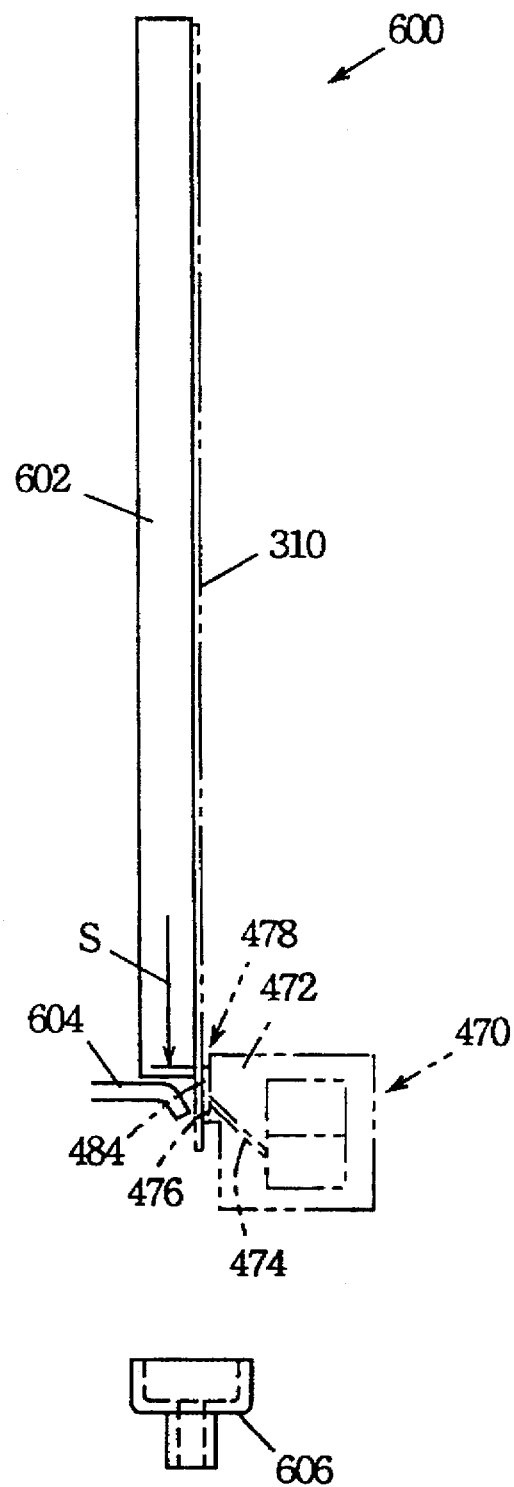
FIG. 31 is a side elevation of a main portion of coating apparatus constructed in accordance with a tenth embodiment of the present invention.
Figure 31A:
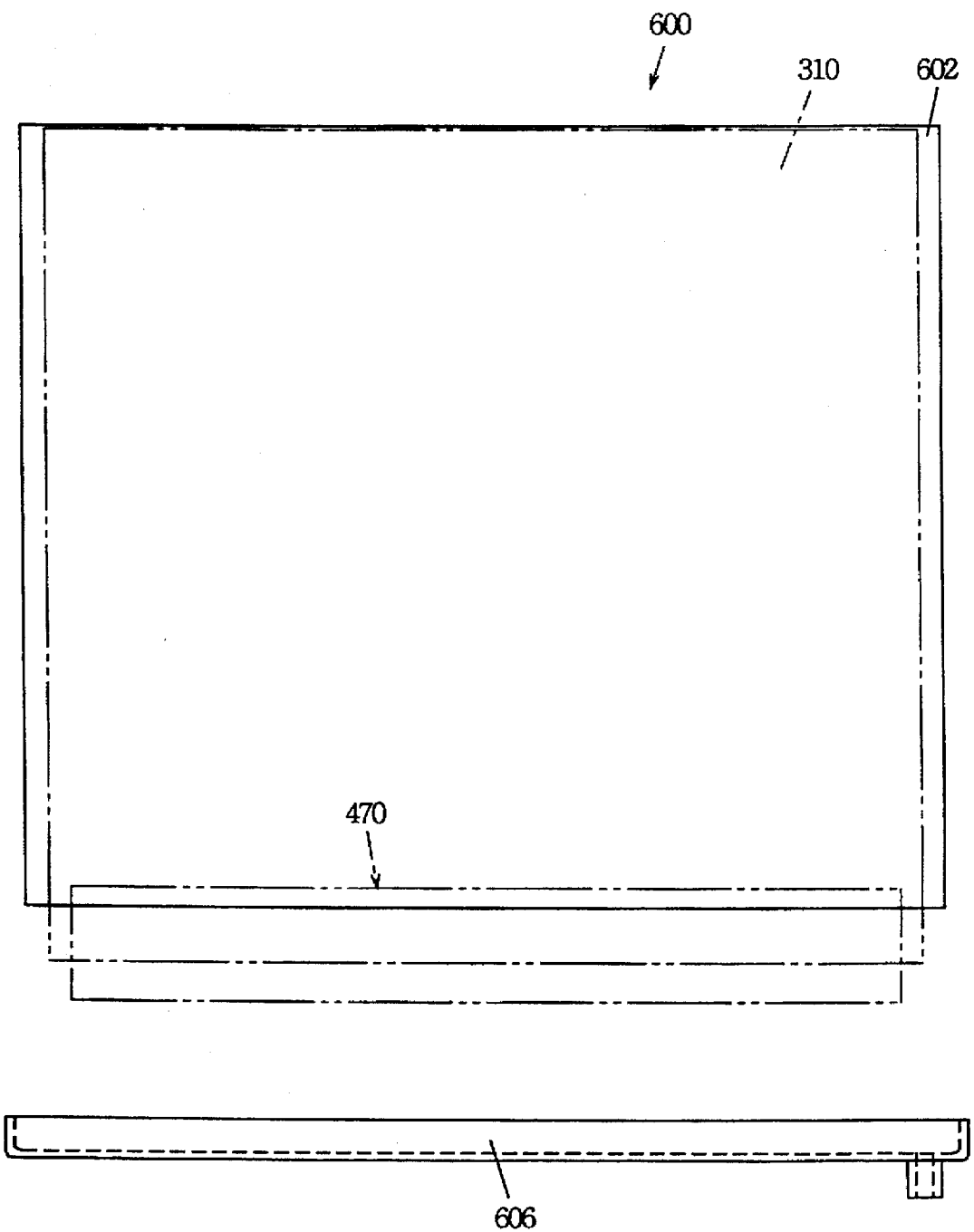
FIG. 31A is a front elevation of the main portion of the coating apparatus in accordance with the tenth embodiment.

FIG. 31 is a schematic side view of a coating apparatus 600 constructed in accordance with the tenth embodiment of the present invention, and FIG. 31A is a front view of the apparatus 600. Referring to FIGS. 31 and 31A, the apparatus 600 includes a substrate mounting stage 602 that is shorter than the longitudinal length of substrate 310, and a coating liquid tank 470. FIGS. 31 and 31A show the state of the apparatus when coating liquid tank 470 is positioned at the lower end of area S on the surface of substrate 310 that requires coating (at the completion of coating).

Referring to FIG. 31, in the apparatus 600, stage 602 holds substrate 310 with its lower end protruding downward below the lower end of stage 602. Since the lower end portion of substrate 312 protrudes beyond the lower end of stage 602, the coating liquid flowing down from the surface of substrate 310 will not be adhered on stage 602. Further, the coating liquid flowing down along the front surface of substrate 310 may not be adhered on the rear surface of substrate 310. Therefore, the above described problem can be avoided.

As for the length of the stage 602, it may be longer than the length of substrate 310 provided that stage 602 can hold the substrate 310 such that the lower end of substrate 310 protrudes downward from the lower edge.

Preferably, coating apparatus 600 further includes a detergent supply nozzle 604 having a blowing outlet arranged along the lower end of stage 602 and facing the rear surface of substrate 310 protruding downward from the lower end of stage 602. Detergent supply nozzle 604 is for blowing the detergent to the rear surface of substrate 310 for removing the coating liquid.

In the tenth embodiment, detergent supply nozzle 604 has a blowing outlet extending approximately entirely over the width of substrate 310. However, the shape of detergent supply nozzle 604 is not limited to this. For example, the detergent supply nozzle for blowing detergent to the rear surface of substrate 310 may be provided locally, and means for moving the detergent supply nozzle in the widthwise direction of substrate 310 may be provided.

More preferably, coating apparatus 600 further includes a receiving container 606 provided immediately below the substrate held by stage 602 and extending along the widthwise direction of substrate 310 for recovering the coating liquid flowing downward from the substrate 310. Receiving container 606 prevents the coating liquid, if any, which flows down from the substrate 310, from contaminating the frame of coating apparatus 600, for example.

It may be possible to apply coating liquid to the substrate by moving the substrate upward while fixing the coating liquid tank. In such a coating apparatus, it is preferred that detergent supply nozzle and the receiving container are moved upward and downward together with the substrate.

Eleventh Embodiment

Figure 32:
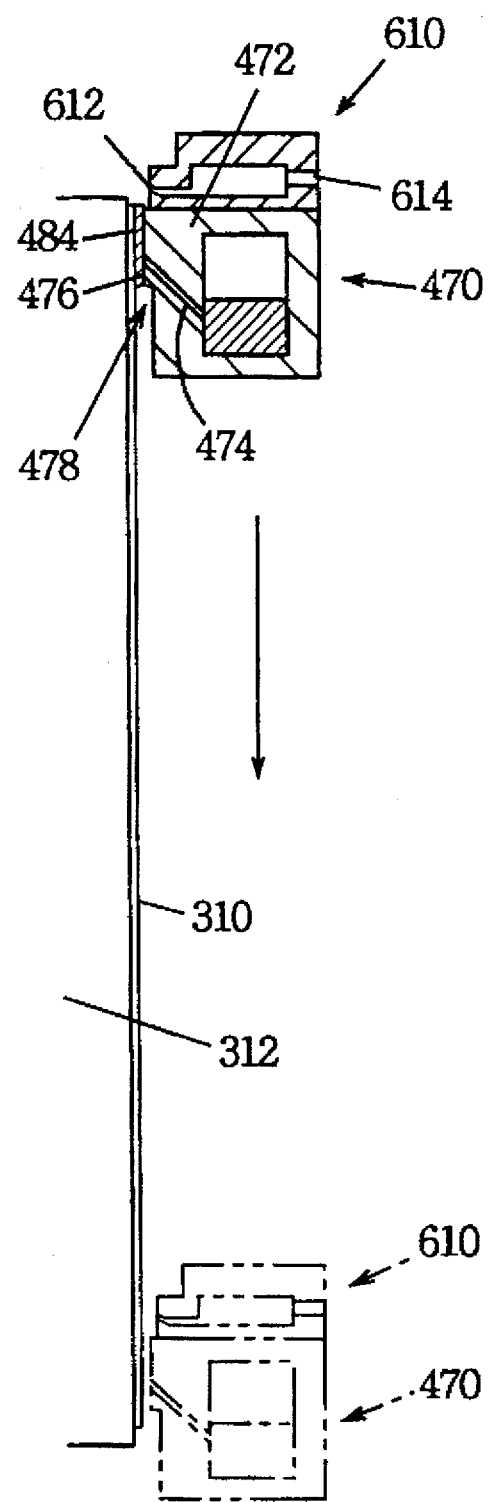
FIG. 32 is a vertical section of the main portion of coating apparatus in accordance with an eleventh embodiment of the present invention.
Figure 33:
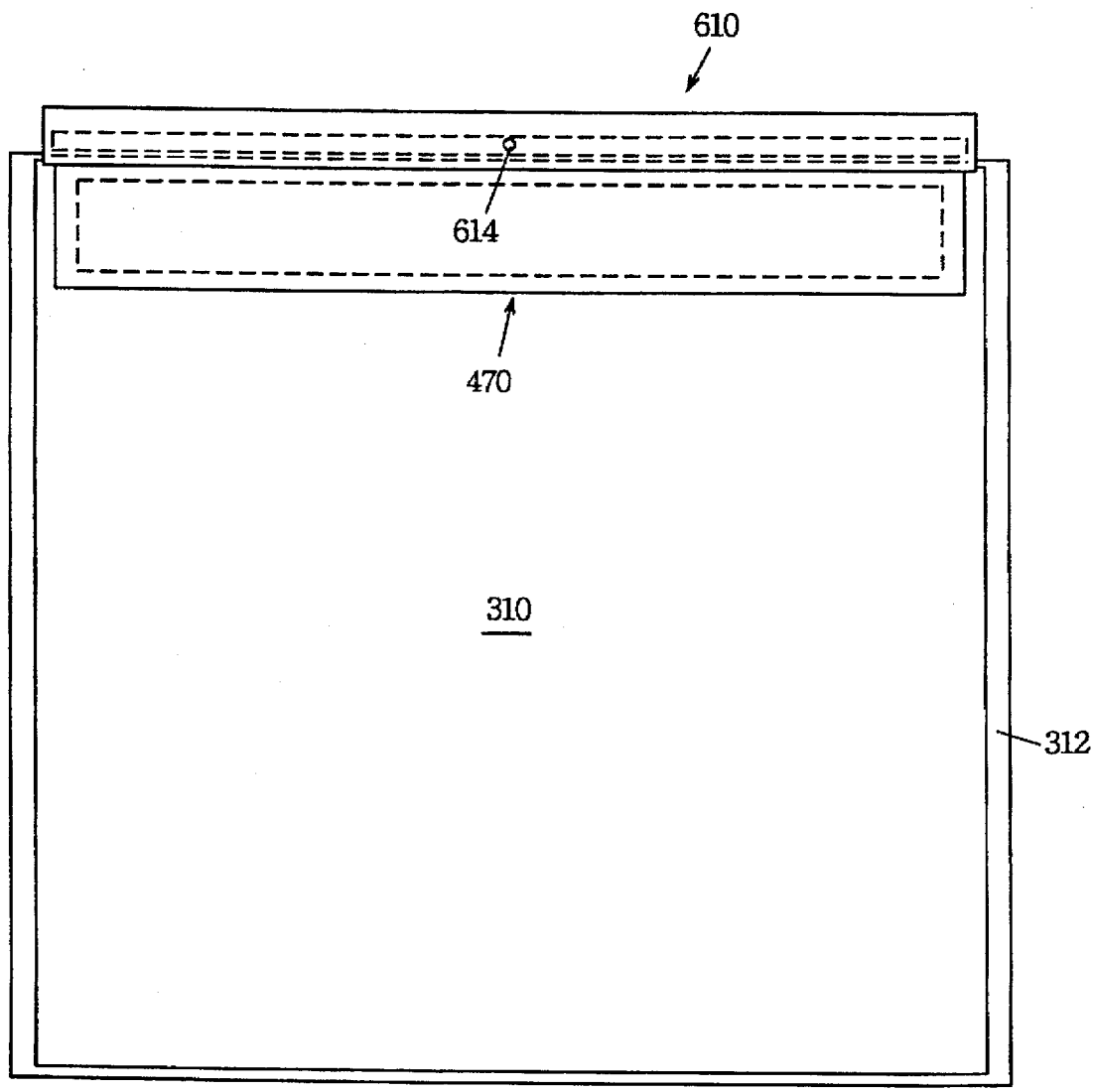
FIG. 33 is a front view of the main portion of the coating apparatus in accordance with the eleventh embodiment.

Referring to FIGS. 32 and 33, the coating apparatus 610 constructed in accordance with the eleventh embodiment of the present invention includes a stage 312 for holding substrate 310, coating liquid tank 470, and a gas blower tank 610 attached integrally on an upper portion of coating liquid tank 470.

The gas blower tank 610 has a hollow body extending entirely over the width of substrate 310. Gas blower tank 610 has a strip shaped nozzle 612 communicated with the inside of gas blower tank 610 and formed along the widthwise direction of gas blower tank 610. Preferably, the strip shaped nozzle 612 has its opening at the tip end positioned such that gas is blown diagonally upward. On the rear wall portion of gas blower tank 610, a gas supply hole 614 for supplying gas to the inside of gas blower tank 610 is formed.

In the coating apparatus shown in FIGS. 32 and 33, coating liquid is applied approximately entirely over the surface of substrate 310 as the coating liquid tank 470 moves from the vicinity of the upper end to the vicinity of the lower end of substrate 310. In the process of coating, gas blower tank 610 moves integrally with the coating liquid tank 470, and gas is blown diagonally upward from the strip shaped nozzle 612. Nitrogen gas may be used as the gas. Therefore, gas is blown to the coating liquid film immediately after the application of the liquid on the surface to be coated of substrate 310. Thus, evaporation of solvent from the coating liquid is accelerated immediately after application thereof on the surface of substrate 310, and as evaporation proceeds viscosity of coating liquid increases. Therefore, during application of the coating liquid, dropping of the coating liquid and sagging of the coating liquid on the surface to be coated can be suppressed.

Blowing of gas from gas blower tank 610 is continued until application of the coating liquid is completed. When coating liquid tank 470 and gas blower tank 610 are moved close to the lower end of substrate 310 denoted by the two dotted lines in FIG. 32 and stopped, blowing of gas from gas blower tank 610 is stopped.

In the gap between front end surface 476 of coating liquid tank 470 and the surface to be coated of substrate 310, pool 484 of the coating liquid is formed. The upper end of the pool 484 is spaced from the strip shaped nozzle 612 of gas blower tank 610, being below the latter. Therefore, depending upon how the position of coating liquid tank 610 is selected at the end of coating, the gas may not be entirely blown over the valid coating area of the surface of substrate 310. It may be possible that the gas is blown not only to the valid area but also to other areas of the surface to be coated of substrate 310. In that case, the coating liquid tank 470 and gas blower tank 610 may further be moved downward after the end of coating operation. After the gas is blown to the lowermost portion of the coating film applied on the surface to be coated of substrate 310, blowing of gas is stopped.

When the coating apparatus of the eleventh embodiment shown in FIGS. 32 and 33 is used, dropping of coating liquid from and sagging of the coating liquid on the coating film is effectively suppressed. Further, in the subsequent step of the coating procedure, for example in the step of drying, flow of coating liquid of the coating film hardly occurs, even when the temperature of the substrate is increased after the coating step. This reduces the possibility of variation in film thickness, and thus degradation of the quality of coating can be prevented.

In the coating apparatus of the eleventh embodiment, gas blower tank 610 is attached integrally with coating liquid tank 470. However, the present invention is not limited to this. Separate coating liquid and gas blower tanks may be used. In that case, the coating liquid tank and the gas blower tank may be driven by separate linear driving mechanisms.

In the above described embodiment, the gas blower tank is moved downward together with the coating liquid tank 470. However, the present invention is not limited to this, and the gas blowing means may be fixedly provided on the upper side, lower side or the side boundaries of substrate 310, or such means may be provided at a plurality of such positions. By blowing gas onto the surface of substrate 310 from this gas blowing means, similar effect as obtained by the gas blower tank 610 moving together with the coating liquid tank 470 can be obtained.

In the above described embodiment, gas blower tank 610 has a strip shaped nozzle 612 formed along the entire length of gas blower tank 610 at the tip. However, the present invention is not limited to this, and a number of holes having small diameter may be formed juxtaposed to each other along the entire length at the front end of gas blower tank. Further, an obstruction plate may be formed in the gas blower tank 610, or a plurality of gas supply holes may be arranged spaced by equal distance on the rear wall portion of gas blower tank 610, so that gas is uniformly blown along the entire widthwise direction of substrate 310 from the strip shaped nozzle 612 of gas blower tank 610. Further, such gas blower tank may be used combined with any of the remaining embodiments of the present invention.

As is clearly shown in FIGS. 26 to 28, the total amount of coating liquid used per substrate is the sum of the amount of coating liquid in the pool formed in the gap between the front end surface of front wall portion of coating liquid tank and the substrate surface to be coated, and the amount of coating liquid applied on the substrate surface to be coated. The coating liquid in the pool is not effectively used for forming the coating film as it may drop across the coated surface at the position of completion of coating or it may flow down from the lower end of the substrate. The rate of effective use of the coating liquid is the ratio between the value of total amount of coating liquid used per substrate minus the amount of coating liquid which is not effectively used, and the total amount of coating liquid used per substrate. Therefore, the ratio of effective use varies dependent on the size of the area of the substrate surface to be coated, the area of the front end surface of the coating liquid tank, the size of the gap and the distance between the upper and lower ends of the pool in the gap.

The efficiency of use of the coating liquid in the coating apparatus in accordance with the present invention will be described using the following example in which the size of the substrate surface to be coated with photoresist is assumed to be 500 mm×600 mm. The photoresist used is S1400-17 sold by Shipley Far East Corporation. If a thickness of 1 µm after drying is desired, the thickness before drying is about 8.3 µm. The gap between the front end surface of the coating liquid tank and the surface to be coated of the substrate is assumed to be constant, and the size G is assumed to be 0.1 mm. The distance between the upper and lower ends of the pool formed in the gap (gap pool) is assumed to be 15 mm, and the entire length of the pool in the widthwise direction of the substrate is assumed to be 500 mm.

Then, the amount of coating liquid in the gap pool can be calculated in accordance with the following equation.

$$500 \times 15 \times 0.1 \times 10^{-3} = 0.75 \ (cc)$$

The amount of coating liquid applied on the surface to be coated of one substrate can be calculated in accordance with the following equation.

$$500 \times 600 \times 0.0083 \times 10^{-3} = 2.49 \ (cc)$$

Therefore, the ratio of effective use of the coating liquid is about 75%, as can be calculated from the following equation.

$$(2.49 \div 3.24) \times 100 = 76.85 (\%)$$

Since the ratio of effective use in the conventional spinner type coating apparatus is about 5%, it can be understood that by the apparatus of the present invention, the coating liquid can be used with remarkably high efficiency. Further, if the apparatus is adapted to recover the coating liquid back in the coating liquid tank after the completion of coating, efficiency in using coating liquid can further be improved.

Twelfth Embodiment

FIGS. 34 to 38 show the coating apparatus 620 constructed in accordance with a twelfth embodiment of the present invention. The coating apparatus 620 includes a stage 622 for holding the substrate 310 vertically, and coating liquid tank 470. Coating liquid tank 470 is the same as that shown in FIG. 20, and therefore detailed description thereof is not repeated. Coating apparatus 620 further includes a linear driving mechanism which can move the coating liquid tank 470 in the direction denoted by the arrow a in FIG. 34, while maintaining a gap 478 having the size G between front end surface 476 of coating liquid tank 470 and the surface to be coated of substrate 310 held by stage 622. The linear driving mechanism is the same as that of the first embodiment, and is not shown in FIG. 34. In order to facilitate removal of substrate 310 from stage 622, a driving mechanism for moving the coating liquid tank 470 and stage 622 apart from each other and toward each other may be provided. In that case, provision of a detector for measuring the size G of gap 478 may be advantageous.

Figure 35:
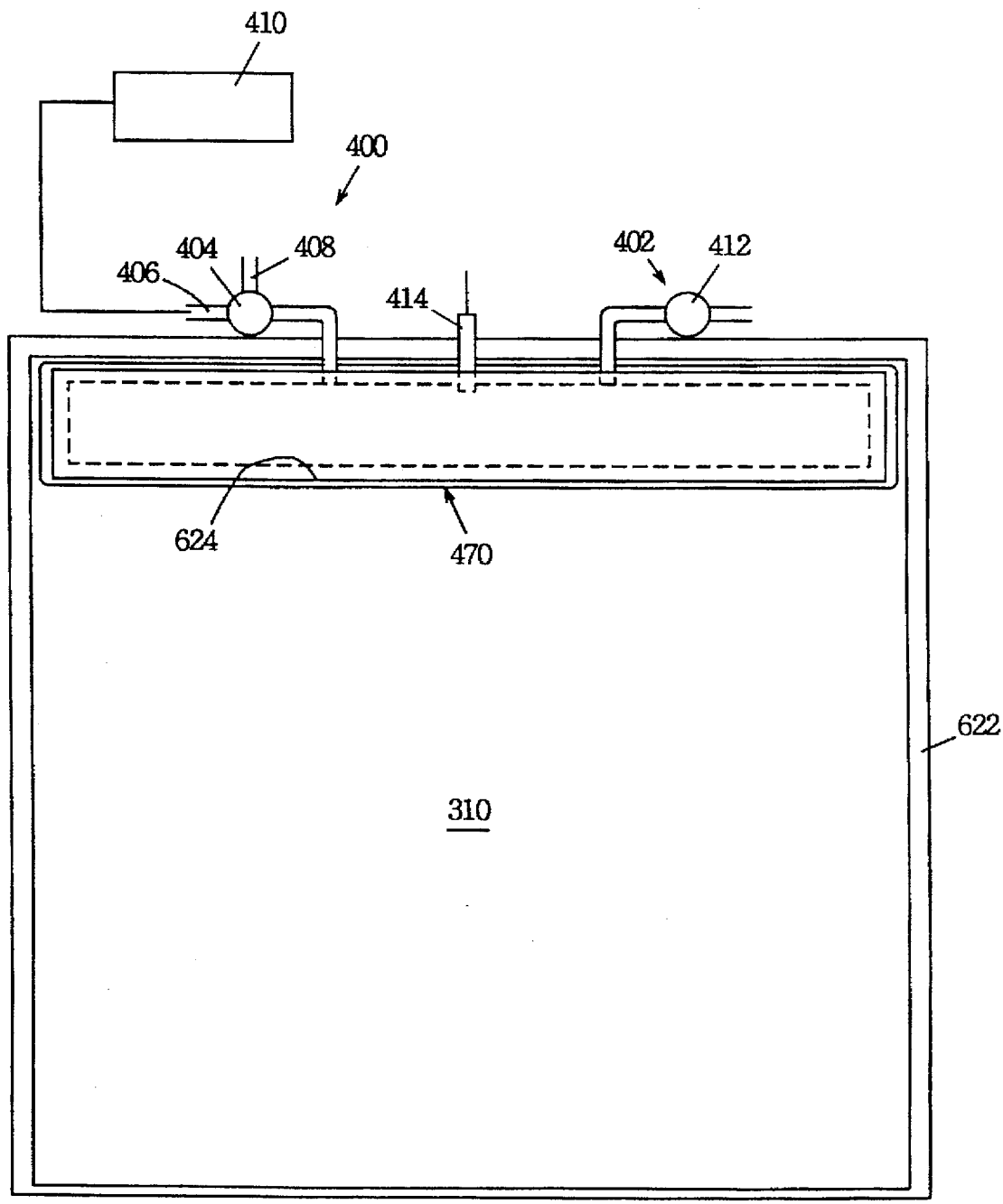
FIG. 35 is a front elevation of the main portion of the coating apparatus in accordance with the twelfth embodiment of the present invention.
Figure 36:
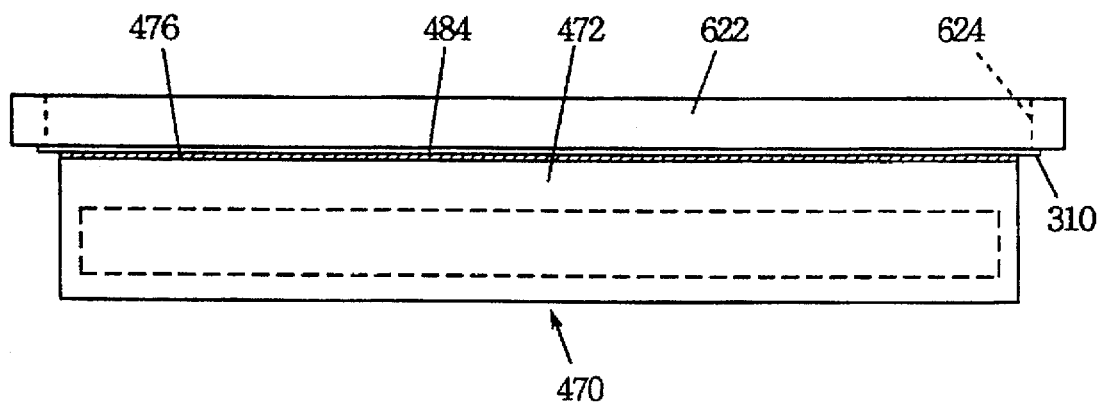
FIG. 36 is a plan view of the main portion of the coating apparatus in accordance with the twelfth embodiment.

As shown in FIG. 35, coating apparatus 620 includes pressure setting system 400 for increasing, decreasing and setting to the ambient the pressure in the tank or to open the inside of the tank to the air, and coating liquid supplying system 402 for supplying the coating liquid to the tank.

The structure of pressure setting system 400 is the same as that shown in FIG. 13. In FIGS. 35 and 13, corresponding portions are denoted by the same reference characters and referred by the same names. Functions of these components are also the same. Therefore, a detailed description is not repeated here. The same applies to the coating liquid supplying system 402.

When pressure setting system 400 is provided, outflow of the coating liquid can be prevented by adjusting the pressure in the coating liquid tank. Therefore, the attitude of the coating liquid tank is not limited to the vertical direction, and it may be set approximately horizontal, facing downward. In that case, the substrate is held horizontally by the stage.

In coating liquid tank 470, a detector 414 for detecting the surface level of coating liquid 322 introduced to the tank is provided.

Figure 34:
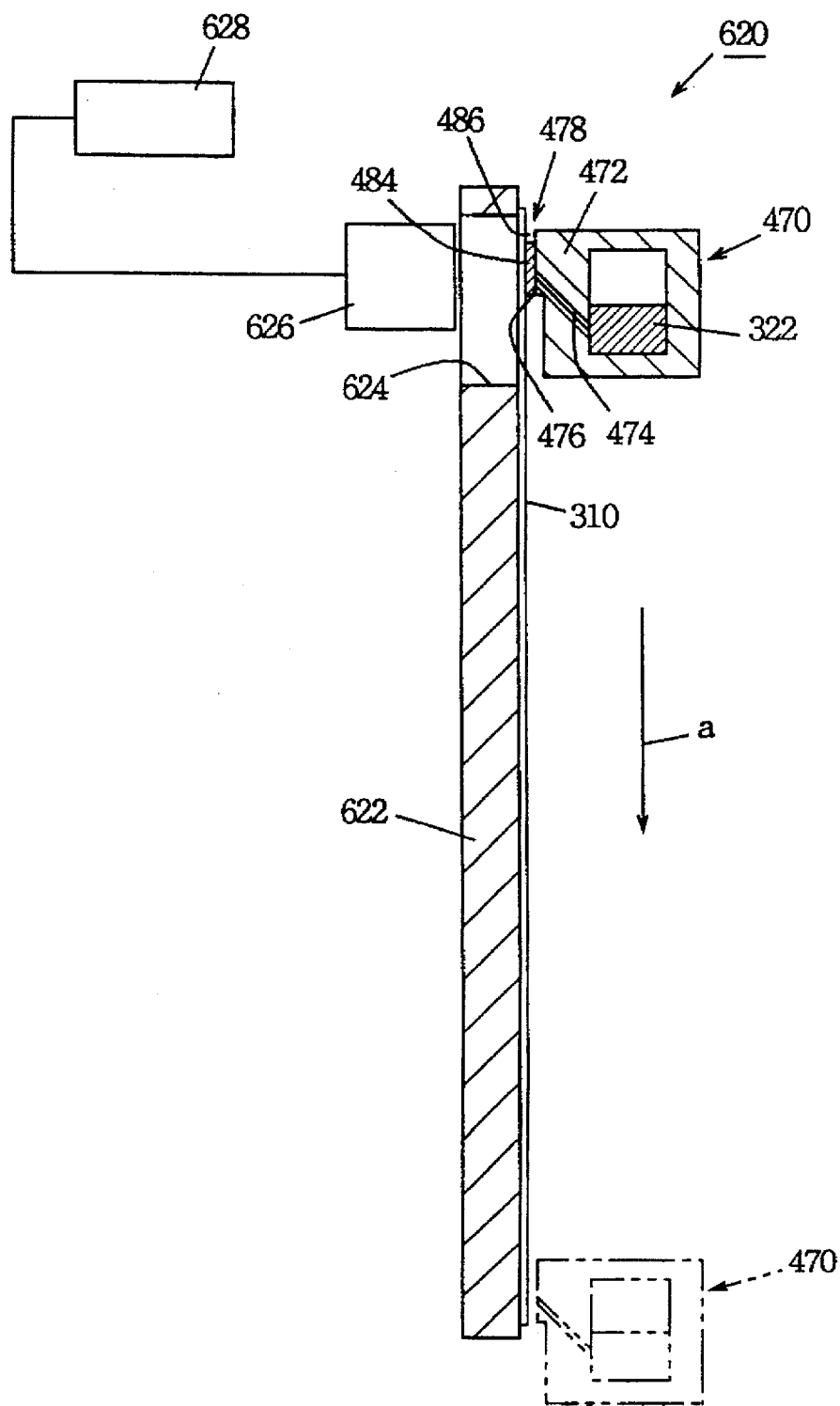
FIG. 34 is a vertical section of the main portion of coating apparatus constructed in accordance with a twelfth embodiment of the present invention.
Figure 37:
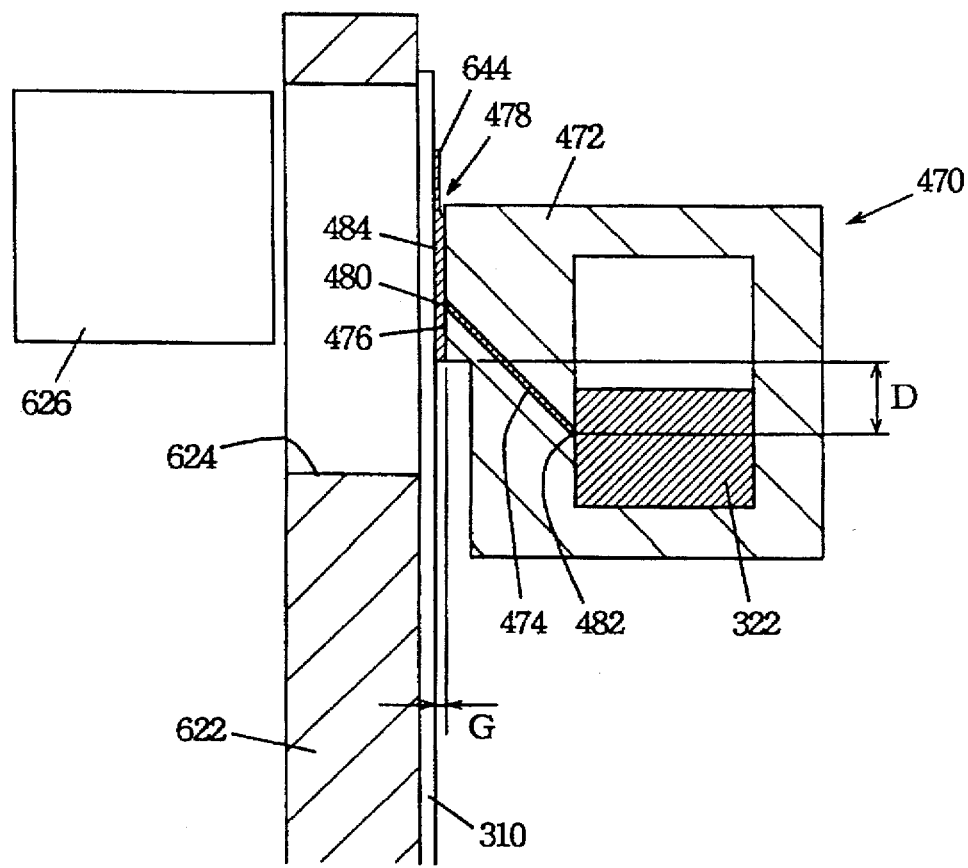
FIG. 37 is an enlarged vertical section of the main portion of the coating apparatus in accordance with the twelfth embodiment of the present invention.

Referring to FIGS. 34 and 37, stage 622 has a through hole 624 formed at a position corresponding to the start position of coating. On a surface opposite to coating liquid tank 470 with respect to the through hole 624, a detector 626 for detecting speed of movement of the upper end of the strip shaped pool 484 extending in the widthwise direction of substrate 310, and a control system 628 for controlling the linear driving mechanism, not shown, based on the detection signal indicative of the speed of movement of the upper end of the pool 484 detected by the detector 626 so that the speed of movement of the upper end of the pool 484 is kept constant, are further provided.

Figure 38:
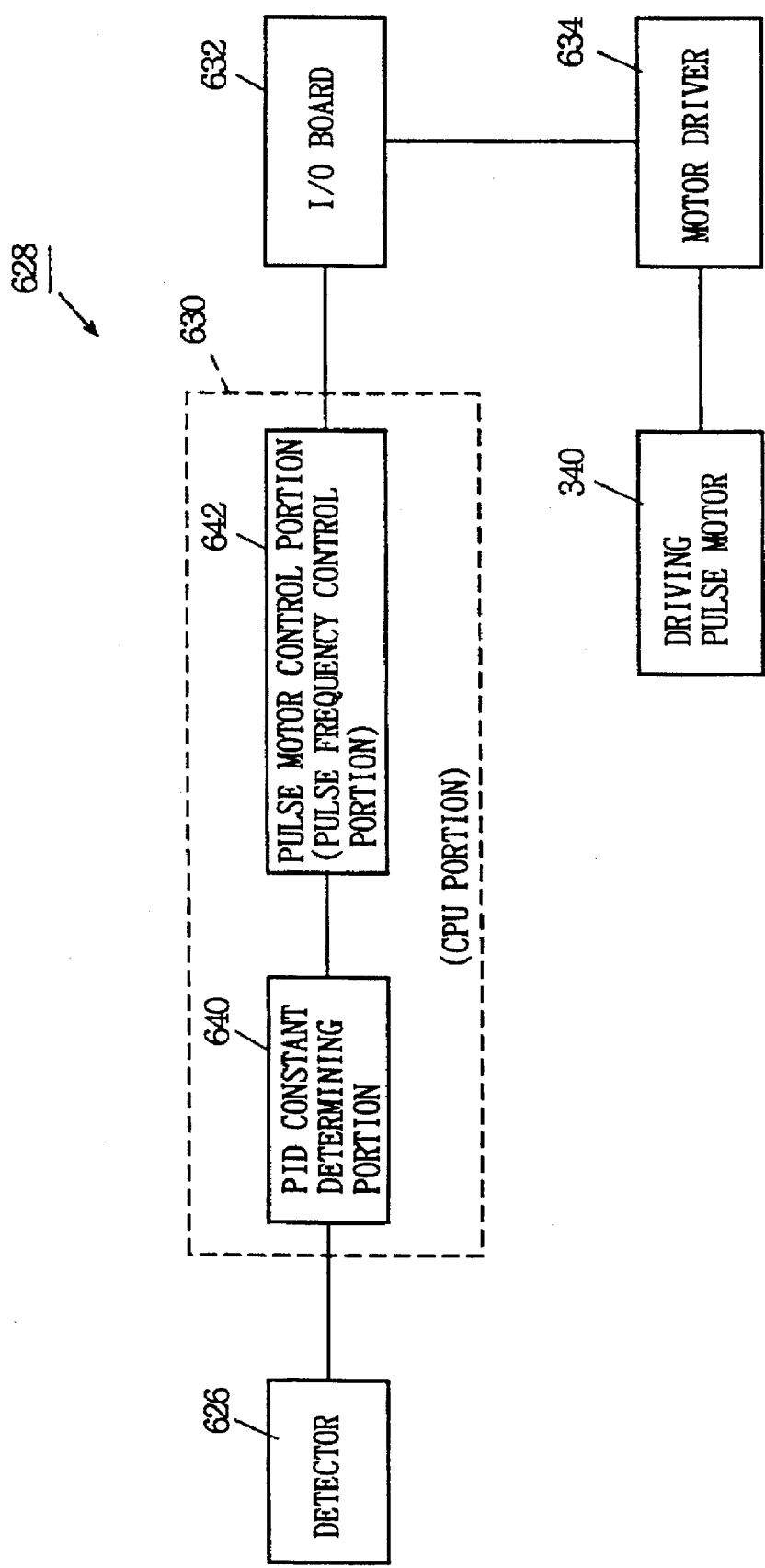
FIG. 38 is a block diagram of a control system in the coating apparatus in accordance with the twelfth embodiment of the present invention.

In the coating apparatus 620, at the start position of coating, it is possible to confirm the formation of the strip shaped pool 484 across the widthwise direction of substrate 310, from the rear side of a transparent substrate 310, through the through hole 624. Referring to FIG. 38, control system 628 includes a CPU portion 630 receiving an output from detector 626 for controlling pulse motor 340 (see FIGS. 6 and 7) for driving the linear driving mechanism, and a motor driver 634 receiving the control signal via an I/O port 632 for driving the pulse motor 340. The control system 628 is for controlling driving pulse motor 340 such that the speed of lowering the meniscus at the upper end of the pool, especially at the position where coating begins.

CPU portion 630 includes a PID constant determining portion 640 and a pulse motor control portion 642. PID constant determining portion 640 is for performing normal PID control, and in accordance with an output from PID constant determining portion 640, pulse motor control portion 642 provides a signal for controlling the motor.

The coating apparatus of the twelfth embodiment operates in the following manner. First, substrate 310 is fixed on stage 622 by vacuum suction, for example. Coating liquid tank 470 to which a prescribed amount of coating liquid 322 has been introduced is positioned at a start end of the area of the surface requiring coating of substrate 310, at the upper end side of the substrate. The tank is moved horizontally from a position apart from the substrate 310 toward the substrate 310 such that there is formed a gap 478 having the size G between front end surface 476 of coating liquid tank 470 and the surface to be coated of substrate 310, and at this position, the tank is stopped. In this case, the pressure in coating liquid tank 470 is so set as to prevent outflow of the coating liquid 322 from coating liquid tank, by using pressure setting system 400. For example, the pressure of coating liquid tank 470 is set to the open air state (ambient). By doing so, the coating liquid will not flow out from coating liquid tank 470 through coating liquid outlet path 474.

It goes without saying that the apparatus 620 may be operated such that a prescribed amount of coating liquid 322 is introduced to coating liquid tank 470 after the gap 478 having the size G is formed.

By using pressure setting system 400, pressure in coating liquid tank 470 is increased so that coating liquid flows from coating liquid tank 470 through coating liquid outlet path 474 to the gap 478. Consequently, part of the pool 484 is formed in gap 478. Thereafter, in order to prevent forceful outflow of the coating liquid out from the coating liquid tank 470, coating liquid tank 470 is opened to the air, for example. Thus a strip shaped pool 484 is formed in the gap 478.

After the strip shaped pool 484 is formed in the gap 478, coating liquid tank 470 is moved in the vertical direction while maintaining the gap 478 having the size G between front end surface 476 of coating liquid tank 470 and the surface to be coated of substrate 310. More specifically, coating liquid tank 470 moves in the direction denoted by the arrow a in FIG. 34.

At this time, at the start position of coating, detector 626 detects the speed of movement of the meniscus at the upper end of pool 484. Based on the detection signal, control system 628 controls the linear driving mechanism, which is not shown, so that the speed of movement of coating liquid tank 470 is adjusted, and the speed of lowering of the meniscus at the upper end of pool 484 is substantially constant.

After coating liquid tank 470 starts downward movement and reaches a constant speed, the coating liquid tank 470 is continuously moved downward while keeping the constant speed. The coating liquid tank 470 is stopped after it reaches the position denoted by the two dotted line in FIG. 34.

In this manner, coating liquid tank 470 moves from the vicinity of the upper end to the vicinity of the lower end of substrate 310, and coating liquid in the pool 484 is brought into contact with the surface area of substrate 310 that requires coating. Thus a coating film 644 is formed as shown in FIG. 37. During coating, the coating liquid in the pool 484 in gap 478 is consumed to form the coating film 644. The amount of coating liquid corresponding to the consumed amount is supplied from coating liquid tank 470 through coating liquid outlet path 474 to gap 478 at least by capillary action, and the amount of coating liquid in the pool 484 in gap 478 is kept constant.

When coating liquid tank 470 has reached the position near the lower end of substrate 310 and is stopped, application of the coating liquid to the surface of substrate 310 is completed. Substrate 310 is removed from stage 622. At this time, coating liquid tank 470 is moved in the horizontal direction away from stage 622, or stage 622 is moved horizontally away from coating liquid tank 470. This facilitates removal of substrate 310 from stage 622. When coated substrate 310 is removed from stage 622, the operation returns to the first step to be ready for the coating of the next substrate.

In the coating apparatus of the twelfth embodiment, the linear driving mechanism is controlled so that at least at the position where coating begins, the speed of movement of the meniscus at the upper end of pool 484 is substantially constant. The speed of movement of the meniscus is one of the critical factors such as the size G of gap 478, characteristics of coating liquid 322, wettability of the surface to be coated of substrate 310 or of front end surface 476 of coating liquid tank 470, for determining the thickness of the coating film thus formed. The lower the speed of movement of the meniscus with respect to the surface to be coated, the film thickness of the formed coating film becomes thinner, and the higher the speed, the thicker the film thickness. In the present invention, the speed of movement of the meniscus at the upper end of the pool 484 is kept substantially constant, the thickness of the coating film formed on the surface of substrate 310 is also constant. Therefore, the thickness of the coating liquid stays within the tolerable range at the vicinity of the coating start position.

Various methods other than that described above may be used for forming the pool 484 in the twelfth embodiment. For example, after the gap 478 is formed, pressure in coating liquid tank 470 may be increased until a strip shaped pool 484 is formed. After the formation of gap 478, the coating liquid tank 470 may be opened to the air so as to form the strip shaped pool 484. Alternatively, the strip shaped pool 484 may be formed by adjusting the pressure in coating liquid tank 470 to a value that permits coating liquid 322 to be supplied to gap 478 from coating liquid tank 470 through coating liquid outlet path 474 at least by capillary action. The pressure in the tank and pressurization and/or opening to the air may be combined.

In any case, after the strip shaped pool 484 is formed, it is necessary to adjust the pressure in coating liquid tank 470 such that coating liquid in pool 484 does not flow out of gap 478 and that coating liquid 322 is supplied from coating liquid tank 470 to the gap 478 during the process of coating. One possibility is that coating liquid tank 470 be at ambient pressure (opened to the air).

In the above described embodiment, the linear control mechanism is controlled based on the detection signal from detector 626 while the speed of movement of coating liquid tank 470 is kept constant or within a tolerable range. However, the present invention is not so limited. For example, while keeping the speed of movement of coating liquid tank 470 at a constant speed or within a tolerable range, the pressure adjusting portion of pressure setting system 400 may be controlled based on the detection signal from detector 626 to adjust the pressure in coating liquid tank 470, so that the speed of movement of the meniscus at the upper end of pool 484 is substantially constant.

When coating liquid tank 470 is moved in a direction away from stage 622, the coating liquid in pool 484 flows down while it is adhered on the coating surface of substrate 310 or front end surface 476 of coating liquid tank 470, so that liquid which drops from the lower edge of substrate 310 cannot be used in the subsequent coating step. Therefore, before separating coating liquid tank 470 horizontally from stage 622, pressure in coating liquid tank 470 is reduced by using pressure setting system 400, so as to recover the coating liquid in pool 484 by returning it to coating liquid tank 470 through coating liquid outlet path 474. At this time of recovery, the area of the front end surface 476 of coating liquid tank 470 from the outlet 480 of coating liquid outlet path 474 to the upper edge must not be below the lower end side of substrate 310, and the gap 478 must be maintained between front end surface 476 and the surface to be coated of substrate 310.

Thirteenth Embodiment

Figure 39:
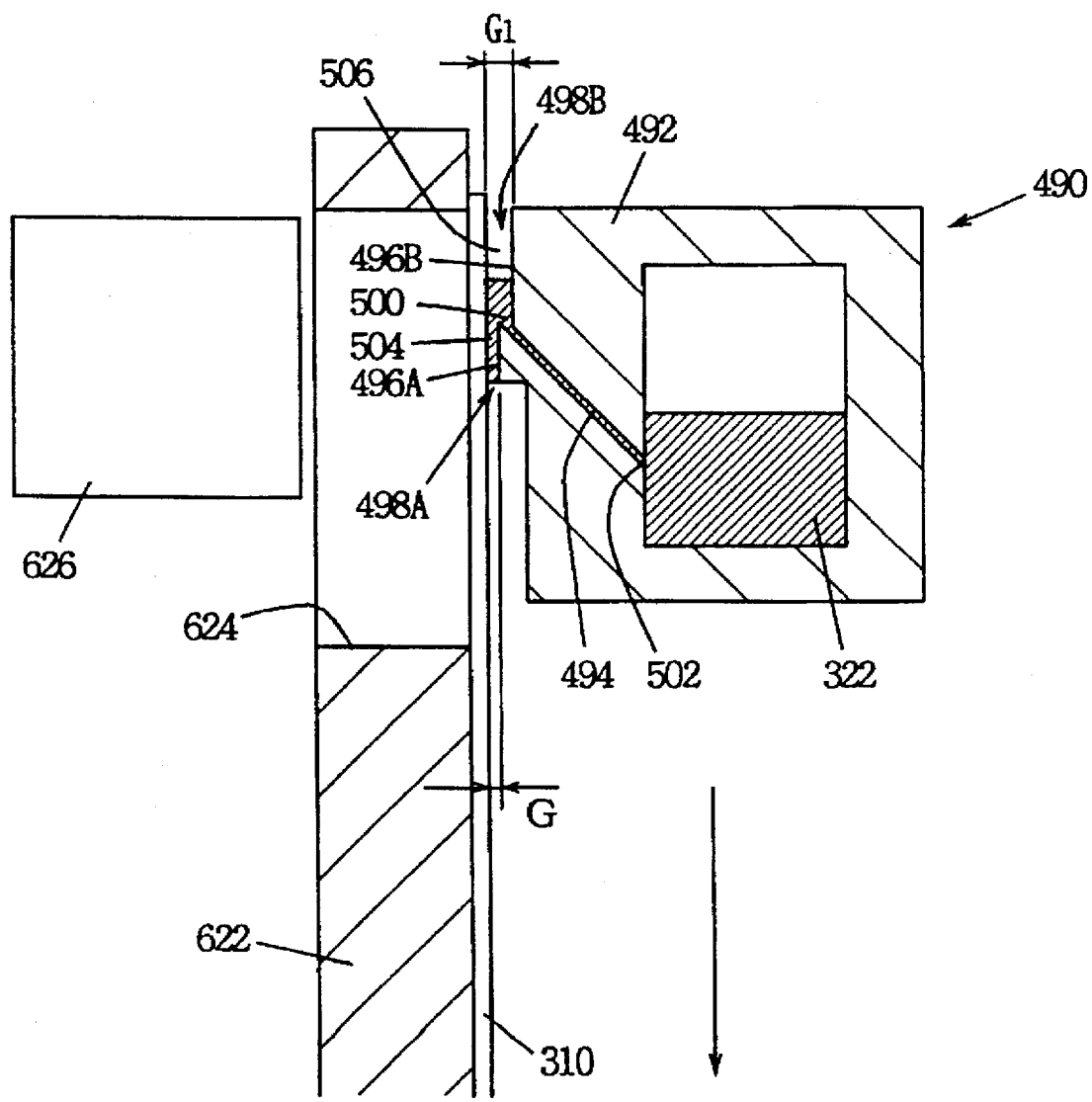
FIG. 39 is an enlarged vertical section of the main portion of coating apparatus constructed in accordance with a thirteenth embodiment of the present invention.

Referring to FIG. 39, the coating apparatus of the thirteenth embodiment differs from the twelfth embodiment only in that in place of coating liquid tank 470 of the coating liquid apparatus of the twelfth embodiment shown in FIGS. 34 to 38, the coating liquid tank 490 shown in FIG. 21 is used. In FIGS. 21, 34 to 38 and 39, the same portions are denoted by the same reference characters and referred to by the same names, and components have similar functions. Therefore, detailed description thereof is not repeated.

It can be readily understood by those skilled in the art that similar effects as in the twelfth embodiment can be obtained by using the coating apparatus of the thirteenth embodiment.

Fourteenth Embodiment

Figure 40:
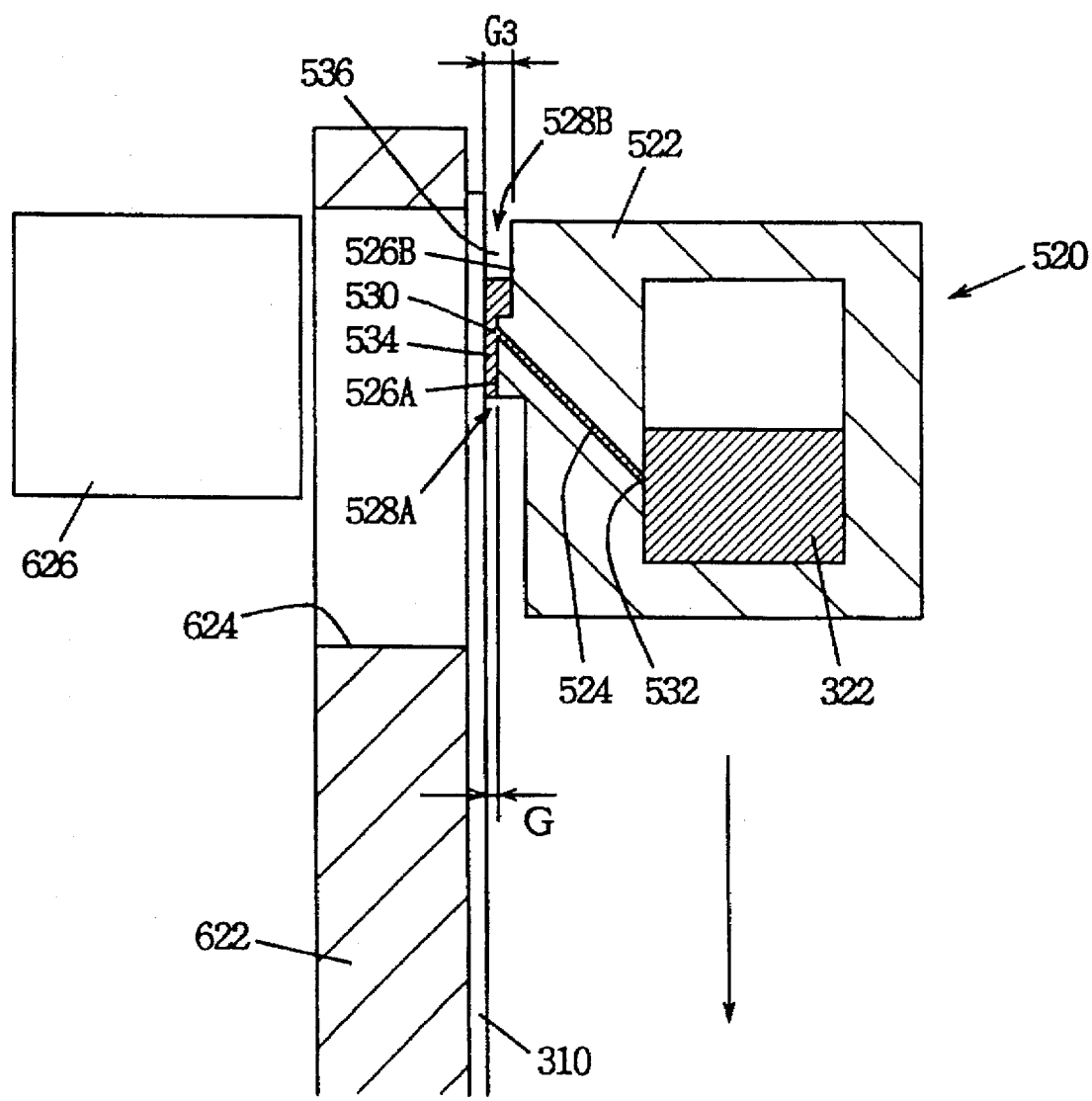
FIG. 40 is an enlarged vertical section of the main portion of coating apparatus constructed in accordance with a fourteenth embodiment of the present invention.

FIG. 40 is an enlarged vertical section of a main portion of the coating apparatus constructed in accordance with the fourteenth embodiment. The coating apparatus of the fourteenth embodiment is the same as the coating apparatus of the twelfth embodiment except that the coating liquid tank 520 shown in FIG. 22 is used instead of the coating liquid tank 470 of the twelfth embodiment. In FIGS. 22, 34 to 38 and 40, the same components are denoted by the same reference characters, are referred to by the same names, and they have similar functions. Therefore, detailed description thereof is not repeated.

The same effects as in the twelfth and thirteenth embodiments can be obtained by using the coating apparatus of the fourteenth embodiment.

Fifteenth Embodiment

Figure 41:
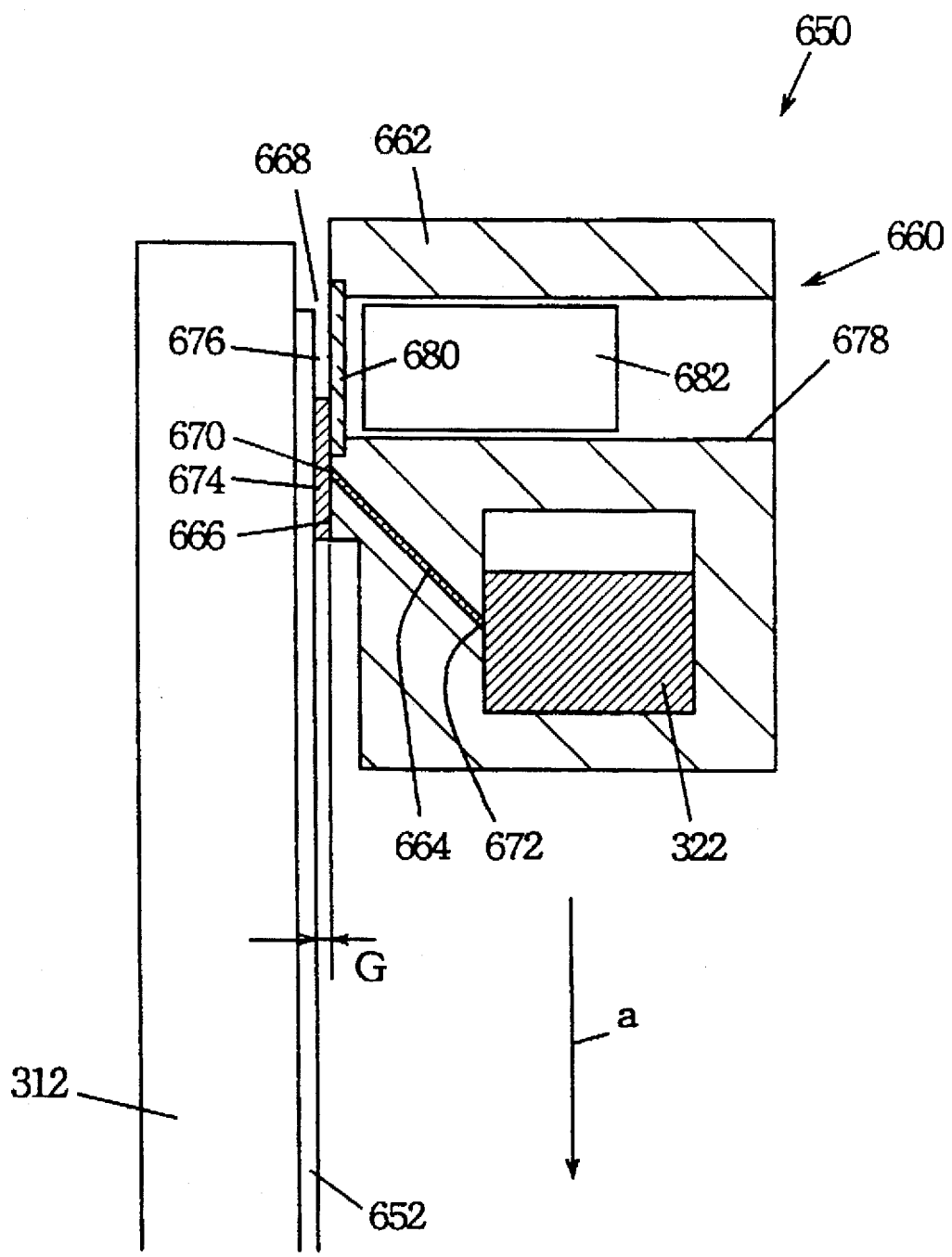
FIG. 41 is an enlarged vertical section of the main portion of coating apparatus constructed in accordance with a fifteenth embodiment.

FIG. 41 is an enlarged vertical section of a main portion of the coating apparatus constructed in accordance with the fifteenth embodiment of the present invention, which allows detection of the speed of movement of the upper end of the pool even when the substrate is not transparent. In this coating apparatus, it is possible to confirm formation of the strip shaped pool between the coating liquid tank and the surface to be coated of the substrate, at the coating start position.

Referring to FIG. 41, the coating apparatus 650 includes a stage 312 holding a substrate 652 which is not transparent, and a coating liquid tank 660 arranged such that a gap 668 having the size G is formed between the tank and the surface to be coated of the substrate 652 held by stage 312, and a linear driving mechanism (not shown) which can move the coating liquid tank 660 in the direction denoted by the arrow a. The apparatus 650 may further include an apparatus (not shown) for moving the stage 312 and coating liquid tank 660 horizontally away from each other.

Front wall portion 662 of coating liquid tank 660 is formed such that upper part thereof protrudes forward as front end surface 666. Coating liquid tank 660 has a hollow shape and has a space for storing coating liquid 322 therein. The space defined by tank 660 communicates with gap 668 formed between the surface to be coated of substrate 652 and front end surface 666, through coating liquid outlet path 664. Coating liquid outlet path 664 has an outlet 670 opened to the front end surface 666, and an inlet 672 opened to the inner space of coating liquid tank 660 at a position lower than the outlet 670. Front end portion 666 is formed such that its lower edge is positioned at a level between the levels of outlet 670 and inlet 672 of coating liquid outlet path 664, and upper edge of portion 666 extends to the upper surface of coating liquid tank 660. The level of the upper edge of front end surface 666 is selected such that assuming that front end surface 666 is indefinitely extended upward, the upper edge is positioned higher than the maximum height of the coating liquid in the pool in gap 668 rising at least by capillary action.

At an upper portion of coating liquid tank 660, a through hole 678 is formed which passes through in the forward and rearward directions at least at a part in the widthwise direction. At an opening on the side of front end surface 666 where it is intersected by through hole 678, a transparent body 680 such as a transparent glass plate is fitted, and the front wall surface of transparent glass plate 680 forms part of the front end surface 666. In through hole 678 and opposite glass plate 680, a detector 682 is provided for detecting the speed of movement of the upper end of pool 674 in gap 668. Detector 682 detects the speed of movement of the upper end of pool 674 in gap 668 through transparent glass plate 680, and provides a detection signal. The speed of coating liquid tank 660 is controlled by using the detection signal.

It should be noted that in this coating apparatus 650, detector 682 moves downward together with the coating liquid tank 660. Therefore, what is detected by detector 682 is the relative speed of movement of the meniscus at the upper end of pool 674 with respect to the coating liquid tank 660.

For the control system controlling the speed of movement of the linear driving mechanism such as described above, a control system for adjusting the pressure in coating liquid tank 660 may be used. By setting the relative speed of movement of the meniscus at the upper end of pool 674 with respect to the coating liquid tank 660 to zero by using the control system. The thickness of the coating film formed can be made constant even at the position where coating starts.

The operation for applying the coating liquid to the surface of substrate 652 by using coating apparatus 650 shown in FIG. 41 is the same as that of the twelfth embodiment. However, in the coating apparatus 650, detector 682 moves downward together with the upper end of pool 674. Therefore, the relative speed of movement of the meniscus at the upper end of pool 674 with respect to the coating liquid tank 660 can be detected by the detector 682 not only at the coating start position but at other positions. Further, the state of the pool 674 formed in gap 668 can be observed at any time during coating. Naturally, the coating apparatus 650 can also be utilized effectively when coating a transparent substrate.

Instead of providing detector 682 in coating liquid tank 660, such as shown in FIG. 41, the detector may be provided separate from the coating liquid tank. In that case, the detector may be moved at the same speed as the speed of movement of the coating liquid tank, or the detector may be stationary.

In order to ensure application of coating liquid to the substrate 652, it is preferred that the coating operation be started after confirmation of the formation of the strip shaped pool 674 along the widthwise direction of substrate 652 in gap 668. For that confirmation, a detector may be used. As the detector, detector 682 shown in FIG. 41 may be used. Alternatively, other detectors may be provided so as to confirm formation of the pool 674. When the coating liquid tank 660 shown in FIG. 41 is used, it is not necessary to provide a through hole in the stage 312 for confirming formation of the pool at the start position of coating. However, the coating apparatus may be provided by combining the coating liquid tank 660 shown in FIG. 41 and the stage 622 having the through hole such as shown in FIG. 34. In that case, if the substrate is transparent, it is possible to detect the speed of movement of the meniscus at the upper end of pool 674 by using detector 682 in coating liquid tank 660 and to detect the state of formation of pool 674, by arranging illumination on the rear side of the stage.

Sixteenth Embodiment

An embodiment using approximately the same hardware structure of the coating apparatus shown in the twelfth embodiment but performing different control will be described. In this coating apparatus, neither the detector 626 shown in FIG. 34 nor the control system 628 is necessary. A further difference from the coating apparatus shown in FIG. 34, is that it is not necessary to provide a through hole in the stage.

Referring to FIG. 34, in the twelfth embodiment, the coating liquid tank 470 is moved such that the speed of movement of the meniscus at the upper end of pool 484 formed in the gap 478 between the surface of substrate 310 and front end surface 476 of coating liquid tank 470 is kept substantially constant. Assume that the speed of movement of the coating liquid tank 470 is instantly increased to the desired speed and the coating liquid tank 470 and the surface to be coated of the substrate 310 are moved at a constant speed relative to each other within a tolerable speed range.

Figure 42:
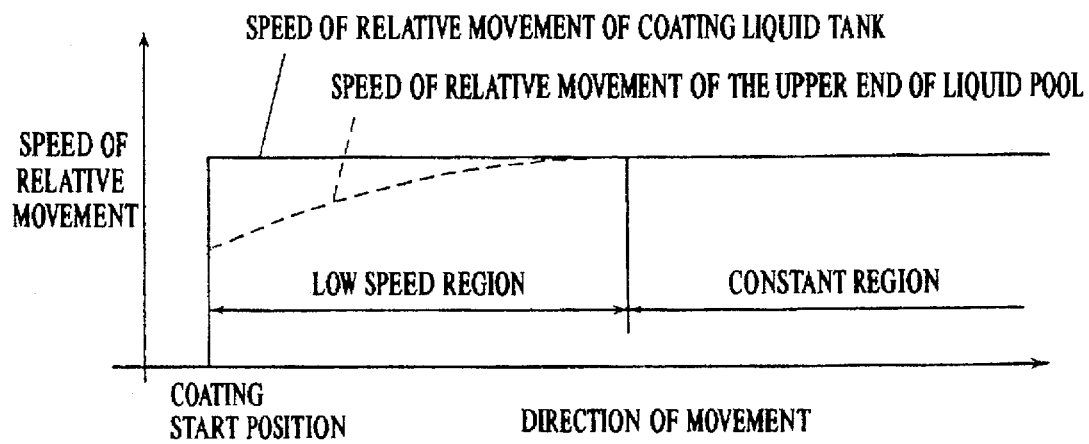
FIGS. 42 to 45 are graphs showing the principle of operation of coating apparatus constructed in accordance with a sixteenth embodiment of the present invention.

In this case, from the start of relative movement to a certain time period, the speed of relative movement of the coating liquid tank 470 and the surface to be coated of the substrate 310 and the speed of relative movement of the meniscus at the upper end of the pool 484 of the coating liquid and the surface to be coated of the substrate 310 are not equal to each other. As shown by the dotted line in FIG. 42, there is a region in which the speed of relative movement between the upper end of the pool 484 and the surface of the substrate 310 is lower than the speed of relative movement between the coating liquid tank 470 and the surface of the substrate 310 (low speed region). A constant region in which both speeds of relative movement are the same follows the low speed region.

Figure 43:
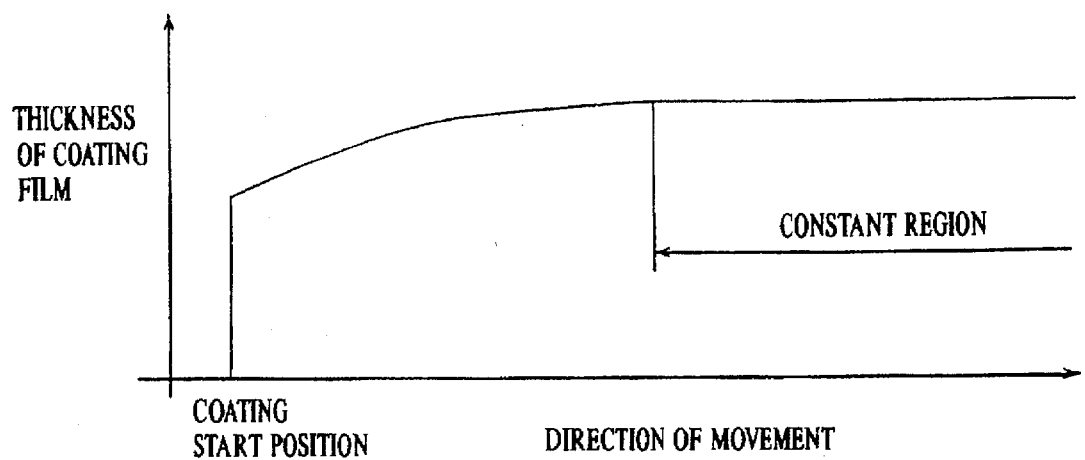

As already described, the lower the speed of relative movement of the meniscus at the upper end of the pool of the coating liquid and the surface to be coated of the substrate, the thinner the film thickness of the coating film formed on the surface of the substrate, and the higher the speed of relative movement, the thicker the coating film. In the low speed region shown in FIG. 42, the speed of relative movement of the upper end of the pool of the coating liquid and the surface to be coated on the substrate is lower than the constant speed, and therefore the film thickness of the coating film corresponding to this region is thinner. As a result, as shown in FIG. 43, that area of the substrate which corresponds to the portion from the coating start position to the low speed region shown in FIG. 42 has the thickness of the coating film thinner than the tolerable range. This area is invalid, and therefore the valid area of the coated substrate is reduced.

In the twelfth to fifteenth embodiments above, the speed of movement of the coating liquid tank is controlled such that the speed of relative movement of the meniscus at the upper end of the pool of coating liquid and the surface to be coated of the substrate is substantially constant. Therefore, the thickness of the coating film applied on the surface of the substrate is also constant, and even near the coating start position, the thickness of the coating film may not be out of the tolerable range.

In this sixteenth embodiment, the above described effect can be obtained in the following manner. First, a curve indicative of the change in film thickness along the direction of movement of coating liquid tank 470 of the film applied on the surface of the substrate 310 is obtained in advance through experiment. The curve would be similar to that shown in FIG. 43.

Further, in advance, the relation between the speed of movement of the meniscus at the upper end of pool 484 in the constant region and the thickness of the coating film is calculated through experiment. Since the speed of movement of the meniscus at the upper end of pool 484 and the speed of movement of coating liquid tank 470 is equal to each other in the constant region, what is necessary is to obtain the relation between the speed of movement of coating liquid tank 470 and the thickness of the coating film through experiment.

Figure 44:
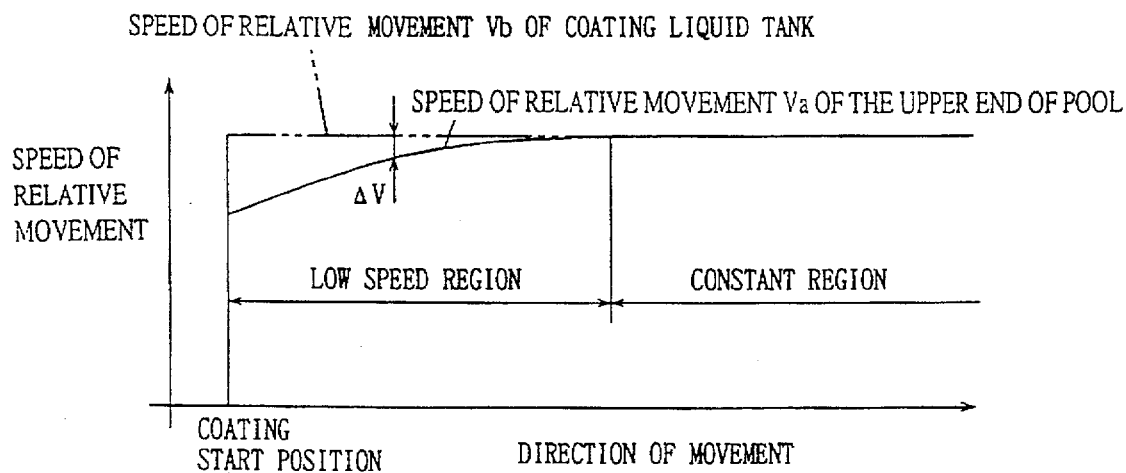

Thereafter, a line indicative of the change in the thickness of coating film such as shown in FIG. 43 is converted to a curve such as shown in FIG. 44 which represents the change in the speed of relative movement Va of the meniscus at the upper end of pool 484 at various positions along the direction of movement of coating liquid tank 470. FIG. 44 also shows, by two dotted lines, the line indicative of the change in the speed of relative movement Vb of coating liquid tank 470 at various positions along the direction of movement of coating liquid tank 470.

Figure 45:
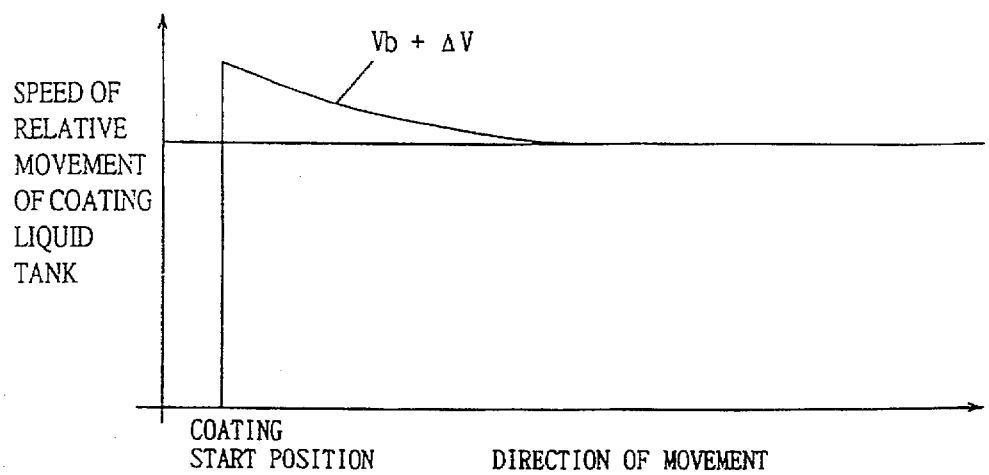
Figure 46:
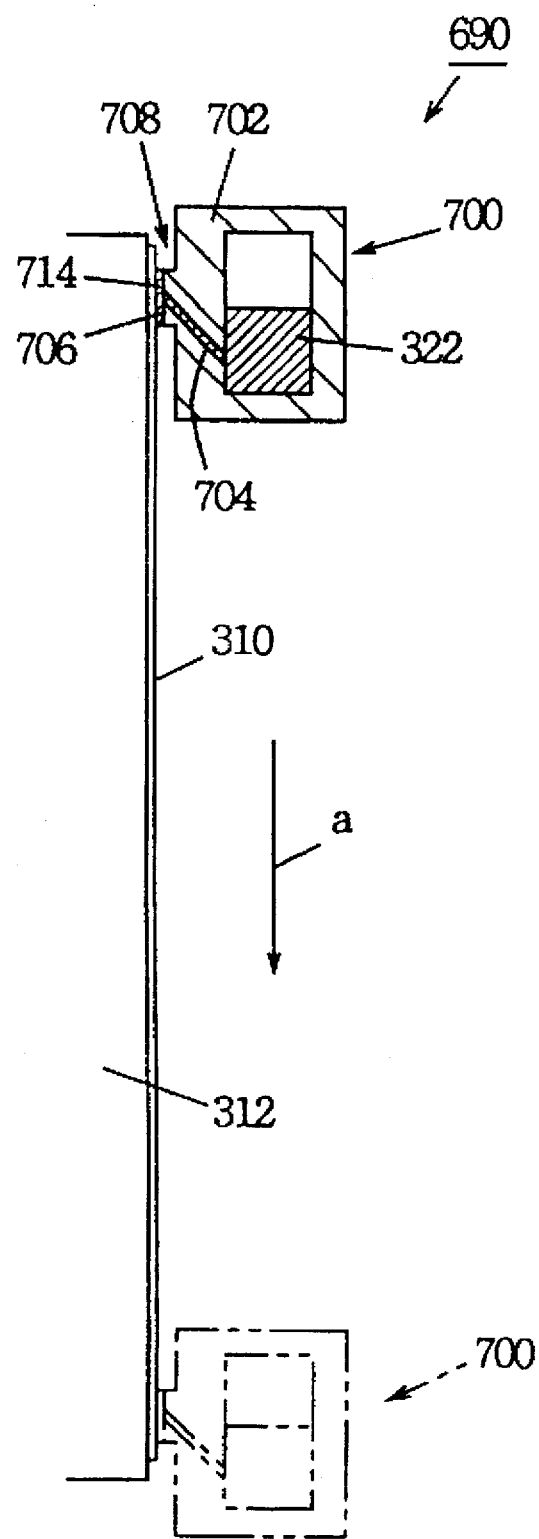
FIG. 46 is a vertical section of the main portion of coating apparatus constructed in accordance with a seventeenth embodiment of the present invention.

Then, the difference between the speed of movement Vb of coating liquid tank 470 and the speed of movement Va of the upper end of liquid pool 484 is represented by ΔV (see FIG. 44). By adding ΔV to the speed of movement Vb of coating liquid tank 470, a curve shown in FIG. 45 is obtained. The curve of FIG. 45 represents the change in the speed of relative movement of coating liquid tank 470 at various positions in the direction of movement of coating liquid tank 470. When the coating liquid tank 470 is moved downward by such a speed as shown in FIG. 45, the speed of movement of coating liquid tank 470 is increased near the start position of coating by the amount (ΔV) which corresponds to the lower speed of movement Va of the meniscus at the upper end of pool 484 which is lower than the original speed of movement Vb of the coating liquid tank 470. By doing so, the speed of relative movement of pool 484 with respect to the surface to be coated of the substrate 310 can be made substantially constant.

The linear driving mechanism moving the coating liquid tank 470 is specifically controlled in the following manner. In accordance with the curve shown in FIG. 45, data representing the change in the speed of movement of coating liquid tank 470 at various positions along the direction of movement of coating liquid tank 470 is stored in a memory, for example, as control data. If the data has been amended through experiment, then the amended data is stored as control data in a memory or the like. When the coating liquid is applied to the surface of substrate 310, the linear driving mechanism is controlled based on the control data stored in the memory by the controlling apparatus, so as to adjust the speed of movement of coating liquid tank 470. Therefore, the speed of movement of the meniscus at the upper end of pool 484 in gap 478 shown in FIG. 34 becomes substantially constant even near the start position of coating. There would not be a portion having thin coating film near the start position of coating, and therefore valid area of the coating film can be extended.

In the above described embodiment, it is assumed that the speed is instantly increased to the desired speed and then the coating liquid tank 470 is moved at a constant speed thereafter, in calculating the control data. Based on such assumption, the curve shown in FIG. 43 representing the change in thickness of the coating film along the direction of moving of coating liquid tank 470 when coating liquid is applied to the surface of substrate 310 has been calculated. However, in calculating the control data, the method and conditions for starting movement of the coating liquid tank 470 is not limited to the above described method. The method of calculating control data is not limited to the above described method, either.

Another possibility is as follows: By using another coating apparatus, the speed of movement of the meniscus at the upper end of the pool formed in the gap between the surface to be coated of the substrate and the front end surface of coating liquid tank is detected, and coating liquid is applied to the surface of the substrate while controlling the speed of movement of the coating liquid tank such that the speed of movement is kept substantially constant. The speed of movement of the coating liquid tank at that time is continuously measured. In accordance with the actually measured value, control data is calculated. If correction of the measured value is necessary, the control data may be calculated in accordance with the corrected measured value.

In the above described embodiment, the speed of movement of the coating liquid tank is controlled. However, the parameter to be controlled is not limited to the speed of movement of the coating liquid tank. For example, pressure in the coating liquid tank may be controlled. In that case, control data serving as a reference for controlling the pressure in the coating tank at various positions along the direction of movement of the coating liquid tank which allows the speed of movement of the meniscus at the upper end of the pool to be substantially constant, is calculated in advance. In that case, the control data may be calculated as a curve representing the change in the pressure in the coating liquid tank. Application of the coating liquid to the surface of the substrate may be carried out by adjusting the pressure in the coating liquid tank, based on the control data calculated in this manner.

The following problem may arise near the position of completion of coating. After the outlet of the coating liquid outlet path formed at the front wall portion of the coating liquid tank goes out below the lower end position of the substrate, supplying of the coating liquid from the coating liquid tank through coating liquid outlet path to the gap between surface to be coated of the substrate and the front end surface of front wall portion is stopped. The speed of movement of the meniscus at the upper end of the pool in the gap becomes higher than the speed of movement of the coating liquid tank by such a speed that corresponds to the amount of coating liquid applied to the surface of the substrate and consumed. Therefore, near the position where coating is completed, when the coating liquid tank is moved downward at a constant speed, the speed of movement of the meniscus at the upper end of the pool becomes higher than that of the coating liquid tank. Therefore, near the position of completion of coating, the thickness of the coating film becomes thicker.

One method for preventing such problem is to adjust the pressure in the coating liquid tank or to adjust the speed of movement of the coating liquid tank in the similar manner as described above, so as to keep substantially constant the speed of meniscus at the upper end of the pool.

Seventeenth Embodiment

In the above described embodiments, except the first embodiment, the outlet of coating liquid outlet path is above its inlet, and the shape of the front wall portion of the coating liquid tank is selected such that the lower edge of the front end surface of the front wall portion of the coating liquid tank is positioned between the outlet and inlet of the coating liquid outlet path. Further, the amount of supply of the coating liquid is selected such that the surface of the coating liquid in the coating liquid tank is at a level between the inlet of the coating liquid outlet path and the lower edge of the front end surface of the coating liquid tank.

However, as in some of the embodiments described above, when pressure setting system 400 for adjusting the pressure in coating liquid tank is provided, the coating apparatus is free from the above described limitation in the shape of the coating liquid outlet path, the positional relation between the outlet and inlet of the coating liquid outlet path and the lower edge of the front end surface of coating liquid tank, and in the surface of the coating liquid introduced to the coating liquid tank. One example will be described with reference to FIGS. 46 to 49 which illustrate coating apparatus 690 constructed in accordance with the seventeenth embodiment.

Figure 47:
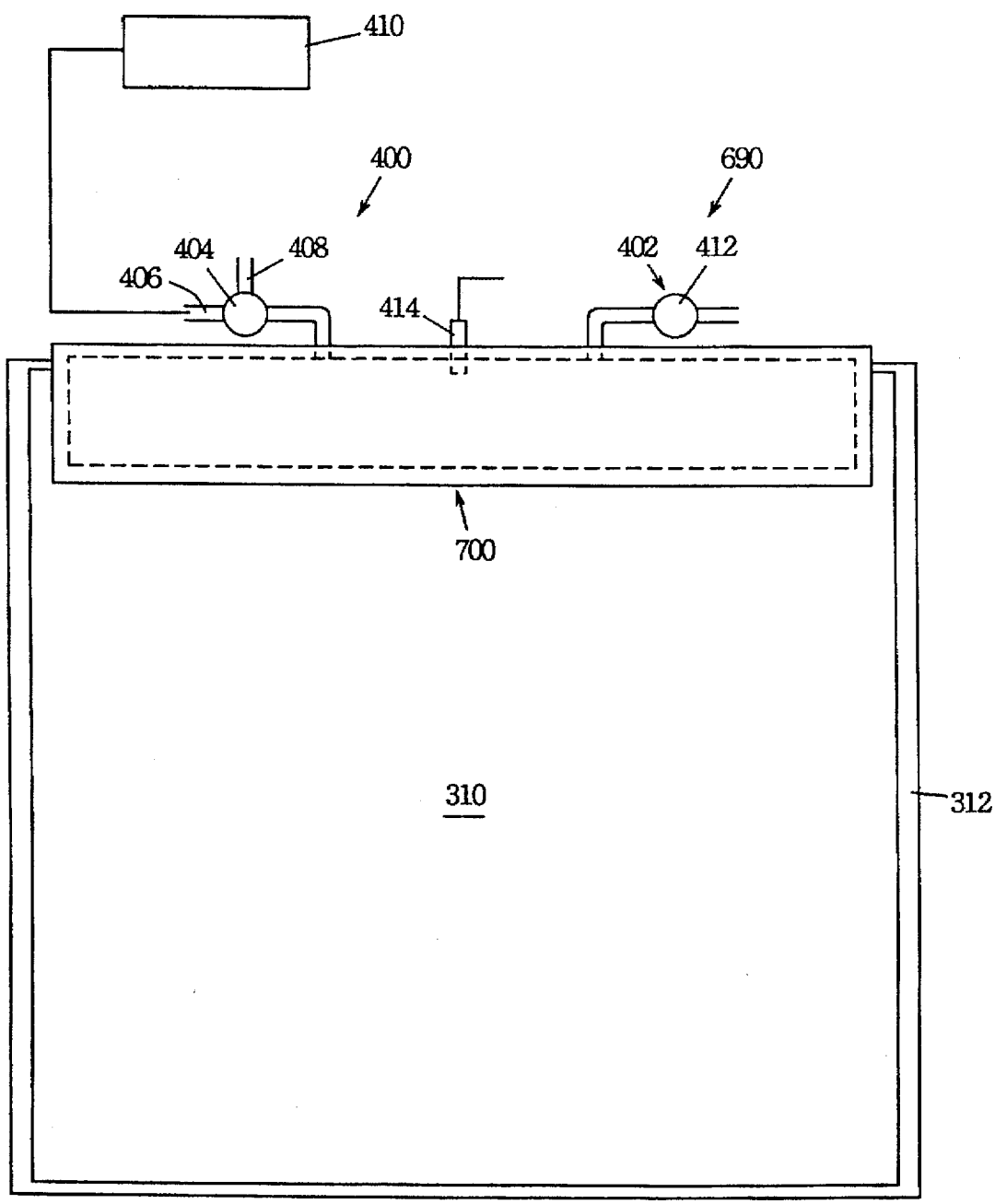
FIG. 47 is a front elevation of the main portion of the coating apparatus in accordance with the seventeenth embodiment of the present invention.
Figure 48:
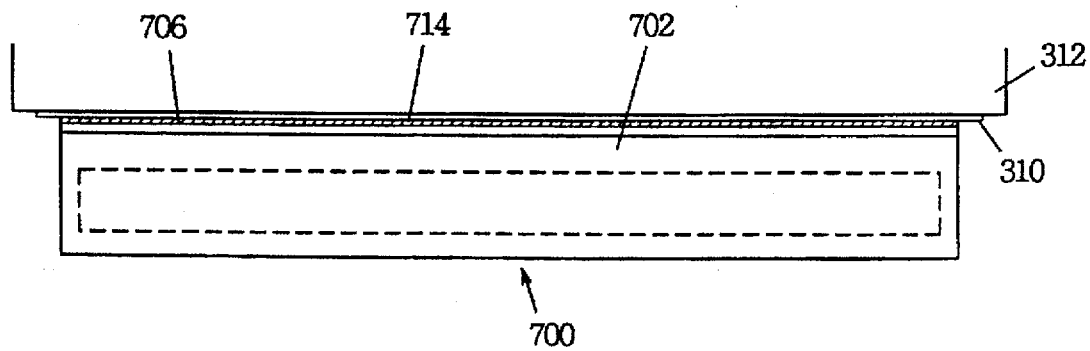
FIG. 48 is a plan view of the main portion of the coating apparatus in accordance with the seventeenth embodiment of the present invention.

Apparatus 690 includes a stage 312 holding a substrate 310, a coating liquid tank 700 positioned in opposition to the surface to be coated of substrate 310 with a gap 708 having a prescribed size G provided between itself and the surface to be coated of the substrate 310, and a linear driving mechanism (not shown) for moving coating liquid tank 700 relative to the substrate 310. Especially as shown in FIG. 47, coating apparatus 690 further includes pressure setting system 400 and coating liquid supply system 402. Pressure setting system 400 and coating liquid supplying system 402 are the same as those shown in FIG. 13, for example, and therefore a detailed description thereof is not repeated.

Figure 49:
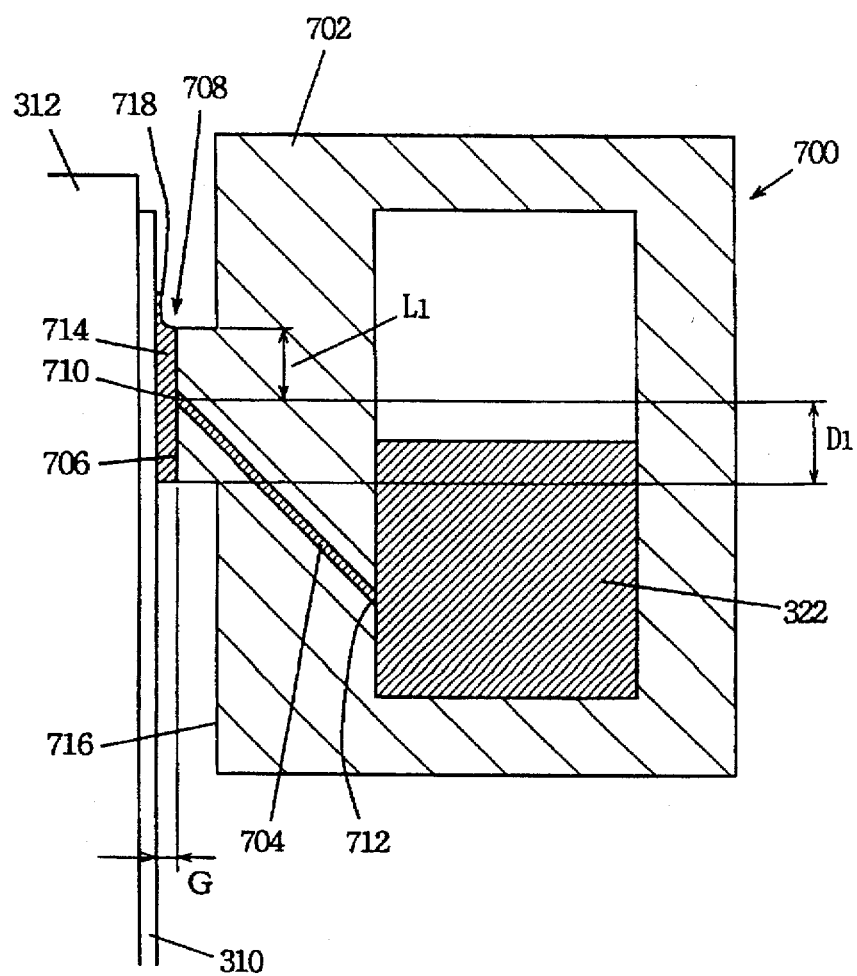
FIG. 49 is an enlarged vertical section of the coating liquid tank in accordance with the seventeenth embodiment of the present invention.

Mainly referring to FIG. 49, coating liquid tank 700 has a hollow body extending along the widthwise direction of substrate 310 with opposing ends closed, and has a space therein for storing coating liquid 322. In front wall portion 702 of coating liquid tank 700, there is formed a coating liquid outlet path 704 for supplying the coating liquid 322 from the coating liquid tank 700 to the gap 708.

A portion of front wall portion 702 protrudes forward from other portions entirely over the widthwise direction, thus providing front end surface 706. The gap 708 having size or thickness G is formed between front end surface 706 and the surface to be coated of substrate 310, as already described.

The outlet 710 of coating liquid outlet path 704 is opened at front end surface 706, and the inlet 712 is opened to the coating liquid tank 700 at a level below the lower edge of front end surface 706.

The mechanism for moving coating liquid tank 700 relative to the substrate 310 and for separating the tank relatively from the substrate 310 may be the same as one of those used in the embodiments described above.

The size G of gap 708 between front end surface 706 of coating liquid tank 700 and the surface to be coated of substrate 310 has significant influence on the quality of coating. The size G is selected within such a range that capillary action develops, taking into consideration the speed of movement of coating liquid tank 700, fluidity and material values of coating liquid 322, wettability of the surface to be coated of substrate 310 and wettability of the front end surface 706, for example. In selecting the size G, efficiency of using the coating liquid and stability in keeping pool 714 in the gap 708 may also be taken into account.

The size of coating liquid outlet path 704 is selected such that flow of coating liquid 322 from coating liquid tank 700 to the gap 708 at least by capillary action and formation of the strip shaped pool 714 in gap at least by capillary action are ensured. Further, the size of the coating liquid outlet path 704 must be set within a range that allows formation of a satisfactory coating film, even at the start of coating.

The front wall surface 716 other than the front end surface 706 of the front wall portion 702 of coating liquid tank 700 is formed such that coating liquid in pool 714 does not flow into the gap formed between the front wall surface 716 and the surface to be coated of the substrate 310 at least by capillary action. Therefore, the pool 714 in gap 708 has its lower end regulated by the lower end of the front end surface 706. The upper edge of pool 714 is regulated by the upper edge of front end surface 706. Thus, setting of the pressure in the coating liquid tank 700 by the pressure setting system 400 ensures that no coating liquid in the pool 714 flows from the gap 708.

If the pressure setting system 400 is provided in this manner, the substrate 310 need not be kept vertical at all times, as shown in the figure. For example, the substrate 310 may be inclined by an appropriate angle so that the surface to be coated faces upward or downward, and the angle of inclination may be set considerably large, thanks to the existence of the pressure setting system 400.

The coating apparatus 690 having the above described structure operates in the following manner. First, substrate 310 is fixed on stage 310 by vacuum suction. As shown in FIG. 49, coating liquid 322 is supplied from coating liquid supplying system 402 to coating liquid tank 700. The amount of supply of the coating liquid 322 is determined such that the surface of the liquid is positioned at a level between the outlet 710 of coating liquid outlet path 704 and the lower edge of front end surface 706. More specifically, the coating liquid is introduced to the coating liquid tank 700 so that the surface level is within the range D1 of FIG. 49, while detecting the surface level of the coating liquid by using detector 414 shown in FIG. 47.

At this time, the coating liquid tank 700 may be opened to the air by operating switch valve 404 of pressure setting system 400 so as to keep the coating liquid within the coating liquid tank 700 which would otherwise flow out of the tank 700 through coating liquid outlet path 704 because the pressure in coating liquid tank 700 increases as the coating liquid is supplied.

When a prescribed amount of coating liquid 322 is introduced to coating liquid tank 700, coating liquid 322 goes upward through coating liquid outlet path 704 at least by capillary action, and reaches the position of the outlet 710. Coating liquid 322 flows in the gap 708 formed between the surface to be coated of substrate 310 and front end surface 706 of coating liquid tank 700, and spreads entirely over the gap 708 at least because of capillary action. By adjusting the pressure in coating liquid tank 700 appropriately by using pressure setting system 400, and by regulation of the flow of the coating liquid at the upper and lower edges of front end surface 706, a strip shaped pool 714 of the liquid is formed along the widthwise direction of substrate 310. The pool 714 is constantly communicated with the coating liquid 322 in coating liquid tank 700 through coating liquid outlet path 704.

The method for initially forming the pool 714 at the coating start position is not limited to the method described above. One possibility is to force formation of a part of the pool 714 by pressurizing the inside of the coating liquid tank 700 by using pressure setting system 400. Thereafter, the pressure in the coating liquid tank 700 is set to a pressure that prevents outflow of the coating liquid from the tank forcefully through coating liquid outlet path 704. This allows formation of a strip shaped pool 714. Another possibility is to form the pool 714 forcefully by supplying coating liquid 322 to the gap 708 by increasing the pressure in coating liquid tank 700. Still another possibility is to open the coating liquid tank 700 to the air, from the start of coating until the formation of a strip shaped pool 714.

In any case, at the latest by the time the strip shaped pool 714 is formed, the pressure in the coating liquid tank 700 must be set to a value that prevents outflow of the coating liquid from the lower edge of front end surface 706 and that allows a sufficient amount of coating liquid 322 to flow from coating liquid tank 700 to the pool 714 in the gap 708 during the process of coating, as will be described later.

When strip shaped pool 714 is formed in gap 708, coating liquid tank 700 is moved in the longitudinal direction (direction denoted by the arrow a of FIG. 46) of the substrate, while maintaining the gap 708 of the size G between front end surface 706 and the surface to be coated of substrate 310. After the coating liquid tank 700 is moved to the position denoted by the two dotted lines in FIG. 46 and the upper edge of front end surface 706 goes out of the area requiring coating of the substrate 310, coating liquid tank 700 is stopped. As coating liquid tank 700 moves from the vicinity of the upper end to the vicinity of the lower end of substrate 310, the coating liquid in pool 714 is in contact with the area requiring coating of the surface 310, and thus coating film 718 is formed as shown in FIG. 49.

During the process of coating, coating liquid in the pool 714 of gap 708 is applied to the surface of the substrate 310 and thus consumed. An amount of coating liquid corresponding to the amount of consumption of the coating liquid is supplied from coating liquid tank 700 through coating liquid outlet path 704 to gap 708 at least by capillary action, and thus the amount of coating liquid in pool 714 in the gap 708 is maintained constant.

When coating is completed, substrate 310 is removed from the stage 312. At this time, when coating liquid tank 700 is moved horizontally to a direction away from stage 312 or stage 312 is moved horizontally away from coating liquid tank 700, substrate 310 can be readily removed. When substrate 310 is removed from stage 312, the operation returns to the first step for the coating of the next substrate 310.

At the end of coating, when coating liquid tank 700 is moved away from the stage 312, the gap 708 is widened, and the pool 714 is destroyed. The coating liquid in pool 714 flows downward while it is adhered on the front end surface 706 of coating liquid tank 700 and the surface to be coated of substrate 310, and thus the liquid cannot be used for subsequent coating. In order to save the coating liquid, the pressure in the coating liquid tank 700 may be reduced by using pressure setting system 400 so as to recover the coating liquid in pool 714 in gap 708 through coating liquid outlet path 704 back to the coating liquid tank 700, before moving coating liquid tank 700 away from the stage 312. At the time of recovery of the coating liquid, the range of the front end surface 706 from the outlet 710 of the coating liquid outlet path 704 to the upper edge of the front end surface 706 must not be out from the lower end of substrate 310. Further, the positional relation between stage 312 and the coating liquid tank 700 must be kept such that the gap 708 is formed between the front end surface 706 and the surface to be coated of substrate 310.

Eighteenth Embodiment

Figure 50:
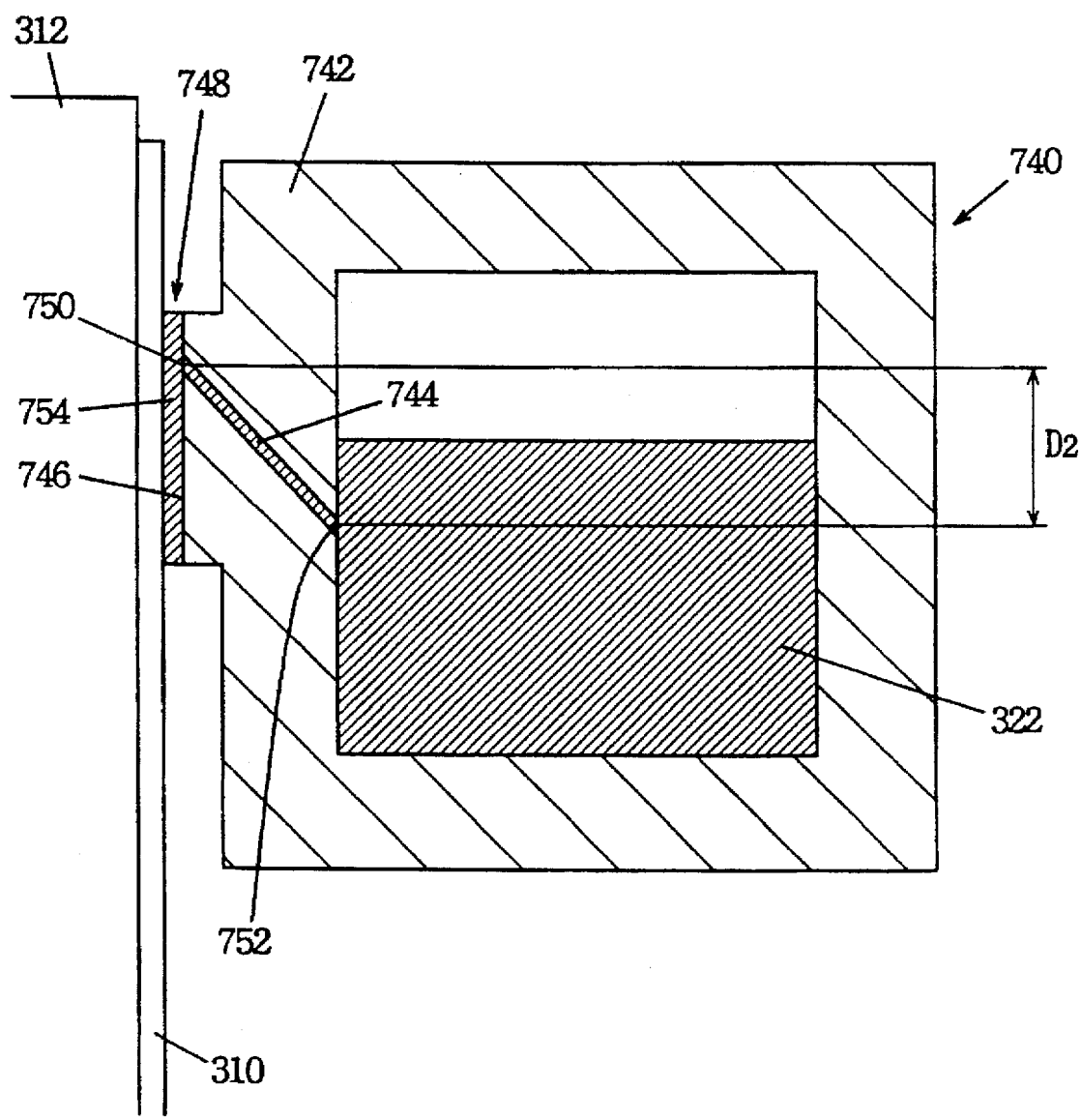
FIG. 50 is an enlarged vertical section of the coating liquid tank of coating apparatus constructed in accordance with an eighteenth embodiment of the present invention.

FIG. 50 is a vertical section of a coating liquid tank 740 of the coating apparatus in accordance with the eighteenth embodiment. The coating liquid tank 740 may be used instead of the coating liquid tank 700 of the seventeenth embodiment. In the coating liquid tank 740 shown in FIG. 50, positional relation between the outlet 750 and inlet 752 of coating liquid outlet path 744 is different from the positional relation between outlet 710 and inlet 712 of coating liquid outlet path 704 of coating liquid tank 700 of FIG. 49. In coating liquid tank 740, front wall portion 742 is formed such that the lower end of front end surface 746 of front wall portion 742 is positioned lower than the inlet 752 of coating liquid outlet path 744.

Coating liquid 322 is introduced to coating liquid tank 740 such that the surface of the coating liquid is positioned at a level within the range D2 between outlet 750 and inlet 752 of coating liquid outlet path 744. The coating liquid which has flown into the gap 748 from coating liquid tank 740 through coating liquid outlet path 744 forms a pool 754 in gap 748. The lower end of pool 754 is regulated by the lower edge of front end surface 746, and the upper end of pool 754 is regulated by the upper edge of front end surface 746. In order to prevent outflow of the coating liquid in pool 754 from gap 748, pressure in the coating liquid tank 740 is adjusted by pressure setting system 400, not shown in FIG. 50.

The same effect as in the coating apparatus of the seventeenth embodiment can be obtained when the coating liquid tank 740 of FIG. 50 is used.

Nineteenth Embodiment

Figure 51:
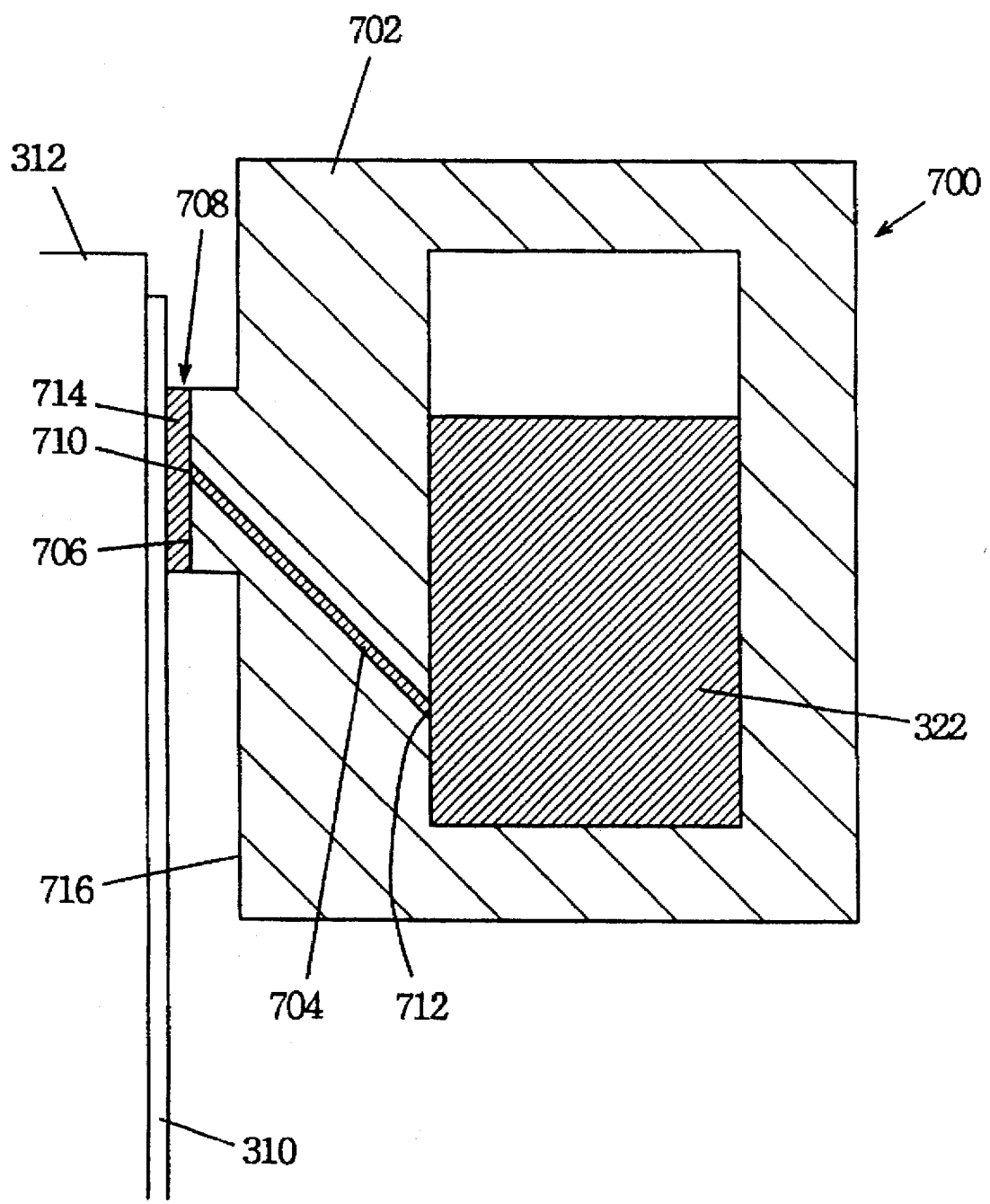
FIG. 51 is an enlarged vertical section of the coating liquid tank of coating apparatus constructed in accordance with a nineteenth embodiment of the present invention.

FIG. 51 is a cross section of a coating liquid tank 700 used in the coating apparatus constructed in accordance with the nineteenth embodiment of the present invention.

The structure of the coating liquid tank 700 is the same as the coating liquid tank 700 shown in FIG. 49. In FIGS. 51 and 49, the same components are denoted by the same reference characters and referred to by the same names. They have similar functions. Therefore, detailed descriptions thereof is not repeated.

The coating apparatus in accordance with the nineteenth embodiment differs from the coating apparatus of the seventeenth embodiment in that coating liquid 322 is introduced to coating liquid tank 700 such that the surface level thereof is positioned higher than the outlet 710 of coating liquid outlet path 704. By providing pressure setting system 400 for adjusting pressure in the coating liquid tank 700, the coating liquid 322 may be introduced in such a manner as shown in FIG. 49.

Twentieth Embodiment

Figure 52:
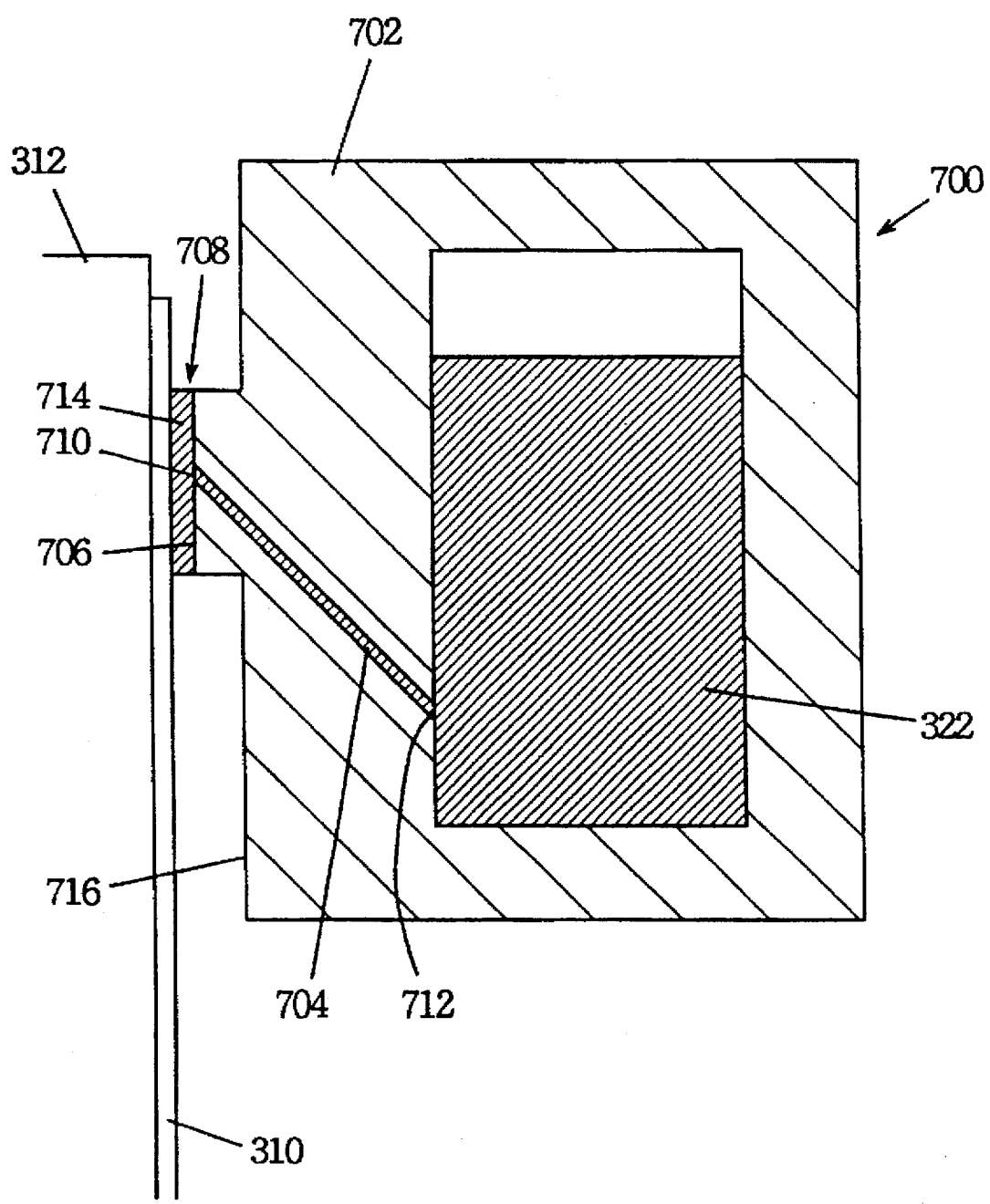
FIG. 52 is an enlarged vertical section of the coating liquid tank of coating apparatus constructed in accordance with a twentieth embodiment of the present invention.

FIG. 52 is a cross section of the coating liquid tank 700 used in the coating apparatus constructed in accordance with the twentieth embodiment of the present invention. The coating liquid tank 700 is also the same as the coating liquid tank 700 shown in FIGS. 51 and 49. In the coating apparatus in accordance with the twentieth embodiment, the coating liquid 322 is introduced to the coating liquid tank 700 such that the surface of the liquid is at a level positioned above the upper edge of front end surface 706 of front wall portion 702. In this case also, the pressure in coating liquid tank 700 is adjusted by using pressure setting system 400 (not shown) so as to prevent outflow of the coating liquid from the pool 714.

Twenty-First Embodiment

Figure 53:
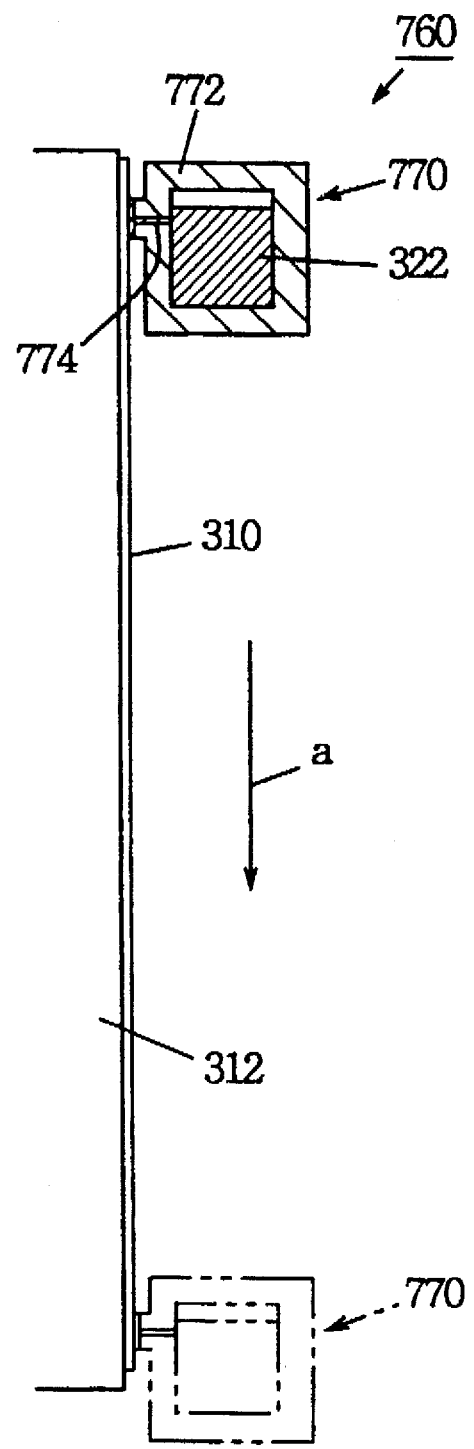
FIG. 53. is a vertical section of a main portion of coating apparatus constructed in accordance with a twenty-first embodiment of the present invention.

FIG. 53 is a vertical section of a main portion of the coating apparatus 760 constructed in accordance with the twenty-first embodiment of the present invention. The coating apparatus 760 differs from the coating apparatuses of the seventeenth to twelfth embodiments in that it includes a coating liquid tank 770 in place of coating liquid tank 700. Coating liquid tank 770 has front wall portion 772 and a front end surface protruding from front wall portion 772. Horizontal coating liquid outlet path 774 is formed through front wall portion 772 from coating liquid tank 770 to have an opening at the front end surface.

In coating liquid tank 770, coating liquid 322 is introduced such that the surface level of the liquid is positioned higher than the coating liquid outlet path 774. The coating liquid tank 770 is also movable in the direction of the arrow a as in other embodiments, and the size of the gap between the front end surface and the surface to be coated of substrate 310 is kept constant.

Other portions of the apparatus of this embodiment shown in FIG. 53 are the same as the corresponding portions of the seventeenth embodiment, and therefore detailed descriptions thereof is not repeated.

Twenty-Second Embodiment

Figure 54:
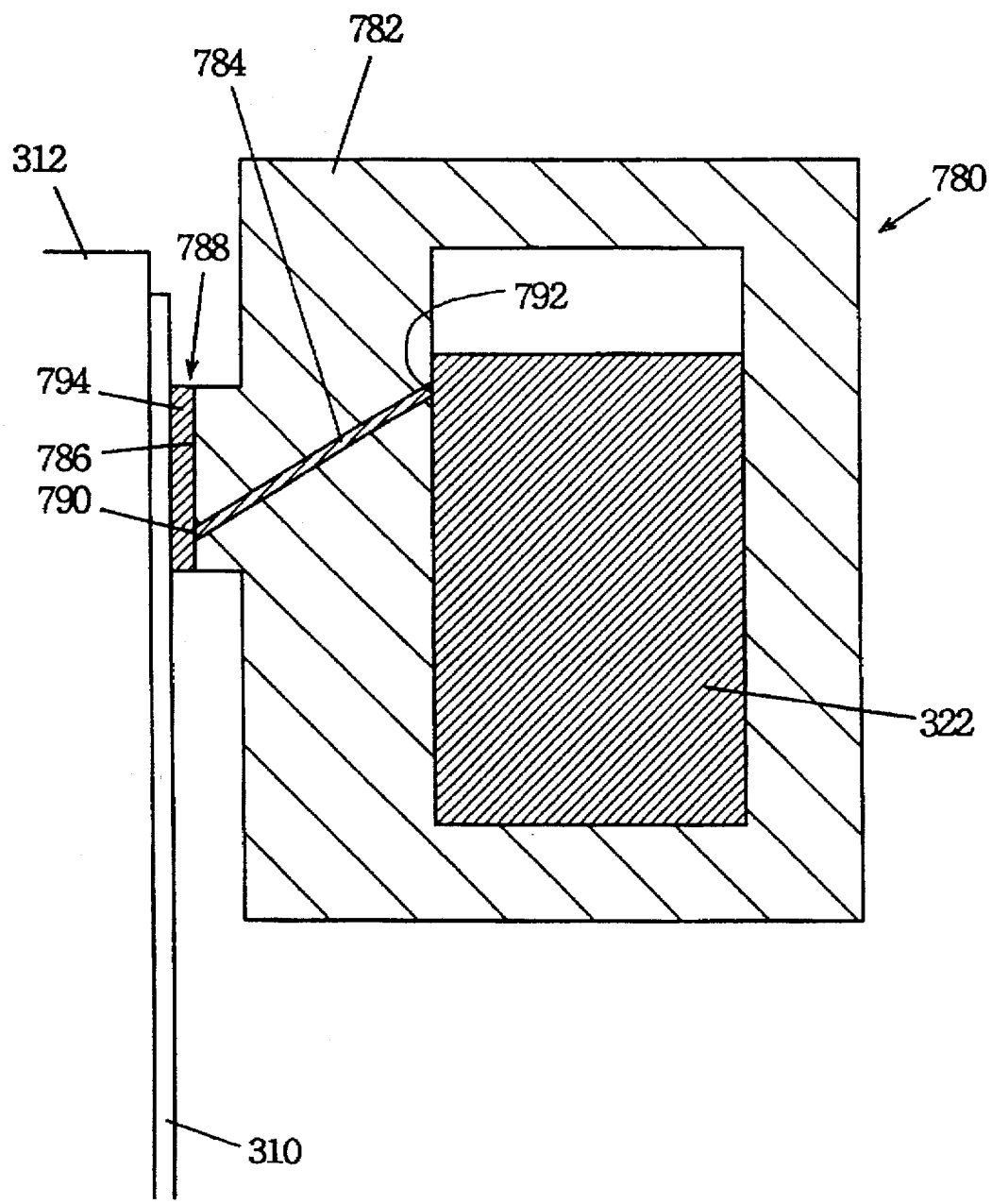
FIG. 54 is an enlarged vertical section of the coating liquid tank of coating apparatus constructed in accordance with a twenty-second embodiment of the present invention.

FIG. 54 is a cross section of a coating liquid tank 780 used in the coating apparatus constructed in accordance with the twenty-second embodiment of the present invention. The coating liquid tank 780 shown in FIG. 54 has the front end surface 786 formed protruding from front wall portion 782, and a coating liquid outlet path 784 inclined downward from coating liquid tank 780 to be opened at the outlet 790 on the front end surface 786. The coating liquid outlet path 784 is opened at inlet 792 in coating liquid tank 780. The lower end of front end surface 786 is formed to be positioned lower than the outlet 790 of coating liquid outlet path 784. As for the position of inlet 792, it is depicted as being positioned approximately at the same height as the upper end of front end surface 786 in FIG. 54. However, it may be higher or lower than that position. Coating liquid 322 is introduced into tank 780 such that the surface of liquid 322 is positioned at a level above inlet 792.

Pool 794 is formed by the coating liquid flowing from tank 780 through coating liquid outlet path 784 to gap 788 between the front end surface 786 and the surface to be coated of substrate 310. The upper end of pool 794 is regulated by the upper edge of front end surface 786, and the lower end of pool 794 is regulated by the lower edge of front end surface 786. The pressure in coating liquid tank 780 is set by a pressure setting system (not shown) so as to prevent outflow of the coating liquid in pool 794 from gap 788. Other portions of the coating apparatus in accordance with the twenty-second embodiment are the same as the corresponding portions of the seventeenth embodiment. Therefore, a detailed description thereof is not repeated.

Now, in the coating apparatuses in accordance with the seventeenth to twenty-second embodiments above, the upper ends of pools 714, 754, and 794 in respective gaps 708, 748 and 788 are regulated by the upper edge of front end of respective surfaces 706, 746 and 786 of respective coating liquid tanks 700, 740 and 780. Therefore, there is a possibility of the following problem, which will be described with reference to the seventeenth embodiment as an example.

Figure 55:
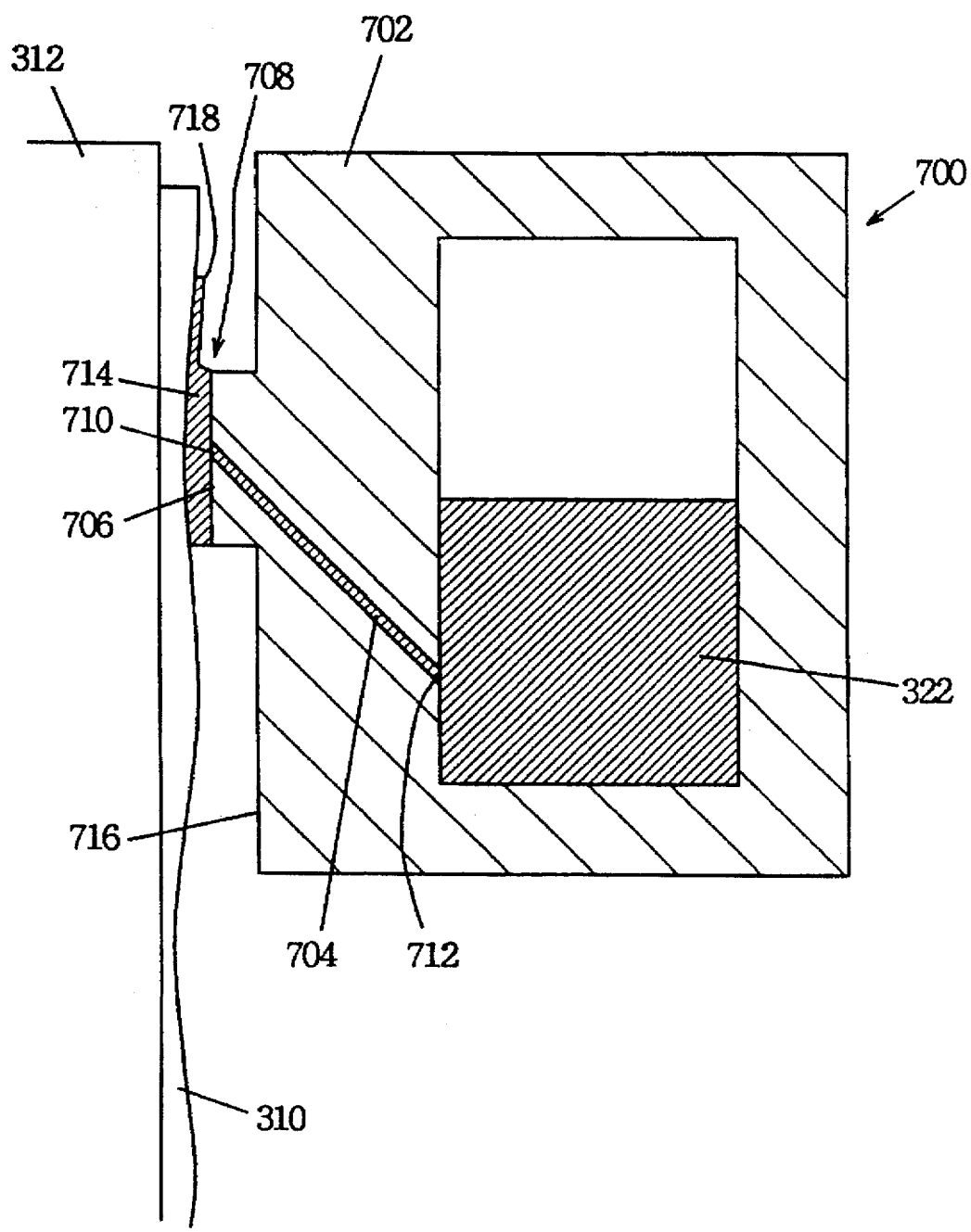
FIGS. 55 to 57 illustrate a problem related to use of the coating liquid tank shown in FIG. 49.

Referring to FIG. 55, let us consider a process of applying coating liquid to the surface of substrate 310 by moving the coating liquid tank 700 downward. In that case, it is possible that the size of gap 708 between the front end surface 706 and the surface to be coated of substrate 310 is not constant. This may be caused by the waviness of the surface to be coated of substrate 310, the waviness of the surface to be coated along the widthwise direction of the substrate 310 or the precision in movement when the coating liquid tank 700 is moved downward.

Figure 56:
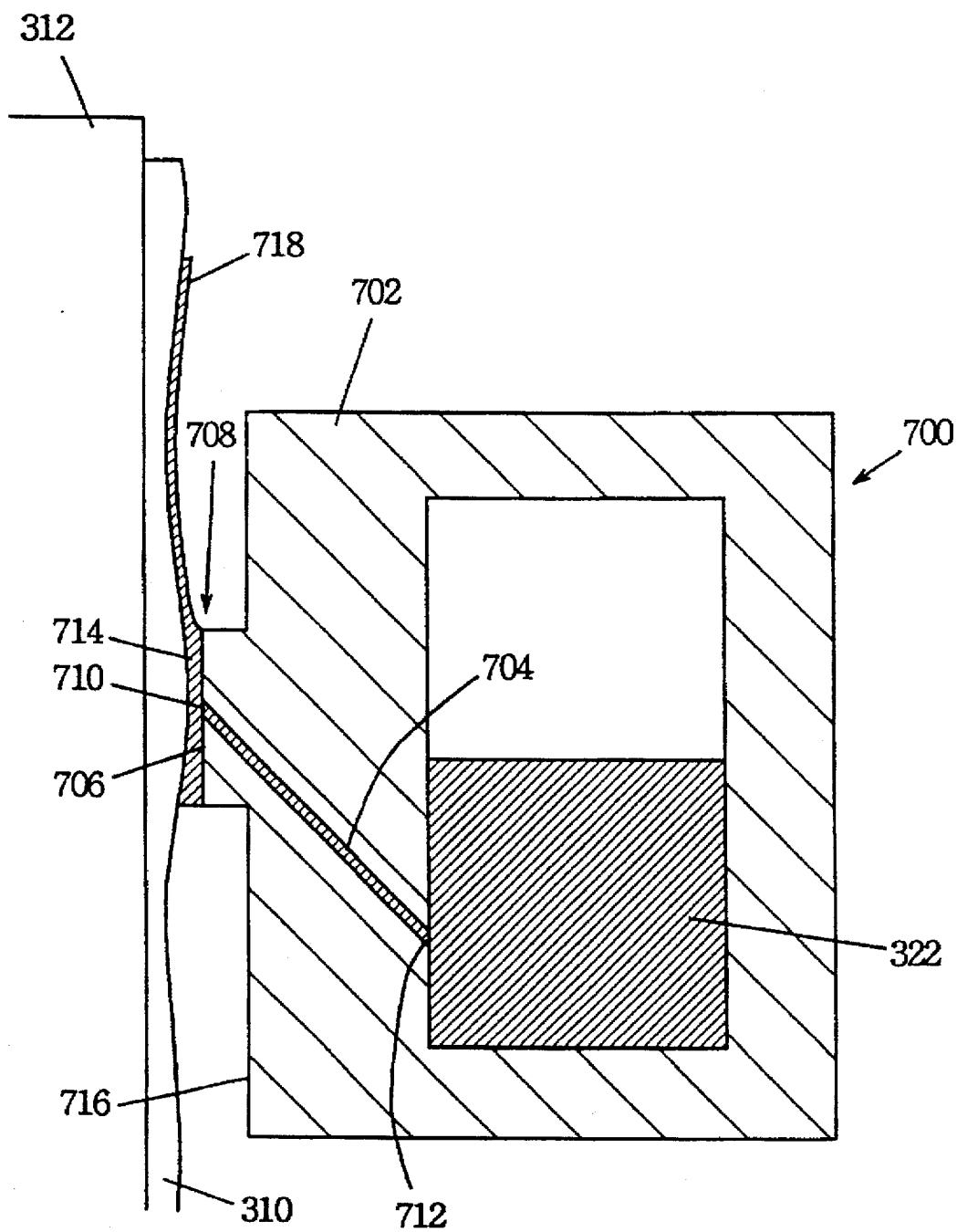

It is possible that the gap between the surface to be coated of substrate 310 and the front end surface 706 may become larger. In that case, the volume of the space sandwiched between the front end surface 706 and the surface to be coated is increased. Then, as shown in FIG. 56, assume that the size of gap 708 is reduced and the volume of the stage sandwiched between front end surface 706 and the coating surface is reduced. At this time, it is possible that part of the coating liquid goes out over the upper edge of front end surface 706, from the pool 714 in gap 708. Consequently, the meniscus at the upper end of the pool 714 may become inappropriate to maintain a stable film thickness, resulting in degradation of quality of the coating film, such as uneven film thickness.

Figure 57:
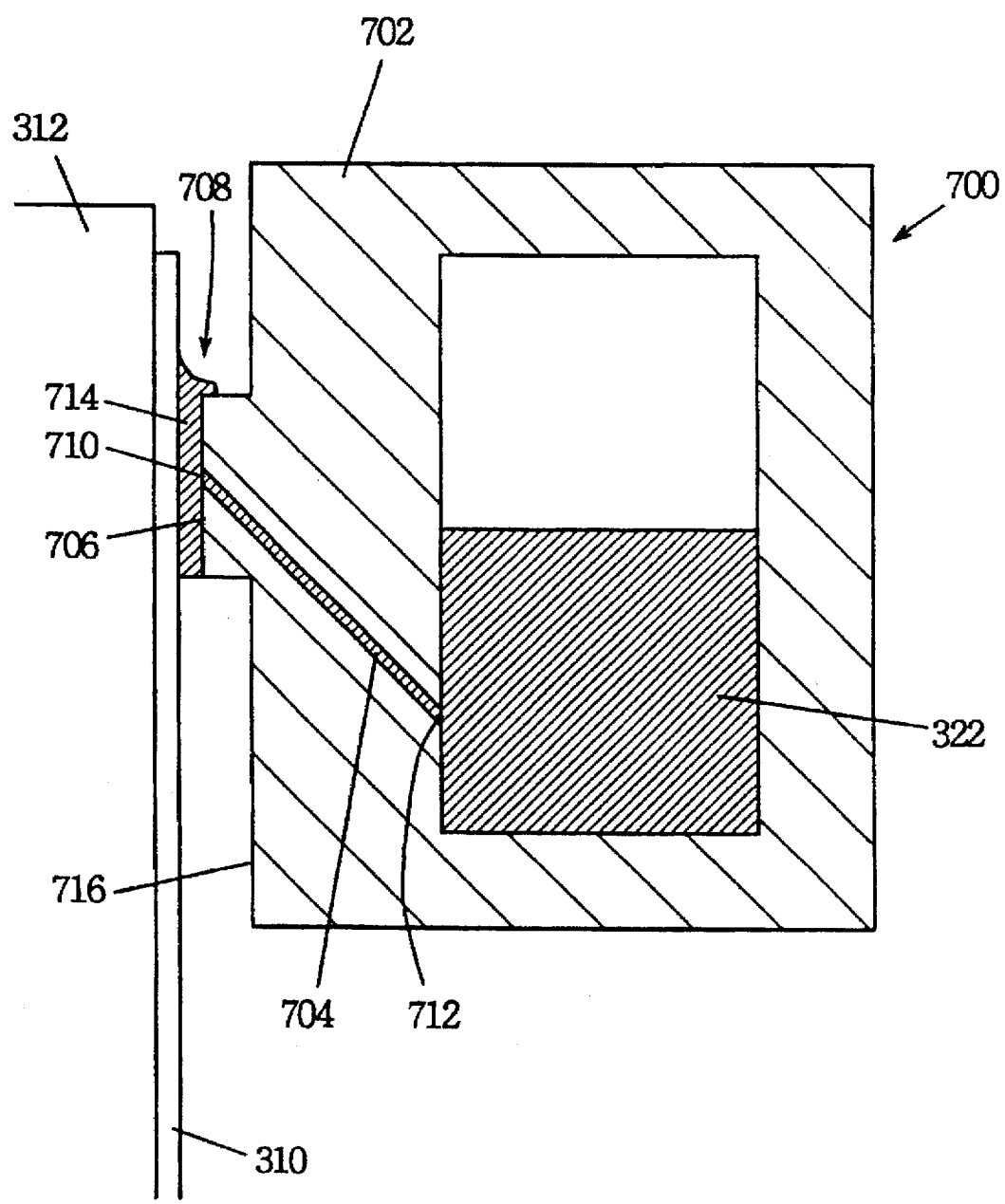

Referring to FIG. 57, when pool 714 is formed in gap 708 between front end surface 706 of coating liquid tank 700 and the surface to be coated of substrate 310 and coating is to be started by moving the coating liquid tank 700 downward, it is possible that the coating liquid in pool 714 flows out over the upper edge of front end surface 706. In this case also, the state of the meniscus at the upper end of pool 714 may become unacceptable, causing poor quality of the provided coating film.

Twenty-Third Embodiment

Figure 58:
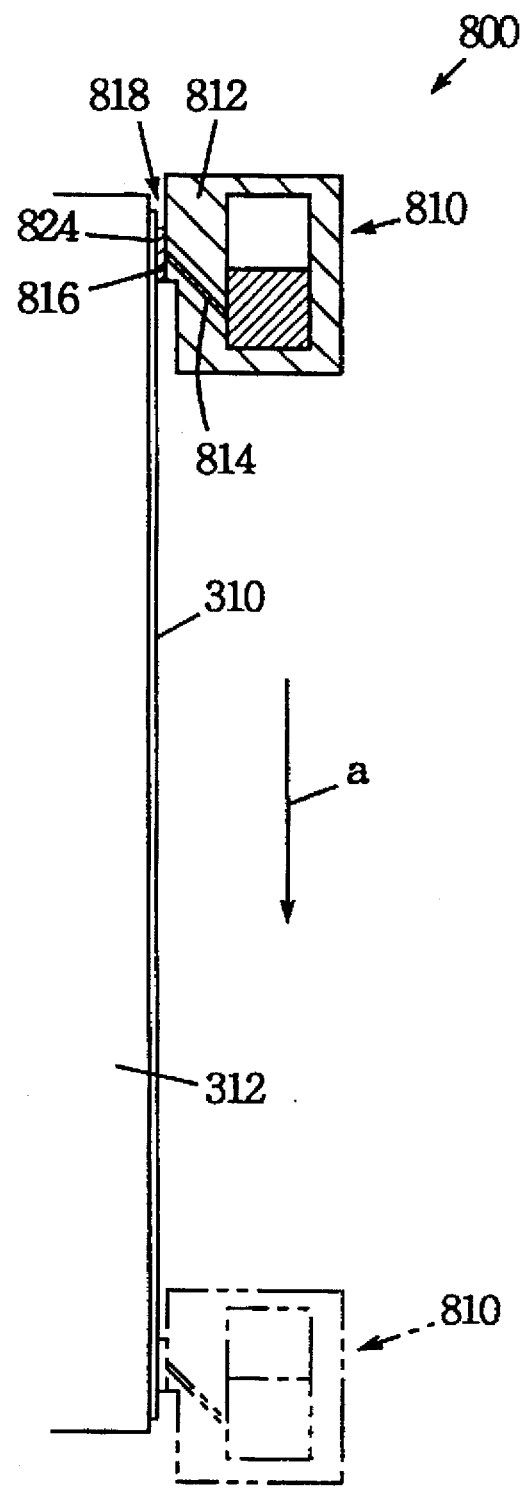
FIG. 58 is a vertical section of the main portion of coating apparatus constructed in accordance with a twenty-third embodiment of the present invention.
Figure 59:
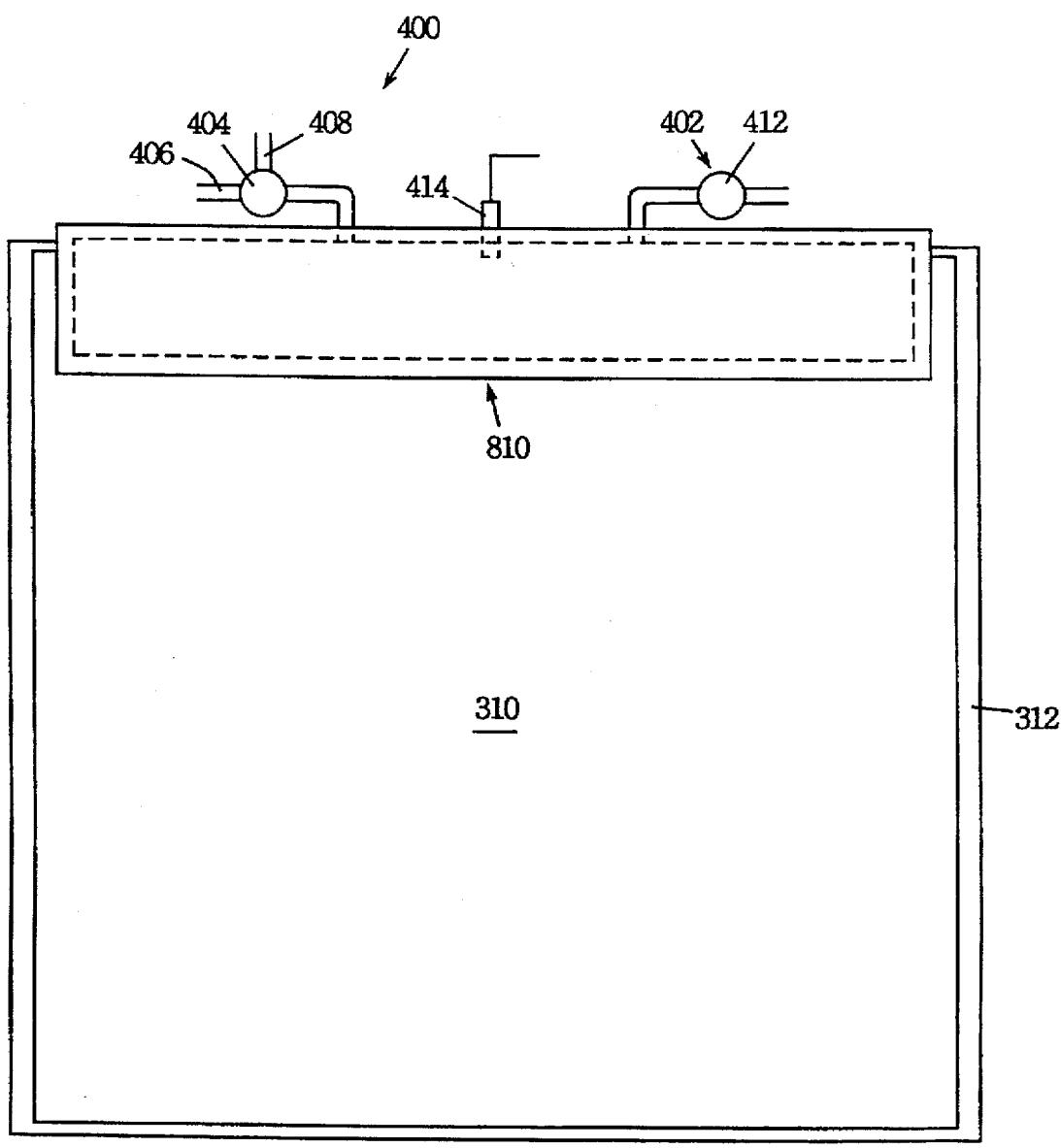
FIG. 59 is a front elevation of the main portion of the coating apparatus in accordance with the twenty-third embodiment of the present invention.
Figure 60:
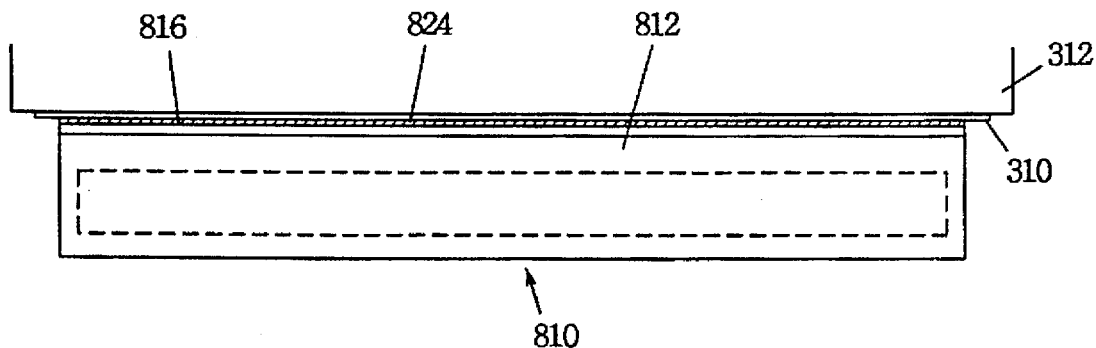
FIG. 60 is a plan view of the main portion of the coating apparatus in accordance with the twenty third embodiment.

FIG. 58 is a schematic illustration of a coating apparatus 800 which can solve the above described problem. In FIGS. 58 to 61, the same components as those of the above described embodiments are denoted by the same reference characters, they are referred to by the same names and they have similar functions. Therefore, a detailed description thereof is not repeated.

Figure 61:
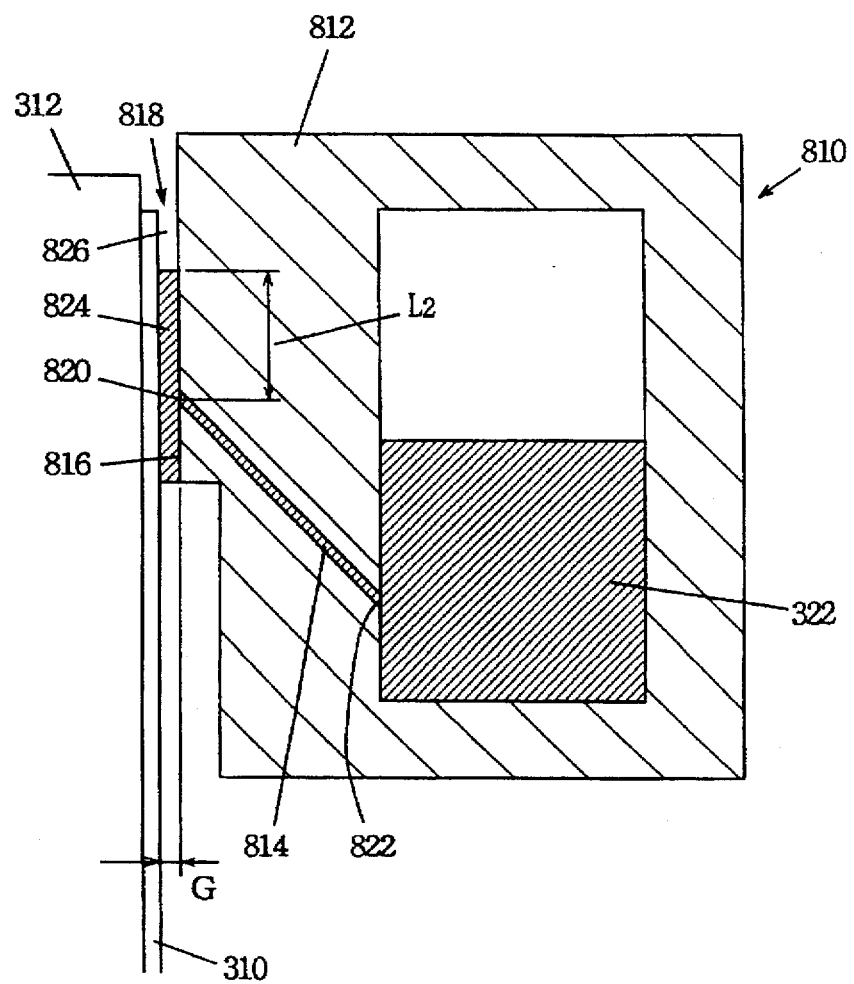
FIG. 61 is an enlarged vertical section of the coating liquid tank of the coating apparatus in accordance with the twenty-third embodiment.

The coating apparatus 800 of the twenty-third embodiment differs from other embodiments in that instead of the coating liquid tanks used in other embodiments, a coating liquid tank 810 is used. The coating liquid tank 810 differs from the coating liquid tanks of other embodiments in the position of the upper edge of the front end surface 816 of front wall portions 812. Referring to FIG. 61, assuming that the front end surface 816 and the surface to be coated of substrate 310 are indefinitely extended upward, in the coating liquid tank 810, the front wall portion 812 is formed such that the upper end of the front end surface 816 is positioned higher than the maximum height reached by the coating liquid in gap 818 when it rises in gap 818 at least because of capillary action. The front wall portion 812 is formed such that the lower end of front end portion 816 is positioned at a height between outlet 820 and inlet 822 of coating liquid outlet path 814, as in the coating liquid tank of the seventeenth embodiment.

To the coating liquid tank 810, coating liquid 322 is supplied from coating liquid supplying system 402. The amount of coating liquid supplied is adjusted such that the surface of coating liquid 322 is positioned at a level between outlet 820 of coating liquid outlet path 814 and the lower edge of the front end surface 816, while detecting the surface level of the liquid 322 in tank 810 by detector 414.

When a prescribed amount of coating liquid 322 is introduced to coating liquid tank 810, coating liquid 322 flows to the gap 818 through coating liquid outlet path 814 from coating liquid tank 810 at least because of capillary action. At this time, when the pressure in coating liquid tank 810 is appropriately adjusted by the pressure setting system 400, the lower end of pool 824 formed in gap 818 is regulated by the lower edge of front end surface 816, and coating liquid will not be dropped from gap 818. Further, the upper end of pool 824 is positioned lower than the upper edge of front end surface 816, and above the pool 824 in gap 818 there is a space which does not contain the coating liquid. At this time, at the upper end and lower end of the pool 824, menisci are formed.

The coating apparatus of the twenty-third embodiment operates in a similar manner to the coating apparatus of the seventeenth embodiment. However, referring to FIG. 58, when coating liquid tank 810 is stopped at a position near the lower end of substrate 310 denoted by the two dotted lines, it is necessary that the upper end of pool 824 in gap 818 is already positioned lower than the area of the surface of the substrate 310 requiring coating.

When the coating apparatus of the twenty-third embodiment is used, the upper end of pool 824 formed in gap 818 between front end surface 816 of coating liquid tank 810 and the surface to be coated of substrate 310 is positioned lower than the upper edge of front end surface 816. There is formed a space 826 containing no coating liquid above the pool 824. Therefore, the problem described with reference to FIGS. 55 to 57 is not generated in this coating apparatus. More specifically, even when the volume of the space sandwiched between the front end surface 816 of coating liquid tank 810 and the surface to be coated of the substrate changes, what occurs is simply the upward and downward relative movement of the upper end of pool 824 with respect to the upper edge of front end surface 816. The coating liquid never goes out over the upper edge of front end surface 816. Further, even at the start of coating, the coating liquid of pool 824 does not flow out of gap 818.

In the coating liquid tank 810 of the twenty-third embodiment, the front end surface 816 is formed by the upper part of front wall portion 812 of coating liquid tank 810 which part is entirely protruding forward. However, the same effect can be obtained by the coating liquid tank having such a front wall portion that has almost similar shape as that of coating liquid tank 700 shown in the seventeenth embodiment with the height of the front end surface made sufficiently high.

In the above described embodiment, it is assumed that the surface to be coated of substrate 310 is a uniform plane surface without any wave or the like. The gap 818 between this surface and the front end surface 816 of coating liquid tank 810 has the same size over the entire upward and downward directions of the front end surface 816. However, the aspect described especially with respect to this embodiment of the present invention is applicable not only to such a situation. For example, the shape of the front wall portion 812 may be selected such that the gap 818 becomes wider from the lower end to the upper end of the front end surface 816.

When a coating film is to be formed on the surface of substrate 310 by using the above described coating apparatus, the film thickness of the coating is determined dependent on the speed of movement of coating liquid tank 810, the size G of gap 818, fluidity and material values of coating liquid 322, condition of the surface to be coated of substrate 310 and/or surface condition of the front surface 816 of coating liquid tank 810. In order to suppress variation in thickness of the coating film, coating must be performed while adjusting the speed of movement of coating liquid tank 810 and the size G of gap 818 to be within tolerable ranges.

One of the factors determining the film thickness of the coating is the speed of movement of coating liquid tank 810. However, in the coating apparatus in accordance with the twenty-third embodiment, exactly speaking, the speed of movement of coating liquid tank 810 is not precisely the same as the speed of movement of the upper end of pool 824. In this case, one of the factors determining the thickness of the coating film is the speed of movement of the meniscus at the upper end of pool 824.

More specifically, when coating liquid tank 810 is moved while maintaining the size G of gap 818 constant, ideally, the speed of movement of the upper end of pool 824 in gap 818 will be equal to the speed of movement of the coating liquid tank 810 except at the start of coating. However, as a practical matter, the meniscus at the upper end of pool 824 moves upward or downward in gap 818 because, for example, of waviness of the surface to be coated of substrate 310. Therefore, the speed of movement of coating liquid tank 810 is not equal to the speed of movement of the meniscus at the upper end of pool 824.

Therefore, even if the coating liquid tank 810 is moved at a constant speed, the speed of movement of the meniscus at the upper end of pool 824 is not constant. However, in accordance with this twenty-third embodiment, as in the fourth embodiment the possibility is avoided that the coating liquid in the pool 824 may go out over the upper edge of the front end surface of the coating liquid tank 810 during the coating process or at the start of the coating as illustrated in FIGS. 56 and 57, which would otherwise adversely effect the thickness of the coating film. Thus, the variation or fluctuation in the coating film thickness can be restricted.

Furthermore, in accordance with this twenty-third embodiment utilizing the coating liquid tank 810 as shown in FIG. 61, it has been confirmed by the present inventor that when the size G of the gap is within the range of from 0.1 to 0.3 mm, the thickness of the coating film obtained is stable at a constant value. What is essential is not merely the size of the gap but also the shape of the meniscus formed in the gap. That shape of the meniscus is regulated by the size of the gap. That is why the size of the gap should be determined as described above.

Now, assume that the coating liquid is applied to the substrate 310 until, at the lower end side of substrate 310, the upper end of pool 824 formed in gap 818 goes below from the lower end of the surface to be coated of substrate 310. Outlet 820 of the coating liquid outlet path 814 attains lower than the lower end of the surface to be coated of substrate 310 at some time point. Thereafter, the coating liquid 322 is not supplied at least by capillary action from coating liquid outlet path 814 to pool 824 in gap 818. Therefore, when coating liquid tank 810 is moved further downward and the upper end of pool 824 is lower than the lower end of the surface to be coated of substrate 310, the coating liquid in pool 824 is consumed but is not supplemented. Therefore, in this period, the speed of the meniscus at the upper end of pool 824 is the sum of the speed of lowering of the meniscus at the upper end of pool 824 caused by consumption of the coating liquid, and the speed of movement downward of the coating liquid tank 810.

As a result, an invalid region is formed at the lower end of the substrate surface being coated, as will be described. Referring to FIG. 61, the distance from outlet 820 of coating liquid outlet path 814 to the upper end of pool 824 is represented by $L_2$. In the range from the lower end of the surface to be coated of substrate 310 and extending upward for the distance $L_2$, the thickness of the coating film is out of the prescribed tolerable range. Therefore, the aforementioned invalid area is formed.

Referring to FIG. 49, when the distance $L_1$ between outlet 710 of coating liquid outlet path 704 and upper end of front end surface 706 of the seventeenth embodiment is compared with distance $L_2$, then $L_2 > L_1$ provided that the size G of the gap is the same.

Therefore, when the substrate is coated by using the coating liquid tank 810 in accordance with the twenty-third embodiment, the invalid area formed at the lower end of substrate 310 becomes larger as compared with the area formed by using the coating liquid tank 700 of the seventeenth embodiment. Therefore, though the coating film having constant thickness can be obtained at other portions, the substrate area which can be effectively used is reduced.

Twenty-Fourth Embodiment

Figure 62:
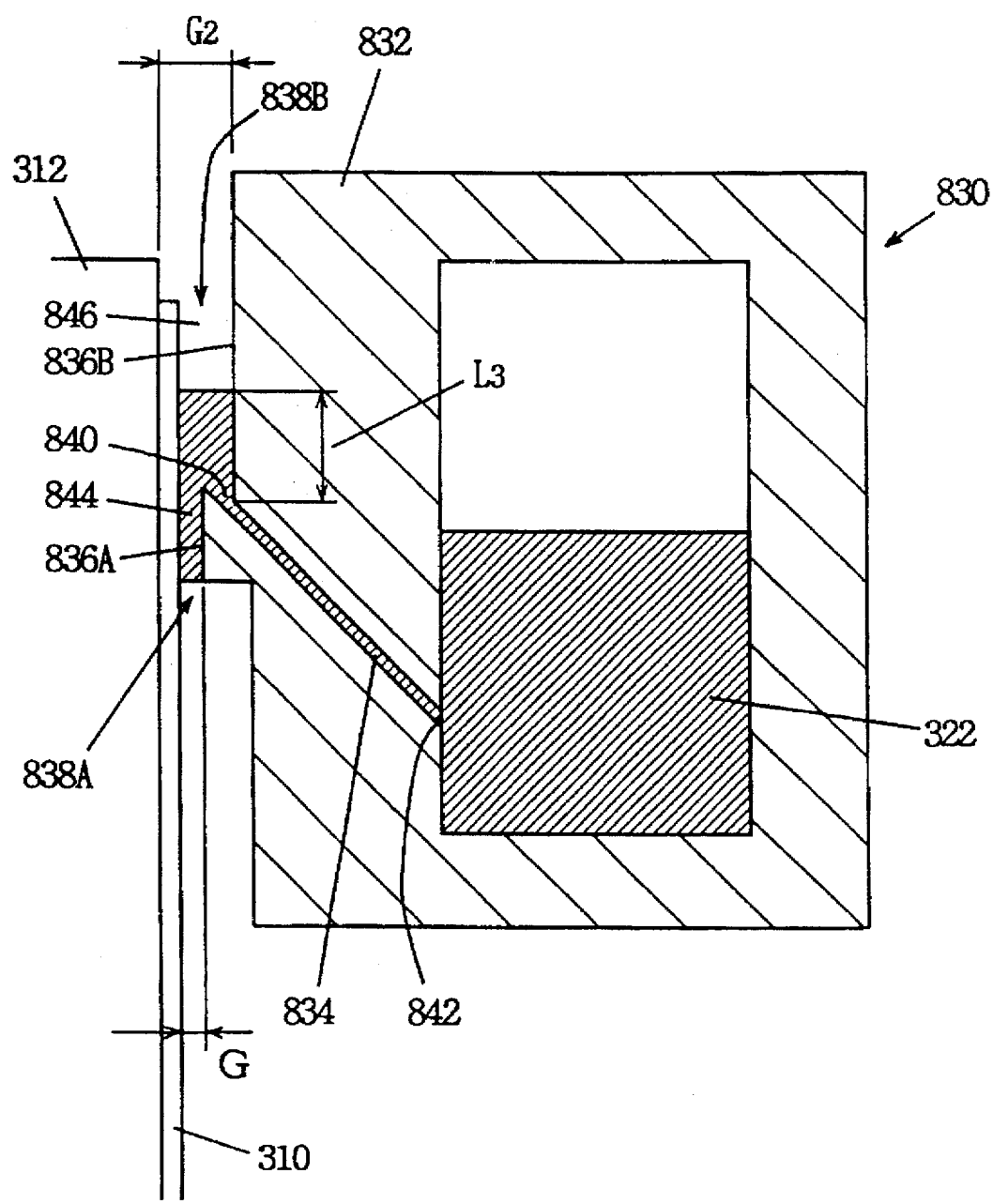
FIG. 62 is an enlarged vertical section of the coating liquid tank of coating apparatus constructed in accordance with a twenty-fourth embodiment of the present invention.

Such a problem can be solved by the coating apparatus constructed in accordance with the twenty-fourth embodiment which includes coating liquid tank 830 of FIG. 62 which replaces coating liquid tank 810 of the twenty-third embodiment. Other portions of the coating apparatus in accordance with the twenty-third embodiment are the same as the corresponding portions of the apparatuses in accordance with the seventeenth and twenty-third embodiments. Therefore, detailed descriptions of elements that are also present in the seventeenth and twenty-third embodiments are not repeated here.

Referring to FIG. 62, in the coating liquid tank 830 of the apparatus in accordance with the twenty-fourth embodiment, the front end surface of the front wall portion 832 is stepped having a front surface lower portion 836A and a front end surface upper portion 836B which is recessed rearward of the front end surface lower portion 836A.

The size G of the lower gap 838A formed between front end surface lower portion 836A and the surface to be coated of substrate 310 held by stage 312 is the same as that size G of the gaps 708 and 818 in the seventeenth and twenty-third embodiments above. The size $G_2$ of the upper gap 838B formed between front end surface upper portion 836B and the surface to be coated is larger than the size G.

The outlet 840 of coating liquid outlet path 834 is formed to be positioned at a boundary between front end surface lower portion 836A and front end portion upper portion 836B. The lower end of front end surface lower portion 836A of front wall portion 832 is formed to be positioned at a height between outlet 840 and inlet 842 of coating liquid outlet path 834.

The upper edge of front end surface upper portion 836B of front wall portion 832 is determined in the following manner. Assume that the front end surface upper portion 836B and the surface to be coated of substrate 310 extend indefinitely upward. At this time, upper gap 838B will be extended upward indefinitely. The coating liquid may flow into upper gap 838B through coating liquid outlet path 834. The coating liquid rises in upper gap 838B at least because of capillary action, but is regulated by gravity, so that it reaches a certain maximum height. The upper edge of front end surface upper portion 836B is positioned higher than the maximum reached by the coating liquid.

Coating liquid 322 is introduced to coating liquid tank 830, and the surface thereof is adjusted to be at a level between outlet 840 of coating liquid outlet path 834 and the lower end of front end surface lower portion 836A. The pressure in coating liquid tank 830 is adjusted appropriately by pressure setting system 400. The coating liquid which flows into gaps 838A and 838B from coating liquid tank 830 through coating liquid outlet path 834 forms a pool 844 having an end that is regulated by the lower edge of front end surface lower portion 836A. The upper edge of pool 844 is positioned below the upper end of front end surface upper portion 836B. As a result, above the pool 844 in upper gap 838B, there is a space 846 that does not contain coating liquid.

Using coating liquid tank 830 shown in FIG. 62, the gap size G2 is larger than the gap size G. When the distance from outlet 840 of coating liquid outlet path 834 to the upper end of the pool 844 in upper gap 838B is represented by $L_3$, there is the relation $L_3<L_2$ with the distance $L_2$ being labeled in FIG. 61. Therefore, when the coating apparatus having the coating liquid tank 830 shown in FIG. 62 is used, the invalid area formed at the lower end of the surface to be coated of substrate 310 can be made smaller than when the coating apparatus having the coating liquid tank 810 shown in FIG. 61 is used. Therefore, the area of the substrate which can be effectively used can be enlarged.

In the coating liquid tank 830 shown in FIG. 62, the size G of lower gap 838A is the same as the gap size G of the gap when the coating liquid tank 700 of the seventeenth embodiment or the coating liquid tank 810 of the twenty-third embodiment is used. Therefore, when coating liquid is applied until the outlet 840 of coating liquid outlet path 834 of coating liquid tank 830 reaches the lower end of the surface to be coated of substrate 310 on the lower side of substrate 310, even if the coating liquid in pool 844 within the range from outlet 840 to the lower edge of front end surface lower portion 836A should flow down, the amount is limited, and therefore any resulting decrease in efficiency in using the coating liquid can be minimized. Further, it is possible to stabilize the pool 844 within the gaps 838A and 838B.

Twenty-Fifth Embodiment

Figure 63:
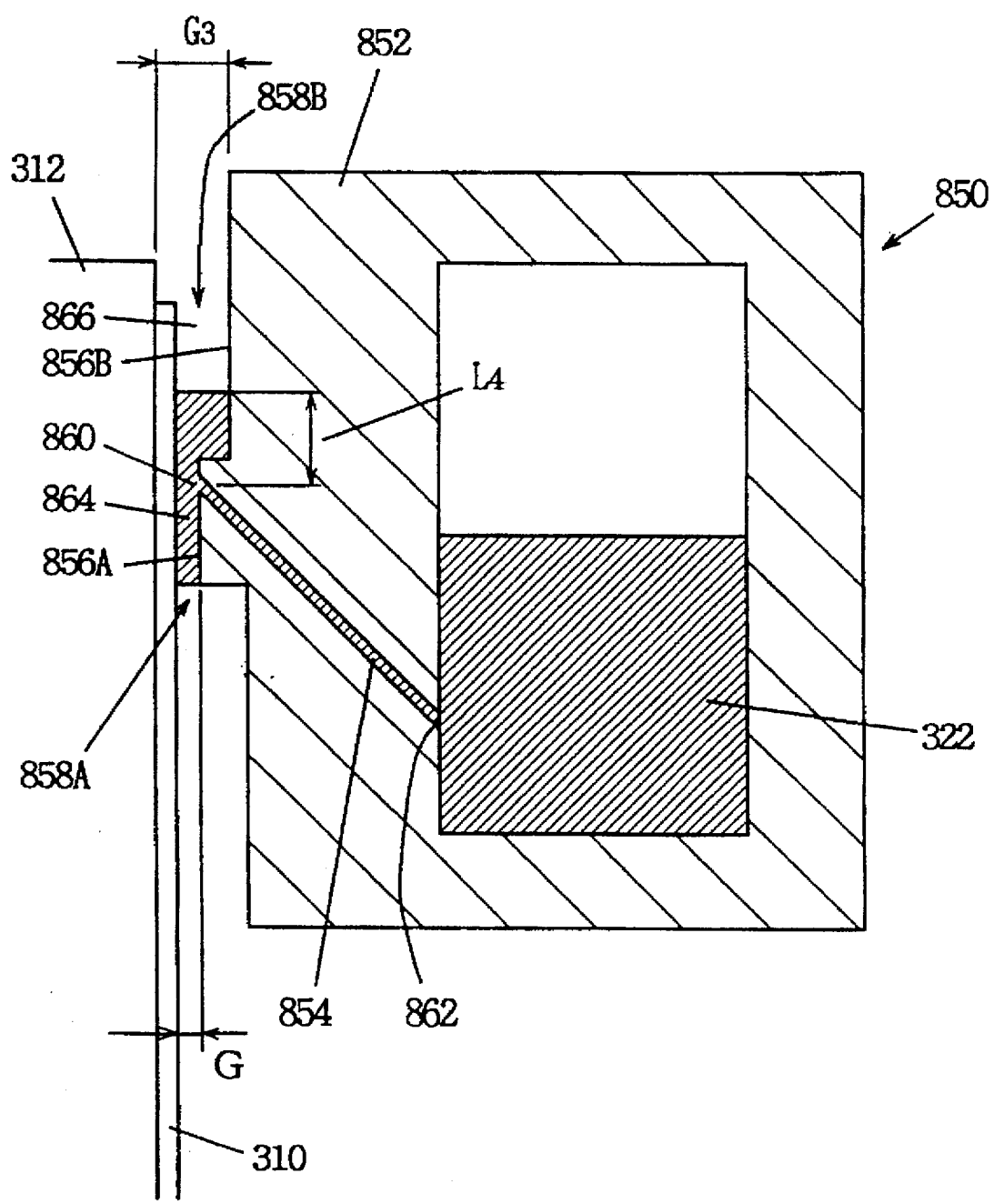
FIG. 63 is an enlarged vertical section of the coating liquid tank of coating apparatus constructed in accordance with a twenty-fifth embodiment of the present invention.

FIG. 63 shows a coating liquid tank 850 of the coating apparatus constructed in accordance with the twenty-fifth embodiment of the present invention. In the coating liquid tank 850, the front wall portion 852 has its front end surface divided into front end surface lower portion 856A and front end portion upper portion 856B, providing a stepped surface. Front end portion lower portion 856B extends from the lower end of front end surface to a position slightly above outlet 860 of coating liquid outlet path 854. Front end surface upper portion 860B extends from slightly above outlet 860 to the upper end of front wall portion 852, and is recessed so as to be rearward of front end portion lower portion 856A. As already described, outlet 860 of coating liquid outlet path 854 is opened in front end portion lower portion 856A.

Other portions of coating liquid tank 850 shown in FIG. 63 are the same as those of coating liquid tank 830 shown in FIG. 62. The position of the upper edge of front end surface upper portion 856B is determined in the similar manner as the front end surface upper portion 836B of FIG. 62. The size G of lower gap 858A between front end surface lower portion 856A and the surface to be coated of substrate 310 is the same as the size G of lower gap 838A shown in FIG. 62. The size $G_3$ of upper gap 858B between the front end surface upper portion 856B and the surface to be coated is selected to be larger than the size G of lower gap 858A. The lower edge of front end surface lower portion 856A is positioned at a level between outlet 860 and inlet 862 of coating liquid outlet path 854.

The surface of coating liquid 322 in tank 850 is at a level between outlet 860 of coating liquid outlet path 854 and the lower edge of front end portion lower portion 856A. The pressure in coating liquid tank 850 is adjusted appropriately by pressure setting system 400, and coating liquid flows into gaps 858A and 858B from coating liquid tank 850 through coating liquid outlet path 854 having a coating liquid forms a pool 864. The lower end that is positioned at the lower edge of front end portion lower portion 856A. The upper end of pool 864 is positioned lower than the upper edge of front end portion upper portion 856B. In upper gap 858B, above pool 864 there is a space 866 that does not contain any coating liquid.

In the coating liquid tank 850 shown in FIG. 63, the distance from outlet 860 of coating liquid outlet path 854 to the upper end of pool 864 is represented by $L_4$. Between the distance $L_4$ and $L_2$ shown in FIG. 61, the relation $L_4<L_2$ holds. Therefore, when the coating liquid tank 850 shown in FIG. 63 is used, effects similar to those obtained when coating liquid tank 830 of FIG. 62 can be obtained.

In FIGS. 62 and 63, the front end surface is a stepped surface having two surfaces. However, this aspect of the present invention is not limited to the coating liquid tank having such a shape as shown in FIG. 62 or 63. For example, the front wall portion may be formed to have the front end surface stepped with three or more surfaces, with the gap between each of the stepped surface and the surface to be coated of the substrate having different size. Further, a structure in which the gap between the surface to be coated and part of the front end surface is made wider toward the upper end of the front end surface, may be utilized.

In either case, the size of the gap between the front end surface and the substrate surface to be coated is selected to stabilize holding of the coating liquid in the pool. More specifically, the front end surface may be formed such that at least part of the gap between the front end surface of the coating liquid tank and the substrate surface to be coated is made wider above the outlet of coating liquid path that extends from the interior of the coating liquid tank.

The coating liquid tanks shown in FIGS. 62 and 63 may be modified in the following manner. First, as in the coating liquid tank 740 of FIG. 50, the lower edge of the front end surface of the coating liquid tank is formed below the inlet of coating liquid outlet path, and the coating liquid may be introduced to the coating liquid tank such that the surface of the liquid is positioned at a level between the outlet and the inlet of the coating liquid outlet path. Alternatively, as shown in FIG. 51, the coating liquid may be introduced so that its surface is positioned above the outlet of the coating liquid outlet path. Further, as shown in FIG. 52, the coating liquid may be introduced to the coating liquid tank such that its surface is positioned further above the upper edge of the front end surface. Referring to FIG. 53, the coating liquid outlet path may extend horizontally through the front wall portion of the coating liquid tank, and the coating liquid may be introduced into the coating liquid tank such that its surface is positioned at a level above the coating liquid outlet path. Alternatively, as shown in FIG. 54, a coating liquid outlet path that is inclined downward from the inside of the coating liquid tank toward the front end side may extend through the front wall portion of the coating liquid tank, the lower end of the front end surface may be lower than the outlet of the coating liquid outlet path, and the surface of the coating liquid may be at a level higher than the inlet of the coating liquid outlet path.

Twenty-Sixth Embodiment

In order to be sure that the coating liquid is applied to the substrate surface to be coated, it is necessary that at least at the coating start position, a strip shaped pool of the coating liquid is formed along the widthwise direction of the front end surface of the coating liquid tank. Therefore, it is convenient if formation of the strip shaped pool at the coating start position can be confirmed before moving the coating liquid tank downward. Coating apparatus functioning in this way will be described in the following.

Figure 64:
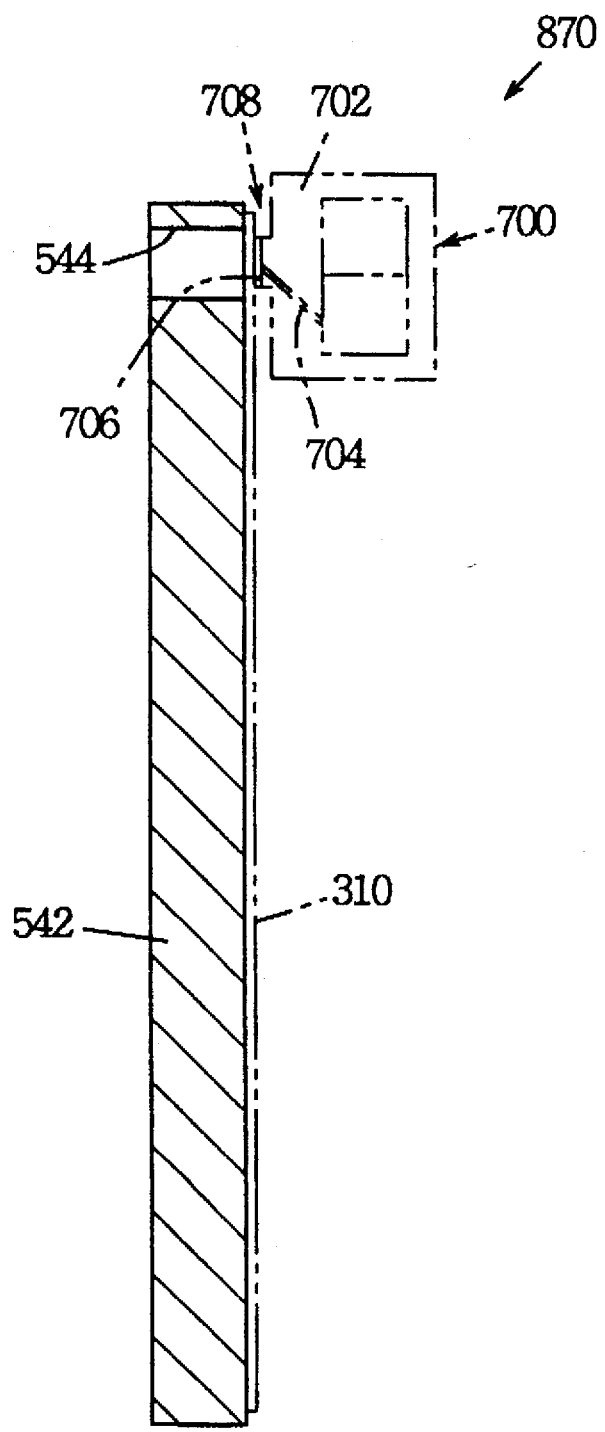
FIG. 64 is a vertical section of the main portion of coating apparatus constructed in accordance with a twenty-sixth embodiment of the present invention.
Figure 65:
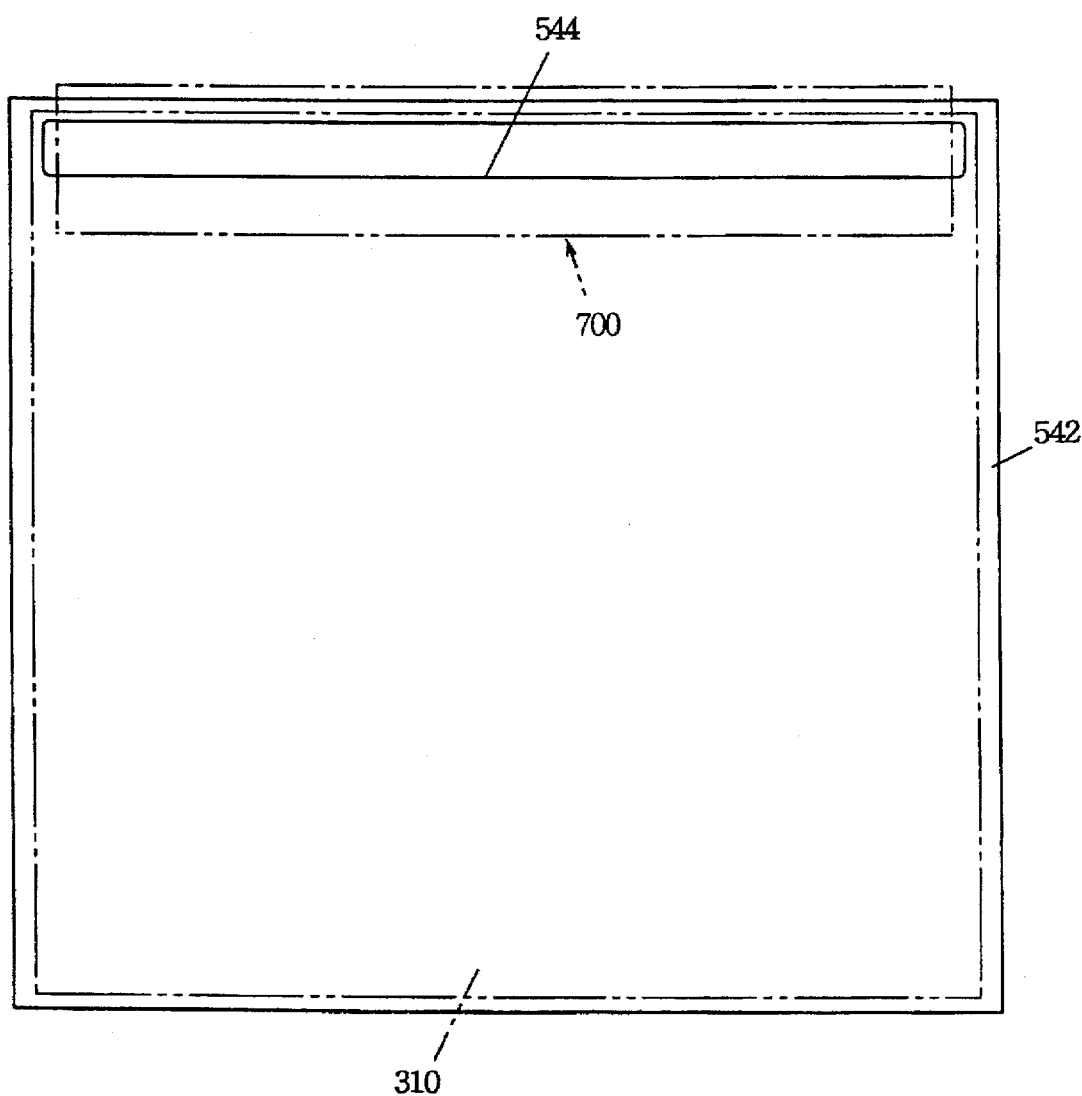
FIG. 65 is a front elevation of the main portion of the coating apparatus in accordance with the twenty-sixth embodiment of the present invention.

FIG. 64 is a vertical section of the main portion and FIG. 65 is a front view of the coating apparatus constructed in accordance with the twenty-sixth embodiment of the present invention, which includes a stage 542 for holding the substrate 310, which stage has a through hole 544 formed at a position corresponding to the coating start position. Substrate 310 is a transparent sheet, such as a glass substrate for LCDs. As for the coating liquid tank, coating liquid tank 700 shown in FIG. 49, for example, may be used. In FIG. 64, components corresponding to those of FIG. 49 are denoted by the same reference characters, they referred to by the same names and they have the similar functions. Therefore, a detailed description thereof is not repeated.

In the coating apparatus 870, the front end surface 706 of the front wall portion 702 of the coating liquid tank 700 can be observed through the through hole 544 in stage 542. When coating liquid is applied to the surface to be coated of substrate 310 by using the coating apparatus 870, first, at the coating start position, whether the strip shaped pool is formed or not along the widthwise direction of substrate 310 in gap 708 between front end surface 706 of coating liquid tank 700 and the surface of substrate 310 can be confirmed. Thereafter, the coating liquid tank 700 may be moved downward for the coating operation. As a result, the operator can be sure that coating liquid is applied to the substrate.

Twenty-Seventh Embodiment

Figure 66:
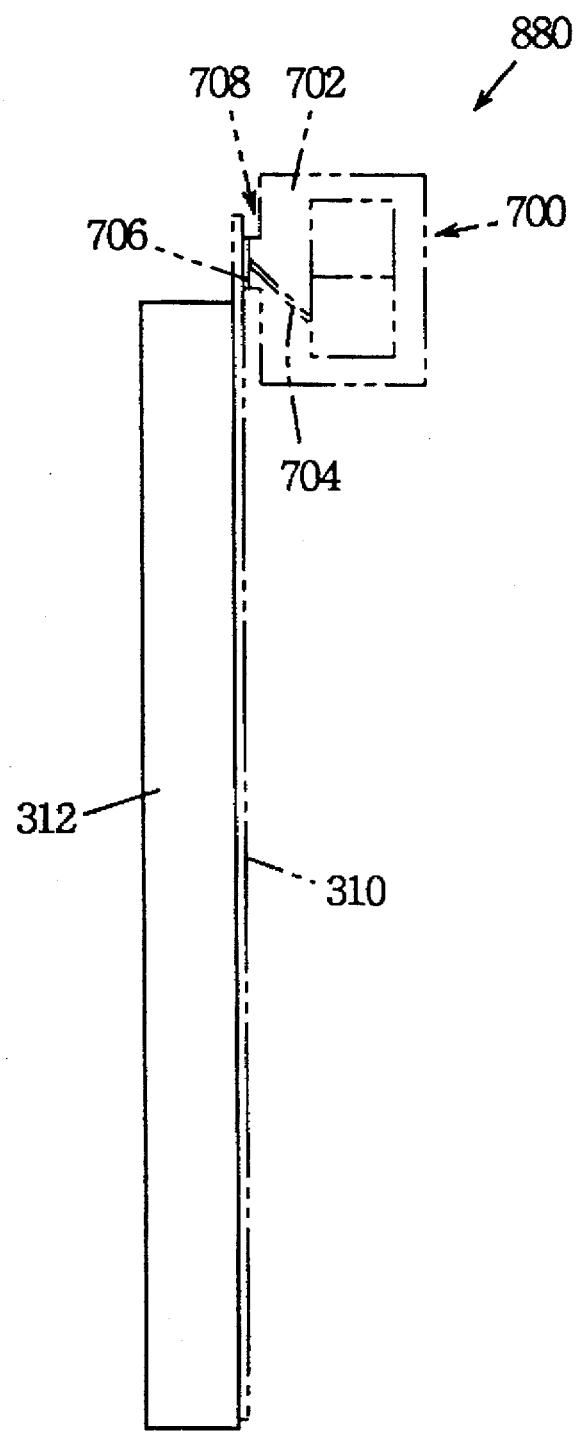
FIG. 66 is a vertical section of the main portion of coating apparatus constructed in accordance with a twenty-seventh embodiment of the present invention.
Figure 67:
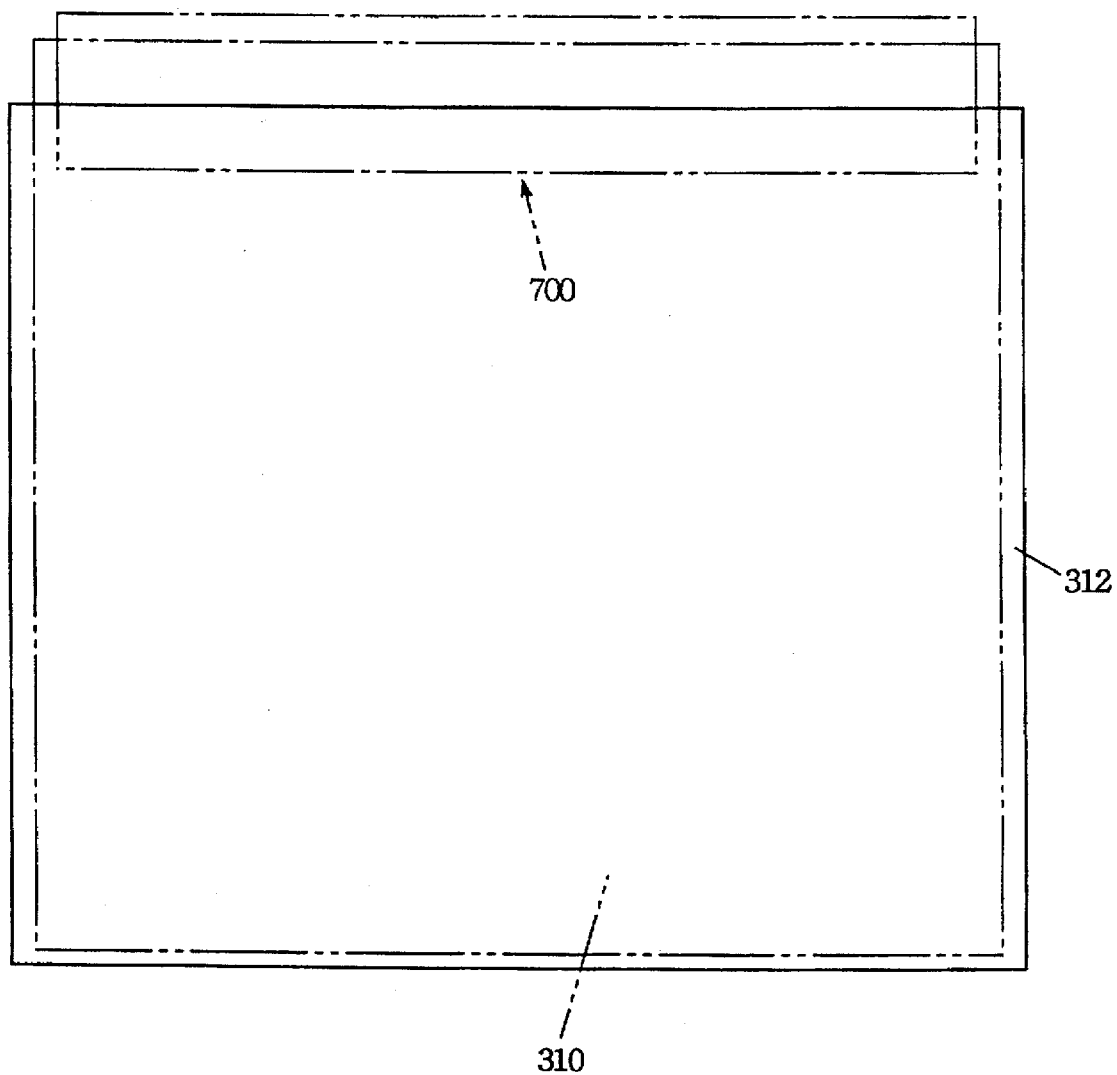
FIG. 67 is a plan view of the main portion of the coating apparatus in accordance with the twenty-seventh embodiment of the present invention.

FIG. 66 shows a side view of a main portion of the coating apparatus 880 constructed in accordance with the twenty-seventh embodiment, and FIG. 67 is the front view of this embodiment.

The coating apparatus 880 includes a stage 312 for holding a substrate 310, which stage 312 is shorter than the longitudinal (vertical) length of the substrate 310. In this case also, the substrate 310 must be a transparent substrate. Stage 312 can hold the substrate 310 with its upper end portion, which is the coating start position, protrudes above the upper end of stage 312.

In this coating apparatus 880, the surface to be coated of substrate 310 at its upper end portion which protrudes above the upper end of stage 312, can be observed from the opposite side (looking from behind stage 312). Therefore, at the coating start position, whether or not the strip shaped pool has been formed in the gap 708 between the surface to be coated of substrate 310 and the front end surface 706 of the coating liquid tank 700 can be confirmed. Thereafter, by moving the coating liquid tank 700 downward, an operator can be confident what a coating operation will be carried out satisfactorily.

It is not always necessary that the longitudinal length of stage 312 be shorter than the length of substrate 310. What is necessary is that stage 312 can hold the substrate with the upper end portion of substrate extending above the upper edge of the stage. Though not shown, when a transparent substrate is to be coated, the position corresponding to the coating start position of the stage holding the substrate may be formed of a transparent material such as a transparent glass. The stage as a whole may be formed by a transparent material. Alternatively, a plurality of appropriate portions of the stage may be formed of transparent material and/or a plurality of through holes may be formed at appropriate portions of the stage. In this case, the state of the pool formed in the gap 708 between the surface to be coated of substrate 310 and the front end surface 706 of the coating liquid tank 700 can be observed not only at the coating start position but at other positions.

In the above described embodiments, whether the pool is formed or not is observed by an operator. However, instead of relying solely upon visual monitoring by the operator, a detector may be provided for detecting the state of the pool.

Twenty-Eighth Embodiment

Figure 68:
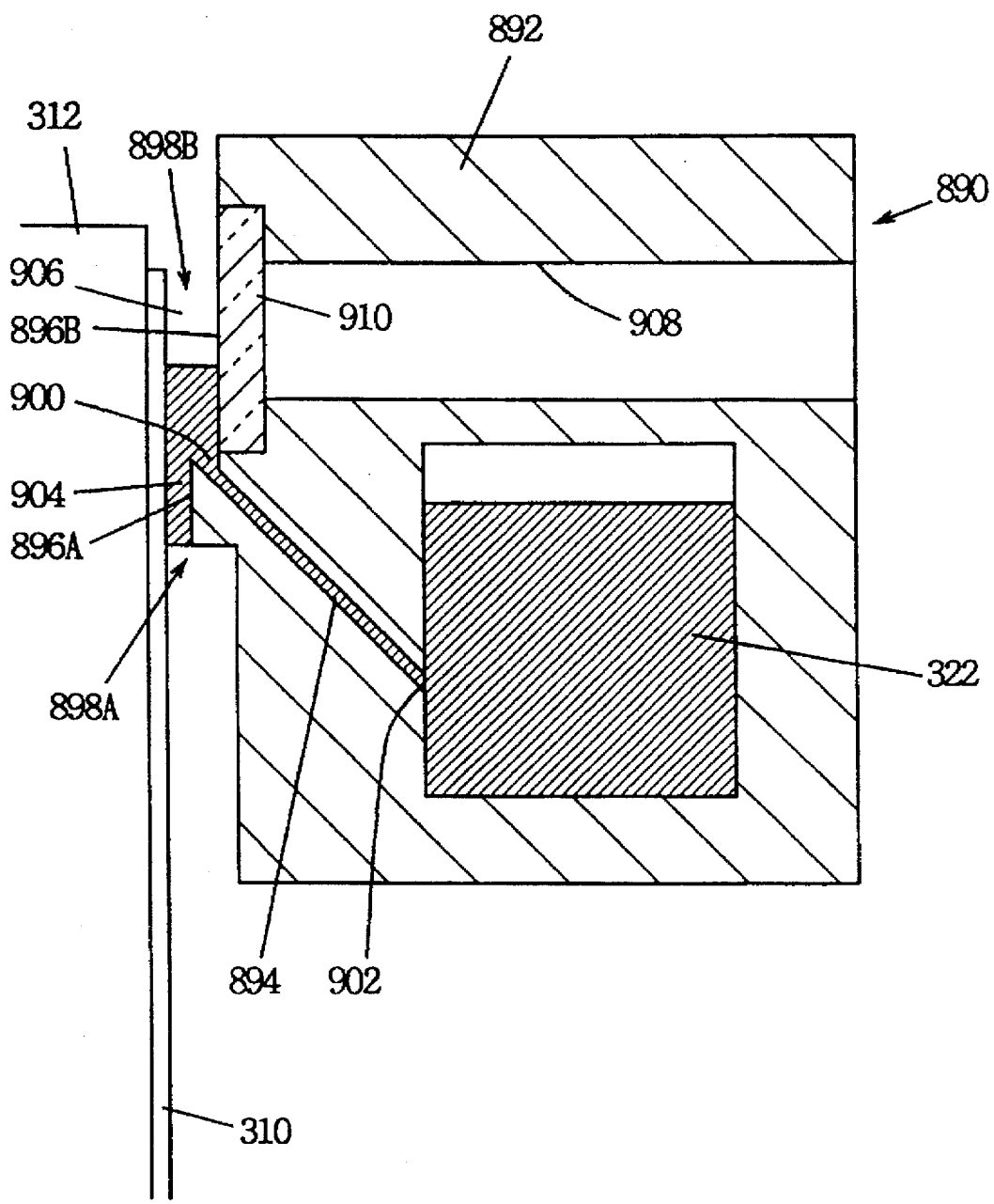
FIG. 68 is an enlarged vertical section of the coating liquid tank of coating apparatus constructed in accordance with the twenty-eighth embodiment.

FIG. 68 is an enlarged vertical section of a coating liquid tank 890 used in the coating apparatus constructed according to the twenty-eighth embodiment of the present invention which allows confirmation that a strip shaped pool has formed at the coating start position, even when the substrate is not transparent.

The basic structure of the coating liquid tank 890 is the same as the coating liquid tank 830 shown in FIG. 62. More specifically, the front wall portion 892 of the coating liquid tank 890 is formed such that it has a stepped front end surface including front end surface lower portion 896A and front end portion upper portion 896B. The size of upper gap 898B between front end surface upper portion 896B and the surface to be coated of substrate 310 is made larger than the size of lower gap 898A between front end surface lower portion 896A and the surface to be coated of substrate 310. The outlet 900 of coating liquid outlet path 894 is disposed at the boundary between front end surface lower and upper portions 896A and 896B.

The lower edge of front end surface lower portion 896A is positioned at a level between outlet 900 and inlet 902 of coating liquid outlet path 894. The height of the upper edge of front end surface upper portion 896B is determined in a manner similar to that used for determining the height of the upper edge of front end surface 816 in the coating liquid tank 810 shown in FIG. 61.

At the upper portion of coating liquid tank 890, a through hole 908 passing in the forward and rearward directions is formed at least at a portion in the widthwise direction. A transparent glass plate 910 is fitted in the front end side of the through hole 908 so as to close the opening. The front wall surface of transparent glass plate 910 constitutes the front end surface upper portion 896B of front wall portion 892.

By using the coating apparatus having the coating liquid tank 890, coating liquid is applied to the surface of substrate 310 in the following manner. Coating liquid 322 is introduced to tank 890 until the surface of liquid 322 in tank 890 is at a level between outlet 900 of coating liquid outlet path 894 and the lower edge of front end surface lower portion 896A. The pressure in coating liquid tank 890 is adjusted appropriately adjusted by pressure setting system 400. Coating liquid flows into gaps 898A and 898B from coating liquid tank 890 through coating liquid outlet path 894 to form a pool 904. The lower end of pool 904 is positioned at the lower edge of front end surface lower portion 896A and the upper end of pool 904 is positioned below the upper edge of front end surface upper portion 896B. In the upper gap 898B, and above the pool 904 there is a space 906 containing no coating liquid. Viewing forward from the rear side of the through hole 908, the upper end portion of pool 904 can be observed through transparent glass plate 910. After successful formation of pool 904 at the coating start position is confirmed, the coating liquid tank 890 may be moved downward with confidence that a coating operation can be carried out satisfactorily.

Further, by the coating apparatus using the coating liquid tank 890 shown in FIG. 68, the state of at least the upper end portion of pool 904 can be advantageously at any time, not only at the coating start position but also at other portions. This coating apparatus can be effectively used no matter whether the substrate 310 is transparent or not.

Twenty-Ninth Embodiment

Figure 69:
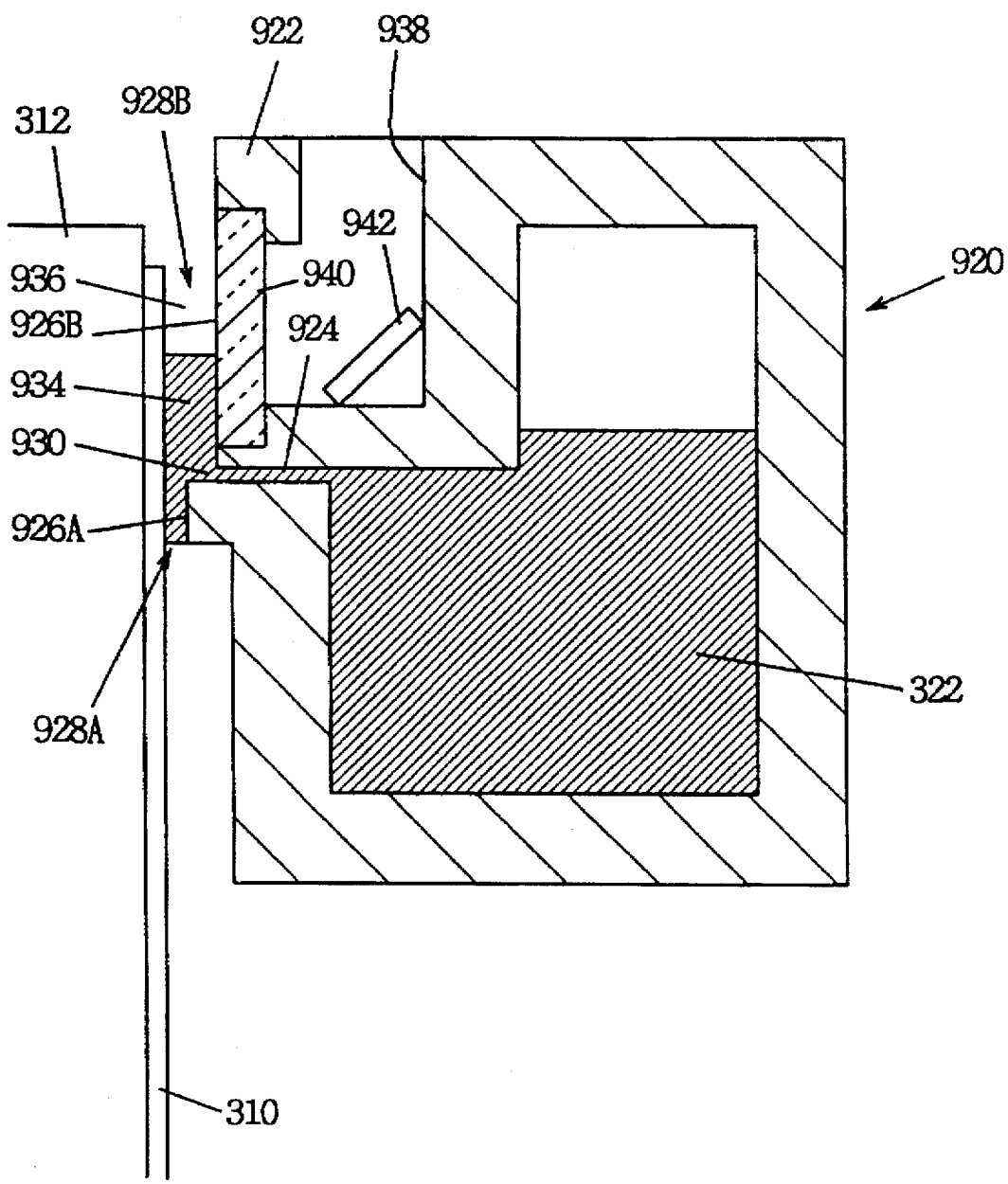
FIG. 69 is an enlarged vertical section of the coating liquid tank of the coating apparatus in accordance with a twenty-ninth embodiment.

The structure of the coating liquid tank allowing observation of the upper end portion of the pool is not limited to that shown in FIG. 68. FIG. 69 shows another structure for permitting such observation.

FIG. 69 is a partially enlarged vertical section of the coating apparatus constructed in accordance with the twenty-ninth embodiment of the present invention, in which the coating liquid tank 920 is formed such that the front wall portion 922 has a stepped front end surface including a front end surface lower portion 926A and a front end surface upper portion 926B. The size of upper gap 928B between the front end surface upper portion 926B and the surface to be coated of substrate 310 is made larger than the size of lower gap 928A between front end surface lower portion 926A and the substrate surface to be coated. Coating liquid outlet path 924 extends horizontally, passing through the front wall portion 922, with its outlet positioned at the boundary between front end surface lower and upper portions 926A and 926B.

Coating liquid tank 920 has, at its upper portion in the front, a through hole 938 extending from the front end surface and bent upward, formed at least at a portion in the widthwise direction. On the front end side of through hole 938, a transparent glass plate 940 is fitted so as to close the opening, and the front wall surface of transparent glass plate 940 forms the front end surface upper portion 926B. Mirror 942 is arranged at the bent portion of through hole 938 so that by looking downward from the upper side of through hole 938, the upper end portion of pool 934 in gap 928B can be observed through transparent glass plate 940 as a reflection from mirror 942.

The problem caused near the position of completion of coating when the coating liquid is applied to the substrate has already been described with reference to FIGS. 27 to 30.

Figure 70:
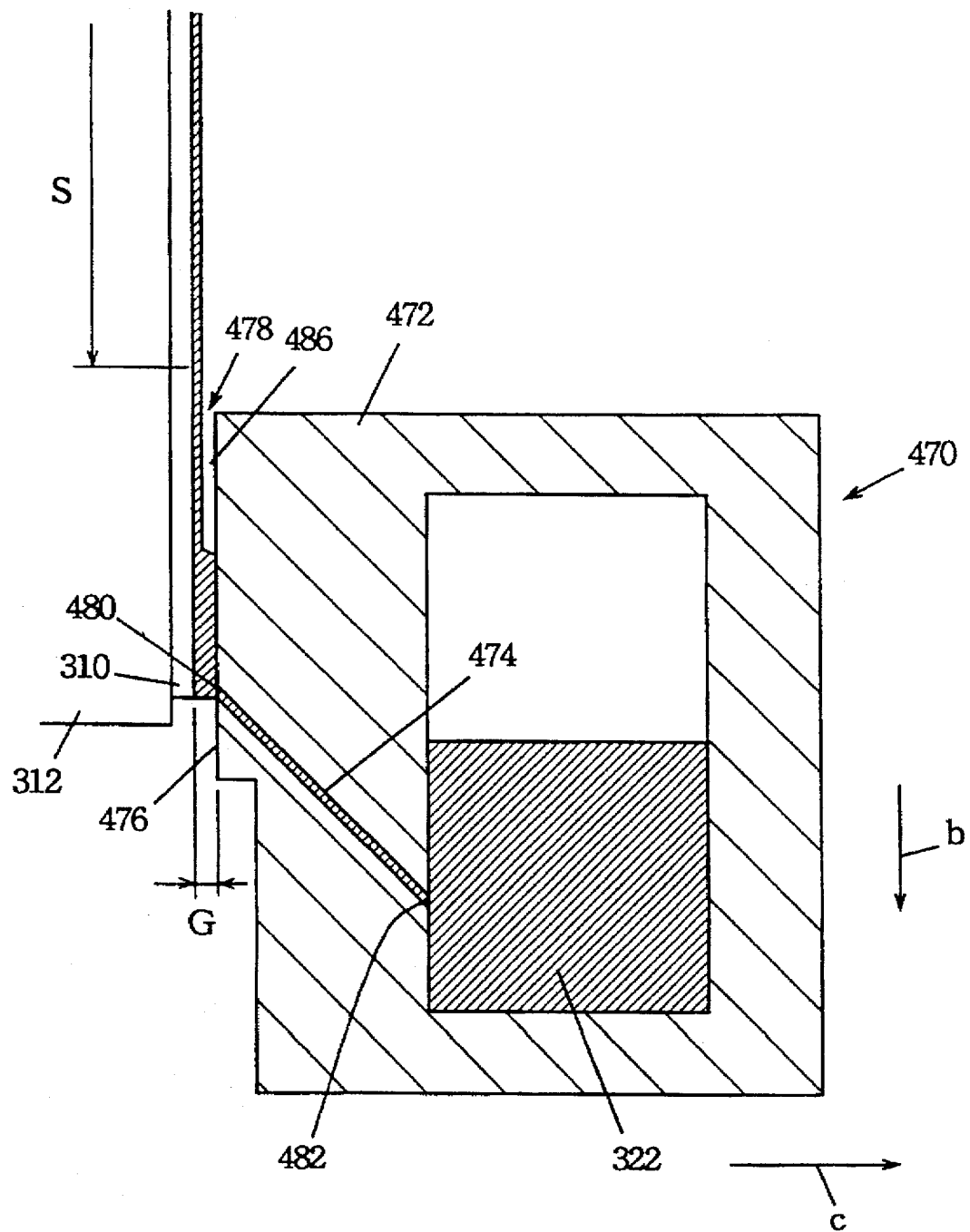
FIG. 70 illustrates a problem related to use of the coating liquid tank shown in FIG. 20.

That is, when coating liquid tank 470 is moved away from substrate 310 as shown by arrow c in FIG. 70, the coating liquid left on the surface to be coated of substrate 310 may flow down, and may adhere on the surface of the stage holding the substrate, or because of capillary action the coating liquid may enter the gap between the surface of the stage and rear surface of the substrate, and adhere to the rear surface of the substrate.

An apparatus for solving such a problem is provided by a thirtieth embodiment of this invention which shall now be described.

Thirtieth Embodiment

Figure 71:
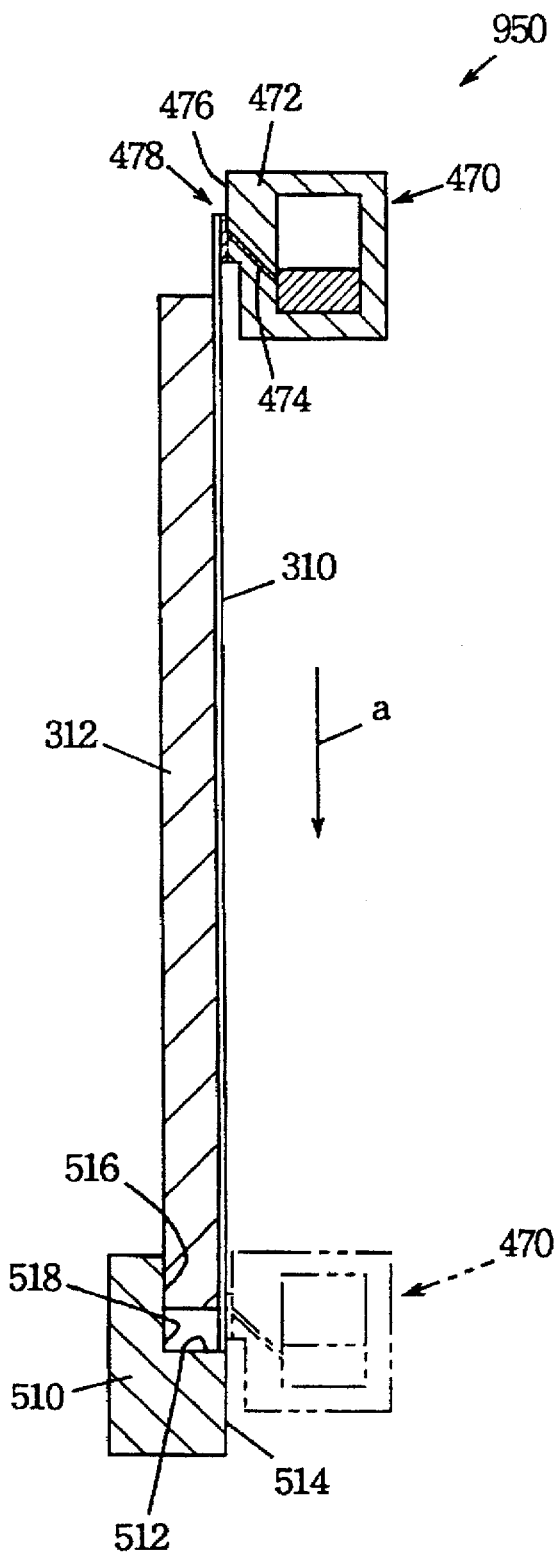
FIG. 71 is a vertical section of the main portion of coating apparatus constructed in accordance with a thirtieth embodiment of the present invention.

FIGS. 71 to 78 show the coating apparatus 950 constructed in accordance with the thirtieth embodiment. Now referring more particularly to FIGS. 71 to 73, the coating apparatus 950 includes a stage 312 for holding the substrate 310 vertically, and a coating liquid tank 470 having a hollow body extending in the widthwise direction of substrate 310 with opposing ends closed. Substrate 310 and stage 312 are the same as those of the embodiments described previously. The coating liquid tank 470 is the same as the coating tank of the fourth embodiment shown in FIG. 20, for example. In FIGS. 71 and 20, the same components are denoted by the same reference characters, they are referred to by the same names, and they have the same functions. Therefore, a detailed description thereof is not repeated.

The longitudinal length of stage 312 of this embodiment is selected to be shorter than the longitudinal Length of substrate 310. Stage 312 holds the substrate 310 such that the upper and lower end portions of substrate 310 protrude upward and downward, respectively, from the respective upper and lower ends of stage. Coating liquid tank 470 can be moved linearly in the longitudinal direction denoted by the arrow a, while maintaining the gap 478 having the size G (see FIG. 74) between the front end surface 476 and the surface to be coated of substrate 310 held by stage 312. This movement is realized by a linear driving mechanism (not shown). In order to facilitate removal of substrate 310 from stage 312, a driving mechanism for moving the stage 312 and the coating liquid tank 470 away from each other may be provided, as in the above described embodiments.

The coating apparatus 950 further includes an extended member 510 arranged below stage 312 and having end surface 512 formed to be in contact with at least part of the lower end of substrate 310 held by stage 312 or to be close to and opposing the lower end of substrate 310. The extended member 510 is fixed on stage 312 by means of a screw or the like (not shown). The extended member 510 has a front wall surface 514 opposing to the front end surface 476 of coating liquid tank 470 and providing a gap between its front wall surface 514 and the front end surface 476. The front wall surface 514 is formed and arranged such that the gap thus formed is continuous to or coplanar with the gap 478 formed between the front end surface 476 of coating liquid tank 470 and the surface to be coated of substrate 310 held by stage 312, on the side where coating is completed.

In this embodiment, the front wall surface 514 is formed such that it is flush or coplanar with the surface to be coated of the substrate 310 held by stage 312. Therefore, the size of the gap between front end surface 476 of coating liquid tank 470 and the surface to be coated of substrate 310 and the front wall surface 514 of the extended member 510 is the prescribed size G. Coating liquid tank 470 can be continuously moved on the side of termination of coating, until the lower edge of the front end surface 476 of coating liquid tank 470 passes over the terminating end (lower end) of the surface to be coated of substrate 310 and reaches at least the front wall surface 514. Such movement is in the vertical direction as denoted and results from the arrow a, by controlling the linear driving mechanism by a control apparatus (not shown).

The extended member 510 has a vertical surface 518 which is fixed to be in tight contact with the rear surface 516 of stage 312. The extended member 510 may be formed integral with the stage 312. Alternatively, a driving mechanism may be provided for moving the rear surface 516 of stage 312 and vertical surface 518 of extended member 510 in sliding contact with each other. In that case, after the substrate 310 is held by stage 312, the extended member 510 may be moved until the end surface 512 is brought into contact or near to the lower end of substrate 310. This is advantageous in facilitating mounting of substrate 310 on the stage 312.

In some cases, the extended member 510 may not be provided. In that case, the invalid area formed near the lower end of substrate 310 becomes larger than when the extended member 510 is provided. However, the problem that the coating liquid is adhered on the rear surface of substrate 310 or on the stage 312 can be avoided by having the substrate stage 312 hold the substrate 310 with the lower end of the substrate 310 projecting downward from the lower end of the stage 312, as in FIG. 31.

Figure 72:
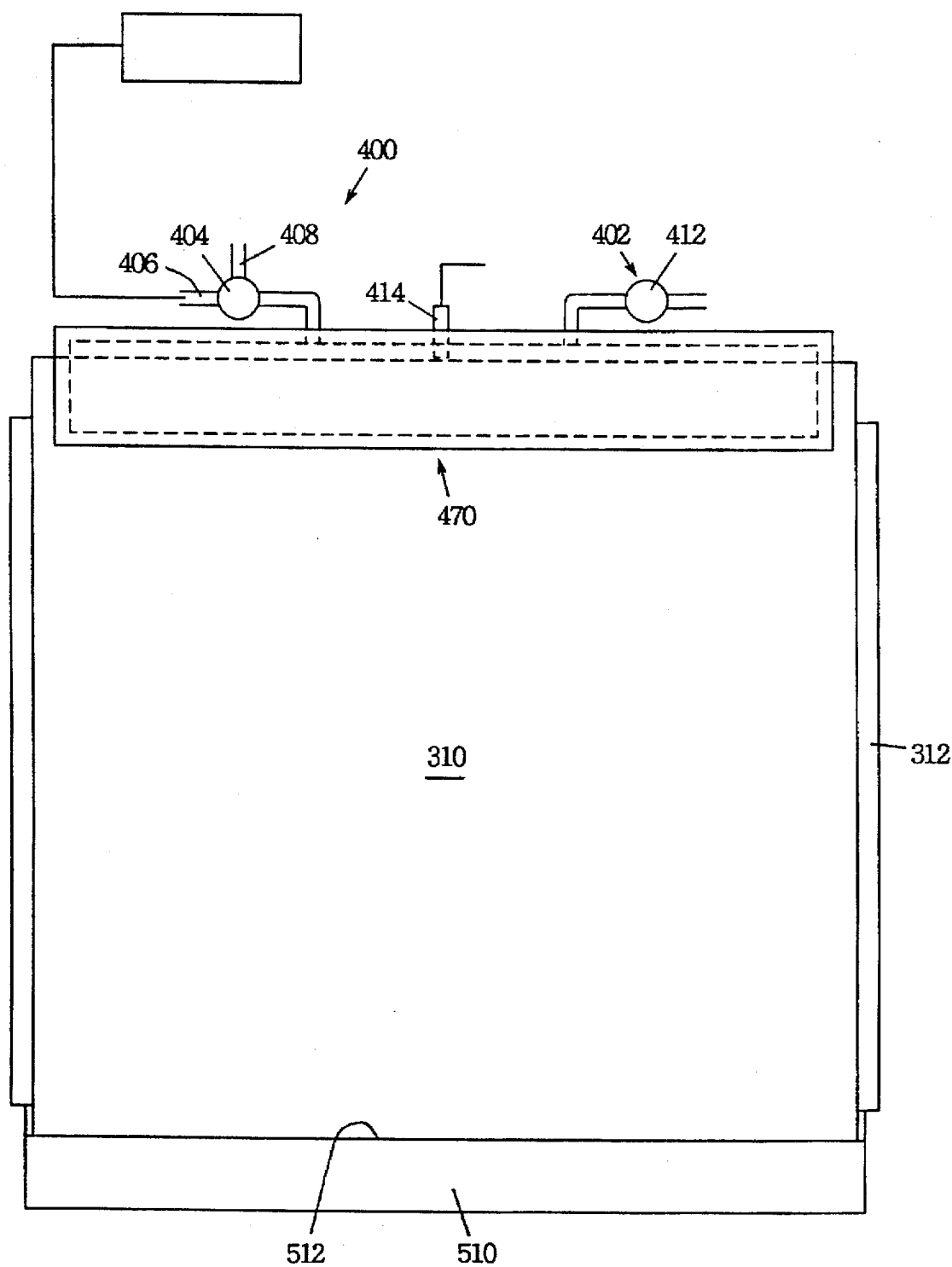
FIG. 72 is a front elevation of a main portion of the coating apparatus in accordance with the thirtieth embodiment of the present invention.
Figure 73:
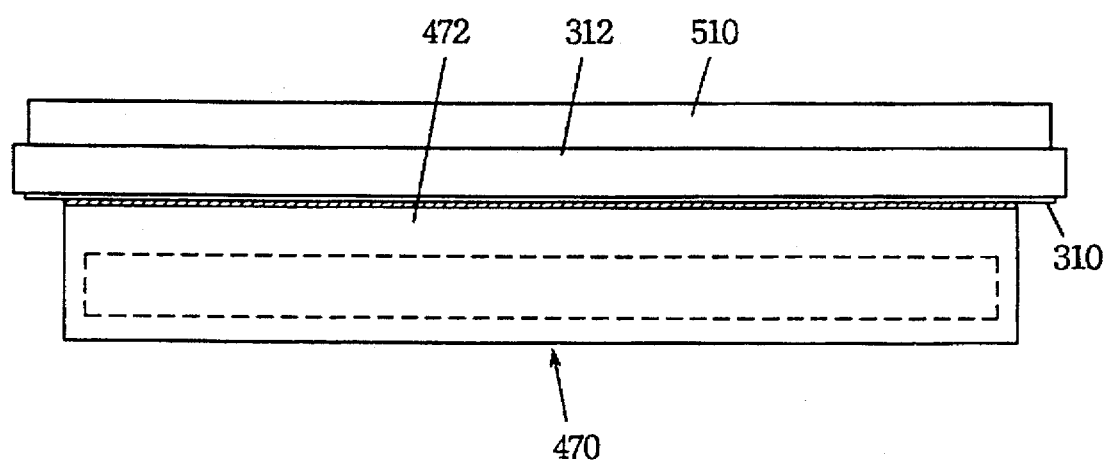
FIG. 73 is a plan view of the main portion of the coating apparatus in accordance with the thirtieth embodiment of the present invention.

Referring to FIG. 72, in coating liquid tank 470, pressure setting system 400 for increasing, decreasing or setting the pressure in the tank to open to air (ambient pressure), and coating liquid supplying system 402 for supplying the coating liquid to the tank are provided. In FIGS. 72 and 13, for example, corresponding portions are denoted by the same reference characters, they are referred to by the same names and their functions are similar. Therefore, detailed descriptions will not be repeated.

Mainly referring to FIG. 74, the position of the upper end of front end surface 476 at front wall portion 472 of coating liquid tank 470 is determined in the following manner. Assume that the front end surface 476 and the surface to be coated of substrate 310 are extended indefinitely upward. In that case, the gap 478 having the size G will also be extended indefinitely. The coating liquid 322 is introduced to the gap 478 through coating liquid outlet path 474. The coating liquid may rise in the gap 478 at least by capillary action. However, because of gravity, coating liquid in gap 478 may not exceed a certain maximum height A. The upper edge of the front end surface 476 is selected to be above the maximum height A.

Figure 74:
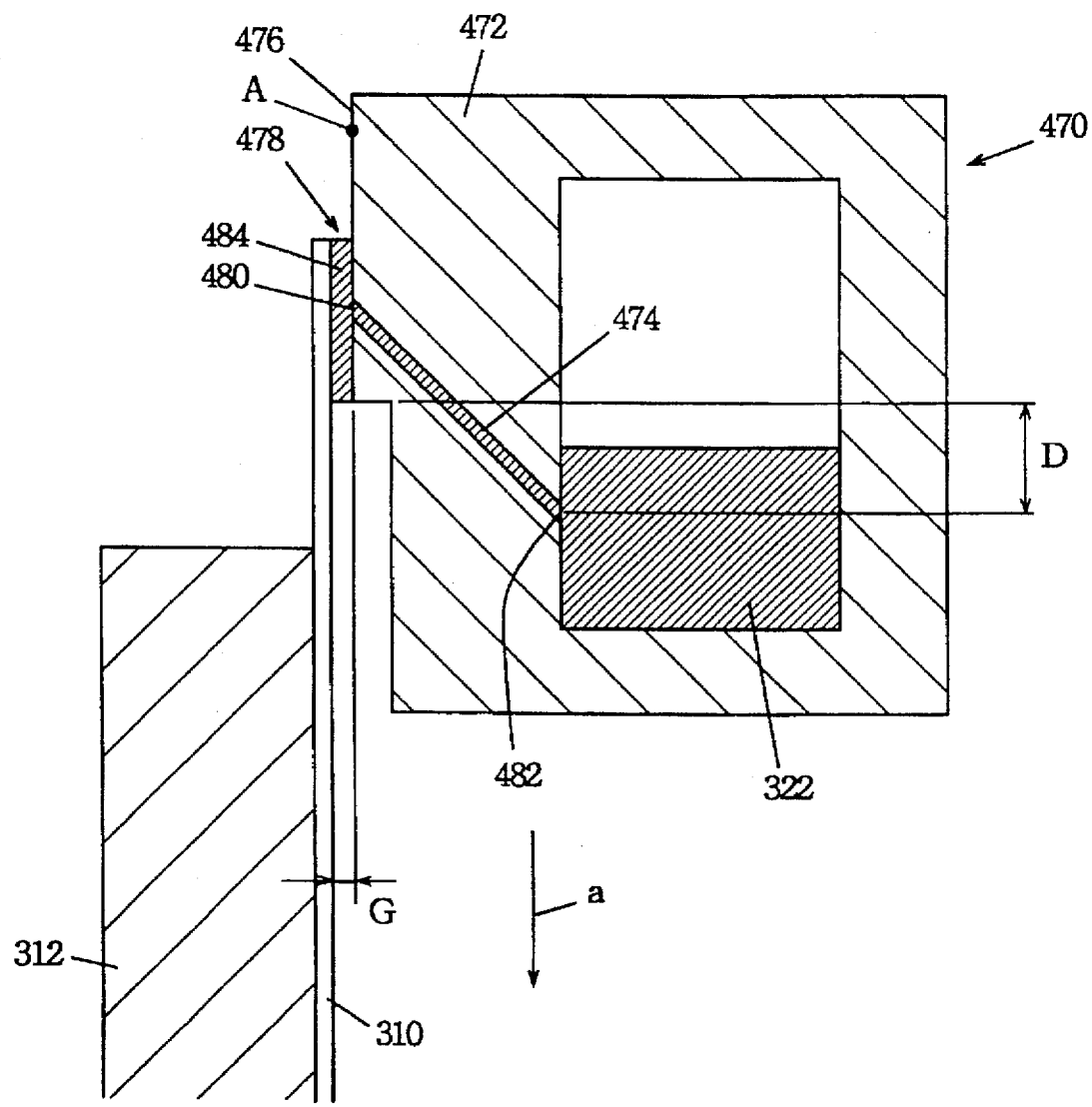
FIG. 74 is an enlarged vertical section of the coating liquid tank at the coating start position in accordance with the thirtieth embodiment of the present invention.

The coating apparatus is provided with a linear driving mechanism and a control apparatus for controlling same so that it can position and stop the coating liquid tank 470 at the position that is shown in FIG. 74. FIG. 74 shows positional relation between the coating liquid tank 470 and substrate 310 at the start of coating to where the upper end of the surface to be coated of substrate 310 is positioned between the outlet 480 of coating liquid outlet path 474 and the position A of the maximum height on front end surface 476, and there is a gap 478 having the size G between the front end surface 476 and the surface to be coated of substrate 310.

With tank 470 in its position of FIG. 74, the coating liquid is introduced thereto such that the surface of the coating liquid is at a position between inlet 482 of coating liquid outlet path 474 and the lower edge of front end surface 476. Coating liquid 322 flows upward into gap 478 through coating liquid outlet path 474, and forms a pool 484 having a lower end that is regulated by the lower edge of front end surface 476. As for the upper end of pool 484, coating liquid cannot rise above the upper end of substrate 310, and is regulated by the upper end of substrate 310.

When coating liquid tank 470 is moved downward from its position of FIG. 74 as denoted by the arrow a, while maintaining size G for the gap 478 between the surface to be coated of substrate 310 and the front end surface 476 of coating liquid tank 470, application of the coating liquid to the surface of substrate 310 starts.

As described previously with respect to the twelfth embodiment shown in FIGS. 34 to 38, let us consider an example in which coating liquid tank 470 is stopped such that the upper end of the surface to be coated of substrate 310 is positioned above the maximum height A (shown in FIG. 74 only) on front end surface 476 of front wall portion 472, and coating liquid tank 470 is moved in the direction of the arrow a at a speed of movement which is instantly raised to the desired speed. At this time, referring to FIG. 42, from the start of movement of coating liquid tank 470 until the lapse of a prescribed time period, the speed of movement of the coating liquid tank 470 is not equal to the speed of movement of the meniscus at the upper end of pool 484 formed in the gap 478. More specifically, the speed of movement of the meniscus at the upper end of pool 484 is slower than the speed of movement of coating liquid tank 470 within this range. Thereafter, those two speeds become equal to each other.

As a result, as already shown in FIG. 43, the thickness of the coating film formed will be thinner in this range. In the twelfth embodiment, the delay in rise of the speed of movement at the upper end of the coating liquid in pool 484 is taken into consideration, and the speed of movement of the coating liquid tank 470 is corrected. In the thirtieth embodiment, this problem is solved by positioning the coating liquid tank 470 at such a position as shown in FIG. 74. Coating liquid tank 470 is moved at a constant speed in the direction of the arrow a. At the start of coating, the flow of the coating liquid introduced to the gap 478 in the upward direction is regulated by the upper end of the surface to be coated of substrate 310. Therefore, the upper end of the pool 484 in gap 478 is positioned at the upper end of the surface to be coated, and even when the movement of coating liquid tank 470 is started, it does not move from the upper end of the surface to be coated until after the lapse of a prescribed time period.

More specifically, when movement of the coating liquid tank 470 starts, the lower end of the front end surface 476 also starts to move. The area of the gap 478 at the portion where the front end surface 476 opposes the surface to be coated of substrate 310 increases gradually until the upper end of the front end surface 476 reaches the upper end position of the surface to be coated. To the gradually increasing portion of the gap 478, coating liquid is introduced from coating liquid tank 470 through coating liquid outlet path 474, at least because of capillary action. Though the volume of the pool 484 formed in gap 478 increases gradually, the position of the meniscus at the upper end of the pool 484 does not move from the upper end of the surface to be coated. The meniscus at the upper end of the pool 484 starts its movement downward after the degree of increase in area of said portion of gap 478 exceeds the speed of supply of the coating liquid from coating liquid tank 470 or after the position A of the maximum height on front end surface 476 reaches the upper end position of the surface to be coated of substrate 310 at the latest, because of movement of the coating liquid tank 470. At this time, a space 486 containing no coating liquid (see FIG. 75) is formed in gap 478 above pool 484.

As already described, after the lapse of a prescribed time period from the start of movement of coating liquid tank 470, the meniscus at the upper end of pool 484 moves, and coating liquid is applied to the surface of substrate 310. Here, when coating begins, the time in which such transitional phenomenon that results in the low speed region shown in FIG. 42 may have been passed. After the lapse of a certain time period from the start of downward movement of coating liquid tank 470, movement of the meniscus at the upper end of pool 484 starts, generation of such region causing reduced thickness in coating film such as shown in FIG. 43 can be avoided. Therefore, the area of the substrate can be used more effectively, at least on the starting side.

When the coating liquid tank 470 and substrate 310 are to be positioned as shown in FIG. 74, it is necessary to appropriately set the distance between the upper end of the surface to be coated of substrate 310 and the maximum height A on front end surface 476. This dimension may be set using as a reference the distance of travel of coating liquid tank 470 necessary for the speed of movement of the tank 470 to rise into the tolerable range when the coating liquid tank 470, which has been stopped, begins to move downward. Alternatively, the distance may be set using the distance necessary for the tank 470 to travel until the thickness of the coating film formed reaches the tolerable range, when the tank 470 which has been stopped, begins to move downward.

Referring to FIGS. 71 and 74, substrate 310 is a transparent substrate such as a glass substrate for LCDs, for example. Therefore, in this coating apparatus 950, at the start position of coating, whether a strip shaped pool 484 has been formed along the widthwise direction of substrate 310 in gap 478 between the surface to be coated of substrate 310 and the front end surface 476 of the coating liquid tank 470 can be confirmed from the side opposite to the surface to be coated of substrate 310, which protrudes above the upper end of stage 312. As the coating liquid tank 470 is moved downward after obtaining visual confirmation that pool 484 has formed, application of coating liquid to the surface of substrate 310 can be ensured. Alternatively, a detector may be provided to confirm formation of the pool 484.

Figure 76:
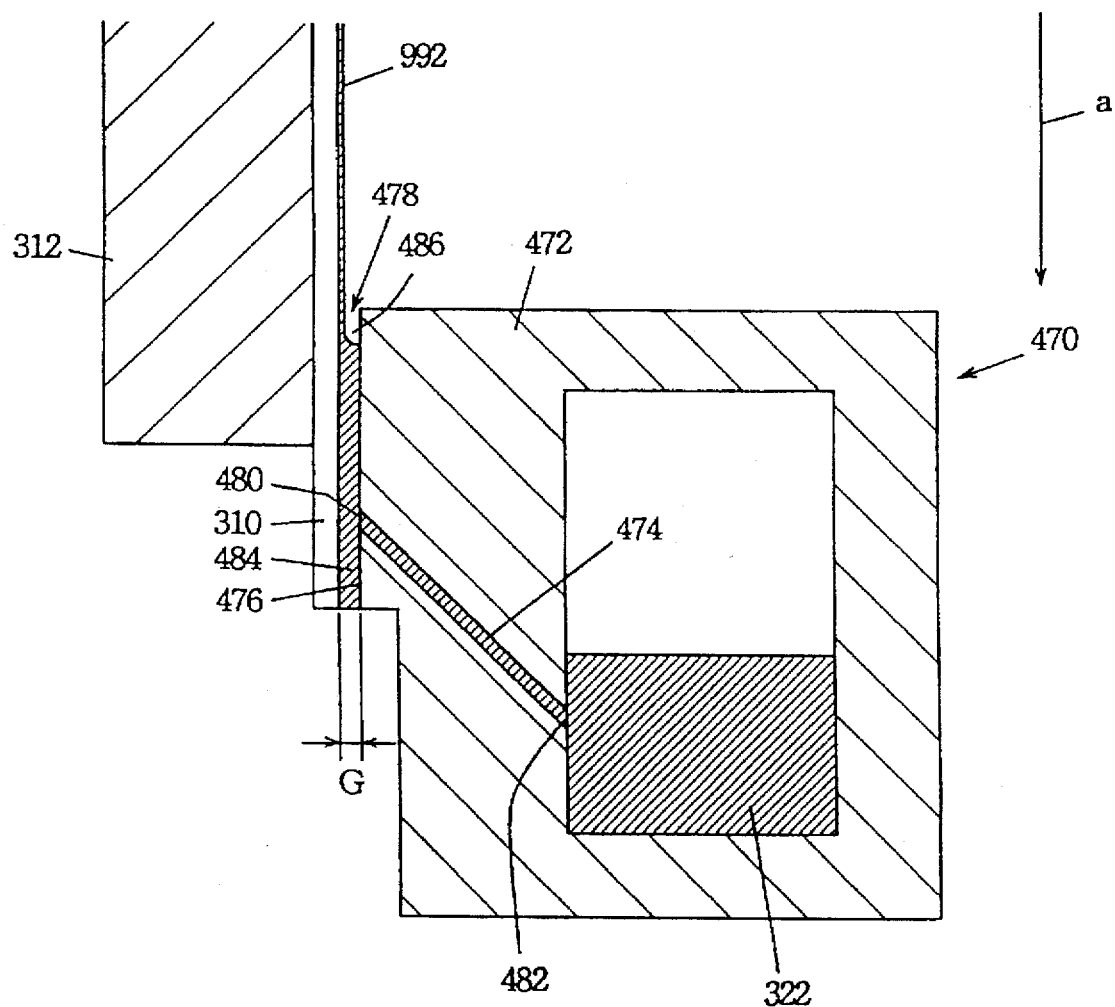
FIG. 76 is an enlarged vertical section of the coating liquid tank, at the coating terminating position of the coating apparatus in accordance with the thirtieth embodiment of the present invention.

Now, referring to FIG. 76, assume that the extended member 510 of FIG. 71 is not provided on the terminating side of coating, at a certain point, the lower end of front end surface 476 of coating liquid tank 470 reaches the terminating end (lower end) of the surface to be coated of substrate 310. Further, when coating liquid tank 470 is moved downward, the upper end of pool 484 (or the upper edge of front end surface 476 of coating liquid tank 470) will reach the terminating end of the surface to be coated of substrate 310. In that case, the following problem arises.

Until the lower edge of front end surface 476 of coating liquid tank 470 reaches the lower end of the surface to be coated of substrate 310, as in FIG. 76, the upper end of pool 484 moves in the direction of the arrow a at approximately the same speed as the speed of movement of coating liquid tank 470. After the lower edge of the front end surface 476 of coating liquid tank 470 reaches the lower end of the surface to be coated of substrate 310, the area of the portion of front end surface 476 of coating liquid tank 470 which opposes the surface to be coated of substrate 310 gradually reduces. Accordingly, gap 478 is broken, and part of the coating liquid of the pool 484 which has been kept in the gap 478 which has been broken may flow downward and be dropped from the lower end of substrate 310 or from the lower edge of front end surface 476 of coating liquid tank 470. However, in this case, since the lower end of substrate 310 protrudes downward beyond the lower end of stage 312, it is not possible for the dropped coating liquid to adhere on the stage 312 or enter the space between stage 312 and the rear surface of substrate 310, at least by capillary action.

Part of the coating liquid in gap 478 has its movement suppressed by the lower end of substrate 310. Therefore, the speed of movement of the meniscus at the upper end of pool 484 becomes lower than the speed of movement of coating liquid tank 470. As a result, it is possible that the thickness of the coating film 992 formed becomes thinner near the terminating end of the surface to be coated of substrate 310.

Figure 77:
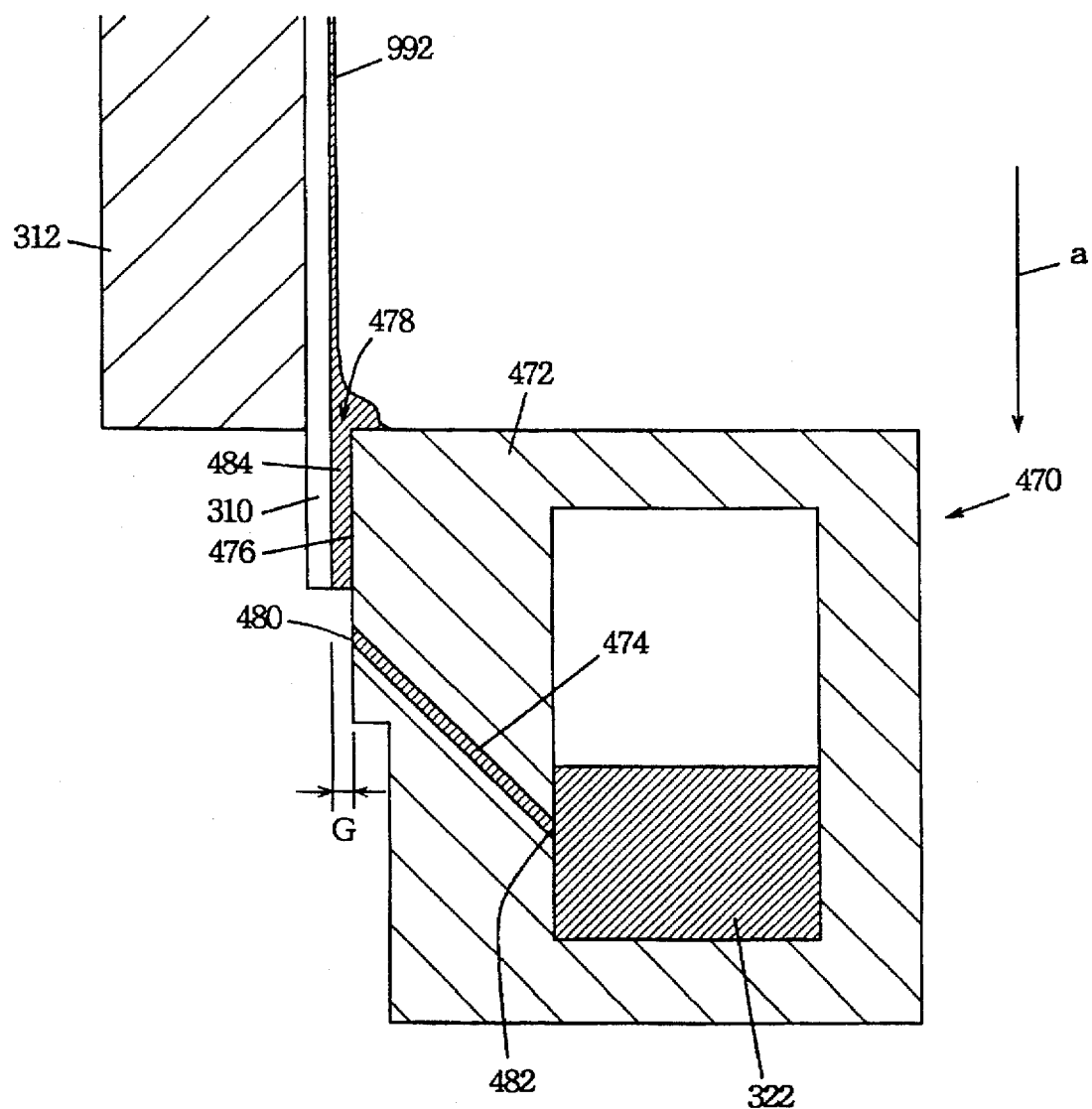
FIG. 77 illustrates a problem related to the coating liquid tank and generated at the coating terminating position of the coating apparatus in accordance with the thirtieth embodiment.

Further, as shown in FIG. 77, it is possible that part of the coating liquid in pool 484 flows out over the upper edge of front end surface 476 of coating liquid tank 470. In this case also, an invalid region is formed where the thickness of the formed coating film is out of the tolerable range, near the lower end of the surface to be coated of substrate 310.

Figure 78:
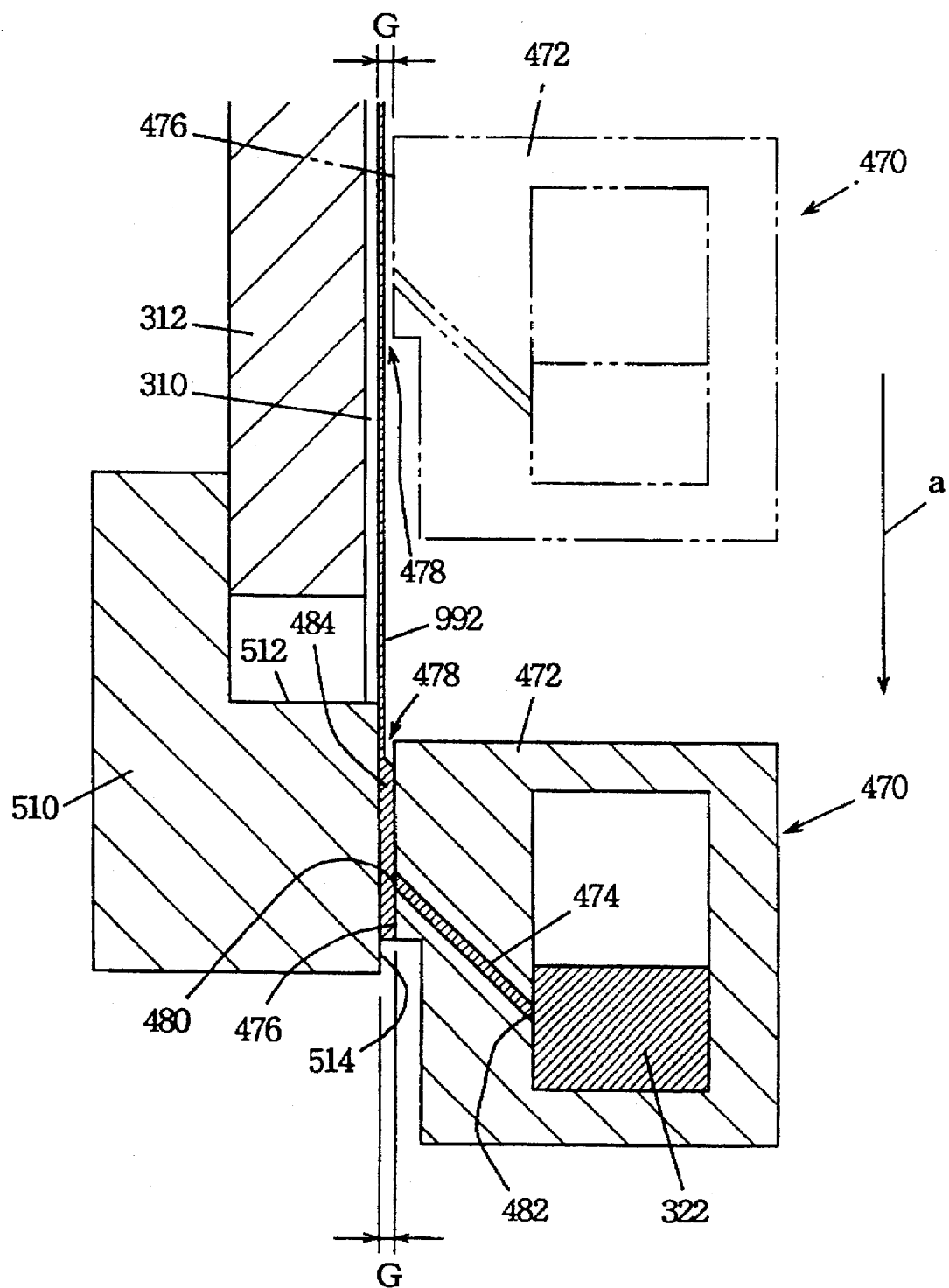
FIG. 78 is an enlarged vertical section of the extended member and the coating liquid tank, at the coating terminating position of the coating apparatus in accordance with the thirtieth embodiment of the present invention.

However, this problem is solved by the extended member 510 in the coating apparatus in accordance with the thirtieth embodiment. Referring to FIG. 78, assume that the upper end of the front end surface 476 of coating liquid tank 470 goes below the lower end of the surface to be coated of substrate 310 at the terminating end of coating. In this case, the gap having the size G may be maintained between front end surface 476 and front wall surface 514. The pool 484 is maintained in this space. Therefore, the coating liquid of the pool 484 which has formed in the gap 478 between front end surface 476 of coating liquid tank 470 and the surface to be coated of substrate 310 is not at all influenced in its speed of movement, even when the front end surface 476 moves below the lower end of the substrate 310. As a result, the problem that part of the coating liquid in pool 484 in gap 478 can rise above the upper end of front end surface 476 such as shown in FIG. 77 is avoided. Further, as shown in FIG. 78, if the coating liquid tank 470 is moved in the direction of the arrow a until the meniscus at the upper end of pool 484 reaches the terminating end of the surface to be coated of substrate 310, the thickness of the coating film 992 formed on the surface of the substrate 310 would be uniform until the terminating end.

If the longitudinal length of the front wall portion 514 of the extended member 510 is made longer than the longitudinal length of the front end surface 476 of the coating liquid tank 470, pool 484 is maintained therebetween, when the coating liquid tank 470 is stopped. By reducing the pressure in coating liquid tank 470, the coating liquid in the pool 484 will return to the coating liquid tank 470 and be recovered.

The coating apparatus in accordance with the thirtieth embodiment operates in the following manner. First, substrate 310 is fixed on stage 312 by vacuum suction or the like. At this time, upper and lower end portions of substrate 310 protrude upward and downward from the respective upper and lower ends of stage 312.

Coating liquid tank 470 containing a prescribed amount of coating liquid 322 is at the position shown in FIGS. 71 and 74. More specifically, the coating liquid tank 470 is positioned such that the upper end of substrate 310 is positioned between the position A on front end surface 476 of coating liquid tank 470 and the outlet 480 of coating liquid outlet path 474, and that a gap 478 having the size G is formed between the front end surface 476 and the surface to be coated of substrate 310.

Then, pressure in the coating liquid tank 470 is increased by using the pressure setting system 400, the coating liquid flows into gap 478 from coating liquid tank 470 through coating liquid outlet path 474. Consequently, part of the pool 484 is formed in gap 478. Thereafter, in order to prevent forced flow of the coating liquid out of the tank, the coating liquid tank 470 is opened to the air. Thus, a strip shaped pool 484 is formed in the gap 478. The procedure for forming the strip shaped pool 484 is not limited to that described above, and various other methods may be used, including those described above.

After the strip shaped pool 484 is formed in gap 478, the coating liquid tank 470 is opened to the air, so that the coating liquid in pool 484 does not flow out of the gap 478 and so that the coating liquid 322 is supplied to the gap 478 from coating liquid tank 470 during the process of coating.

At this time, the lower end of the strip shaped pool 484 formed in gap 478 is regulated by the lower edge of the front end surface 476 of front wall portion 472 of coating liquid tank 470. The upper end of pool 484 is regulated, in the best case, by the upper end of the surface to be coated of substrate 310.

When the strip shaped pool 484 is formed in gap 478, the coating liquid tank 470 is moved in the direction of the arrow a, while keeping the gap 478 having the size G between the front end surface 476 of coating liquid tank 470 and the surface to be coated of substrate 310. Until the position A of the highest reach on front end surface 476 reaches the upper end of the surface to be coated of substrate 310, the area of front end surface 476 opposing to the surface to be coated of substrate 310 increases gradually. To this gradually increasing portion, the coating liquid is supplied from coating liquid tank 470 through coating liquid outlet path 474 at least by capillary action. Therefore, movement of the upper end of the pool 484 is suppressed during this period.

Figure 75:
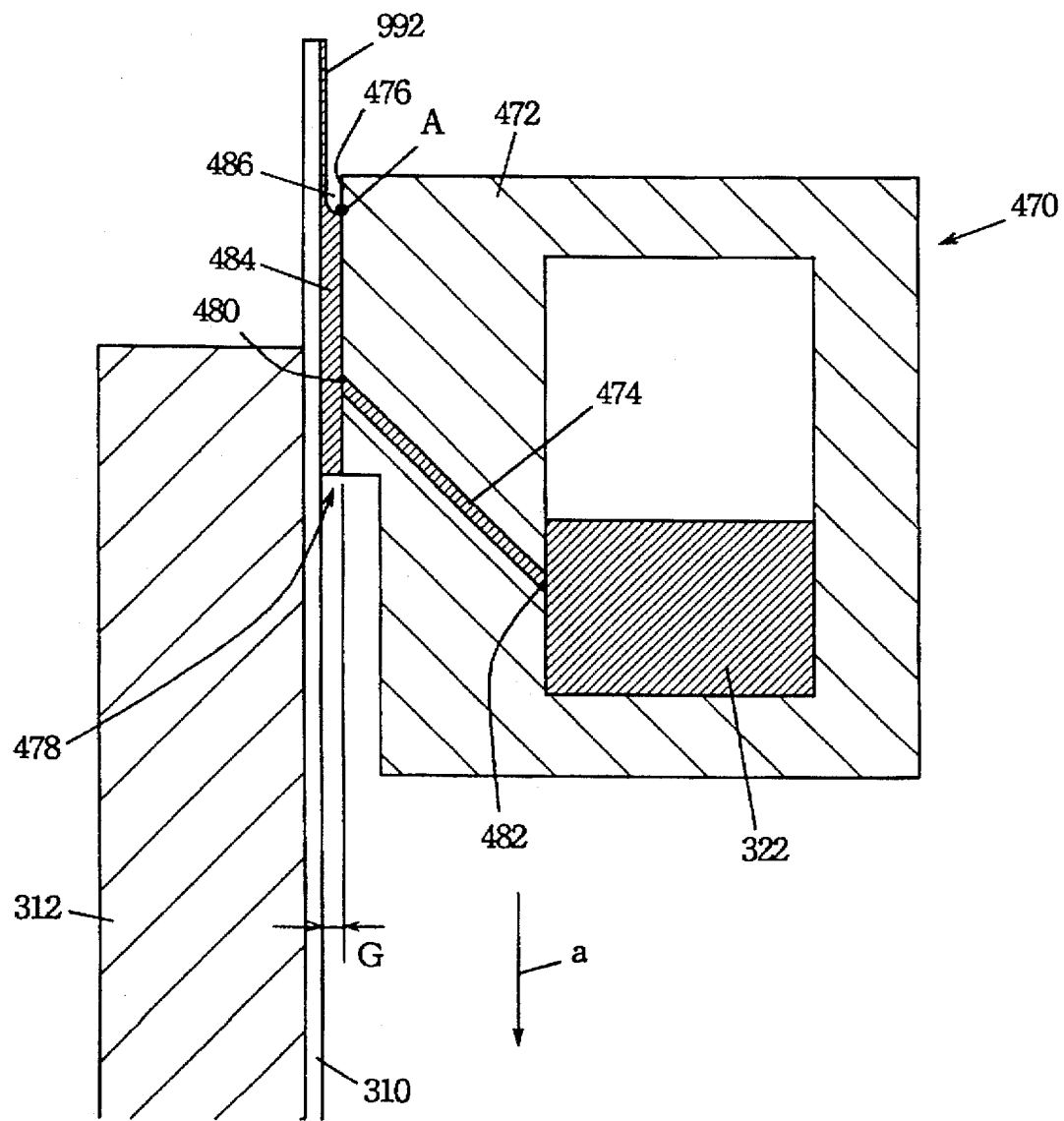
FIG. 75 is an enlarged vertical section of the coating liquid tank, during coating operation of the coating apparatus in accordance with the thirtieth embodiment of the present invention.

After the degree of increase of the opposing area between the front end surface 476 of coating liquid tank 470 and the surface to be coated of substrate 310 exceeds the speed at which the coating liquid is supplied thereto from coating liquid tank 470, or at the latest, after the height A on front end surface 476 reaches the upper end position of the surface to be coated of substrate 310, the meniscus at the upper end of pool 484 in gap 478 starts moving on the surface to be coated of substrate 310, together with the movement of coating liquid tank 470. As a result, coating liquid is applied to the surface of substrate 310 and coating film 992 is formed, as shown in FIG. 75.

When coating liquid tank 470 is continuously moved downward, the liquid in the pool 484 is continuously applied to the surface of substrate 310. An amount of coating liquid which corresponds to the consumed amount of coating liquid is supplied from coating liquid tank 470 through coating liquid outlet path 474 to the gap 478 at least by capillary action. Therefore, coating liquid is applied to the surface of substrate 310, with the amount of coating liquid in the pool 484 in the gap 478 being kept constant.

At this time, above the pool 484 of gap 478, there is formed a space 486 which does not contain any coating liquid. When the volume of the gap 478 sandwiched between front end surface 476 and the surface to be coated is changed because of a wave on the surface of substrate 310, for example, the upper end of the pool 484 may move upward or downward relative to the coating liquid tank 470. However, since there is the space 486 containing no coating liquid, the coating liquid does not flow out over the upper edge of front end surface 476 of the coating liquid tank 470. Furthermore, selection of the size of the gap within the range from 0.1 to 0.3 mm previously described enables the restriction of the adverse effect on the coating film thickness by the size of the gap.

Then, coating liquid tank 470 is moved to a position where the upper end of the pool 484 in gap 478 is at least out of the area requiring coating, for example at the position near the lower end of substrate 310 denoted by the two dotted lines in FIG. 71, and then the coating liquid tank 470 is stopped. Preferably, as shown in FIG. 78, the coating liquid tank 470 is moved to a position where the front end surface 476 of coating liquid tank 470 is completely below the surface requiring coating of the substrate 310 and is positioned in opposition to the front wall surface 514 of extended member 510, and then the tank is stopped. By doing so, the area at which the coating film thickness is out of the tolerable range at the terminating side of substrate 310 can be minimized or eliminated.

At the position shown in FIG. 78, the pressure in coating liquid tank 470 is reduced and the coating liquid in gap 478 returns to the coating liquid tank 470. This can minimize the dropping of coating liquid.

Thereafter, coating liquid tank 470 is moved in the direction away from the stage 312, for example in the horizontal direction, so as to facilitate removal of the substrate 310 from the stage 312. When the coated substrate 310 is removed from stage 312, the operation returns to the first step for coating of the next substrate 310.

In this embodiment, at the terminating side of coating, the end surface 512 of extended member 510 is brought into contact with or close to the lower end of substrate 310, and substrate 310 is held in this position against stage 312 by vacuum suction or the like. Therefore, possibility of dropping or sliding of substrate 310 held by the stage 312 and causing damage can be reduced. Even when the thickness of substrate 310 is increased, extended member 510 assists in supporting substrate 310, and therefore holding of substrate 310 by the stage 312 is made more stable.

In the foregoing, the thirtieth embodiment of the present invention has been described. The shape of the coating liquid tank 470 is not limited to that described above and a coating liquid tank of various other shapes may be used. Therefore, the positional relation between the substrate and the coating liquid tank at the start position of coating is not limited to that described above, and positional relationships of various other embodiments already described may be used. Further, the positional relation between the substrate 310 and the stage 312 at the terminating end of the thirtieth embodiment may be changed to those of the above described other embodiments. In that case, the extended member 510 may not be provided.

Thirty-first Embodiment

Figure 79:
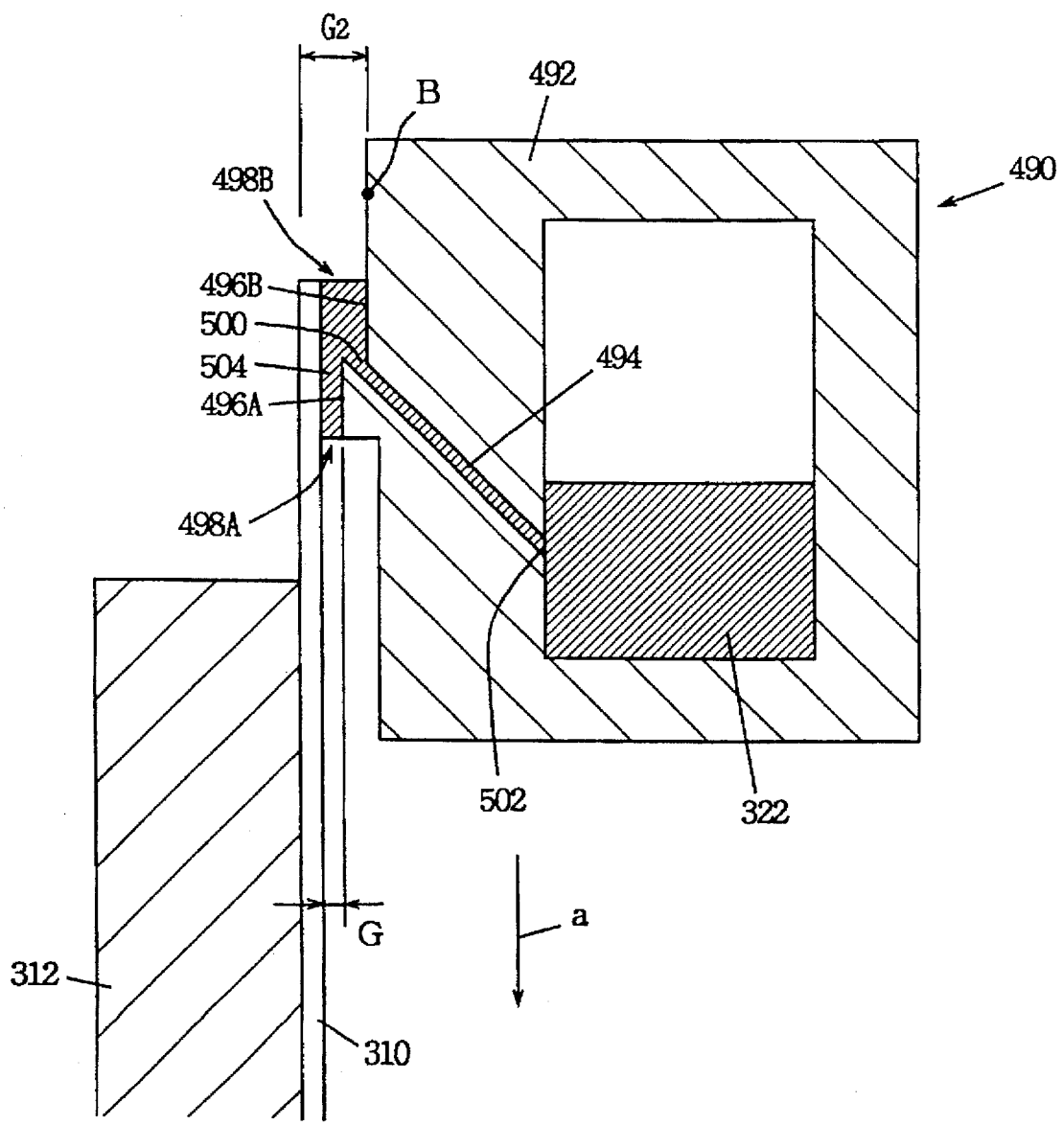
FIG. 79 is an enlarged vertical section of the coating liquid tank, at the coating start position of a coating apparatus constructed in accordance with a thirty-first embodiment of the present invention.

Referring to FIG. 79, the coating apparatus in accordance with the thirty-first embodiment of the present invention includes, instead of the coating liquid tank 470 of the thirtieth embodiment, the coating liquid tank 490 of the fifth embodiment shown in FIG. 21. In FIGS. 79 and 21, corresponding components are denoted by the same reference characters, they are referred to by the same names and their functions are similar. Therefore, a detailed description thereof is not repeated.

The embodiment of FIG. 79 differs from that of FIG. 21 in that the coating liquid tank 490 is positioned at the coating start position such that the upper end of the surface to be coated of substrate 310 is positioned between outlet 500 of coating liquid outlet path 494 and a position B of maximum reach on front end surface upper portion 496B of coating liquid tank 490.

The coating apparatus of the thirty-first embodiment is the same as that of FIG. 21 except that the problem in the thickness of the coating film at the coating start position can be advantageously solved by the present embodiment.

Thirty-Second Embodiment

Figure 80:
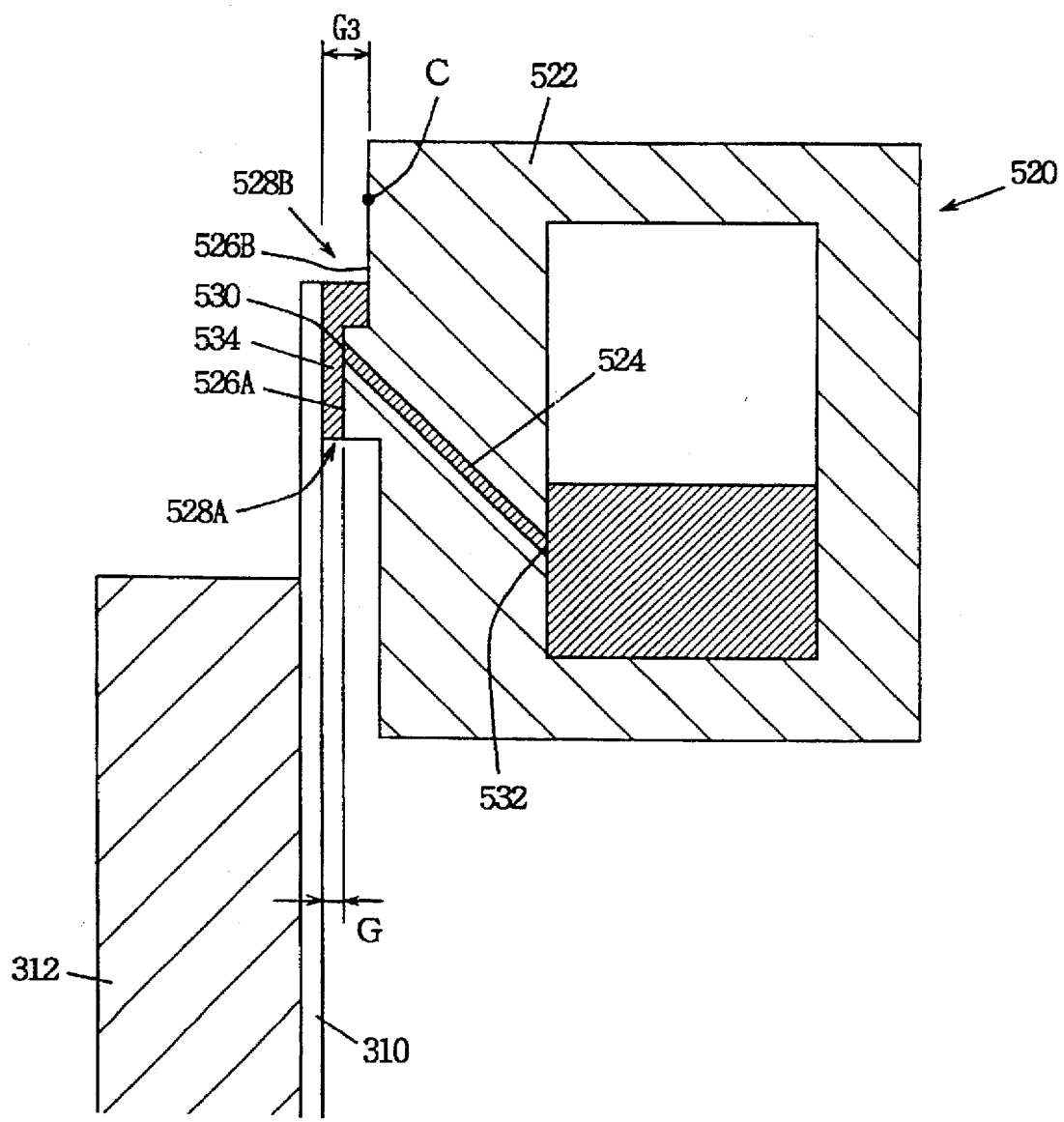
FIG. 80 is an enlarged vertical section of the coating liquid tank, at the coating start position of a coating apparatus constructed in accordance with a thirty-second embodiment of the present invention.

FIG. 80 shows a main portion of the coating apparatus constructed in accordance with the thirty-second embodiment of the present invention. The apparatus of the thirty-second embodiment differs from that of the thirtieth embodiment by using coating liquid tank 520 of the sixth embodiment shown in FIG. 22 instead of the coating liquid tank 470 of the thirtieth embodiment. When coating liquid tank 520 is used, it is positioned such that the upper end of the surface to be coated of substrate 310 is positioned between outlet 530 of coating liquid outlet path 524 and the position C of maximum reach on the front end surface upper portion 526B.

Operation and effect of the apparatus in accordance with the present embodiment are the same as those of the thirtieth and thirty-first embodiments above. Therefore, a detailed description thereof is not repeated.

Thirty-third Embodiment

Figure 81:
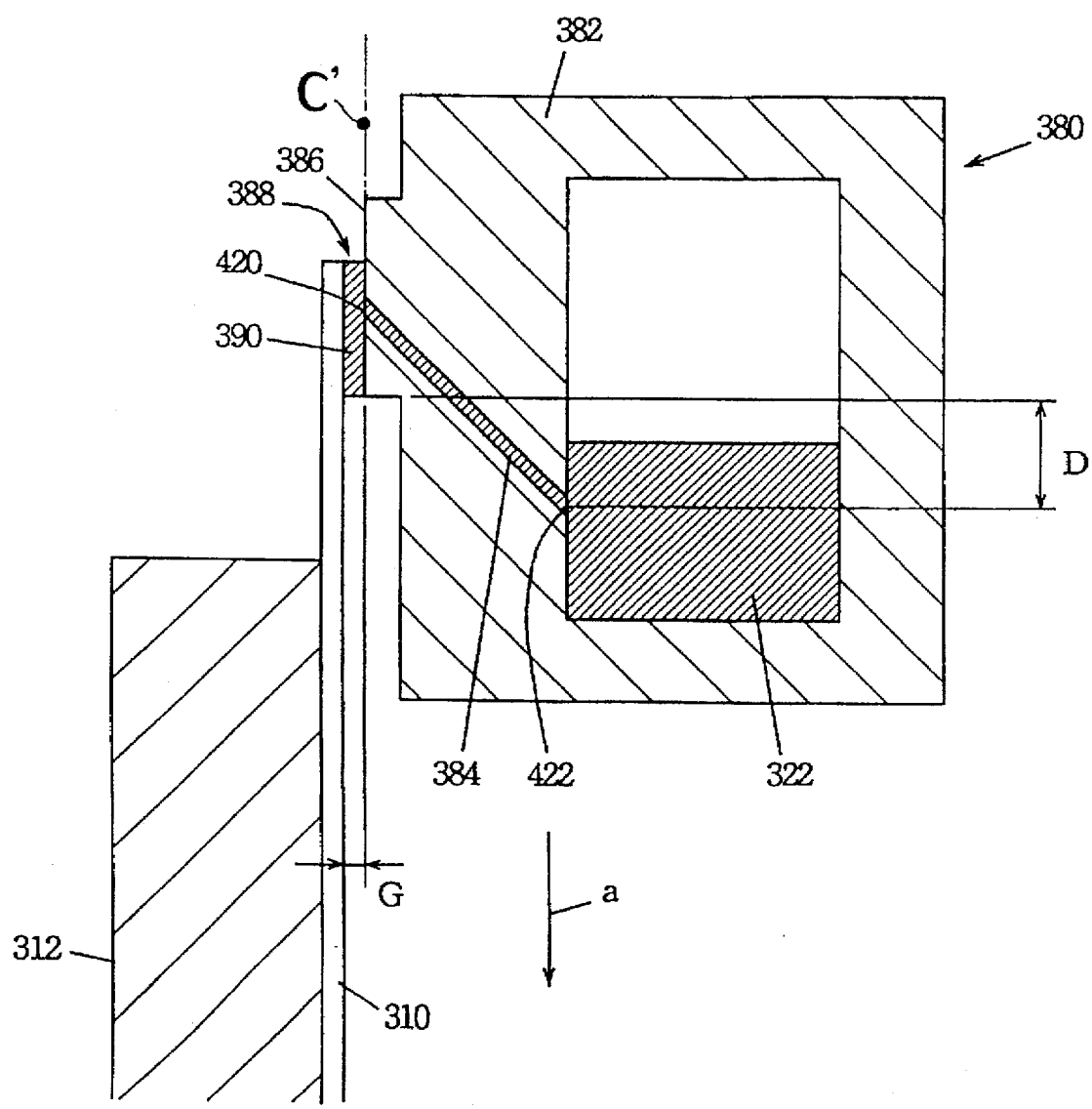
FIG. 81 is an enlarged vertical section of the coating liquid tank, at the coating start position of a coating apparatus constructed in accordance with a thirty-third embodiment of the present invention.
Figure 82:
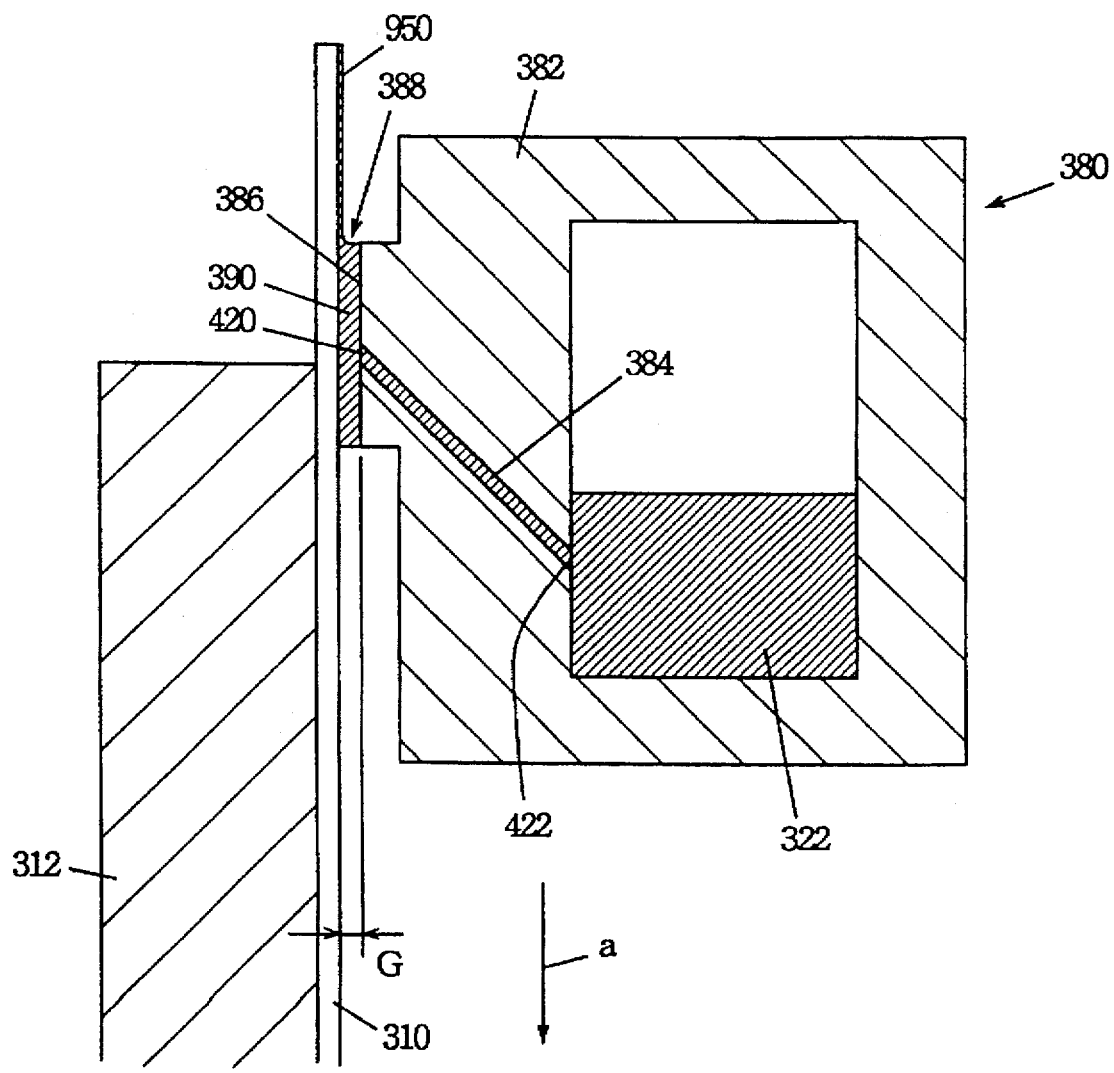
FIG. 82 is an enlarged vertical section of the coating liquid tank, during coating operation of the coating apparatus in accordance with the thirty-third embodiment of the present invention.

FIGS. 81 and 82 are vertical sections of the main portion of the coating apparatus constructed in accordance with the thirty-third embodiment of the present invention. The apparatus of this embodiment has a structure very similar to that of the thirtieth embodiment shown in FIGS. 71 to 74. However, instead of the coating liquid tank 470 of the thirtieth embodiment, the thirty-third embodiment includes the coating liquid tank 380 of the third embodiment shown in FIG. 15. In FIGS. 15, 81 and 82, corresponding portions are denoted by the same reference characters and they have the same names and same functions. Therefore, a detailed description thereof is not repeated.

What should be noted is the position of the upper edge of the front end surface 386 of front wall portion 382 of the tank 380. Assume that the front end surface 386 and the surface to be coated of substrate 310 are extended indefinitely upward. The gap 388 between front end surface 386 and the surface to be coated of substrate 310 is also assumed to extend upward indefinitely. When coating liquid 322 flows from coating liquid tank 380 to the gap 388 through coating liquid outlet path 384, the coating liquid may rise in the assumed gap 388 at least by capillary action. However, because of gravity, the maximum height that can be reached by the coating liquid at this time is labeled C'; which will be referred to as the maximum height position.

The front wall portion 382 is formed such that the upper end of the front end surface 386 of coating liquid tank 380 is positioned between outlet 420 of coating liquid outlet path 384 and the maximum height position C'. The lower edge of front end surface 386 is formed to be positioned between outlet 420 and inlet 422 of coating liquid outlet path 384.

When coating liquid 322 is introduced to the coating liquid tank 380 such that the liquid surface is at a level within the range D between the inlet 422 of coating liquid outlet path 384 and the lower end of the front end surface 386, coating liquid flows into the gap 388 from coating liquid tank 380 through coating liquid outlet path 384, and forms a pool 390. The lower end of the pool 390 is regulated by the lower end of front end surface 386.

Meanwhile, at the coating start position, the coating liquid tank 380 is positioned such that the upper end of the substrate 310 is, as shown in FIG. 81, positioned at a level between outlet 420 of coating liquid outlet path 384 and the upper edge of front end surface 386. The upper end of pool 390 formed in the gap 388 is regulated by the upper end of substrate 310.

The operation of the apparatus when coating liquid is applied to the surface of substrate 310 using this apparatus is very similar to the operation of the thirtieth, thirty-first and thirty-second embodiments above. The coating liquid tank 380 is at the position shown in FIG. 81, and a strip shaped pool 390 is formed. Thereafter, the coating liquid tank 380 is moved downward as denoted by the arrow a, while maintaining the gap 388 of a size G between front end surface 386 and the surface to be coated of substrate 310.

Referring to FIG. 82, until the upper end of front end surface 386 reaches the upper end of substrate 310, the meniscus at the lower end of pool 390 moves downward together with the lower edge of the front end surface 386. However, the meniscus at the upper end of pool 390 does not move. The amount of coating liquid in the pool increases gradually during this period. When the upper end of front end surface 386 reaches the upper end of substrate 310, the meniscus at the upper end of pool 390 is regulated by the upper edge of front end surface 386, and starts moving downward together with the upper end of front end surface 386. At this time, coating liquid in the pool 390 is applied to the surface of substrate 310, thus forming a coating film 950. An amount of coating liquid corresponding to the amount of coating liquid consumed for forming the coating film 950 is supplied from coating liquid tank 380 through coating liquid outlet path 384 to the pool 390. By the time the upper end of the pool 390 starts its movement, a period in which thickness of the film becomes thinner has already passed (see FIG. 42). Therefore, even near the coating start position, the coating film 950 has a constant desirable film thickness.

Figure 83:
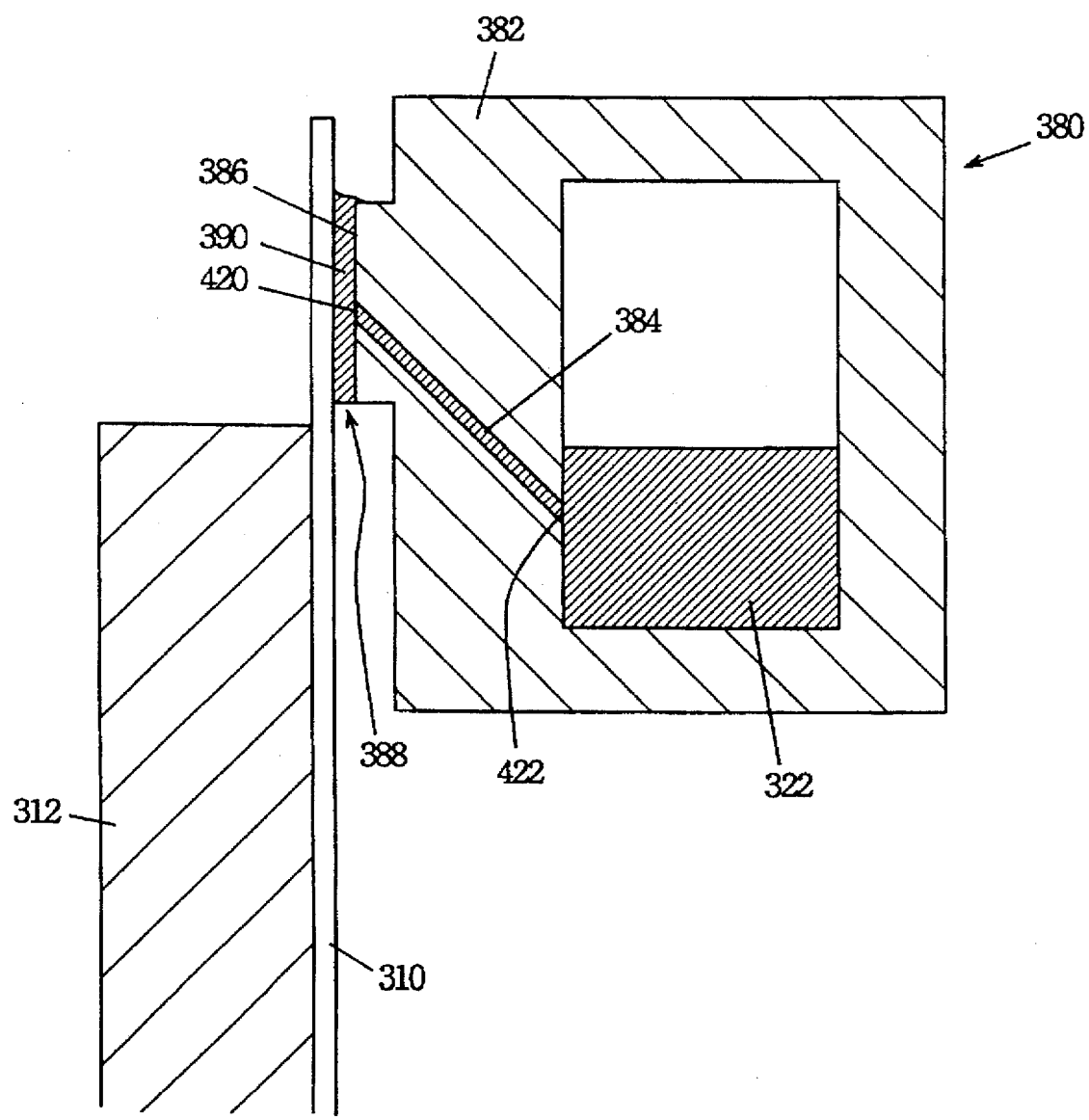
FIG. 83. illustrates a possible problem related to the coating liquid tank, which problem is solved by the coating apparatus of the thirty-third embodiment of the present invention.

Assume that at the coating start position, coating liquid tank 380 is positioned such that the upper end of the substrate 310 is positioned above the upper edge of front end surface 386 and the coating liquid tank 380 is moved downward from that position, as shown in FIG. 83. In that case, together with the start of movement of coating liquid tank 380, pool 390 starts downward movement immediately. However, the upper end of pool 390 cannot move at the same speed as the tank 380 immediately. Therefore, the coating liquid in pool 390 flows over the upper edge of front end surface 386 as shown in FIG. 83. Therefore, in the example of FIG. 83, defective coating film would be formed near the coating start position.

By contrast, when the coating liquid tank 380 is positioned as shown in FIG. 81, such problem can be avoided.

Thirty-fourth Embodiment

Figure 84:
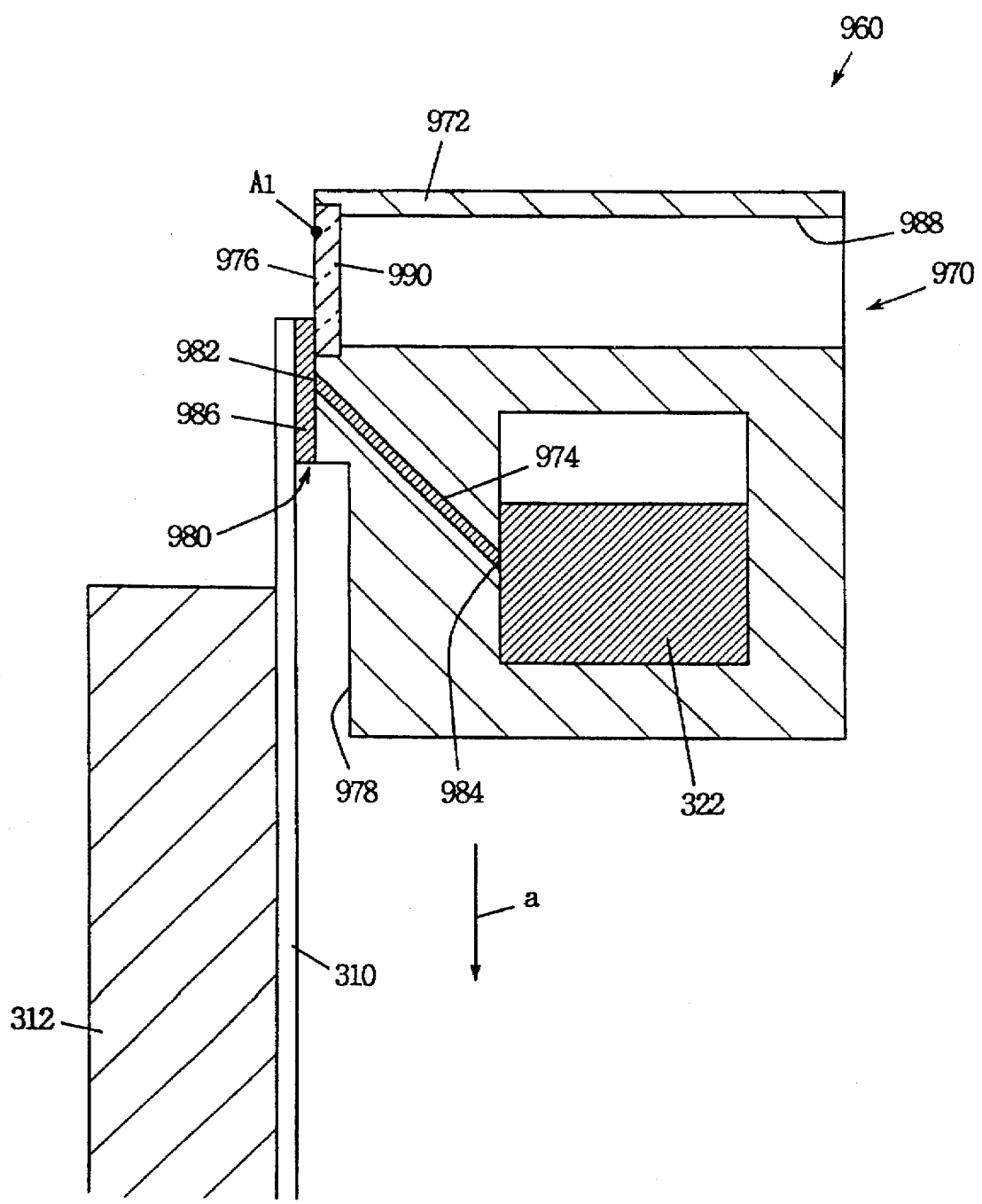
FIG. 84 is an enlarged vertical section of the coating liquid tank, at the coating start position of a coating apparatus constructed in accordance with a thirty-fourth embodiment of the present invention.

FIG. 84 is a vertical cross section of the main portion of coating apparatus 960 constructed in accordance with the thirty-fourth embodiment of the present invention. The coating apparatus 960 has a structure similar to that of the coating apparatus of the thirtieth embodiment shown in FIGS. 71 to 78, except that coating liquid tank 970 shown in FIG. 84 is used in place of the coating liquid tank 470 shown in FIG. 74. By using the coating liquid tank 970, it is possible to confirm conditions at the upper end of the pool 986 formed in the gap 980 between the front end surface 976 of the coating liquid tank 970 and the surface to be coated of substrate 310, even if the substrate 310 is not transparent.

Referring to FIG. 84, the appearance of the coating liquid tank 970 is similar to that of the coating liquid tank 470 of the thirtieth embodiment shown in FIG. 74. More specifically, the coating liquid tank 970 has a front end surface 976 of front wall portion 972, with the lower end of front end surface 976 being positioned at a level between outlet 982 and inlet 984 of coating liquid outlet path 974. Coating liquid 322 is introduced to the coating liquid tank 970 such that the surface thereof is positioned at a level between the lower edge of front end surface 976 and inlet 984 of coating liquid outlet path 974. The upper edge of front end surface 976 is selected to be higher than the maximum height (position A1) of the coating liquid in a gap 980 when the gap is assumed to be extended indefinitely upward. Therefore, when coating liquid is applied to the surface to be coated of the substrate 310 by using the coating liquid tank 970, satisfactory thickness of the coating film can be obtained near the start position, as in the thirtieth embodiment.

The feature of the coating liquid tank 970 is that it has a through hole 988 passing in the forward and rearward direction at the upper portion of tank 970. A transparent body 990 such as a transparent glass plate is fitted in the opening on the side of the front end surface 976, and the front end surface 976 is constituted by the front wall surface of transparent glass plate 990. From the side of the surface to be coated of substrate 310, the state of the upper end of pool 986 formed in the gap 980 can be observed through the through hole 988. Therefore, after satisfactory formation of the strip shaped pool 986 at the coating start position is confirmed, coating liquid tank 970 can be moved downward.

Thirty-Fifth Embodiment

Figure 85:
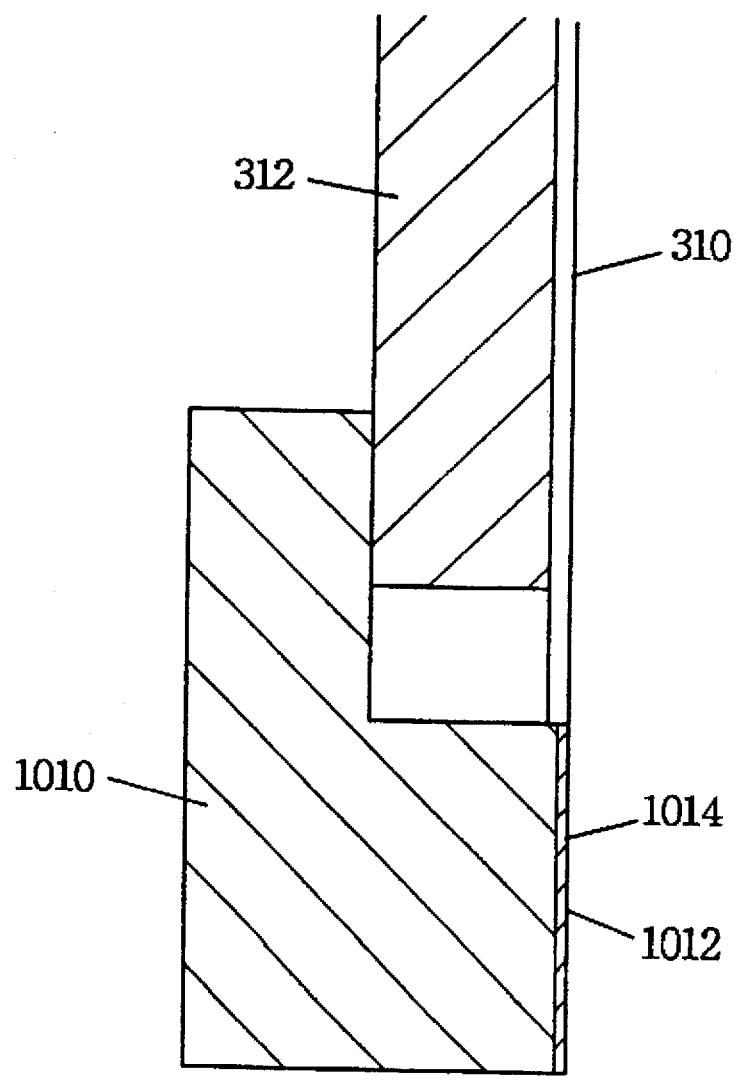
FIG. 85 is enlarged vertical section of the main portion of coating apparatus at a coating terminating position and constructed in accordance with a thirty-fifth embodiment of the present invention.

FIG. 85 is a cross section of the extended member in the coating apparatus constructed in accordance with the thirty-fifth embodiment of the present invention. The coating apparatus of the present embodiment is the same as the coating apparatus of the thirty-second embodiment except that an extended member 1010 is used instead of the extended member 510.

Referring to FIG. 85, the extended member 1010 of the coating apparatus has a portion 1014 providing the front wall surface 1012 formed of a material having specific nature. This material has poorer wettability than that of the surface to be coated of substrate 310, with respect to the coating liquid. For example, this portion 1014 is formed of fluoride resin. Alternatively, a film having such nature as mentioned above is provided at this portion 1014 by surface treatment.

When the extended member 1010 of FIG. 85 is used, coating liquid tends not to be adhered on the front wall surface 1012 of extended member 1010. Even if the coating liquid adheres on the front wall surface 1012, the coating liquid may not form a film but becomes a drop. Therefore, adhered coating liquid can be readily removed from the front wall surface 1012 of the extended member 1010, and thus extended member 1010 can be cleaned easily.

However, if this extended member 1010 is used, it should be noted that the problem of the thickness of the coating film near the terminating end of the surface to be coated of substrate 310 becomes more serious as compared with when the front wall surface 1012 is formed by using a material having the same or higher wettability as the surface to be coated of substrate 310 with respect to the coating liquid. However, even in this case, the problem can be reduced as compared to when such extended member is not provided at all.

Thirty-Sixth Embodiment

Figure 86:
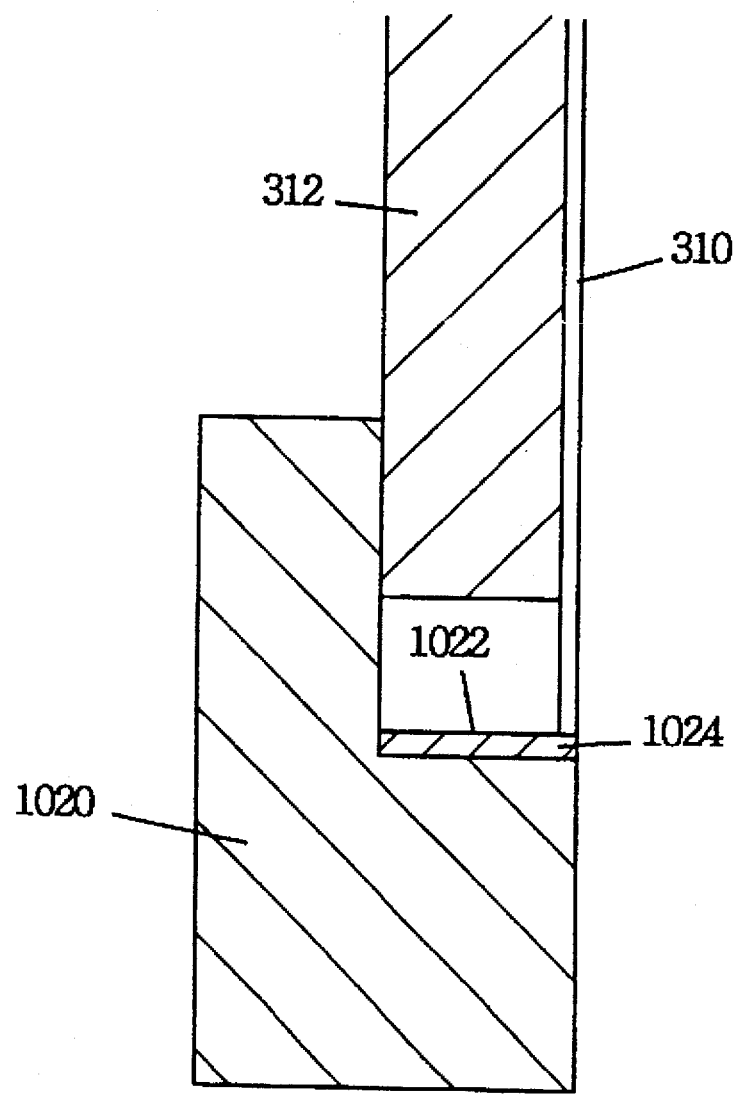
FIG. 86 is an enlarged vertical section of the main portion of coating apparatus at a coating terminating position and constructed in accordance with a thirty-sixth embodiment of the present invention.

FIG. 86 is a cross section of a main portion of the coating apparatus constructed in accordance with the thirty-sixth embodiment of the present invention. The coating apparatus of this embodiment is the same as that of the thirtieth embodiment except that extended member 1020 is used instead of the extended member 510. In extended member 1020, the portion 1024 providing the end surface 1022 that is in contact with or close to the lower end of substrate 310, is formed of a material having a specific nature. Similar to the material of portion 1014 in the thirty-fifth embodiment, this material has poorer wettability than that of the surface to be coated of substrate 310 with respect to the coating liquid. For example, this portion 1024 is formed by a resin fluoride. Alternatively, a film having such nature as mentioned above is formed at this portion 1024 by surface treatment.

When the extended member 1020 shown in FIG. 86 is used, the possibility of the coating liquid entering the space between end surface 1022 and a lower portion of substrate 310 can be minimized or eliminated, when the pool of the coating liquid formed in the gap between front end surface of the coating liquid tank and the surface to be coated of substrate 310 passes at the portion where the lower end of substrate 310 and end surface 1022 of extended portion 1020 is in contact with each other or close to each other. After the completion of coating, when the coating liquid tank is moved away from the stage 312 in the horizontal direction, for example, in order to remove substrate 310 from the stage 312, the possibility of the coating liquid entering into the space between the lower end portion of substrate 310 and the end surface 1022 can be eliminated or minimized.

Therefore, the possibility of contamination of the lower end surface of substrate 310 by the coating liquid can be minimized or eliminated.

When the portion 1024 provided the end surface 1022 of extended member 1020 is formed by a resin fluoride or the like, the possibility of damaging the substrate 310 caused by contact with the end surface 1022, if the substrate 310 is a glass substrate for LCDs, for example, can also be reduced.

In some of the above described embodiments, the extended member is arranged such that the front wall surface is flush with the surface to be coated of substrate 310. Such mode is the best. However, arrangement of the extended member is not limited to this and the front wall surface of the extended member may not be flush with the surface to be coated of the substrate 310.

In the thirtieth embodiment above, coating liquid tank 470 is moved to a position where the meniscus at the upper end of pool 484 is positioned below the lower end of substrate 310 and movement of the tank 470 is stopped thereafter. However, the present invention is not limited to such embodiment. Provided that application of the coating liquid is continued until the lower end of front end surface 476 of coating liquid tank 470 passes over the lower end position of the surface to be coated of substrate 310, influence on the coating film so formed and caused by suppression in movement of pool 484 by the lower end of substrate 310 can be reduced, as compared with the examples which do not include such extended member.

Figure 87:
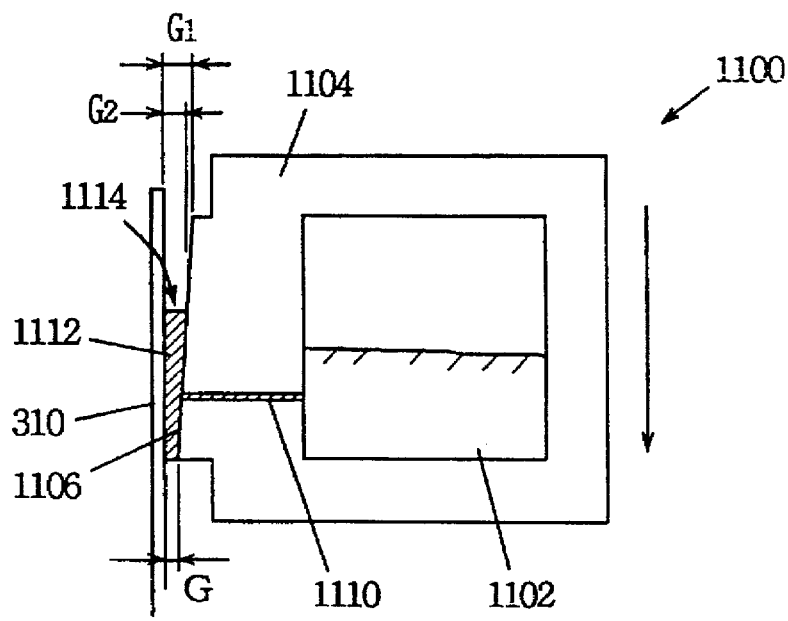
FIGS. 87 and 88 are enlarged vertical sections of two other examples of coating liquid tanks.

Referring to FIG. 87, a coating liquid tank 1100 may be used in the coating apparatus described above, which coating liquid tank 1100 has front end surface 1106 of front wall portion 1104 opposing the surface to be coated of substrate 310 with a gap 1114, of which size is G at the lower edge and G1 at the upper edge (G1>G). In that case, coating liquid 1102 which flows from coating liquid tank 1100 to the gap 1114 through coating liquid outlet path 1110 forms a liquid pool 1112 in the gap 1114. The lower end of pool 1112 is regulated by the lower edge of front end surface 1106. The upper end of pool 1112 may be regulated by the upper edge of front end surface 1106, or the shape of front wall portion 1104 may be selected such that the upper edge of front end surface 1106 is positioned higher than the highest position reached by the coating liquid in pool 1112. In the example shown in FIG. 87, the shape of front wall portion 1104 is selected such that the upper edge of front end surface 1106 becomes higher than the highest position reached by the coating liquid in pool 1112.

In the example shown in FIG. 87, the size of gap 1114 is G at the lower end, and G1 at the upper end. However, the size of the upper end of pool 1112 is G2 (G<G2<G1), which size G2 is an important factor determining the thickness of the coating film. This gap is referred to as substantial gap in the specification of the present application. A stable coating film of uniform thickness can be formed provided that the shape of the front end surface 1106 of front wall portion 1104 is selected such that the size G2 of the substantial gap is from 0.1 to 0.3 mm, as already mentioned.

Coating liquid outlet path 1110 is horizontal in the example shown in FIG. 87, and a pressure adjusting system (not shown) allowing adjustment of the pressure in coating liquid tank 1100 is necessary. When such pressure adjusting system is provided, the attitude of substrate 310 is not limited to vertical but it may be inclined. However, when coating liquid tank 1100 having such an inclined front end surface as shown in FIG. 87 is used, it has been found that the thickness of the coating film becomes uneven when the surface to be coated of substrate 310 is horizontal and faces upward. Therefore, the attitudes of the substrate and the coating liquid tank must be selected appropriately to avoid such disadvantage. The acceptable range is determined based on a number of factors including the state of the surface to be coated of the substrate, fluidity of coating liquid 1102 over front end surface 1106, and so on.

Figure 88:
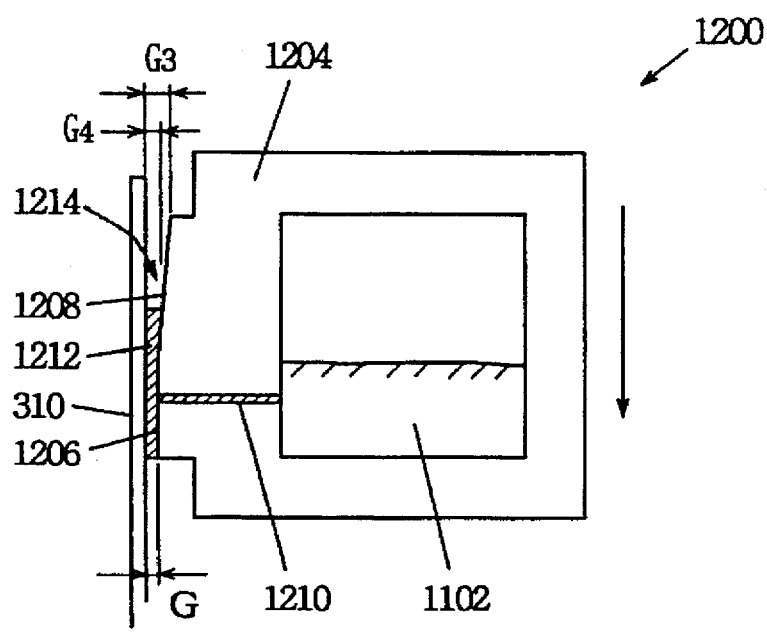

Similarly, as shown in FIG. 88, a coating liquid tank 1200 may be used, having a front wall portion 1204 with a front end surface that consists of a lower front end surface 1206 which is parallel to the surface to be coated of substrate 310 with a gap G therebetween, and an inclined upper front end surface 1208 forming a wedge-shaped gap between surface 1208 and the surface to be coated of the substrate 310 with such wedge-shaped gap being wider at its top then at its bottom. The coating liquid which flows from coating liquid tank 1200 to gap 1214 through coating liquid outlet path 1210 forms a pool 1212. The lower end of pool 1212 is regulated by the lower edge of lower front end surface 1206. Front wall portion 1204 is formed such that the upper end of pool 1212 does not reach the upper edge of front end surface upper portion 1208.

In this case also, what determines the thickness of the coating film is not the gap G3 (G3>G) between the uppermost portion of front end surface upper portion 1208 and the surface to be coated of substrate 310 but the size G4 (G<G4<G3) of the substantial gap at the upper end of pool 1212. The thickness of the formed coating film is uniform so long as the gap G4 is in the range of from 0.1 to 0.3 mm.

It has also been found that in the coating liquid tank 1200 of FIG. 88, uniform coating film cannot be formed when coating is performed with the surface to be coated of the substrate horizontal and facing upward, just as when coating liquid tank 1100 of FIG. 87 is used. Therefore, in this case (FIG. 88) also, the attitudes of the substrate and the coating liquid must be selected within such a range that prevents such disadvantage.

In the embodiments described above, when the substrate to be coated is mounted on and removed from the substrate stage, the coating liquid tank is moved in a direction away from the substrate surface to be coated (in a direction to increase the gap defined between the front end surface of the coating liquid tank and the surface to be coated of the substrate) to facilitate the operation of the coating apparatus in effecting the coating.

The present invention, however, is not limited thereto. For example, as an alternative, when the substrate to be coated is secured on the substrate stage, it is possible to locate the coating liquid tank above a position at which the tank is normally situated to start the coating, and the coating liquid tank is moved downward (in a direction parallel to the substrate surface to be coated) to that start position to begin the coating after the substrate to be coated is mounted on the stage.

As another alternative, it is possible to move the coating liquid tank (in a direction parallel to the substrate surface to be coated) below a position at which the tank is normally located to terminate the coating when the substrate having the coating film formed on the surface to be coated is removed from the stage.

As long as the operation for mounting and removing the substrate to be coated on and from the substrate stage is facilitated in effecting the coating, one of the tank movements described in the above embodiments and in the two alternatives, or a combination thereof, may be adopted in moving the coating liquid tank.

Furthermore, positioning the tank is not limited to moving only the tank. It is possible to move at least one of the stage and/or the tank relative to each other.

In the embodiments described above, to apply the coating liquid on the substrate surface to be coated, the coating liquid tank is moved relative to the substrate to be coated that is mounted on the stationary substrate stage by the linear driving mechanism illustrated in FIGS. 6 through 8 while the prescribed gap between the substrate surface to be coated and the front end surface of the tank is kept constant.

The present invention, however, is not limited thereto. It is possible to move the stage which mounts the substrate to be coated and/or the coating liquid tank relative to each other by another moving mechanism. That is, it is possible to move the stage, alternatively, while maintaining the coating liquid tank stationary, or to move both the substrate and the tank, by another moving mechanism.

In the embodiments described above, the coating liquid tank is formed with a front end surface at that inner or upper portion in the vertical direction of the front wall portion thereof which protrudes forward over the entire width of the tank. The coating liquid outlet path from the tank is formed in the widthwise direction of the front wall portion. The coating liquid tank is narrower than or equal in width to the substrate to be coated. The present invention, however, is not limited thereto.

As previously explained, the coating liquid is applied to the substrate surface to be coated while the coating liquid of the pool formed in the gap is moved onto the substrate surface to be coated.

Accordingly, the range of the coating film formed on the substrate surface to be coated in the widthwise direction thereof (for example, orthogonal to the direction in which the tank is moved by the linear driving mechanism to effect the coating) is determined by the size in the widthwise direction of the gap in which the pool of coating liquid is formed.

In other words, that range is determined by those portions of the front end surface and of the substrate surface to be coated which define the gap. It is essential that the coating liquid be supplied to that gap defined. In view of the above, or because of the structure of the tank, it is possible to employ a coating liquid tank having a width greater than that of the substrate to be coated and formed with a front end surface projecting forward over the entire width of a front wall portion of the tank.

Alternatively, it is possible to use a coating liquid tank formed with a front end surface projecting forward over that width of a front wall portion which corresponds not to the entire width of the tank but only to the width of the substrate surface to be coated. Furthermore, it is possible to arrange the width of the front wall portion so that it is greater than that of the coating liquid tank. Moreover, it is possible to combiningly adopt the widths of the front end surface, front wall portion, and coating liquid tank.

Besides, the coating liquid outlet path formed in the widthwise direction of the front wall portion may be opened entirely or partially in the widthwise direction of the front end surface.

Thus, it is possible to alter the shape or structure of the coating liquid tank by adopting various modifications thereof.

In the type of the coating apparatus (for example, the one in accordance with the third embodiment), the outlet of the coating liquid outlet path passing through the front wall portion of the coating liquid tank is positioned above the inlet thereof and the front end surface has its lower edge disposed at a position at a level between the outlet and the inlet, and the coating liquid is introduced to the tank such that the surface of the coating liquid is positioned at a level between the inlet and the lower edge. In that type of the apparatus, supplying the coating liquid into the gap between the front end surface and the substrate surface to be coated during the coating process may be solely by the capillary action, not in cooperation with a pressure setting system, except when the pool of the coating liquid is formed in the gap at the start of the coating. Of course, it is also possible to forcibly push coating liquid out of the tank into the gap by utilizing the pressure setting system to applying pressure within the tank.

On the contrary, in the type of the apparatus other than the above type, for instance, of the apparatus in accordance with the seventeenth, twentieth, and twenty-first embodiments, it is necessary to control the supply amount of the coating liquid delivered to the gap by the use of the pressure setting system, since there is a possibility that the coating liquid will flow out of the gap. That holds true particularly for the apparatus constructed in accordance with the twenty-first embodiment.

In either type, the amount of the coating liquid supplied through the coating liquid outlet path to the gap is equal to the amount of the coating liquid consumed in the gap when the pressure setting system is not employed. By contrast, the former is not equal precisely to the latter when the pressure setting system is utilized, since the amount of the coating liquid expected to be consumed for the coating is set beforehand and that amount of the coating liquid is supplied to the gap.

Nevertheless, where the pressure setting system is used in the apparatus, for instance, in accordance with the twenty-first embodiment, the substrate surface to be coated can be largely inclined, since the amount of the coating liquid supplied through the coating liquid outlet path to the gap is regulated.

Besides, where the pressure setting system, for example, the one designated 400 in the description of the third embodiment, is employed to set the pressure in the coating liquid tank, the pressure setting system, as a first function thereof, maintains the pressure in the coating liquid tank constant. To perform this function during the process of the coating, the change in volume of the coating liquid in the tank caused by the consumption for coating the substrate is corrected by continuously displacing the diaphragm 440 during that process, precisely.

The pressure setting system conducts a second function of displacing the diaphragm 440 to a required position and to have the same remain in that position, so that the system can set the pressure in the tank while applying or reducing the coating liquid therein.

These two functions of the pressure setting system are not performed where the coating liquid tank is opened to the air.

In the coating apparatus according to the embodiments described above, the pressure setting system can perform the first function and/or second function as required.

In the twelfth embodiment illustrated in FIG. 34, the control system controls the linear driving mechanism to have the upper end of the pool move at a constant speed.

However, the control system may also perform the controlling function to set the relative positions of the coating liquid tank and the substrate stage at the start of the coating as depicted in FIG. 74, and/or may perform the function of raising the speed of the coating liquid tank relative to the substrate stage so that the required dimension is in a tolerable range as described in the thirtieth embodiment with reference to FIGS. 71 through 74.

In the embodiments illustrated above, the substrate stage has its width larger than that of the substrate to be coated. The present invention, however, is not limited thereto in that the stage may have its width equal to or smaller than that of the substrate.

Among the coating apparatus described in the above embodiments, the preferable structure of the coating apparatus should be adopted in view of its simplicity, the coating quality obtained, the coating film thickness, the stability of the coating quality, and the like.

In that sense, the coating apparatus 950 of the thirtieth embodiment shown in FIGS. 71 through 74 is preferably adopted.

Alternatively, such coating apparatus is also preferably adopted as provided with one liquid tank 490 illustrate in FIG. 79, the tank 520 in FIG. 80, or the tank 380 in FIG. 81, rather than the tank in FIGS. 71 through 74 In the latter coating starts at the coating start position depicted in one of these figures. As required, these coating tanks may be, in turn, provided with the gas blower portion 370 in the second embodiment shown in FIGS. 9 through 11 or the gas blower tank 610 in the eleventh embodiment illustrated in FIGS. 32 and 33, respectively. The gas blower portion 370 or tank 610, may not necessarily moved integrally with the coating liquid tank, as detailed in the second and eleventh embodiments.

The substrate stage, preferably, has its width smaller than that of the substrate to be coated so that both the ends of the latter can project in the widthwise direction thereof from those of the former.

Besides, the substrate stage holds the substrate to be coated with the substrate surface to be coated inclined upward preferably.

The extended member 510 shown in FIGS. 71 through 74, is, preferably, made of resin material, such as a fluoride resin, as described in the twenty-fifth and -sixth embodiments so that the lower end of the substrate can be satisfactorily free from breakage.

The coating apparatus according to the embodiments described above broadly fall into two groups. One group (referred to as group K temporarily herein) is structured such that the outlet of the coating liquid outlet path passing through the front wall portion of the coating liquid tank is positioned above the surface level of the coating liquid stored in the tank. On the other hand, the apparatus of the other group (referred to as group L) is constituted such that the outlet and inlet of the coating liquid outlet path are located below the surface level.

The coating apparatus of the group K, in turn, fall into two subgroups. One subgroup (referred to as subgroup K1) is structured such that the lower edge of the front end surface is located at the height between the outlet and inlet of the coating liquid outlet path, and the surface level of the coating liquid stored in the coating liquid tank is positioned between the inlet of the coating liquid outlet path and the lower edge of the front end surface when the coating liquid is supplied in the tank.

On the other hand, the apparatus of the other subgroup (referred to as subgroup K2) is constituted differently such that the requirement for the above structure of the above group K is met.

Typical examples of the subgroup K1 are the coating apparatus constructed in accordance with the third and fourth embodiments, while examples of the subgroup K2 are the apparatus constructed in accordance with the seventeenth and eighteenth embodiments, and those of group L are those of the nineteenth and twenty-second embodiments.

Based on the above proposition, the following is a supplement to the description of the embodiments explained above with regard to the manner in which the pool of the coating liquid is formed in the gap between the surface to be coated of the substrate and the front end surface of the coating liquid tank. That is, in the apparatus of the group K, the gap is prepared before and after the required amount of the coating liquid is supplied to the tank, and then the coating liquid flows out of the tank through its outlet to the gap when the inside of the tank is opened to the air, thus forming the pool of the coating liquid. To achieve the above, it is a prerequisite that beforehand the coating liquid adheres to at least part of the front end surface including the outlet and its vicinity, although no mention has been made thereof in the description of the embodiments above.

Such prerequisite can be met, for example, in the case where coating treatments to substrates following a first substrate are sequentially conducted in applying the coating apparatus of the present invention to so called single substrate processing even if the front end surface is cleaned every time the coating treatment to the single substrate is terminated.

For the above reason, it has been described that in the apparatus of the subgroups K1 and K2 it is not necessary to employ the pressure setting system to form the pool in the gap.

To achieve that end, even where no coating liquid adheres to the surface to be coated, it has also been described that part of the pool of the coating liquid in the gap is formed by the application of pressure to the inside of the coating liquid tank by the pressure setting system, and thereafter the belt-shaped pool required is formed by sequentially conducting the step of applying pressure in the tank and/or the step of opening the tank to the air utilizing the system.

The manner of forming the pool of the coating liquid in the gap is not limited to the above. For example, the coating apparatus may be provided with a moving mechanism for moving the substrate stage and/or the coating liquid tank relative to each other and in the direction toward and/or away from each other. In such apparatus, the moving mechanism moves the stage and/or the tank relative to and in the direction toward each other to cause the front end surface of the tank to come into contact with the substrate surface to be coated. Subsequently, the moving mechanism moves the stage and/or tank relative to and in the direction away from each other by the distance necessary to form the belt-shaped gap of prescribed size for the pool.

Where the coating liquid adheres beforehand to the substrate surface to be coated and/or the front end surface including the outlet and its vicinity, the moving mechanism moves such substrate surface and/or front end surface relative to and in the direction toward each other to form at least part of the pool of the coating liquid in the gap. Subsequently, the moving mechanism likewise moves the stage and/or the tank relative to and away from each other by the distance referred to above. The pressure setting system may also be employed to form the pool in conjunction with the above moving mechanism.

In the apparatus of the group L, the outlet and inlet of the coating liquid outlet path are located below the surface level when the coating liquid is supplied to the tank, as stated above. Accordingly, the pressure setting system sets the pressure of the tank into the tank so that the coating liquid flows out in the gap to form the pool of the coating liquid therein.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An apparatus for applying a coating liquid to a substrate a discrete sheet and having a surface to be coated and a length, the surface to be coated having an upper portion and a lower portion, the apparatus comprising:

substrate holding means for holding the substrate such that the surface to be coated is positioned vertically or inclined;

a coating liquid tank for storing the coating liquid therein, said coating liquid tank having:

a hollow body with opposing ends closed;

a front end surface having a lower edge and an upper edge, said front end surface being adapted to face the surface to be coated of the substrate held by said substrate holding means and to extend over at least a prescribed range of width of the surface to be coated;

a coating liquid outlet disposed on said front end surface and having an outlet opening;

a coating liquid inlet having an inlet opening disposed at a level below a level of said outlet opening; and a coating liquid outlet path extending between said outlet and said inlet, the coating liquid rising to reach said outlet at least by capillary action through said outlet path; and moving means for holding said coating liquid tank with its front end surface facing the surface to be coated of the substrate held by said substrate holding means with a gap of a prescribed size therebetween, and for linearly moving said substrate holding means and said coating liquid tank relative to each other, while maintaining said gap of the prescribed size, with linear movement of said substrate holding means and said coating liquid tank relative to each other bringing about relative movement of said tank and said substrate holding means from a first position corresponding to said upper portion where coating of said surface to be coated of the substrate starts and to a second position corresponding to the lower portion where coating of the surface to be coated of the substrate is terminated, wherein said lower edge of said front end surface of said coating liquid tank is disposed at a level between said outlet and said inlet of said coating liquid tank when said coating liquid tank is held by said moving means, and said upper edge is disposed between said outlet and a maximum height reached by said coating liquid rising in the gap of said prescribed size at least by capillary action which coating liquid flows from said outlet to said gap when said coating liquid tank is held by said moving means, both said front end surface of said coating liquid tank and said surface to be coated of said substrate being projected upward infinitely to define said gap of said prescribed size therebetween; and wherein when the coating liquid is introduced to said coating liquid tank with said coating liquid tank being held by said moving means, the coating liquid inside of said hollow body is bounded by an upper surface that is positioned at a level between a level of said inlet opening and said lower edge of said front end surface of said coating liquid tank, and the coating liquid introduced to said gap through said coating liquid outlet path forms a pool in which flow is regulated by said upper and lower edges of said front end surface.

2. The apparatus according to claim 1, wherein said substrate is transparent; and said substrate holding means is adapted to hold said substrate such that an upper end portion of the surface to be coated of the substrate protrudes upward from an upper end of said substrate holding means.

3. The apparatus according to claim 1, wherein said substrate holding means is adapted to hold said substrate in a position such that a lower end portion of the substrate protrudes downward from a lower end of said substrate holding means.

4. The apparatus according to claim 3, further comprising:

recovery means provided at the lower end portion of said substrate holding means opposing, from below, a lower end of the substrate held by said substrate holding means, for recovering coating liquid that drips from the lower end of said substrate.

5. The apparatus according to claim 1, further comprising:

pressurizing means operatively connected with said coating liquid tank, for increasing pressure inside said coating liquid tank prior to application of the coating liquid to said surface to be coated, so as to allow flow of said coating liquid from said tank through said coating liquid outlet path to said gap, for forming the pool in said gap.

6. The apparatus according to claim 1, further comprising:

pressure reducing means operatively connected with said coating liquid tank, for reducing pressure inside said coating liquid tank when application of said coating liquid to said surface to be coated is completed, so that coating liquid in said pool flows back into said coating liquid tank through said coating liquid outlet path.

7. The apparatus according to claim 1, further comprising:

gas blower means for blowing a prescribed gas to impinge upon coating liquid that has been applied to the surface to be coated of said substrate from said pool, to thereby promote drying of the coating liquid.

8. The apparatus according to claim 7, wherein said gas blower means includes a gas blower tank provided on an upper surface of said coating liquid tank and is moved with said coating liquid tank, for blowing said prescribed gas to impinge upon the coating liquid immediately after its application to the surface to be coated of the substrate.

9. The apparatus according to claim 1, further comprising:

control means for controlling speed of movement of said moving means so that movement of a meniscus at the upper end of said pool is kept at a speed that is substantially constant.

10. The apparatus according to claim 9, wherein said control means is adapted to position said coating liquid tank and said substrate holding means such that at said first position where coating starts, the upper end of the substrate held by said substrate holding means is positioned between said upper edge of said front end surface of said coating liquid tank and the outlet of said coating liquid outlet path.

11. The apparatus according to claim 10, wherein said control means is adapted to control said moving means such that at the start of movement of said moving means, by the time the meniscus at the upper end of said pool in said gap attains a level that is the same level as where the upper end of the substrate is located, movement of said coating liquid tank relative to the substrate attains a speed within a prescribed range.

12. The apparatus according to claim 1, further comprising:

an extended member arranged on a lower end side of said substrate holding means and having an end surface facing and in contact with or close to the lower end of the substrate held by said substrate holding means.

13. The apparatus according to claim 12, wherein said extended member has a front wall surface and is arranged such that said front wall surface forms a lower gap that is continuous with the gap formed between the surface to be coated of the substrate held by said substrate holding means and said front end surface of said coating liquid tank, at a position between the front wall surface and said front end surface of the coating liquid tank, and said moving means moves said coating liquid tank until at least a portion of the pool formed between the surface to be coated of the substrate held by said substrate holding means and said front end surface of said coating liquid tank passes the lower end of the substrate and reaches a position confronting said front wall surface of said extended member.

14. The apparatus according to claim 13, wherein said moving means moves said coating liquid tank until the meniscus at the upper end of the pool formed between said front end surface of said coating liquid tank and the surface to be coated of the substrate held by said substrate holding means passes the lower end of the substrate and reaches a position confronting said front wall surface of said extended member.

15. The apparatus according to claim 13, wherein said front wall of said extended member is aligned so as to be coplanar with the surface to be coated of the substrate held by said substrate holding means.

16. The apparatus of claim 13, wherein said front wall surface of said extended member comprises a surface having poorer wettability with respect to the coating liquid than does the surface to be coated of the substrate held by said substrate holding means.

17. The apparatus according to claim 12, wherein said end surface of said extended member comprises a surface that has poorer wettability with respect to the coating liquid than does the substrate held by said substrate holding means.

18. The apparatus according to claim 1, wherein said prescribed size is from 0.1 to 0.3 mm.

19. An apparatus for applying a coating liquid to a substrate comprising a discrete sheet and having a surface to be coated and a length, the surface to be coated having an upper portion and a lower portion, the apparatus comprising:

substrate holding means for holding the substrate such that the surface to be coated is positioned vertically or inclined;

a coating liquid tank for storing the coating liquid therein, said coating liquid tank having:

a hollow body with opposing ends closed;

a front end surface having a lower edge and an upper edge, said front end surface being adapted to face the surface to be coated of the substrate held by said substrate holding means and to extend over at least a prescribed range of width of the surface to be coated of the substrate;

a coating liquid outlet disposed on said front end surface and having an outlet opening;

a coating liquid inlet having an inlet opening disposed at a level below a level of said outlet opening; and a coating liquid outlet path extending between said outlet and said inlet, the coating liquid rising to reach said outlet at least by capillary action through said outlet path; and moving means for holding said coating liquid tank with its front end surface facing the surface to be coated of the substrate held by said substrate holding means with a gap of prescribed size therebetween, and for linearly moving said substrate holding means and said coating liquid tank relative to each other, while maintaining said gap of the prescribed size, with linear movement of said substrate holding means and said coating liquid tank relative to each other bringing about relative movement of said tank and said substrate holding means from a first position corresponding to said upper portion where coating of the surface to be coated of the substrate starts to a second position corresponding to said lower portion where coating of the surface to be coated of the substrate is terminated, wherein said lower edge of said front end surface of said coating liquid tank is disposed at a level between said outlet and said inlet when said coating liquid tank is held by said moving means, and an upper edge disposed above a maximum height reached by said coating liquid rising in the gap of said prescribed size at least by capillary action which coating liquid flows from said outlet to said gap when said coating liquid tank is held by said moving means, both said front end surface of said coating liquid tank and the surface to be coated of said substrate being projected upward infinitely to define said gap of said prescribed size therebetween; and wherein when the coating liquid is introduced to said coating liquid tank with said coating liquid tank being held by said moving means, the coating liquid inside of said hollow body is bounded by an upper surface that is positioned at a level between a level of said inlet opening and said lower edge of said front end surface of said coating liquid tank, and the coating liquid introduced to said gap through said coating liquid outlet path forms a pool in which flow is regulated by said lower edge of said front end surface, and a space that is free of coating liquid is formed above said pool.

20. The apparatus according to claim 19, wherein said substrate is transparent; and said substrate holding means is adapted to hold said substrate such that an upper end portion of the surface to be coated of the substrate protrudes upward from an upper end of said substrate holding means.

21. The apparatus according to claim 19, wherein said substrate holding means is adapted to hold said substrate in a position such that a lower end portion of the substrate protrudes downward from a lower end of said substrate holding means.

22. The apparatus according to claim 21, further comprising:

recovery means provided at the lower end portion of said substrate holding means opposing, from below, a lower end of the substrate held by said substrate holding means, for recovering coating liquid that drips from the lower end of said substrate.

23. The apparatus according to claim 19, further comprising:

pressurizing means operatively connected with said coating liquid tank, for increasing pressure inside said coating liquid tank prior to application of the coating liquid to said surface to be coated, so as to allow flow of said coating liquid from said tank through said coating liquid outlet path to said gap, for forming the pool in said gap.

24. The apparatus according to claim 19, further comprising:

pressure reducing means operatively connected with said coating liquid tank, for reducing pressure inside said coating liquid tank when application of said coating liquid to said surface to be coated is completed, so that coating liquid in said pool flows back into said coating liquid tank through said coating liquid outlet path.

25. The apparatus according to claim 19, further comprising:

gas blower means for blowing a prescribed gas to impinge upon coating liquid that has been applied to the surface to be coated of said substrate from said pool, to thereby promote drying of the coating liquid.

26. The apparatus according to claim 25, wherein said gas blower means includes a gas blower tank provided on an upper surface of said coating liquid tank and is moved with said coating liquid tank, for blowing said prescribed gas to impinge upon the coating liquid immediately after its application to the surface to be coated of the substrate.

27. The apparatus according to claim 19, further comprising:

control means for controlling speed of movement of said moving means so that movement of a meniscus at the upper end of said pool is kept at a speed that is substantially constant.

28. The apparatus according to claim 27, wherein said control means is adapted to position said coating liquid tank and said substrate holding means such that at said first position where coating starts, the upper end of the substrate held by said substrate holding means is positioned between said maximum height and the outlet of said coating liquid outlet path.

29. The apparatus according to claim 28, wherein said control means is adapted to control said moving means such that at the start of movement of said moving means, by the time the meniscus at the upper end of said pool in said gap attains a level that is the same level as where the upper end of the substrate is located, movement of said coating liquid tank relative to the substrate attains a speed within a prescribed range.

30. The apparatus according to claim 19, further comprising an extended member arranged on a lower end side of said substrate holding means and having an end surface facing and in contact with or close to the lower end of the substrate held by said substrate holding means.

31. The apparatus according to claim 30, wherein said extended member has a front wall surface and is arranged such that said front wall surface forms a lower gap that is continuous with the gap formed between the surface to be coated of the substrate held by said substrate holding means and said front end surface of said coating liquid tank, and said moving means moves said coating liquid tank until at least a portion of the pool formed between the surface to be coated of the substrate held by said substrate holding means and said front end surface of said coating liquid tank passes the lower end of the substrate and reaches a position confronting said front wall surface of said extended member.

32. The apparatus according to claim 31, wherein said moving means moves said coating liquid tank until the meniscus at the upper end of the pool formed between said front end surface of said coating liquid tank and the surface to be coated of the substrate held by said substrate holding means passes the lower end of the substrate and reaches a position confronting said front wall surface of said extended member.

33. The apparatus according to claim 31, wherein said front wall of said extended member is aligned so as to be coplanar with the surface to be coated of the substrate held by said substrate holding means.

34. The apparatus according to claim 31, wherein said front wall surface of said extended member comprises a surface that has poorer wettability with respect to the coating liquid than does the surface to be coated of the substrate held by said substrate holding means.

35. The apparatus according to claim 30, wherein said end surface of said extended member comprises a surface that has poorer wettability with respect to the coating liquid than does the substrate held by said substrate holding means.

36. The apparatus according to claim 19, wherein said front end surface of said coating liquid tank is formed such that at least at a portion of said front end surface of said coating liquid tank above said outlet of said coating liquid outlet path, the gap between said front end surface and the surface to be coated of the substrate held by said substrate holding means is wider than said prescribed size.

37. The apparatus according to claim 36, wherein said front end surface of said coating liquid tank is a stepped surface having a front end surface lower portion confronting the surface to be coated of the substrate held by said substrate holding means with a gap therebetween being of said prescribed size, and said stepped surface also has a front end surface upper portion confronting the surface to be coated of the substrate held by said substrate holding means with a gap therebetween being wider than said prescribed size.

38. The apparatus according to claim 37, wherein said outlet of said coating liquid outlet path is formed at a boundary between said front end surface lower portion and said front end surface upper portion.

39. The apparatus according to claim 19, wherein said prescribed size is from 0.1 to 0.3 mm.

40. An apparatus for applying a coating liquid to a substrate comprising a discrete sheet and having a surface to be coated and a length, the surface to be coated having an upper portion and a lower portion, the apparatus comprising:

substrate holding means for holding the substrate such that the surface to be coated is positioned vertically or inclined;

a coating liquid tank for storing the coating liquid therein, said coating liquid tank having:

a hollow body with opposing ends closed;

a front end surface having a lower edge and an upper edge, said front end surface being adapted to face the surface to be coated of the substrate held by said substrate holding means and to extend over at least a prescribed range of width of the surface to be coated;

a coating liquid outlet disposed on said front end surface and having an outlet opening;

a coating liquid inlet having an inlet opening disposed at a level below a level of said outlet opening; and a coating liquid outlet path extending between said outlet and said inlet, the coating liquid rising to reach said outlet at least by capillary action through said outlet path;

moving means for holding said coating liquid tank with its front end surface facing the surface to be coated of the substrate held by said substrate holding means with a gap of prescribed size therebetween, and for linearly moving said substrate holding means and said coating liquid tank relative to each other while maintaining said gap of the prescribed size, with linear movement of said substrate holding means and said coating liquid tank relative to each other bringing about relative movement of said tank and said substrate holding means from a first position corresponding to said upper portion where coating of the surface to be coated of the substrate starts to a second position corresponding to said lower portion where coating of the surface to be coated of the substrate is terminated, wherein said lower edge of said front end surface of said coating liquid tank is disposed at a level between said outlet and said inlet of said coating liquid tank when said coating liquid tank is held by said moving means, and said upper edge is disposed between said outlet and a maximum height reached by said coating liquid rising in the gap of said prescribed size at least by capillary action which coating liquid flows from said outlet to said gap to form a pool therein when said coating liquid tank is held by said moving means, both said front end surface of said coating liquid tank and the surface to be coated of the substrate being projected upward infinitely to define said gap of said prescribed size therebetween; said apparatus further comprising:

pressure adjusting means coupled to said coating liquid tank for controlling, by amount, said coating liquid in said pool; and wherein when the coating liquid is introduced to said coating liquid tank with said coating liquid tank being held by said moving means, the coating liquid inside of said hollow body is bounded by an upper surface that is positioned at a level between a level of said outlet of said coating liquid tank and said lower edge of said front end surface of said coating liquid tank, and the coating liquid introduced to said gap through said coating liquid outlet path forms said pool in which flow is regulated by said upper and lower edges of said front end surface.

41. The apparatus according to claim 40, wherein
said substrate is transparent; and
said substrate holding means is adapted to hold said substrate such that an upper end portion of the surface to be coated of the substrate protrudes upward from an upper end of said substrate holding means.

42. The apparatus according to claim 40, wherein
said substrate holding means is adapted to hold said substrate in a position such that a lower end portion of the substrate protrudes downward from a lower end of said substrate holding means.

43. The apparatus according to claim 42, further comprising:
recovery means provided at the lower end portion of said substrate holding means opposing, from below, a lower end of the substrate held by said substrate holding means, for recovering coating liquid that drips from the lower end of said substrate.

44. The apparatus according to claim 40, wherein
said pressure adjusting means is operatively connected to said coating liquid tank to reduce pressure therein when application of the coating liquid to said surface to be coated is terminated, so that the coating liquid in said pool flows back into said coating liquid tank through said coating liquid outlet path.

45. The apparatus according to claim 40, further comprising:
gas blower means for blowing a prescribed gas to impinge upon coating liquid that has been applied to the surface to be coated of said substrate from said pool, to thereby promote drying of the coating liquid.

46. The apparatus according to claim 45, wherein
said gas blower means includes a gas blower tank provided on an upper surface of said coating liquid tank and is moved with said coating liquid tank, for blowing said prescribed gas to impinge upon the coating liquid immediately after its application to the surface to be coated of the substrate.

47. The apparatus according to claim 40,
control means for controlling speed of movement of said moving means so that movement of a meniscus at the upper end of said pool is kept at a speed that is substantially constant.

48. The apparatus according to claim 47, wherein
said control means is adapted to position said coating liquid tank and said substrate holding means such that at said first position where coating starts, the upper end of the substrate held by said substrate holding means is positioned between said upper edge of said front end surface of said coating liquid tank and the outlet of said coating liquid outlet path.

49. The apparatus according to claim 48, wherein
said control means is adapted to control said moving means such that at the start of movement of said moving means, by the time the meniscus at the upper end of said pool in said gap attains a level that is the same level as where the upper end of the substrate is located, movement of said coating liquid tank relative to the substrate attains a speed within a prescribed range.

50. The apparatus according to claim 40, further comprising:
a extended member arranged on a lower end side of said substrate holding means and having an end surface facing and in contact with or close to the lower end of the substrate held by said substrate holding means.

51. The apparatus according to claim 50, wherein
said extended member has a front wall surface and is arranged such that said front wall surface forms a level gap that is continuous with the gap formed between the surface to be coated of the substrate held by said substrate holding means and said front end surface of said coating liquid tank at a position between the front wall surface and said front end surface of the coating liquid tank, and
said moving means moves said coating liquid tank until at least a portion of the pool formed between the surface to be coated of the substrate held by said substrate holding means and said front end surface of said coating liquid tank passes the lower end of the substrate and reaches a position confronting said front wall surface of said extended member.

52. The apparatus according to claim 51, wherein
said moving means moves said coating liquid tank until the meniscus at the upper end of the pool formed between said front end surface of said coating liquid tank and the surface to be coated of the substrate held by said substrate holding means passes the lower end of the substrate and reaches a position confronting said front wall surface of said extended member.

53. The apparatus according to claim 51, wherein
said front wall of said extended member is aligned so as to be coplanar with the surface to be coated of the substrate held by said substrate holding means.

54. The apparatus of claim 51, wherein
said front wall surface of said extended member comprises a surface having poorer wettability with respect to the coating liquid than does the surface to be coated of the substrate held by said substrate holding means.

55. The apparatus according to claim 50, wherein
said end surface of said extended member comprises a surface that has poorer wettability with respect to the coating liquid than does the substrate held by said substrate holding means.

56. The apparatus according to claim 40, wherein
said prescribed size is from 0.1 to 0.3 mm.

57. An apparatus for applying a coating liquid to a substrate comprising a discrete sheet and having a surface to be coated and a length, the surface to be coated having an upper portion and a lower portion, the apparatus comprising:
substrate holding means for holding the substrate such that the surface to be coated is positioned vertically or inclined;
a coating liquid tank for storing the coating liquid therein, said coating liquid tank having:
a hollow body with opposing ends closed;
a front end surface having a lower edge and an upper edge, said front end surface being adapted to face the surface to be coated of the substrate held by said substrate holding means and to extend over at least a prescribed range of width of the surface to be coated;
a coating liquid outlet disposed on said front end surface and having an outlet opening;
a coating liquid inlet having an inlet opening disposed at a level below a level of said outlet opening; and
a coating liquid outlet path extending between said outlet and said inlet, the coating liquid rising to reach said outlet at least by capillary action through said outlet path; and
moving means for holding said coating liquid tank with its front end surface facing the surface to be coated of the substrate held by said substrate holding means with a gap of prescribed size therebetween, and for linearly moving said substrate holding means and said coating liquid tank relative to each other, while maintaining said gap of the prescribed size, with linear movement of said substrate holding means and said coating liquid tank relative to each other bringing about relative movement of said tank and said substrate holding means from a first position corresponding to said upper portion where coating of the surface to be coated of the substrate starts to a second position corresponding to said lower portion where coating of the surface to be coated of the substrate is terminated, wherein said lower edge of said front end surface of said coating liquid tank having a lower edge disposed at a level between said outlet and said inlet of said coating liquid tank when said coating liquid tank is held by said moving means, and said upper edge is disposed above a maximum height reached by said coating liquid rising in the gap of said prescribed size at least by capillary action which coating liquid flows from said outlet to said gap to form a pool therein when said coating liquid tank is held by said moving means, both said front end surface of said coating liquid tank and the surface to be coated of the substrate being projected upward infinitely to define said gap of said prescribed size therebetween; said apparatus further comprising:

pressure adjusting means coupled to said coating liquid tank for controlling, as to amount, said coating liquid in said pool; and wherein when the coating liquid is introduced to said coating liquid tank with said coating liquid tank being held by said moving means, the coating liquid inside of said hollow body is bounded by an upper surface that is positioned at a level between a level of said outlet and said lower edge of said front end surface of said coating liquid tank, and the coating liquid introduced to said gap through said coating liquid outlet path forms said pool in which flow is regulated by said lower edge of said front end surface, and a space that is free of coating liquid is formed above said pool.

58. The apparatus according to claim 57, wherein
said substrate is transparent; and
said substrate holding means is adapted to hold said substrate such that an upper end portion of the surface to be coated of the substrate protrudes upward from an upper end of said substrate holding means.

59. The apparatus according to claim 57, wherein
said substrate holding means is adapted to hold said substrate in a position such that a lower end portion of the substrate protrudes downward from a lower end of said substrate holding means.

60. The apparatus according to claim 59, further comprising:
recovery means provided at the lower end portion of said substrate holding means opposing, from below, a lower end of the substrate held by said substrate holding means, for recovering the coating liquid that drips from the lower end of said substrate.

61. The apparatus according to claim 57, wherein said pressure adjusting means reduces pressure in said coating liquid tank when application of said coating liquid to said surface to be coated is completed, so that said coating liquid in said pool returns to said coating liquid tank through said coating liquid outlet path.

62. The apparatus according to claim 57, further comprising:

gas blower means for blowing a prescribed gas to impinge upon coating liquid that has been applied to the surface to be coated of said substrate from said pool, to thereby promote drying of the coating liquid.

63. The apparatus according to claim 62, wherein
said gas blower means includes a gas blower tank provided on an upper surface of said coating liquid tank and is moved with said coating liquid tank, for blowing said prescribed gas to impinge upon the coating liquid immediately after its application to the surface to be coated of the substrate.

64. The apparatus according to claim 57, further comprising:
control means for controlling speed of movement of said moving means so that movement of a meniscus at the upper end of said pool is kept at a speed that is substantially constant.

65. The apparatus according to claim 64, wherein
said control means is adapted to position said coating liquid tank and said substrate holding means such that at said first position where coating starts, the upper end of the substrate held by said substrate holding means is positioned between said maximum height and the outlet of said coating liquid outlet path.

66. The apparatus according to claim 65, wherein
said control means is adapted to control said moving means such that at the start of movement of said moving means, by the time the meniscus at the upper end of said pool in said gap attains a level that is the same level as where the upper end of the substrate is located, movement of said coating liquid tank relative to the substrate attains a speed within a prescribed range.

67. The apparatus according to claim 57, further comprising:
an extended member arranged on a lower end side of said substrate holding means and having an end surface facing to and in contact with or close to the lower end of the substrate held by said substrate holding means.

68. The apparatus according to claim 67, wherein
said extended member has a front wall surface and is arranged such that said front wall surface forms a lower gap that is continuous with the gap formed between the surface to be coated of the substrate held by said substrate holding means and said front end surface of said coating liquid tank, at a position between the front wall surface and said front end surface of the coating liquid tank, and said moving means moves said coating liquid tank until at least a portion of the pool formed between the surface to be coated of the substrate held by said substrate holding means and said front end surface of said coating liquid tank passes the lower end of the substrate and reaches a position confronting said front wall surface of said extended member.

69. The apparatus according to claim 68, wherein
said moving means moves said coating liquid tank until the meniscus at the upper end of the pool formed between said front end surface of said coating liquid tank and the surface to be coated of the substrate held by said substrate holding means passes the lower end of the substrate and reaches a position confronting said front wall surface of said extended member.

70. The apparatus according to claim 68, wherein
said front wall of said extended member is aligned so as to be coplanar with the surface to be coated of the substrate held by said substrate holding means.

71. The apparatus of claim 68, wherein
said front wall surface of said extended member comprises a surface having poorer wettability with respect to the coating liquid than does the surface to be coated of the substrate held by said substrate holding means.

72. The apparatus according to claim 67, wherein
said end surface of said extended member comprises a surface that has poorer wettability with respect to the coating liquid than does the substrate held by said substrate holding means.

73. The apparatus according to claim 57, wherein
said front end surface of said coating liquid tank is formed such that at least at a portion of said front end surface of said coating liquid tank above said outlet of said coating liquid outlet path, the gap between said front end surface and the surface to be coated of the substrate held by said substrate holding means is wider than said prescribed size.

74. The apparatus according to claim 73, wherein said front end surface of said coating liquid tank is a stepped surface having a front end surface lower portion confronting the surface to be coated of the substrate held by said substrate holding means with a gap therebetween being of said prescribed size, and
said stepped surface also has a front end surface upper portion confronting the surface to be coated of the substrate held by said substrate holding means with a gap there between being wider than said prescribed size.

75. The apparatus according to claim 74, wherein
said outlet of said coating liquid outlet path is formed at a boundary between said front end surface lower portion and said front end surface upper portion.

76. The apparatus according to claim 57, wherein
said prescribed size is from 0.1 to 0.13 mm.

77. An apparatus for applying a coating liquid to a substrate comprising a discrete sheet and having a surface to be coated and a length, the surface to be coated having an upper portion and a lower portion, the apparatus comprising:
substrate holding means for holding the substrate such that the surface to be coated is positioned vertically or inclined;
a coating liquid tank for storing the coating liquid therein, said coating liquid tank having:
a hollow body with opposing ends closed;
a front end surface having a lower edge and an upper edge, said front end surface being adapted to face the surface to be coated of the substrate held by said substrate holding means and to extend over at least a prescribed range of width of the surface to be coated;
a coating liquid outlet disposed on said front end surface and having an outlet opening;
a coating liquid inlet having an inlet opening disposed at a level below a level of said outlet opening; and
a coating liquid outlet path extending between said outlet and said inlet, the coating liquid rising to reach said outlet at least by capillary action through said outlet path; and
moving means for holding said coating liquid tank with its front end surface facing the surface to be coated of the substrate held by said substrate holding means with a gap of a prescribed size therebetween, and for linearly moving said substrate holding means and said coating liquid tank relative to each other, while maintaining said gap of the prescribed size, with linear movement of said substrate holding means and said coating liquid tank relative to each other bringing about relative movement of said tank and said substrate holding means from a first position corresponding to said upper portion where coating of the surface to be coated of the substrate starts to a second position corresponding to said lower portion where coating of the surface to be coated of the substrate is terminated, wherein
said lower edge of said front end surface of said coating liquid tank is disposed at a level below said inlet when said coating liquid tank is held by said moving means, and said upper edge is disposed between said outlet and a maximum height reached by said coating liquid rising in the gap of said prescribed size at least by capillary action which coating liquid flows from said outlet to said gap to form a pool therein when said coating liquid tank is held by said moving means, both said front end surface of said coating liquid tank and the surface to be coated of the substrate being projected upward infinitely to define said gap of said prescribed size therebetween; said apparatus further comprising:
pressure adjusting means coupled to said coating liquid tank for controlling, by quantity, said coating liquid in said pool; and wherein
when the coating liquid is introduced to said coating liquid tank with said coating liquid tank being held by said moving means, the coating liquid inside of said hollow body is bounded by an upper surface that is positioned at a level between said inlet and said outlet of said coating liquid tank, and the coating liquid introduced to said gap through said coating liquid outlet path forms said pool in which flow is regulated by said upper and lower edges of said front end surface.

78. The apparatus according to claim 77, wherein
said substrate is transparent; and
said substrate holding means is adapted to hold said substrate such that an upper end portion of the surface to be coated of the substrate protrudes upward from an upper end of said substrate holding means.

79. The apparatus according to claim 77, wherein
said substrate holding means is adapted to hold said substrate in a position such that a lower end portion of the substrate protrudes downward from a lower end of said substrate holding means.

80. The apparatus according to claim 79, further comprising:
recovery means provided at the lower end portion of said substrate holding means opposing, from below, a lower end of the substrate held by said substrate holding means, for recovering coating liquid that drips from the lower end of said substrate.

81. The apparatus according to claim 77, wherein
said pressure adjusting means is operatively connected to said coating liquid tank to reduce pressure therein when application of said coating liquid to the surface to be coated is completed, so that coating liquid in said pool flows back into said coating liquid tank through said coating liquid outlet path.

82. The apparatus according to claim 77, further comprising:
gas blower means for blowing a prescribed gas to impinge upon coating liquid that has been applied to the surface to be coated of said substrate from said pool, to thereby promote drying of the coating liquid.

83. The apparatus according to claim 82, wherein
said gas blower means includes a gas blower tank provided on an upper surface of said coating liquid tank and is moved with said coating liquid tank, for blowing said prescribed gas to impinge upon the coating liquid immediately after its application to the surface to be coated of the substrate.

84. The apparatus according to claim 77, further comprising:

control means for controlling speed of movement of said moving means so that a meniscus at the upper end of said pool moves at a speed that is kept substantially constant.

85. The apparatus according to claim 77, wherein said control means is adapted to position said coating liquid tank and said substrate holding means such that at said first position where coating starts, the upper end of the substrate held by said substrate holding means is positioned between said upper edge of said front end surface of said coating liquid tank and the outlet of said coating liquid outlet path.

86. The apparatus according to claim 85, wherein said control means is adapted to control said moving means such that at the start of movement of said moving means, by the time the meniscus at the upper end of said pool in said gap attains a level that is the same level as where the upper end of the substrate is located, movement of said coating liquid tank relative to the substrate attains a speed within a prescribed range.

87. The apparatus according to claim 77, further comprising:

an extended member arranged on a lower end side of said substrate holding means and having an end surface facing and in contact with or close to the lower end of the substrate held by said substrate holding means.

88. The apparatus according to claim 87, wherein said extended member has a front wall surface and is arranged such that said front wall surface forms a lower gap that is continuous with the gap formed between the surface to be coated of the substrate held by said substrate holding means and said front end surface of said coating liquid tank, at a position between the front wall surface and said front end surface of the coating liquid tank, and said moving means moves said coating liquid tank until at least a portion of the pool formed between the surface to be coated of the substrate held by said substrate holding means and said front end surface of said coating liquid tank passes the lower end of the substrate and reaches a position confronting said front wall surface of said extended member.

89. The apparatus according to claim 88, wherein said moving means moves said coating liquid tank until the meniscus at the upper end of the pool formed between said front end surface of said coating liquid tank and the surface to be coated of the substrate held by said substrate holding means passes the lower end of the substrate and reaches a position confronting said front wall surface of said extended member.

90. The apparatus according to claim 88, wherein said front wall of said extended member is aligned so as to be coplanar with the surface to be coated of the substrate held by said substrate holding means.

91. The apparatus of claim 88, wherein said front wall surface of said extended member comprises a surface having poorer wettability with respect to the coating liquid than does the surface to be coated of the substrate held by said substrate holding means.

92. The apparatus according to claim 87, wherein said end surface of said extended member comprises a surface that has poorer wettability with respect to the coating liquid than does the substrate held by said substrate holding means.

93. The apparatus according to claim 77, wherein said prescribed size is from 0.1 to 0.3 mm.

94. An apparatus for applying a coating liquid to a substrate having a surface to be coated and a length, the surface to be coated having an upper portion and a lower portion, the apparatus comprising:

substrate holding means for holding and supporting the substrate substantially along the length of the substrate and such that the surface to be coated is positioned vertically or inclined;

a coating liquid tank for storing the coating liquid therein, said coating liquid tank having:

a hollow body with opposing ends closed;

a front end surface having a lower edge and an upper edge, said front end surface being adapted to face the surface to be coated of the substrate held by said substrate holding means and to extend over at least a prescribed range of width of the surface to be coated;

a coating liquid outlet disposed on said front end surface and having an outlet opening;

a coating liquid inlet having an inlet opening disposed at a level below a level of said outlet opening; and a coating liquid outlet path extending between said outlet and said inlet, the coating liquid rising to reach said outlet at least by capillary action through said outlet path; and moving means for holding said coating liquid tank with its front end surface facing the surface to be coated of the substrate held by said substrate holding means with a gap of a prescribed size therebetween and, for linearly moving said substrate holding means and said coating liquid tank relative to each other, while maintaining said gap of the prescribed size, with linear movement of said substrate holding means and said coating liquid tank relative to each other bringing about relative movement of said tank and said substrate holding means from a first position corresponding to said upper portion where coating of the surface to be coated of the substrate starts and to a second position corresponding to said lower portion where coating of the surface to be coated of the substrate is terminated, wherein said lower edge of said front end surface of said coating liquid tank is disposed at a level below said inlet of said coating liquid tank when said coating liquid tank is held by said moving means, and said upper edge is disposed above a maximum height reached by said coating liquid rising in the gap of said prescribed size at least by capillary action which coating liquid flows from said outlet to said gap to form a pool therein when said coating liquid tank is held by said moving means, both said front end surface of said coating liquid tank and the surface to be coated of the substrate being projected upward infinitely to define said gap of said prescribed size therebetween; said apparatus further comprising:

pressure adjusting means coupled to said coating liquid tank for controlling, by amount, said coating liquid in said pool; and wherein when the coating liquid is introduced to said coating liquid tank with said coating liquid tank being held by said moving means, the coating liquid inside of said hollow body is bounded by an upper surface that is positioned at a level between said outlet and said inlet of said coating liquid tank, and the coating liquid introduced to said gap through said coating liquid outlet path forms said pool in which flow is regulated by said lower edge of said front end surface, and a space that is free of coating liquid is formed above said pool.

95. The apparatus according to claim 94, wherein said substrate is transparent; and said substrate holding means is adapted to hold said substrate such that an upper end portion of the surface to be coated of the substrate protrudes upward from an upper end of said substrate holding means.

96. The apparatus according to claim 94, wherein said substrate holding means is adapted to hold said substrate in a position such that a lower end portion of the substrate protrudes downward from a lower end of said substrate holding means.

97. The apparatus according to claim 96, further comprising:

recovery means provided at the lower end portion of said substrate holding means opposing, from below, a lower end of the substrate held by said substrate holding means, for recovering coating liquid that drips from the lower end of said substrate.

98. The apparatus according to claim 94, wherein said pressure adjusting means is operatively connected with said coating liquid tank to reduce pressure therein when application of said coating liquid to the surface to be coated is completed, so that coating liquid in said pool flows back into said coating liquid tank through said coating liquid outlet path.

99. The apparatus according to claim 94, further comprising:

gas blower means for blowing a prescribed gas to impinge upon coating liquid that has been applied to the surface to be coated of said substrate from said pool, to thereby promote drying of the coating liquid.

100. The apparatus according to claim 99, wherein said gas blower means includes a gas blower tank provided on an upper surface of said coating liquid tank and is moved with said coating liquid tank, for blowing said prescribed gas to impinge upon the coating liquid immediately after its application to the surface to be coated of the substrate.

101. The apparatus according to claim 94, further comprising:

control means for controlling speed of movement of said moving means so that movement of a meniscus at the upper end of said pool is kept at a speed that is substantially constant.

102. The apparatus according to claim 101, wherein said control means is adapted to position said coating liquid tank and said substrate holding means such that at said first position where coating starts, the upper end of the substrate held by said substrate holding means is positioned between said upper edge of said maximum height and the outlet of said coating liquid outlet path.

103. The apparatus according to claim 102, wherein said control means is adapted to control said moving means such that at the start of movement of said moving means, by the time the meniscus at the upper end of said pool in said gap attains a level that is the same level as where the upper end of the substrate is located, movement of said coating liquid tank relative to the substrate attains a speed within a prescribed range.

104. The apparatus according to claim 94, further comprising:

an extended member arranged on a lower end side of said substrate holding means and having an end surface facing and in contact with or close to the lower end of the substrate held by said substrate holding means.

105. The apparatus according to claim 104, wherein said extended member has a front wall surface and is arranged such that said front wall surface forms a lower gap that is continuous with the gap formed between the surface to be coated of the substrate held by said substrate holding means and said front end surface of said coating liquid tank, at a position between the front wall surface and said front end surface of the coating liquid tank, and said moving means moves said coating liquid tank until at least a portion of the pool formed between the surface to be coated of the substrate held by said substrate holding means and said front end surface of said coating liquid tank passes the lower end of the substrate and reaches a position confronting said front wall surface of said extended member.

106. The apparatus according to claim 105, wherein said moving means moves said coating liquid tank until the meniscus at the upper end of the pool formed between said front end surface of said coating liquid tank and the surface to be coated of the substrate held by said substrate holding means passes the lower end of the substrate and reaches a position confronting said front wall surface of said extended member.

107. The apparatus according to claim 105, wherein said front wall of said extended member is aligned so as to be coplanar with the surface to be coated of the substrate held by said substrate holding means.

108. The apparatus of claim 105, wherein said front wall surface of said extended member comprises a surface having poorer wettability with respect to the coating liquid than does the surface to be coated of the substrate held by said substrate holding means.

109. The apparatus according to claim 104, wherein said end surface of said extended member comprises a surface that has poorer wettability with respect to the coating liquid than does the substrate held by said substrate holding means.

110. The apparatus according to claim 94, wherein said front end surface of said coating liquid tank is formed such that at least at a portion of said front end surface of said coating liquid tank above said outlet of said coating liquid outlet path, the gap between said front end surface and the surface to be coated of the substrate held by said substrate holding means is wider than said prescribed size.

111. The apparatus according to claim 110, wherein said front end surface of said coating liquid tank is a stepped surface having a front end surface lower portion confronting the surface to be coated of the substrate held by said substrate holding means with a gap therebetween being of said prescribed size.

112. The apparatus according to claim 111, wherein said outlet of said coating liquid outlet path is formed at a boundary between said front end surface lower portion and said front end surface upper portion.

113. The apparatus according to claim 94, wherein said predetermined size is from 0.1 to 0.3 mm.

114. An apparatus for applying a coating liquid to a substrate comprising a discrete sheet and having a surface to be coated and a length, the surface to be coated having an upper portion and a lower portion, the apparatus comprising:

substrate holding means for holding the substrate such that the surface to be coated is positioned vertically or inclined;

a coating liquid tank for storing the coating liquid therein, said coating liquid tank having:
a hollow body with opposing ends closed;
a front end surface having a lower edge and an upper edge, said front end surface being adapted to face the surface to be coated of the substrate held by said substrate holding means and to extend over at least a prescribed range of width of the surface to be coated;
a coating liquid outlet disposed on said front end surface and having an outlet opening;
a coating liquid inlet having an inlet opening; and
a coating liquid outlet path extending between said outlet and said inlet in said coating liquid tank through which outlet path the coating liquid flows to reach said outlet at least by capillary action; and moving means for holding said coating liquid tank with its front end surface facing the surface to be coated of the substrate held by said substrate holding means with a gap of a prescribed size therebetween, and for linearly moving said substrate holding means and said coating liquid tank relative to each other, while maintaining said gap of the prescribed size, with linear movement of said substrate holding means and said coating liquid tank relative to each other bringing about relative movement of said tank and said substrate holding means from a first position corresponding to said upper portion where coating of the surface to be coated of the substrate starts to a second position corresponding to said lower portion where coating of the surface to be coated of the substrate is terminated, wherein said lower edge of said front end surface of said coating liquid tank is disposed at a level below said outlet when said coating liquid tank is held by said moving means, and said upper edge is disposed between said outlet and a maximum height reached by said coating liquid rising in the gap of said prescribed size at least by capillary action which coating liquid flows from said outlet to said gap to form a pool therein when said coating liquid tank is held by said moving means, both said front end surface of said coating liquid tank and the surface to be coated of the substrate being projected upward infinitely to define said gap of said prescribed size therebetween, said apparatus further comprising:

pressure adjusting means coupled to said coating liquid tank for controlling, by amount, of said coating liquid in said pool; and wherein when the coating liquid is introduced to said coating liquid tank with said coating liquid tank being held by said moving means, the coating liquid inside of said hollow body is bounded by an upper surface that is positioned at a level above both said inlet and said outlet of said coating liquid tank, and the coating liquid introduced to said gap through said coating liquid outlet path forms said pool in which flow is regulated by said upper and lower edges of said front end surface.

115. The apparatus according to claim 114, wherein said substrate is transparent; and
said substrate holding means is adapted to hold said substrate such that an upper end portion of the surface to be coated of the substrate protrudes upward from an upper end of said substrate holding means.

116. The apparatus according to claim 1, wherein said substrate holding means is adapted to hold said substrate in a position such that a lower end portion of the substrate protrudes downward from a lower end of said substrate holding means.

117. The apparatus according to claim 116, further comprising:
recovery means provided at the lower end portion of said substrate holding means opposing, from below, a lower end of the substrate held by said substrate holding means, for recovering coating liquid that drips from the lower end of said substrate.

118. The apparatus according to claim 114, wherein said pressure adjustment means is operatively connected with said coating liquid tank to reduce pressure therein when application of said coating liquid to said surface to be coated is completed, so that coating liquid in said pool flows back into said coating liquid tank through said coating liquid outlet path.

119. The apparatus according to claim 114, further comprising:
gas blower means for blowing a prescribed gas to impinge upon coating liquid that has been applied to the surface to be coated of said substrate from said pool, to thereby promote drying of the coating liquid.

120. The apparatus according to claim 119, wherein said gas blower means includes a gas blower tank provided on an upper surface of said coating liquid tank and is moved with said coating liquid tank, for blowing said prescribed gas to impinge upon the coating liquid immediately after its application to the surface to be coated of the substrate.

121. The apparatus according to claim 114, further comprising:
control means for controlling speed of movement of said moving means so that movement of a meniscus at the upper end of said pool is kept at a speed that is substantially constant.

122. The apparatus according to claim 121, wherein said control means is adapted to position said coating liquid tank and said substrate holding means such that at said first position where coating starts, the upper end of the substrate held by said substrate holding means is positioned between said upper edge of said front end surface of said coating liquid tank and the outlet of said coating liquid outlet path.

123. The apparatus according to claim 122, wherein said control means is adapted to control said moving means such that at the start of movement of said moving means, by the time the meniscus at the upper end of said pool in said gap attains a level that is the same level as where the upper end of the substrate is located, movement of said coating liquid tank relative to the substrate attains a speed within a prescribed range.

124. The apparatus according to claim 114, further comprising:
an extended member arranged on a lower end side of said substrate holding means and having an end surface facing and in contact with or close to the lower end of the substrate held by said substrate holding means.

125. The apparatus according to claim 124, wherein said extended member has a front wall surface and is arranged such that said front wall surface forms a lower gap that is continuous with the gap formed between the surface to be coated of the substrate held by said substrate holding means and said front end surface of said coating liquid tank, at a position between the front wall surface and said front end surface of the coating liquid tank, and said moving means moves said coating liquid tank until at least a portion of the pool formed between the surface to be coated of the substrate held by said substrate holding means and said front end surface of said coating liquid tank passes the lower end of the substrate and reaches a position confronting said front wall surface of said extended member.

126. The apparatus according to claim 125, wherein said moving means moves said coating liquid tank until the meniscus at the upper end of the pool formed between said front end surface of said coating liquid tank and the surface to be coated of the substrate held by said substrate holding means passes the lower end of the substrate and reaches a position confronting said front wall surface of said extended member.

127. The apparatus according to claim 125, wherein said front wall of said extended member is aligned so as to be coplanar with the surface to be coated of the substrate held by said substrate holding means.

128. The apparatus of claim 125, wherein said front wall surface of said extended member comprises a surface having poorer wettability with respect to the coating liquid than does the surface to be coated of the substrate held by said substrate holding means.

129. The apparatus according to claim 124, wherein said end surface of said extended member comprises a surface that has poorer wettability with respect to the coating liquid than does the substrate held by said substrate holding means.

130. The apparatus according to claim 114, wherein said prescribed size is from 0.1 to 0.3 mm.

131. An apparatus for applying a coating liquid to a substrate comprising a discrete sheet and having a surface to be coated and a length, the surface to be coated having an upper portion and a lower portion, the apparatus comprising:

substrate holding means for holding the substrate such that the surface to be coated is positioned vertically or inclined, the surface to be coated having an upper portion and a lower portion;

a coating liquid tank for storing the coating liquid therein, said coating liquid tank having:

a hollow body with opposing ends closed;

a front end surface having a lower edge and an upper edge, said front end surface being adapted to face the surface to be coated of the substrate held by said substrate holding means and to extend over at least a prescribed range of width of the surface to be coated;

a coating liquid outlet disposed on said front end surface and having an outlet opening;

a coating liquid inlet having an inlet opening; and a coating liquid outlet path extending between said outlet and said inlet in said coating liquid tank, through which outlet path the coating liquid moves to reach said outlet at least by capillary action; and moving means for holding said coating liquid tank with its front end surface facing the surface to be coated of the substrate held by said substrate holding means with a gap of a prescribed size therebetween, and for moving said substrate holding means and said coating liquid tank linearly relative to each other, while maintaining said gap of the prescribed size, with linear movement of said substrate holding means and said coating liquid tank relative to each other bringing about relative movement of said tank and said substrate holding means from a first position corresponding to said upper portion where coating of the surface to be coated of the substrate starts to a second position corresponding to said lower portion where coating of the surface to be coated of the substrate is terminated, wherein said lower edge of said front end surface of said coating liquid tank is disposed at a level below said outlet when said coating liquid tank is held by said moving means, and said upper edge is disposed above a maximum height reached by said coating liquid rising in the gap of said prescribed size at least by capillary action which coating liquid flows from said outlet to said gap to form a pool therein when said coating liquid tank is held by said moving means, both said front end surface of said coating liquid tank and the surface to be coated of the substrate being projected upward infinitely to define said gap of said prescribed size therebetween, said apparatus further comprising:

pressure adjusting means coupled to said coating liquid tank for controlling, by amount, said coating liquid in said pool; and wherein when the coating liquid is introduced to said coating liquid tank with said coating liquid tank being held by said moving means, the coating liquid inside of said hollow body is bounded by an upper surface that is positioned at a level above both said inlet and said outlet of said coating liquid tank, and the coating liquid introduced to said gap through said coating liquid outlet path forms said pool in which flow is regulated by said lower edge of said front end surface, and a space void of coating liquid is formed above said pool.

132. The apparatus according to claim 131, wherein said substrate is transparent; and said substrate holding means is adapted to hold said substrate such that an upper end portion of the surface to be coated of the substrate protrudes upward from an upper end of said substrate holding means.

133. The apparatus according to claim 131, wherein said substrate holding means is adapted to hold said substrate in a position such that a lower end portion of the substrate protrudes downward from a lower end of said substrate holding means.

134. The apparatus according to claim 133, further comprising:

recovery means provided at the lower end portion of said substrate holding means opposing, from below, a lower end of the substrate held by said substrate holding means, for recovering coating liquid that drips from the lower end of said substrate.

135. The apparatus according to claim 131, wherein said pressure adjusting means is operatively connected with said coating liquid tank to reduce pressure therein when application of said coating liquid to the surface to be coated is completed, so that coating liquid in said pool flows back into said coating liquid tank through said coating liquid outlet path.

136. The apparatus according to claim 131, further comprising:

gas blower means for blowing a prescribed gas to impinge upon coating liquid that has been applied to the surface to be coated of said substrate from said pool, to thereby promote drying of the coating liquid.

137. The apparatus according to claim 136, wherein said gas blower means includes a gas blower tank provided on an upper surface of said coating liquid tank and is moved with said coating liquid tank, for blowing said prescribed gas to impinge upon the coating liquid immediately after its application to the surface to be coated of the substrate.

138. The apparatus according to claim 131, further comprising:

control means for controlling speed of movement of said moving means so that movement of a meniscus at the upper end of said pool is kept at a speed that is substantially constant.

139. The apparatus according to claim 131, wherein said control means is adapted to position said coating liquid tank and said substrate holding means such that at said first position where coating starts, the upper end of the substrate held by said substrate holding means is positioned between said maximum height and the outlet of said coating liquid outlet path.

140. The apparatus according to claim 139, wherein said control means is adapted to control said moving means such that at the start of movement of said moving means, by the time the meniscus at the upper end of said pool in said gap attains a level that is the same level as where the upper end of the substrate is located, movement of said coating liquid tank relative to the substrate attains a speed within a prescribed range.

141. The apparatus according to claim 131, further comprising:

an extended member arranged on a lower end side of said substrate holding means and having an end surface facing and in contact with or close to the lower end of the substrate held by said substrate holding means.

142. The apparatus according to claim 141, wherein said extended member has a front wall surface and is arranged such that said front wall surface forms a lower gap that is continuous with the gap formed between the surface to be coated of the substrate held by said substrate holding means and said front end surface of said coating liquid tank, at a position between the front wall surface and said front end surface of the coating liquid tank, and said moving means moves said coating liquid tank until at least a portion of the pool formed between the surface to be coated of the substrate held by said substrate holding means and said front end surface of said coating liquid tank passes the lower end of the substrate and reaches a position opposing to said front wall surface of said extended member.

143. The apparatus according to claim 142, wherein said moving means moves said coating liquid tank until the meniscus at the upper end of the pool formed between said front end surface of said coating liquid tank and the surface to be coated of the substrate held by said substrate holding means passes the lower end of the substrate and reaches a position confronting said front wall surface of said extended member.

144. The apparatus according to claim 142, wherein said front wall of said extended member is aligned so as to be coplanar with the surface to be coated of the substrate held by said substrate holding means.

145. The apparatus of claim 142, wherein said front wall surface of said extended member comprises a surface having poorer wettability with respect to the coating liquid than does the surface to be coated of the substrate held by said substrate holding means.

146. The apparatus according to claim 141, wherein said end surface of said extended member comprises a surface that has poorer wettability with respect to the coating liquid than does the substrate held by said substrate holding means.

147. The apparatus according to claim 131, wherein said front end surface of said coating liquid tank is formed such that at least at a portion of said front end surface of said coating liquid tank above said outlet of said coating liquid outlet path, the gap between said front end surface and the surface to be coated of the substrate held by said substrate holding means is wider than said prescribed size.

148. The apparatus according to claim 147, wherein said front end surface of said coating liquid tank is a stepped surface having a front end surface lower portion confronting the surface to be coated of the substrate held by said substrate holding means with a gap therebetween being of said prescribed size, and said stepped surface also has a front end surface upper portion confronting the surface to be coated of the substrate held by said substrate holding means with a gap therebetween being wider than said prescribed size.

149. The apparatus according to claim 148, wherein said outlet of said coating liquid outlet path is formed at a boundary between said front end surface lower portion and said front end surface upper portion.

150. The apparatus according to claim 131, wherein said prescribed size is from 0.1 to 0.3 mm.

\* \* \* \* \*